United States Patent
Konishi et al.

(10) Patent No.: US 11,631,815 B2
(45) Date of Patent: Apr. 18, 2023

(54) QUANTUM DOT ELECTROLUMINESCENCE DEVICE

(71) Applicant: SAMSUNG ELECTRONICS CO., LTD., Suwon-si (KR)

(72) Inventors: Yusaku Konishi, Yokohama (JP); Takahiro Fujiyama, Yokohama (JP); Fumiaki Kato, Yokohama (JP); Keigo Furuta, Yokohama (JP); Kiyohiko Tsutsumi, Suwon-si (KR); Masashi Tsuji, Hwaseong-si (KR); Takao Motoyama, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 250 days.

(21) Appl. No.: 16/729,646

(22) Filed: Dec. 30, 2019

(65) Prior Publication Data
US 2020/0212306 A1     Jul. 2, 2020

(30) Foreign Application Priority Data
Dec. 28, 2018   (JP) .............................. JP2018-248419

(51) Int. Cl.
*H01L 51/00*     (2006.01)
*H01L 51/50*     (2006.01)

(52) U.S. Cl.
CPC ........ *H01L 51/0043* (2013.01); *H01L 51/502* (2013.01); *H01L 51/5056* (2013.01); *H01L 51/5072* (2013.01)

(58) Field of Classification Search
CPC ............... H01L 51/0043; H01L 51/502; H01L 51/5056; H01L 51/5072; H01L 51/0072; H01L 51/5012; C07D 403/04; C07D 403/10
See application file for complete search history.

(56) References Cited

U.S. PATENT DOCUMENTS

| | | | | |
|---|---|---|---|---|
| 2004/0005404 | A1* | 1/2004 | Suzuri | H05B 33/14 427/68 |
| 2007/0262704 | A1* | 11/2007 | Tsai | C07C 211/61 313/503 |
| 2015/0001395 | A1* | 1/2015 | So | H01L 31/101 257/40 |
| 2015/0249215 | A1* | 9/2015 | Ono | H01L 51/0039 438/22 |
| 2016/0240730 | A1 | 8/2016 | Murayama et al. | |

FOREIGN PATENT DOCUMENTS

WO      2015105027 A1     7/2015

* cited by examiner

*Primary Examiner* — Shane Fang
(74) *Attorney, Agent, or Firm* — Cantor Colburn LLP

(57) ABSTRACT

A device having design film thicknesses, to suppress non-uniformity of a light emitting surface, to provide a quantum dot electroluminescence device with good luminous efficiency and light emitting life-span, and to provide an excellent quantum dot electroluminescence device with luminous efficiency and light emitting life-span. A quantum dot electroluminescence device including a hole transport layer, an electron transport layer, and a light emitting layer disposed between the hole transport layer and the electron transport layer, wherein the hole transport layer includes a polymer material and a low molecular material, the light emitting layer includes a quantum dot having a core-shell structure, and a residual film ratio of the hole transport layer is greater than or equal to about 95%.

6 Claims, 1 Drawing Sheet

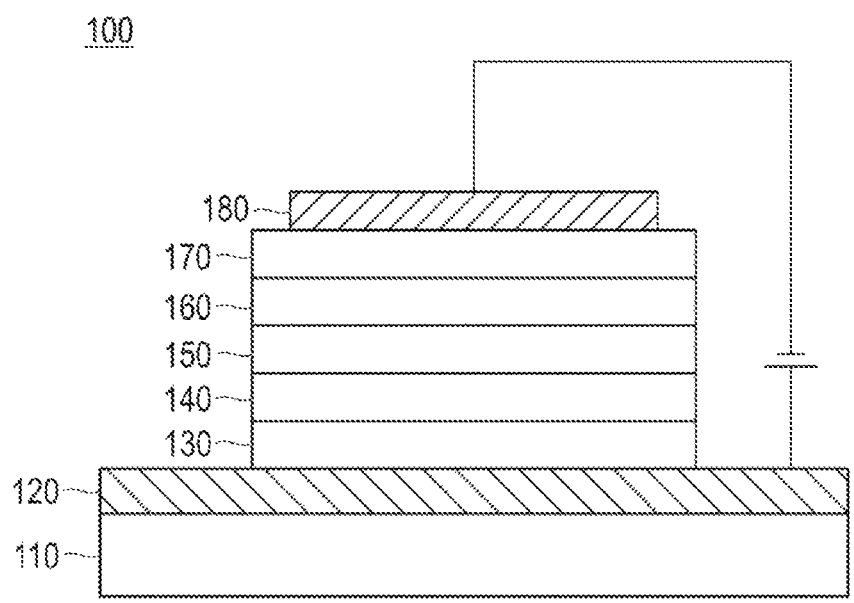

QUANTUM DOT ELECTROLUMINESCENCE DEVICE

CROSS-REFERENCE TO RELATED APPLICATION

This application claims priority to Japanese Patent Application No. 2018-248419 filed on Dec. 28, 2018, in the Japan Patent Office, and Korean Patent Application No. 10-2019-0176495 filed in the Korean Intellectual Property Office on Dec. 27, 2019, and all the benefits accruing therefrom under 35 U.S.C. § 119, the entire content of which is herein incorporated by reference.

BACKGROUND

1. Field

The present disclosure relates to a quantum dot electroluminescence device.

2. Description of the Related Art

Recently, organic electroluminescence devices (hereinafter, also referred to as organic light emitting diodes) using organic materials have attracted attention. Organic light emitting diodes are thin, lightweight, and have low power consumption, and thus are used as display devices, televisions, and lighting devices of portable phones.

However, the organic light emitting diodes have a wide full width at half maximum (FWHM) of the light emitting spectrum, which makes it difficult to cope with the narrowing of the light emitting spectrum, which is required for higher precision and color gamut expansion. As a method of solving this problem, a technique using "a quantum dot", which is an inorganic light emitting material, has attracted attention. A quantum dot electroluminescence device (hereinafter, also referred to as a "quantum dot EL device", a "QLED", etc.) having a light emitting layer including a quantum dot has improved durability since the light emitting material is an inorganic compound, and a relatively long life-span of a device emission may be expected. In addition, since the quantum dot has a feature capable of being dispersed in various solvents, the quantum dot EL device may be manufactured by a wet coating method with an associated low cost and high productivity.

is not sufficient to increase high performance of charge transporting materials disposed near thereto, to optimize a device structure, and to increase high performance of the quantum dot itself. The technical challenge to develop a high performance quantum dot EL device, such as a device with long light emitting life-span, high efficiency, color purity, low driving voltage, and the like remains. Moreover, the development of new charge transporting materials to develop a high performance device structure is likely in itself to be insufficient, and therefore, an effort to develop high performing quantum dots is necessary.

Patent Reference 1 (International publication No. WO2015/105027) discloses a light emitting device having the following structure: among a hole transport layer and the electron transport layer, a carrier transporting material having the same transportability as a transport layer having a small carrier mobility is provided between quantum dots in a form of a dispersion type. More specifically, in examples of this patent publication, poly-TPD (N,N'-diphenyl-N,N'-bis(3-methylphenyl)-[1,1'-biphenyl]-4,4'-diamine) is used as a polymer-based hole transporting material in the hole transport layer. In addition, CBP (4,4'-bis(2,2-carbazole-9-yl) biphenyl) is used as a soluble hole transporting material to facilitate the dispersion of quantum dots in the transport material. In this light emitting device, the CBP is present in the quantum dot layer as a dispersion type, thereby improving hole injection efficiency for the quantum dots, thereby improving the carrier balance. As a result, a decrease in probability of recombination in the hole transport layer reduces the light emission from poly-TPD, and increasing probability of recombination in the quantum dot layer. As a result, since luminous efficiency is improved, luminous efficiency or light emitting color purity is good, and a light emitting device capable of lowering driving voltage is obtained.

SUMMARY

The technical solution described in Patent Reference 1 is that a hole transport layer is dissolved in a solvent and this facilitates forming a light emitting layer with transport material dispersed between quantum dots. However, there is a concern that a non-uniformity or roughness of the light emitting surface may occur, or leakage current may increase from thin portions of a resulting film. In general, a device having a non-uniform light emitting layer, or a device with increasing leakage current at a light emitting surface may have insufficient life-span.

Accordingly, the present disclosure is to provide a quantum dot electroluminescence device capable of constructing devices having a design film thickness, suppressing non-uniform light emitting surfaces, and having good luminous efficiency and light emitting life-span. Our investigations in addressing these areas and technical challenges has provided a QLED having a hole transport layer including a polymer material and a low molecular material and having a residual film ratio of about 95% or more. That is, according to an embodiment, a quantum dot electroluminescence device includes a hole transport layer, an electron transport layer, and a light emitting layer disposed between the hole transport layer and the electron transport layer, wherein the hole transport layer includes a polymer material and a low molecular material, the light emitting layer includes a quantum dot having a core-shell structure, and a residual film ratio of the hole transport layer is greater than or equal to about 95%.

According to the present disclosure, a device having a design film thickness may be constructed, a non-uniformity of a light emitting surface may be suppressed, and a quantum dot electroluminescence device having both good luminous efficiency and light emitting life-span may be provided.

BRIEF DESCRIPTION OF THE DRAWINGS

FIG. 1 is a schematic view showing a quantum dot electroluminescence device according to an embodiment.

DETAILED DESCRIPTION

The present disclosure provides a quantum dot electroluminescence device including a hole transport layer, an electron transport layer, a light emitting layer disposed between the hole transport layer and the electron transport layer, wherein the hole transport layer includes a polymer material and a low molecular material, the light emitting layer includes a quantum dot having a core-shell structure, and a residual film ratio of the hole transport layer is greater than or equal to about 95%.

The quantum dot electroluminescence device of the present disclosure having such a configuration may construct devices according to the design film thickness, suppress non-uniformity of the light emitting surface, and have improved luminous efficiency and light emitting life-span.

In patent reference 1, in order to disperse the carrier transporting material between quantum dots, it is first necessary to dissolve the carrier transport layer with a solvent. As a result, the surface of the carrier transport layer can become relatively non-uniform or exhibit an increase in roughness, and leakage current maybe generated from thin portions of the film. In addition, these two affects may individually contribute to a decrease in the light emitting life-span of the device.

Our work in this area sought to address the above technical challenges and describe herein a quantum dot EL device that includes a hole transport including a polymer material and a low molecular material, and a light emitting layer including a quantum dot having a core-shell structure, and a residual film ratio of the hole transport layer is greater than or equal to about 95%.

The hole transport layer according to the present disclosure includes a polymer material and a low molecular material. Because the low molecular material may enter gaps of the polymer transport material, it becomes a more dense hole transport layer, which is believed to improve hole transport capability of the hole transport layer.

In addition, the light emitting layer according to the present disclosure, when formed on the hole transport layer, can provide a design film thickness with good reproducibility. In addition, because surface smoothness of the hole transport layer may be improved, i.e., reduced, it is possible to suppress the non-uniformity of the light emitting surface, and suppress the occurrence of leakage current. Therefore, the quantum dot electroluminescence device of the present disclosure has improved luminous efficiency and light emitting life-span. The above stated mechanism is based on our work and beliefs, and whether correct or not, such statements are not to diminish the scope of the present disclosure, nor the technical scope of the subject matter claimed.

Hereinafter, embodiments of the present disclosure are described. The present disclosure is not limited only to the following embodiments. In addition, each drawing is exaggerated for better understanding and ease of description, and a dimensional ratio of each constituent element in each drawing may be different from the actual one.

It will be understood that when an element is referred to as being "on" another element, it can be directly on the other element or intervening elements may be present therebetween. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein. As used herein, unless specifically stated, operations such as film formation are actually performed in a glove box, and are carried out under conditions of room temperature (greater than or equal to about 20° C. and less than or equal to about 25° C.) and oxygen concentration of less than or equal to about 1 ppm/moisture concentration of less than or equal to about 1 ppm. Properties, and the like are measured under the conditions of room temperature (greater than or equal to about 20° C. and less than or equal to about 25° C.) and relative wet humidity of greater than or equal to about 40% RH and less than or equal to about 50% RH.

Hereinafter, the polymer material and the low molecular material included in the hole transport layer and the hole transport layer are described. In this specification, the hydrogen atom included in the polymer material and the low molecular material may be a deuterium atom.

Hole Transport Layer

The polymer material that constitutes the hole transport layer of the present disclosure may desirably have a HOMO energy level of greater than or equal to about 5.3 electron volts (eV) and less than or equal to about 6.2 eV. Within the range, holes may be efficiently transported to the light emitting layer, the driving voltage of the device may be reduced, and the luminous efficiency may be improved. The HOMO energy level of the polymer material is desirably greater than or equal to about 5.4 eV and less than or equal to about 5.7 eV.

In this specification, the HOMO energy levels of the polymer material and the low molecular material are values of ionization potentials measured using the photoelectron spectrometer AC-3 (made by Hitachi High-Technologies Corporation) in an air atmosphere.

Polymer Material

The polymer material, which constitutes the hole transport layer of the present disclosure, may desirably have a weight average molecular weight (Mw) of about 10,000 grams per mole (g/mole) to about 1,000,000 g/mole. Within the range, since a residual ratio of a film may be improved and lamination properties may be improved, it is possible to form a stable uniform hole transport layer. In addition, a viscosity of the solution may be lowered, inkjet suitability may be improved, and it is possible to form a uniform hole transport layer stably by a coating method. The polymer material may desirably have a weight average molecular weight (Mw) of greater than or equal to about 30,000 g/mole and less than or equal to about 600,000 g/mole, and more desirably greater than or equal to about 80,000 g/mole and less than or equal to about 450,000 g/mole.

The measurement of the weight average molecular weight (Mw) of the polymer material is not particularly limited and may be applied by using a known method or by appropriately changing the known methods. In the present specification, the weight average molecular weight (Mw) uses a value measured by the following method.

Measurement of Weight Average Molecular Weight (Mw)

The weight average molecular weight (Mw) of the polymer material is measured under the following conditions by SEC (Size Exclusion Chromatography) using polystyrene as a standard material.

(SEC Measurement Condition)
Analysis equipment (SEC): Shimadzu Corporation, Prominence
Column: Polymer Laboratories, PLgel MIXED-B
Column temperature: 40° C.
Flow rate: 1.0 mL/min
Injection amount of sample solution: 20 microliter (μL) (concentration: about 0.05 weight percent)
Eluent: tetrahydrofuran (THF)
Detector (UV-VIS detector): Shimadzu Corporation, SPD-10AV
Standard sample: polystyrene.

The number average molecular weight (Mn) and polydispersity (Mw/Mn) of the polymer material may also be measured by the same method as described above.

When the polymer material is a copolymer composed of two or more structural units, the structure of the polymer material is not particularly limited. The polymer material may be any of random copolymer, alternate copolymer, periodic copolymer, and block copolymer.

The polymer compound of the present embodiment desirably has an amine structure. By including the amine structure, the hole transport property may be improved.

The polymer material of the present embodiment may be synthesized by using a known organic synthesis method. The specific synthesis method of the polymer material of the present embodiment may be easily understood by a person of an ordinary skill in the art referring to the following examples. The monomers used for the polymerization of the polymer material may be synthesized by appropriately combining known synthesis reactions and their structures may be confirmed by known methods (for example, NMR, LC-MS, etc.).

Hereinafter, polymer compounds 1 to 6, which are desirable embodiments of the polymer material, are described. The polymer materials may be used individually or in combination of two or more types.

Polymer Compound 1

According to the preferred embodiment of the present disclosure, the polymer material includes a polymer compound (hereinafter simply referred to also as "polymer compound 1") including a segment of an alternate copolymer of a structural unit represented by Chemical Formula 1. According to a more desirable embodiment, the polymer material is polymer compound 1.

The polymer compound 1 includes a segment of an alternate copolymer of the structural unit represented by Chemical Formula 1.

Chemical Formula 1

  (1)

In Chemical Formula 1, X is a group represented by Chemical Formula 2, Y is a substituted or unsubstituted C6 to C60 divalent aromatic hydrocarbon group, or a substituted or unsubstituted divalent aromatic heterocyclic group having 3 to 60 ring-forming atoms.

Chemical Formula 2

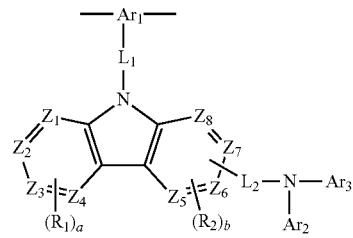

(2)

In Chemical Formula 2, $Ar_1$ is a substituted or unsubstituted C6 to C60 trivalent aromatic hydrocarbon group, or a substituted or unsubstituted trivalent aromatic heterocyclic group having 3 to 60 ring-forming atoms, $Ar_2$ and $Ar_3$ are independently a substituted or unsubstituted C6 to C60 monovalent aromatic hydrocarbon group, or a substituted or unsubstituted monovalent aromatic heterocyclic group having 3 to 60 ring-forming atoms, $L_1$ and $L_2$ are independently a single bond, a substituted or unsubstituted C6 to C60 divalent aromatic hydrocarbon group, or a substituted or unsubstituted divalent aromatic heterocyclic group having 3 to 60 ring-forming atoms, $R_1$ and $R_2$ are independently, a substituted or unsubstituted C1 to C20 alkyl group, a substituted or unsubstituted C1 to C20 alkoxy group, a substituted or unsubstituted C6 to C60 monovalent aromatic hydrocarbon group, or a substituted or unsubstituted monovalent aromatic heterocyclic group having 3 to 60 ring-forming atoms, or $R_1$ and $R_2$ are linked to each other to form a ring, a is an integer of 0 to 4, b is an integer of 0 to 3, and $Z_1$ to $Z_4$ are independently a nitrogen atom, CH or $CR_1$; and $Z_5$ to $Z_8$ are independently a nitrogen atom, CH, or $CR_2$, and where one of $Z_5$ to $Z_8$ is connected to $L_2$.

The polymer compound 1 may include one or more structural units represented by Chemical Formula 1, and may further include one or more other structural units. Herein, the polymer compound 1 includes a segment of the alternate copolymer in which X and Y are alternately bonded, and thus the reproducibility of the preparation is high. In addition, since the polymer compound 1 has no localization of X and Y, homogeneous characteristics may be obtained when used as a thin film.

The polymer compound 1 may include one type of X or two or more types of X as a structural unit.

The polymer compound 1 may improve hole transport properties because X includes a nitrogen-containing aromatic heterocycle (for example, carbazole backbone) substituted with an amino group.

In addition, in the polymer compound 1, X includes an aromatic group (An) in the main chain and an amino group ($N(Ar_2)(Ar_3)$) that binds a nitrogen-containing aromatic heterocycle and a nitrogen-containing aromatic heterocycle in the side chain. For this reason, the polymer compound 1 has a deep HOMO level, and as a result, may achieve high luminous efficiency and a low driving voltage in the quantum dot light emitting device.

In Chemical Formula 2, $Ar_1$ may be a substituted or unsubstituted C6 to C60 trivalent aromatic hydrocarbon group or a substituted or unsubstituted trivalent aromatic heterocyclic group having 3 to 60 ring-forming atoms.

Herein, the aromatic hydrocarbon group is a group derived from an aromatic hydrocarbon compound including at least one aromatic hydrocarbon ring. Herein, when the aromatic hydrocarbon group includes two or more aromatic hydrocarbon rings, the two or more aromatic hydrocarbon rings may be compensated with each other. In addition, the aromatic hydrocarbon group may be substituted with one or more substituents.

Examples of aromatic hydrocarbon compounds may include, for example benzene, pentalene, indene, naphthalene, anthracene, azulene, heptalene, acenaphthalene, phenalene, fluorene, anthraquinone, phenanthrene, biphenyl, triphenylene, pyrene, chrysene, pycene, perylene, pentaphene, pentacene, tetraphene, hexaphene, hexacene, rubicene, trinaphthylene, heptaphene, and pyrantrene, but are not particularly limited thereto.

In addition, the aromatic heterocyclic group is a group derived from an aromatic heterocycle compound including at least one aromatic heterocycle having at least one heteroatom (for example, nitrogen atom (N), oxygen atom (O), phosphorus atom (P), and sulfur atom (S)), and the remaining ring-forming carbon atom (C). In addition, when the aromatic heterocyclic group includes two or more aromatic heterocycles, two or more aromatic heterocycles may be condensed with each other. The aromatic heterocyclic group may be substituted with one or more substituents.

The aromatic heterocycle compounds may include, for example, pyrazoline, imidazoline, oxazoline, thiazoline, triazoline, tetrazoleline, oxadiazoline, pyridine, pyridazinine, pyrimidine, triazine, carbazoline, azacarbazoline, indoline, quinolinine, isoquinoline, benzimidazoline, imidazopyridine, imidazopyrimidine, furan, benzofuran, dibenzofuran, azadibenzofuran, thiophene, benzothiophene, dibenzothiophene, azadibenzothiophene, and the like, but are not particularly limited thereto.

Examples of the trivalent aromatic hydrocarbon groups in $Ar_1$ may be a group obtained by removing any three hydrogen atoms from the hydrogen atoms of the aromatic hydrocarbon compound. In addition, examples of the trivalent aromatic heterocyclic group may be a group obtained by removing any three hydrogen atoms from the hydrogen atoms of the aromatic heterocycle compound.

Among them, from the viewpoint of adjusting the HOMO level, it is desirably that $Ar_1$ may be the following groups.

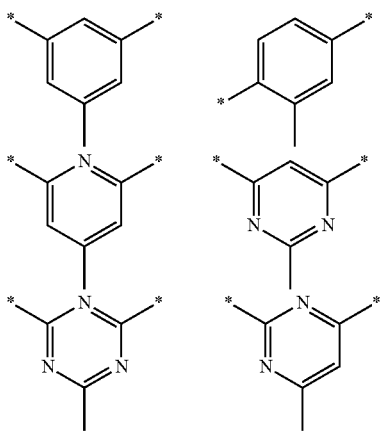

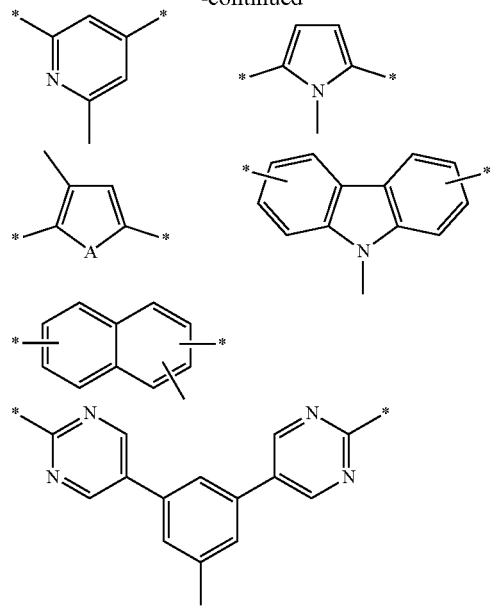

In the chemical formulae, A is —O—, —S—, —Se—, —$NR_1$— ($R_1$ is hydrogen, deuterium atom, a substituted or unsubstituted alkyl group, a substituted or unsubstituted aryl group or a substituted or unsubstituted heteroaryl group) or —$CR_2R_3$— ($R_2$ and $R_3$ are independently a hydrogen atom, a deuterium atom, a substituted or unsubstituted alkyl group, a substituted or unsubstituted aryl group, or a substituted or unsubstituted heteroaryl group), and * is a linking portion.

Substituents when the trivalent aromatic hydrocarbon group or the trivalent aromatic heterocyclic group is substituted may include, for example, a halogen atom, an alkyl group, an alkoxy group, an aromatic hydrocarbon group, and an aromatic heterocyclic group, but are not particularly limited thereto. The above substituents may also be used together.

Herein, examples of the halogen atom may include for example, a fluorine atom, a chlorine atom, a bromine atom, and an iodine atom.

The alkyl group may include, for example, a methyl group, an ethyl group, an n-propyl group, a isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, a isohexyl group, a 1,3-dimethylbutyl group, a 1-isopropylpropyl group, a 1,2-dimethylbutyl group, an n-heptyl group, a 1,4-dimethylpentyl group, 3-ethylpentyl group, a 2-methyl-1-isopropylpropyl group, a 1-ethyl-3-methylbutyl group, an n-octyl group, a 2-ethylhexyl group, a 3-methyl-1-isopropylbutyl group, a 2-methyl-1-isopropylbutyl group, a 1-tert-butyl-2-methylpropyl group, an n-nonyl group, a 3,5,5-trimethylhexyl group, an n-decyl group, a isodecyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, an n-eicosyl group, an n-heneicosyl group, an n-docosyl group, an n-tricosyl group, and an n-tetracosyl group.

The carbon number of the alkyl group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkyl group. This is because the ligand of the quantum dot and the alkyl group present in the hole transport layer may interact with each other, thereby improving effects such as hole injectability.

In addition, when the solvent that disperses the quantum dot is a long-chain hydrocarbon-based solvent, it is desirable that the number of the alkyl group in the polymer compound is small in terms of securing a residual film ratio of the hole transport layer.

Therefore, as the substituent, hydrogen, or a linear or branched C1 to C18 alkyl group is more desirable. These substituents may be appropriately selected according to the used quantum dot or the solvent that disperses the quantum dot.

The alkoxy group may include, for example, a methoxy group, an ethoxy group, a propoxy group, an isopropoxy group, a butoxy group, a pentyloxy group, a hexyloxy group, a heptyloxy group, an octyloxy group, a nonyloxy group, a decyloxy group, a undecyloxy group, a dodecyloxy group, a tridecyloxy group, a tetradecyloxy group, a pentadecyloxy group, a hexadecyloxy group, a heptadecyloxy group, an octadecyloxy group, a 2-ethylhexyloxy group, or a 3-ethylpentyloxy group.

The carbon number of the alkoxy group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkoxy group. This is because the ligand of the quantum dot and the alkoxy group present in the hole transport layer may interact with each other, thereby improving effects such as hole injectability.

In addition, when the solvent that disperses the quantum dot is a long-chain hydrocarbon-based solvent, it is desirable that the number of the alkoxy group in the polymer compound is small in terms of securing a residual film ratio of the hole transport layer.

Therefore, as the alkoxy group, a linear or branched C1 to C18 alkoxy group is more desirable. These alkoxy groups may be appropriately selected according to the used quantum dot or the solvent that disperses the quantum dot.

Examples of the aromatic heterocyclic group (or aromatic hydrocarbon group) which may be introduced into the trivalent aromatic hydrocarbon group (or trivalent aromatic heterocyclic group) may include, for example, a group obtained by removing any one hydrogen atom from the aromatic heterocycle (or aromatic hydrocarbon).

In Chemical Formula 2, $Ar_2$ and $Ar_3$ are independently a substituted or unsubstituted C6 to C60 monovalent aromatic hydrocarbon group, or a substituted or unsubstituted monovalent aromatic heterocyclic group having 3 to 60 ring-forming atoms.

Herein, the monovalent aromatic hydrocarbon group and the monovalent aromatic heterocyclic group are the same as $Ar_1$ in Chemical Formula 2, except that the trivalent aromatic heterocyclic group and the trivalent aromatic heterocyclic group are changed into monovalent groups, and thus the descriptions thereof are omitted. In addition, when the monovalent aromatic hydrocarbon group or the monovalent aromatic heterocyclic group is substituted, the substituent is the same as the substituent of $Ar_1$ in Chemical Formula 2, and thus the descriptions thereof are omitted.

From the viewpoint of raising the HOMO level, hole transport property, and hole injection property of the polymer compound 1, the monovalent aromatic hydrocarbon group may desirably be a phenyl group, a biphenyl group, a fluorenyl group, a naphthyl group, an anthryl group, a phenanthryl group, a naphthacenyl group, a pyrenyl group, a terphenyl group, a tolyl group, a tert-butylphenyl group, or a (phenylpropyl)phenyl group, and more desirably a phenyl group, a biphenyl group, a fluorenyl group, a naphthyl group, an anthryl group, a terphenyl group, or a tolyl group.

In addition, from the viewpoint of raising the HOMO level, hole transport property, and hole injection property of the polymer compound 1, the monovalent aromatic heterocyclic group may desirably be a pyridyl group, a bipyridyl group, a pyrrolyl group, a pyrazinyl group, a pyridinyl group, a pyridmidyl group, an indolyl group, a puryl group, a benzofuranyl group, a dibenzofuranyl group, a quinolyl group, a quinoxanyl group, a carbazolyl group, a phenantridinyl group, an acridinyl group, a phenazinyl group, a phenothiazinyl group, a phenoxazinyl group, an oxazolyl group, an oxathiazolyl group, a furazanyl group, a thienyl group, a thiophenyl group, an isothiophenyl group, or a dibenzothiophenyl group, and more desirably a pyridyl group, a pyrrolyl group, a carbazolyl group, a dibenzofuranyl group, a dibenzothiophenyl group, or a bipyridyl group.

In addition, from the viewpoint of raising the HOMO level, hole transport property, hole injection property, solubility, and coating property of the polymer compound 1, when the monovalent aromatic hydrocarbon group or the monovalent aromatic heterocyclic group is substituted, the substituent may desirably be a C1 to C 18 alkyl group, a C1 to C18 alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, an amino group substituted with the substituent, a silyl group, a substituted silyl group, a halogen atom, an acyl group, an acyloxy group, an imine moiety, an amide group, an acidimide group, a monovalent heterocyclic group, a carboxyl group, a carboxyl group substituted with the substituent, a cyano group, or a nitro group.

Examples of $Ar_2$ and $Ar_3$ may be as follows.

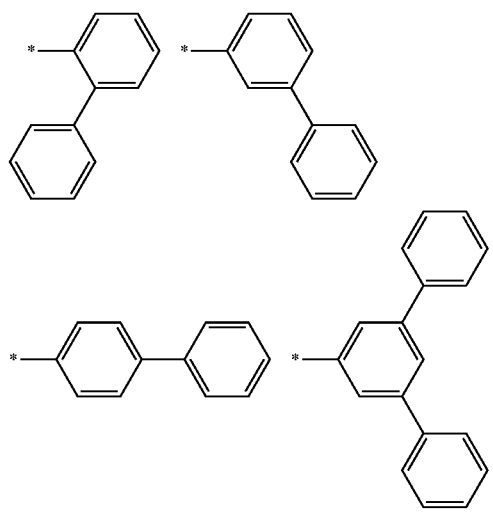

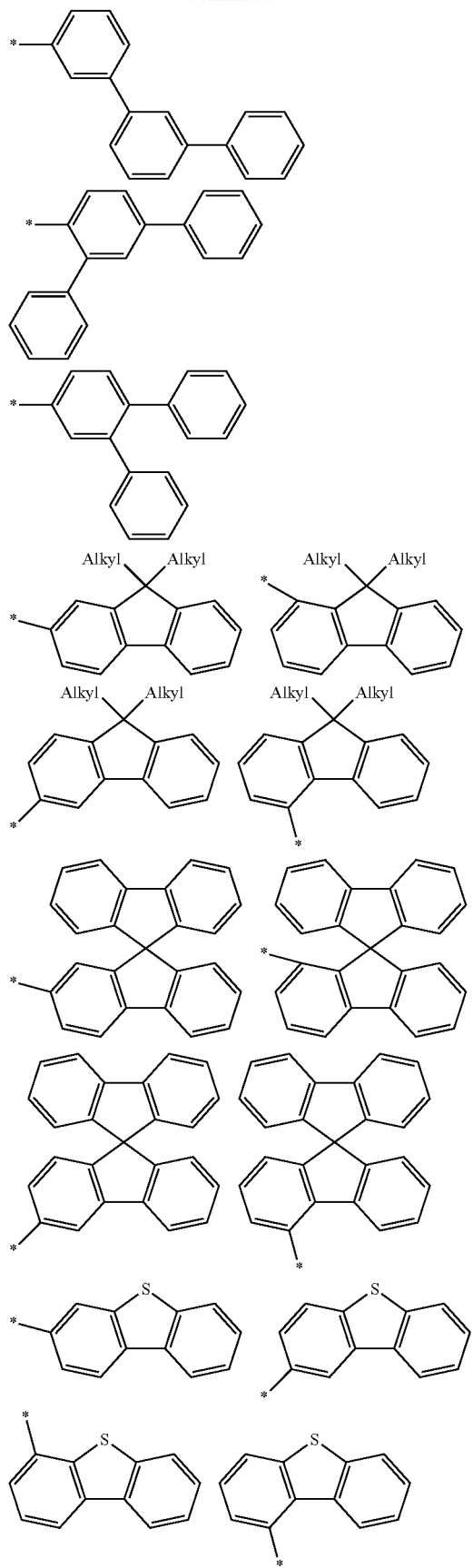
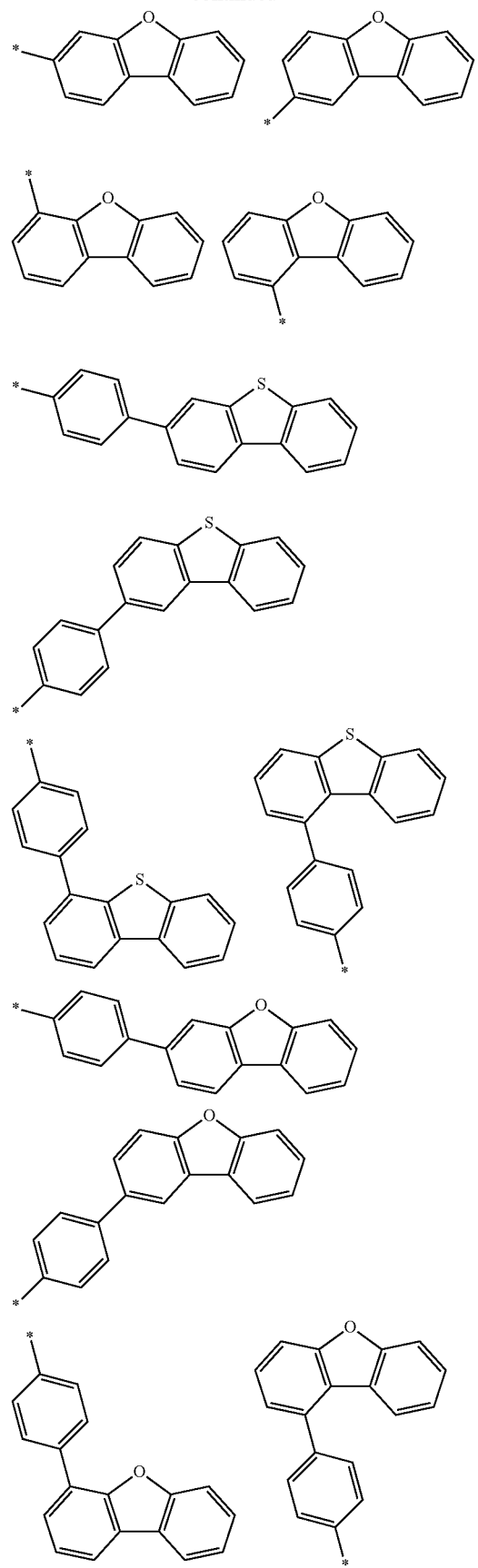

-continued

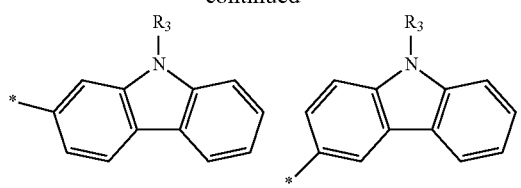
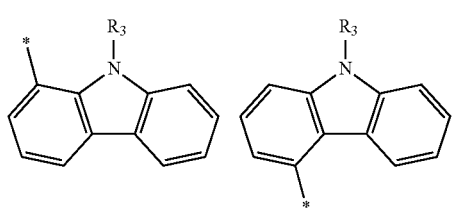
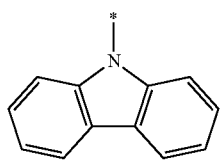
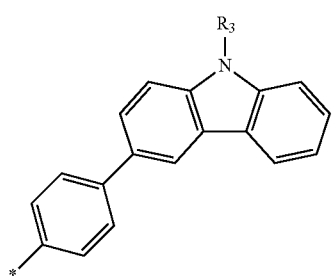
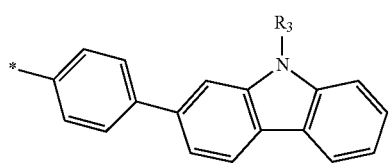
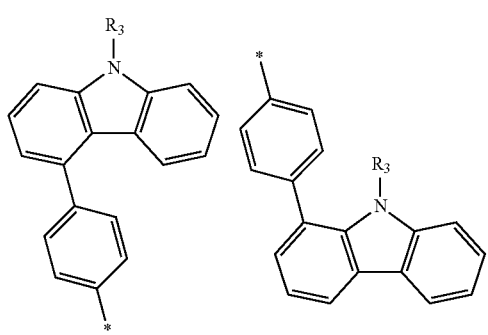
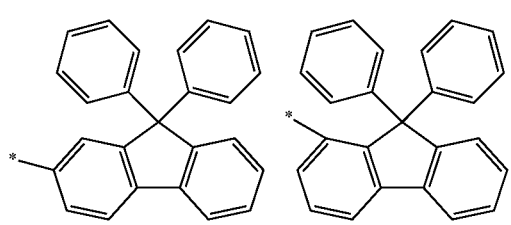

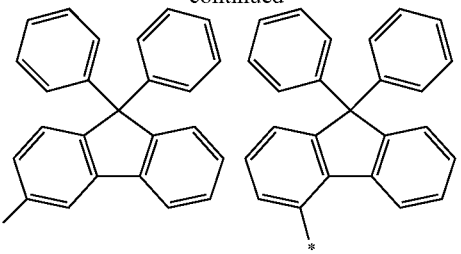

In the chemical formulae, $R_3$ is independently a substituted or unsubstituted C1 to C20 alkyl group, a substituted or unsubstituted C1 to C20 alkoxy group, a substituted or unsubstituted C6 to C60 monovalent aromatic hydrocarbon group, or a substituted or unsubstituted monovalent aromatic heterocyclic group having 3 to 60 ring-forming atoms, * is a linking portion, and "Alkyl" indicates substitution or unsubstitution with an alkyl group.

The carbon number of the alkyl group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkyl group. This is because the ligand of the quantum dot and the alkyl group present in the hole transport layer may interact with each other, thereby improving effects such as hole injectability.

In addition, when the solvent that disperses the quantum dot is a long-chain hydrocarbon-based solvent, it is desirable that the number of the alkyl group in the polymer compound is small in terms of securing a residual film ratio of the hole transport layer.

Therefore, as the alkyl group, a linear or branched C1 to C18 alkyl group is more desirable. The alkyl group may be appropriately selected according to the used quantum dot or the solvent that disperses the quantum dot.

The carbon number of the alkoxy group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkoxy group. This is because the ligand of the quantum dot and the alkoxy group present in the hole transport layer may interact with each other, thereby improving effects such as hole injectability.

In addition, when the solvent that disperses the quantum dot is a long-chain hydrocarbon-based solvent, it is desirable that the number of the alkoxy group in the polymer compound is small in terms of securing a residual film ratio of the hole transport layer.

Therefore, as the alkoxy group, a linear or branched C1 to C18 alkoxy group is more desirable. These alkoxy groups may be appropriately selected according to the used quantum dot or the solvent that disperses the quantum dot.

In Chemical Formula 2, $L_1$ and $L_2$ are independently a single bond, a substituted or unsubstituted C6 to C60 divalent aromatic hydrocarbon group, or a substituted or unsubstituted divalent aromatic heterocyclic group having 3 to 60 ring-forming atoms.

Herein, the divalent aromatic hydrocarbon group and the divalent aromatic heterocyclic group are the same as $Ar_1$ in Chemical Formula 2, except that the trivalent aromatic heterocyclic group and the trivalent aromatic heterocyclic group are changed divalent groups, and thus the descriptions thereof are omitted. In addition, when the divalent aromatic hydrocarbon group or the divalent aromatic heterocyclic group is substituted, the substituent is the same as the substituent of $Ar_1$ in Chemical Formula 2, and thus the descriptions thereof are omitted.

From the viewpoint of raising the HOMO level, hole transport property, and hole injection property of the polymer compound 1, the divalent aromatic hydrocarbon group may desirably be a phenylene group, a biphenylene group, a fluorenylene group, a naphthylene group, an anthrylene group, a phenanthrylene group, a naphthacenylene group, a pyrenylene group, a terphenylene group, a tolylene group, a tert-butylphenylene group, or a (phenylpropyl)phenylene group, and more desirably a phenylene group, a biphenylene group, a fluorenylene group, a naphthylene group, an anthrylene group, a terphenylene group, or a tolylene group.

In addition, from the viewpoint of raising the HOMO level, hole transport property, and hole injection property of the polymer compound 1, the divalent aromatic heterocyclic group may desirably be a pyridyl group, a bipyridyl group, a pyrrolyl group, a pyrazinyl group, a pyridinyl group, a pyridmidyl group, an indolyl group, a puryl group, a benzofuranyl group, a dibenzofuranyl group, a quinolyl group, a quinoxanyl group, a carbazolyl group, a phenantridinyl group, an acridinyl group, a phenazinyl group, a phenothiazinyl, a phenoxazinyl group, an oxazolyl group, an oxathiazolyl group, a furazanyl group, a thienyl group, a thiophenyl group, an isothiophenyl group, or a dibenzothiophenyl group, and more desirably a pyridyl group, a pyrrolyl group, a carbazolyl group, a dibenzofuranyl group, a dibenzothiophenyl group, or bipyridyl group.

In addition, from the viewpoint of raising the HOMO level, hole transport property, hole injection property, solubility, and coating property of the polymer compound 1, when the divalent aromatic hydrocarbon group or the divalent aromatic heterocyclic group is substituted, the substituent may desirably be a C1 to C50 alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, an amino group substituted with the substituent, an silyl group, an substituted silyl group, an a halogen atom, an acyl group, an acyloxy group, an imine moiety, an amide group, an acidimide group, an monovalent heterocyclic group, a carboxyl group, a carboxyl group substituted with the substituent, an a cyano group, or an nitro group, and more desirably a C1 to C50 alkyl group.

The carbon number of the alkyl group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkyl group. This is because the ligand of the quantum dot and the alkyl group present in the hole transport layer may interact with each other, thereby improving effects such as hole injectability.

In addition, when the solvent that disperses the quantum dot is a long-chain hydrocarbon-based solvent, it is desirable that the number of the alkyl group in the polymer compound is small in terms of securing a residual film ratio of the hole transport layer.

Therefore, as the alkyl group, a linear or branched C1 to C18 alkyl group is more desirable. The alkyl group may be appropriately selected according to the used quantum dot or the solvent that disperses the quantum dot.

The carbon number of the alkoxy group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkoxy group. This is because the ligand of the quantum dot and the alkoxy group present in the hole transport layer may interact with each other, thereby improving effects such as hole injectability.

In addition, when the solvent that disperses the quantum dot is a long-chain hydrocarbon-based solvent, it is desirable that the number of the alkoxy group in the polymer compound is small in terms of securing a residual film ratio of the hole transport layer.

Therefore, as the alkoxy group, a linear or branched C1 to C18 alkoxy group is more desirable. These alkoxy groups may be appropriately selected according to the used quantum dot or the solvent that disperses the quantum dot.

Among these, $L_1$ and $L_2$ are independently desirably a single bond, a phenylene group, a biphenylene group, a fluorenylene group, a naphthylene group, an anthracenylene group, a phenanthrylene group, a naphthacenylene group, a pyrenylene group, a terphenylene group, a tolylene group, a tert-butylphenylene group, or a (phenylpropyl) phenylene group, and more desirably a single bond, a phenylene group, a biphenylene group, a terphenylene group, or a fluorenylene group.

In Chemical Formula 2, $R_1$ and $R_2$ are independently a substituted or unsubstituted C1 to C20 alkyl group, a substituted or unsubstituted C1 to C20 alkoxy group, a substituted or unsubstituted C6 to C60 monovalent aromatic hydrocarbon group, or a substituted or unsubstituted monovalent aromatic heterocyclic group having 3 to 60 ring-forming atoms. Optionally, two adjacent $R_1$ and/or two adjacent $R_2$ may be linked to each other to form a ring. $R_1$ and $R_2$ may be the same or different.

In addition, when a is greater than or equal to 2 and less than or equal to 4, each $R_1$ may be the same and may be different. In the same way, when b is 2 or 3, each $R_2$ may be the same and may be different.

Herein, the C1 to C20 alkyl group may include a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isopropylpropyl group, a 1-ethyl-3-methylbutyl group, an n-octyl group, a 2-ethylhexyl group, a 3-methyl-1-isopropylbutyl group, a 2-methyl-1-isopropylbutyl group, a 1-tert-butyl-2-methylpropyl group, an n-nonyl group, a 3,5,5-trimethylhexyl group, an n-decyl group, an isodecyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, an n-eicosyl group, and the like, but is not particularly limited thereto.

The carbon number of the alkyl group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkyl group. This is because the ligand of the quantum dot and the alkyl group present in the hole transport layer may interact with each other, thereby improving effects such as hole injectability.

In addition, when the solvent that disperses the quantum dot is a long-chain hydrocarbon-based solvent, it is desirable that the number of the alkyl group in the polymer compound is small in terms of securing a residual film ratio of the hole transport layer.

Therefore, as the alkyl group, a linear or branched C1 to C18 alkyl group is more desirable. The alkyl group may be appropriately selected according to the used quantum dot or the solvent that disperses the quantum dot.

Herein, the C1 to C20 alkoxy group may include a methoxy group, an ethoxy group, an n-propoxy group, a isopropoxy group, an n-butoxy group, a isobutoxy group, a sec-butoxy group, a tert-butoxy group, an n-pentoxy group, an isopentoxy group, a tert-pentoxy group, a neo pentoxy group, a 1,2-dimethylpropoxy group, an n-hexyloxy group, an isohexyloxy group, a 1,3-dimethylbutoxy group, a 1-isopropyl propoxy group, a 1,2-dimethylbutoxy group, an n-heptyloxy group, a 1,4-dimethylpentyloxy group, a 3-ethylpentyloxy group, a 2-methyl-1-isopropyl propoxy group, a 1-ethyl methylbutoxy group, an n-octyloxy group, a 2-ethylhexyloxy group, a 3-methyl-1-isopropyl butoxy group, a 2-methyl-1-isopropoxy group, a 1-tert-butyl-2-methyl-propoxy group, an n-nonyloxy group, a 3,5,5-trimethylhexyloxy group, an n-decyloxy group, a isodecyloxy group, an n-undecyloxy group, a 1-methyldecyloxy group, an n-dodecyloxy group, an n-tridecyloxy group, an n-tetradecyloxy group, an n-pentadecyloxy group, an n-hexadecyloxy group, an n-heptadecyloxy group, an n-octadecyloxy group, an n-eicosyloxy group, and the like, but is not particularly limited thereto.

The carbon number of the alkoxy group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkoxy group. This is because the ligand of the quantum dot and the alkoxy group present in the hole transport layer may interact with each other, thereby improving effects such as hole injectability.

In addition, when the solvent that disperses the quantum dot is a long-chain hydrocarbon-based solvent, it is desirable that the number of the alkoxy group in the polymer compound is small in terms of securing a residual film ratio of the hole transport layer.

Therefore, as the alkoxy group, a linear or branched C1 to C18 alkoxy group is more desirable. These alkoxy groups may be appropriately selected according to the used quantum dot or the solvent that disperses the quantum dot.

Herein, the C6 to C60 monovalent aromatic hydrocarbon group and the monovalent aromatic heterocyclic group having 3 to 60 ring-forming atoms are the same as $Ar_1$ in Chemical Formula 2, except that the trivalent aromatic heterocyclic group and trivalent aromatic heterocyclic group are changed into monovalent groups, and thus the descriptions thereof are omitted. In addition, when the C1 to C20 alkyl group, the C1 to C20 alkoxy group, the C6 to C60 monovalent aromatic hydrocarbon group, or the monovalent aromatic heterocyclic group having 3 to 60 ring-forming atoms is substituted, the substituent is the same as the substituent of $Ar_1$ in Chemical Formula 2, and thus the descriptions thereof are omitted.

Of these, $R_1$ and $R_2$ desirably are phenyl groups or fluorenyl groups.

a is the number of $R_1$ in Chemical Formula 2 bound to the nitrogen-containing aromatic heterocycle positioned in the side chain, but may be an integer ranging from 0 to 4.

b is the number of $R_2$ in Chemical Formula 2 bound to the nitrogen-containing aromatic heterocycle positioned in the side chain, but is an integer of 0 to 3, and desirably an integer of 0 to 2. More desirably it may be 0 or 1, particularly 0.

In Chemical Formula 2, $Z_1$ to $Z_8$ of the nitrogen-containing aromatic heterocycle may independently be a nitrogen atom or CH.

The nitrogen-containing aromatic heterocycle desirably has a structure shown below.

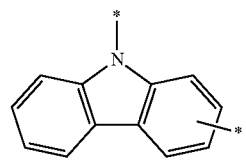

In the above chemical formula, * is a linking portion.

From the viewpoint of further improving the HOMO level and hole transport capability and reducing a driving voltage, X may desirably be structural units represented by Chemical Formula 2-1 to Chemical Formula 2-6. Herein, a plurality of X's in the segment of the alternate copolymer of the structural unit represented by Chemical Formula 1 may be the same or different.

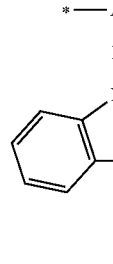

(2-1)

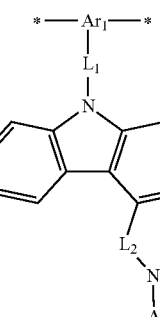

(2-2)

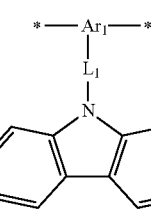

(2-3)

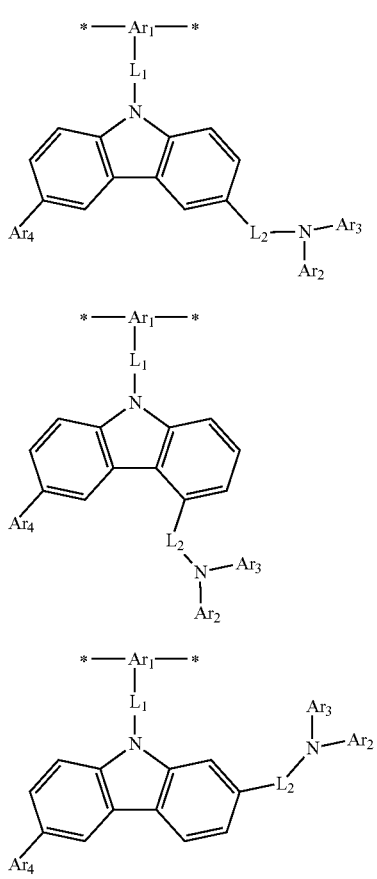
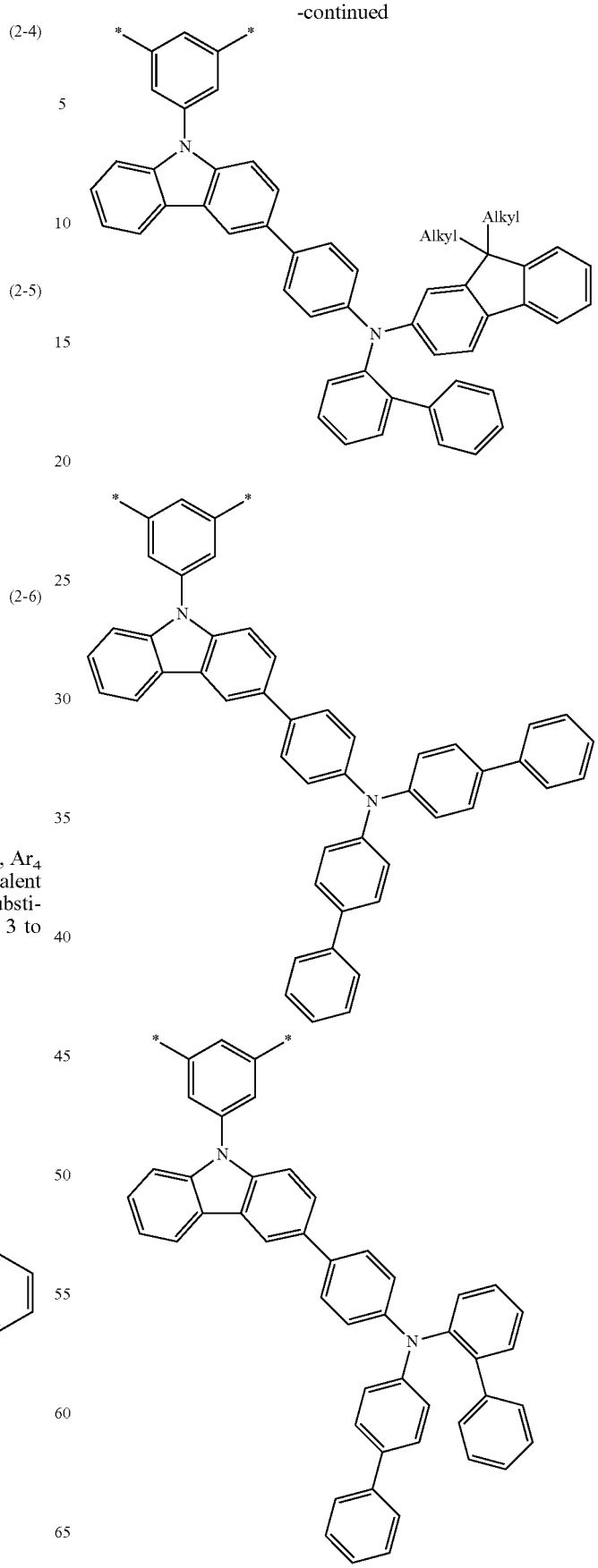
In Chemical Formula 2-1 to Chemical Formula 2-6, $Ar_4$ is a substituted or unsubstituted C6 to C60 monovalent aromatic hydrocarbon group, or a substituted or unsubstituted monovalent aromatic heterocyclic group having 3 to 60 ring-forming atoms.
The specific example of X is shown below.
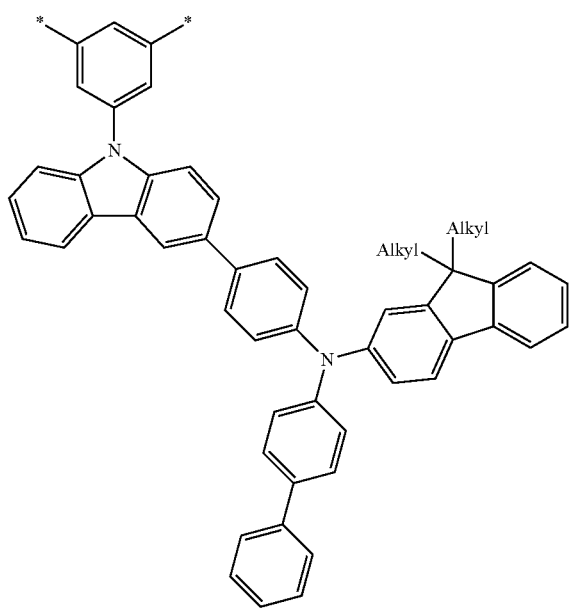

-continued
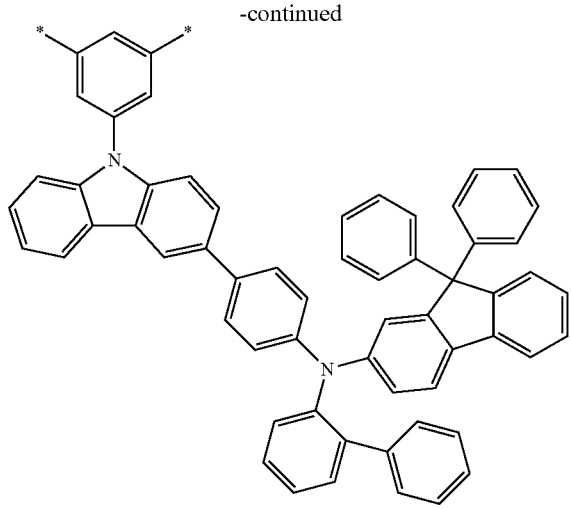
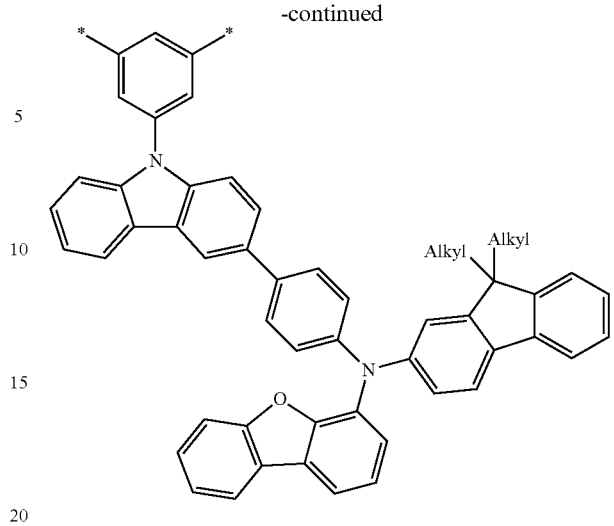
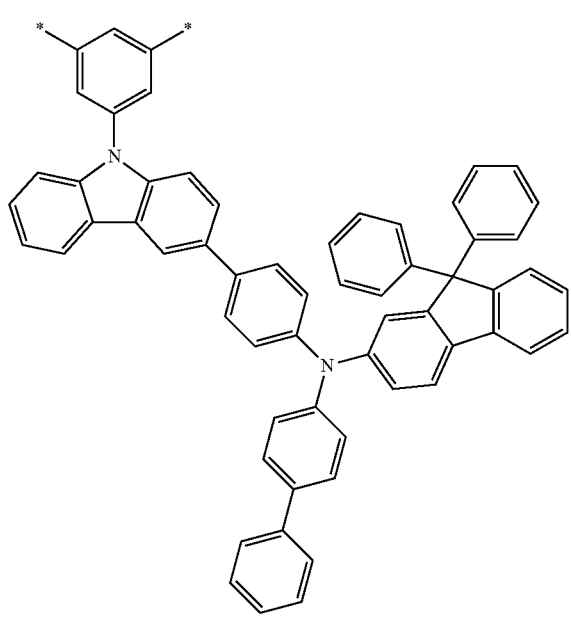
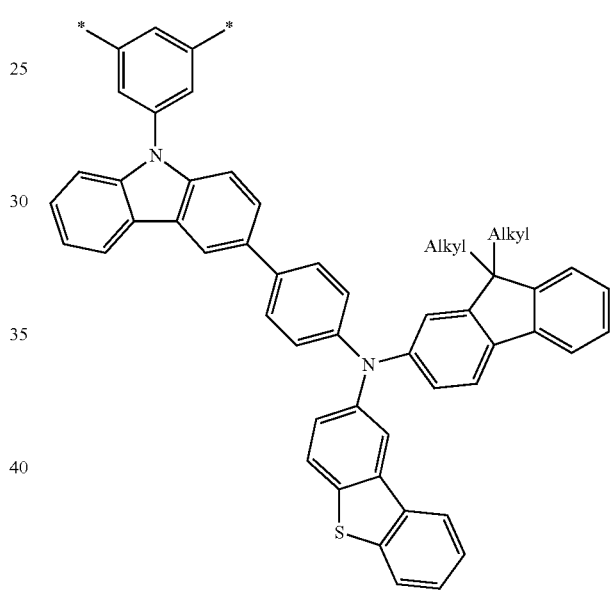
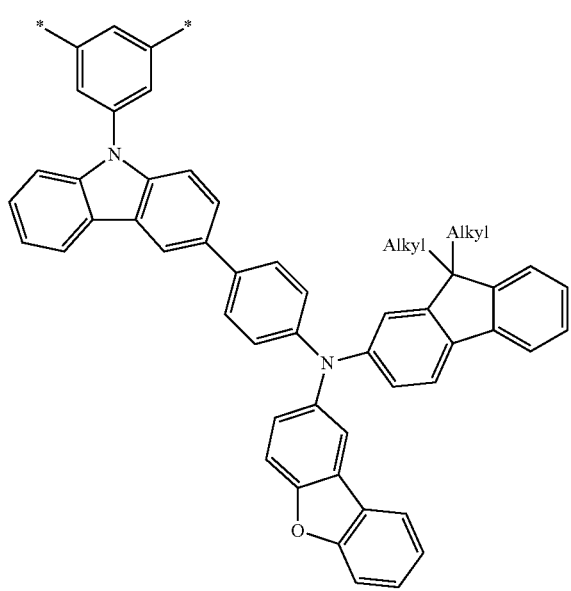
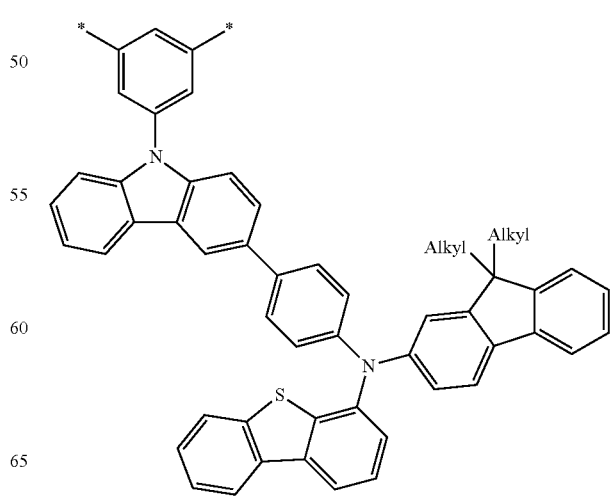

23
-continued
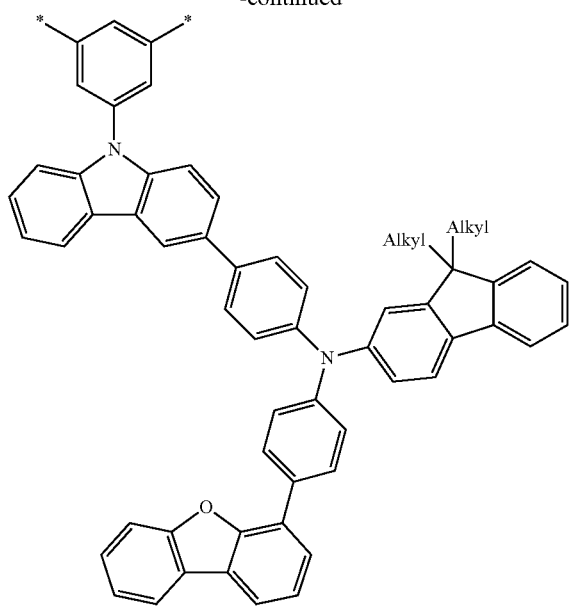
24
-continued
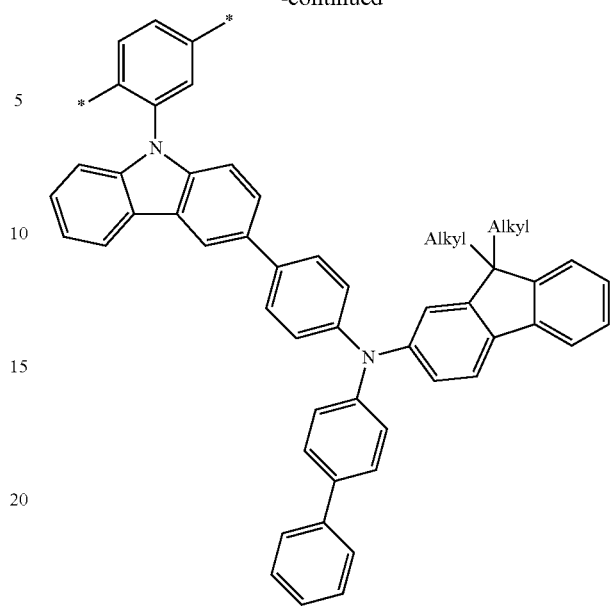
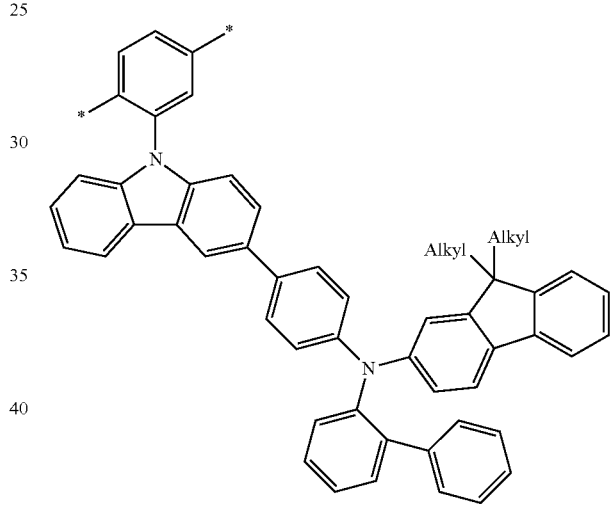
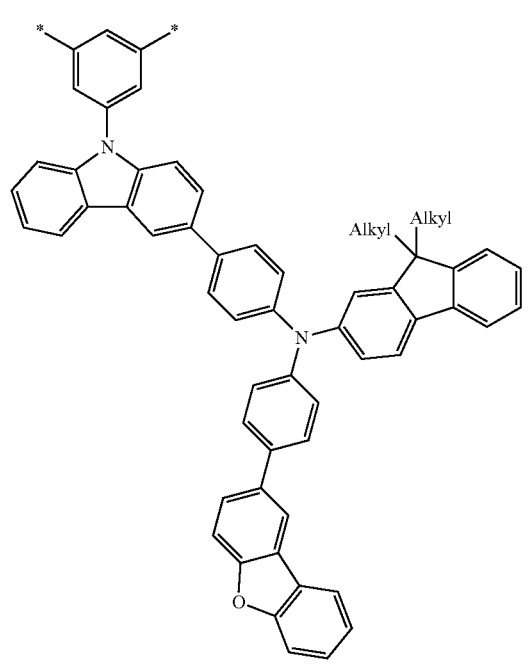
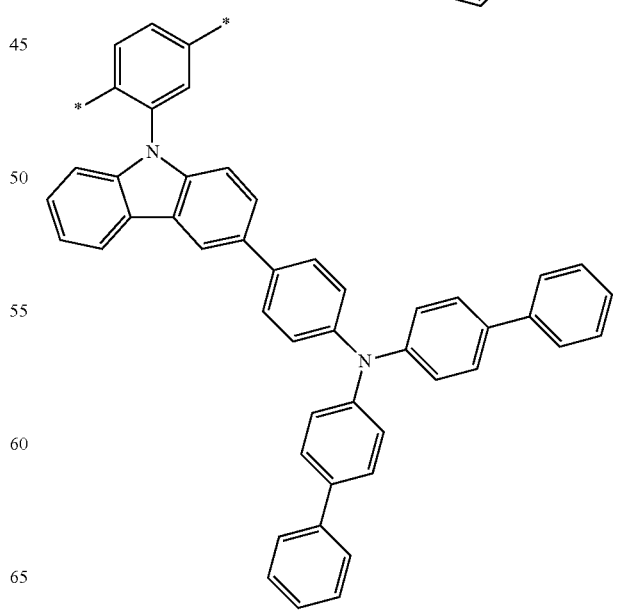

25
-continued
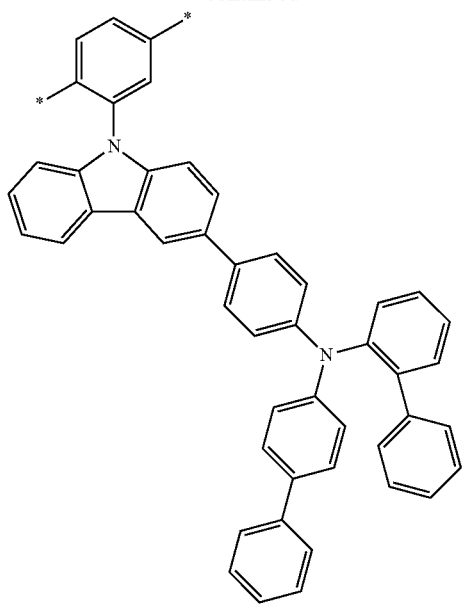
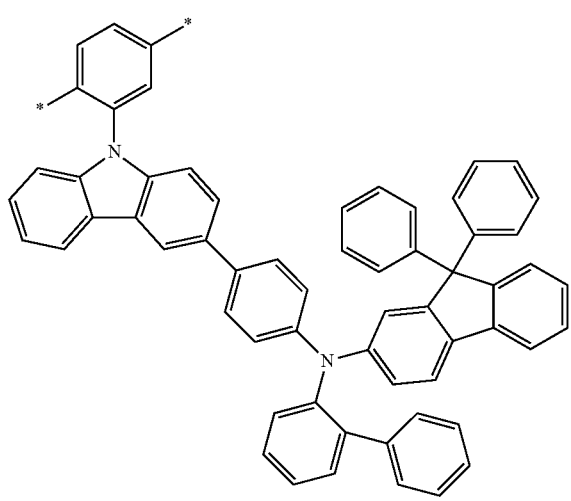
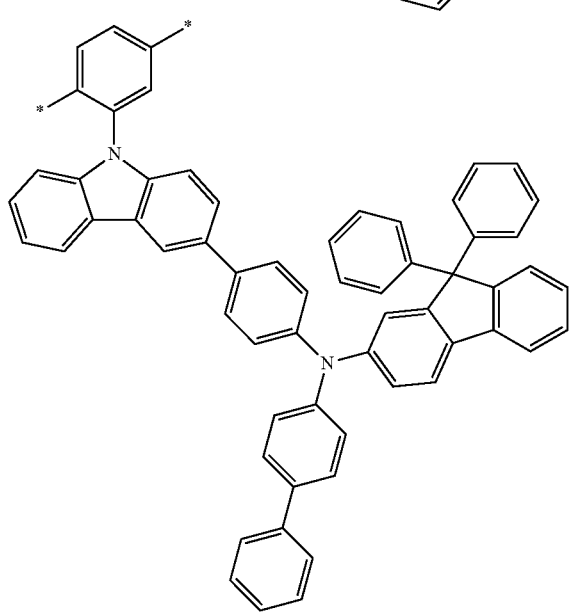
26
-continued
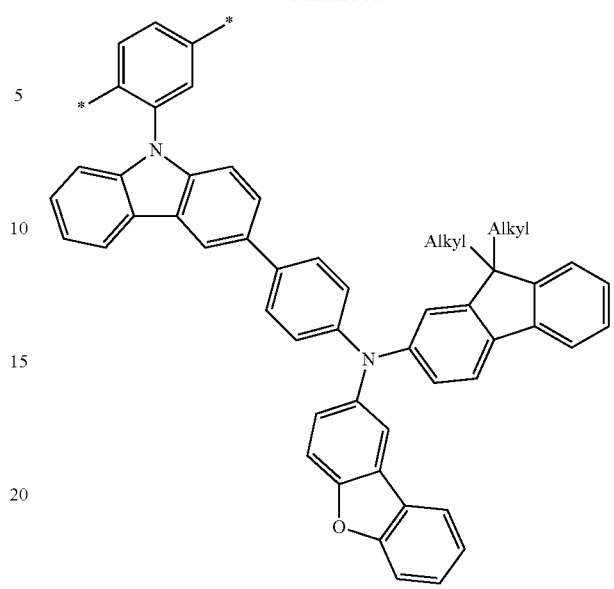
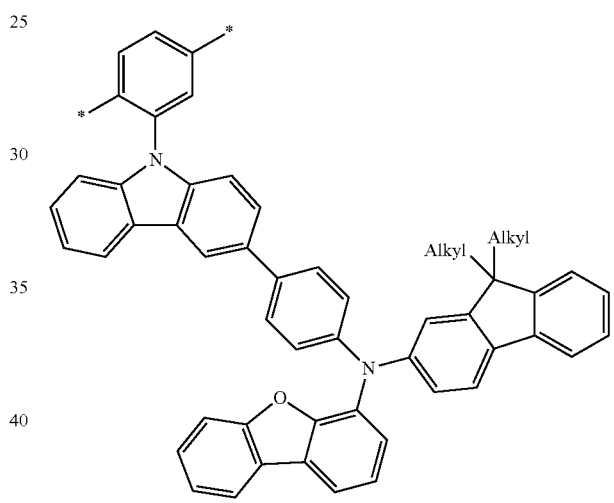
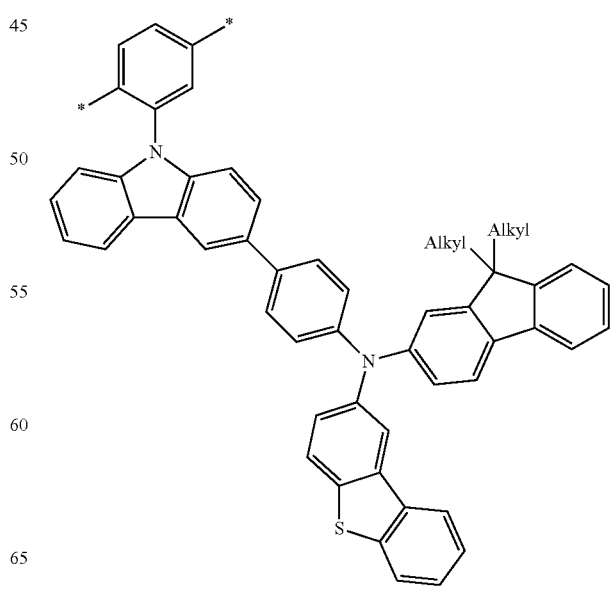

-continued
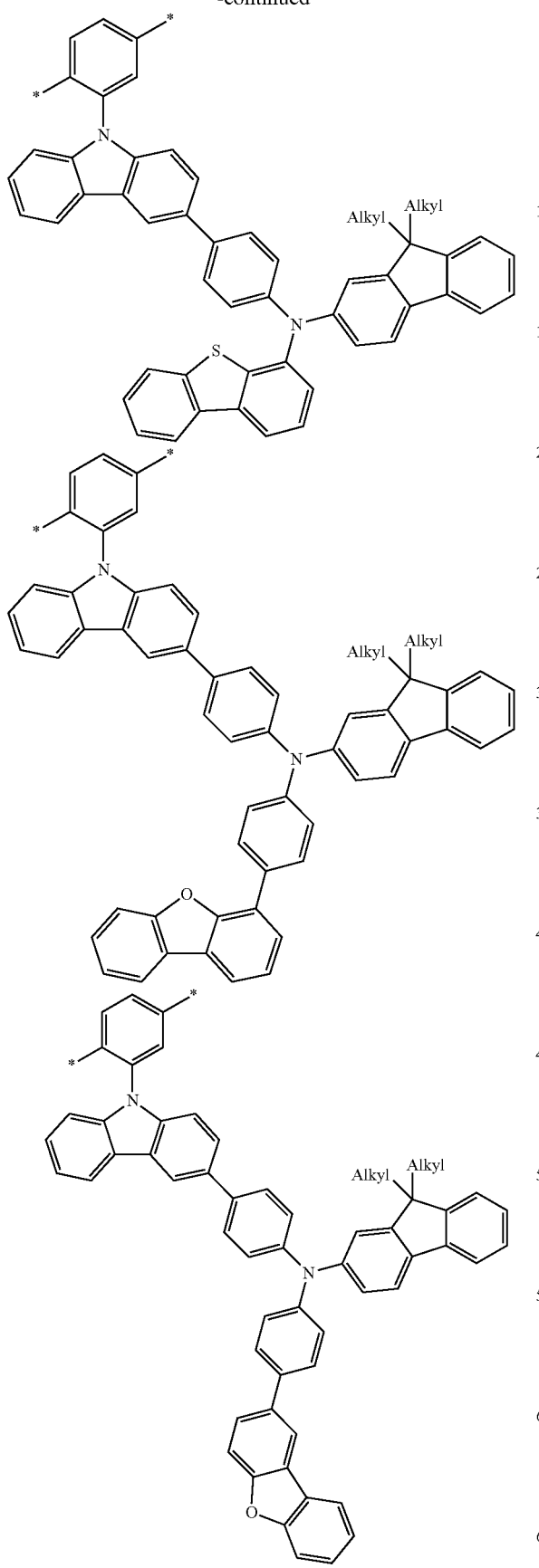
-continued
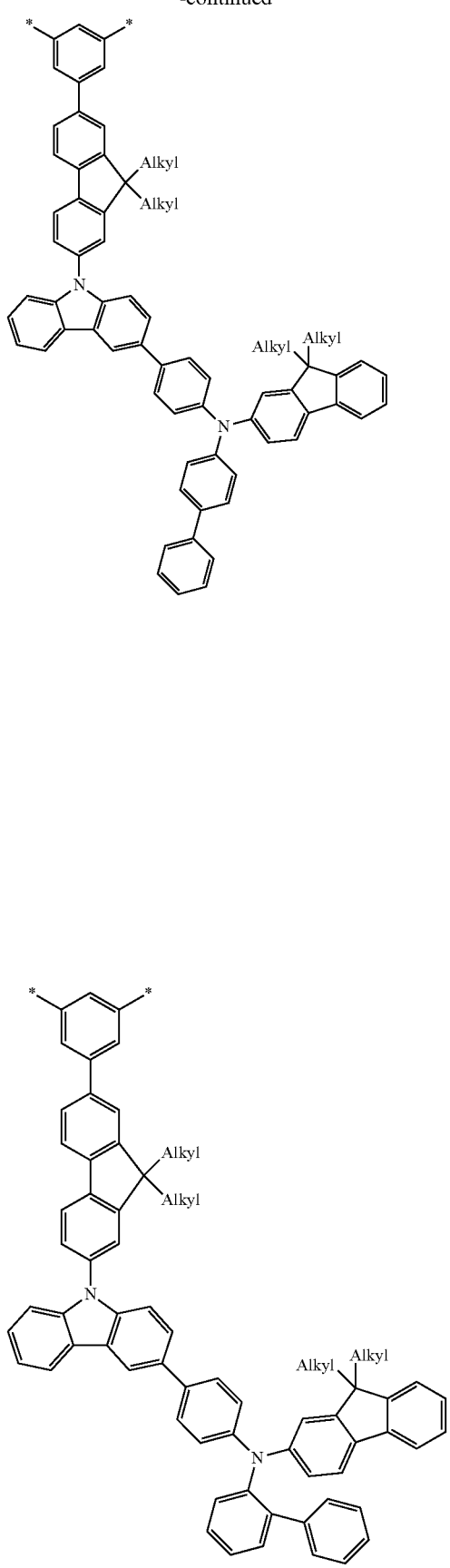

29
-continued
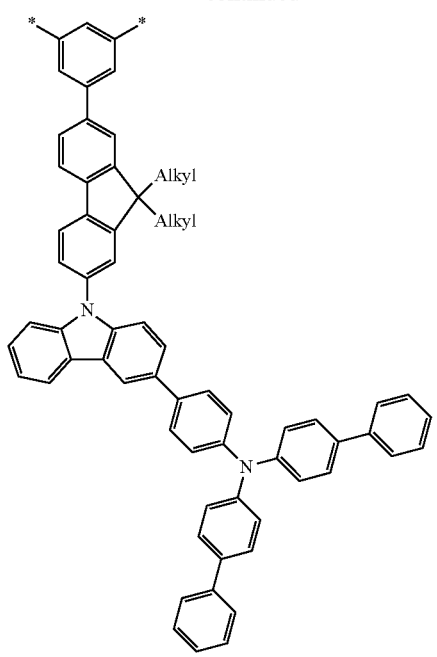
30
-continued
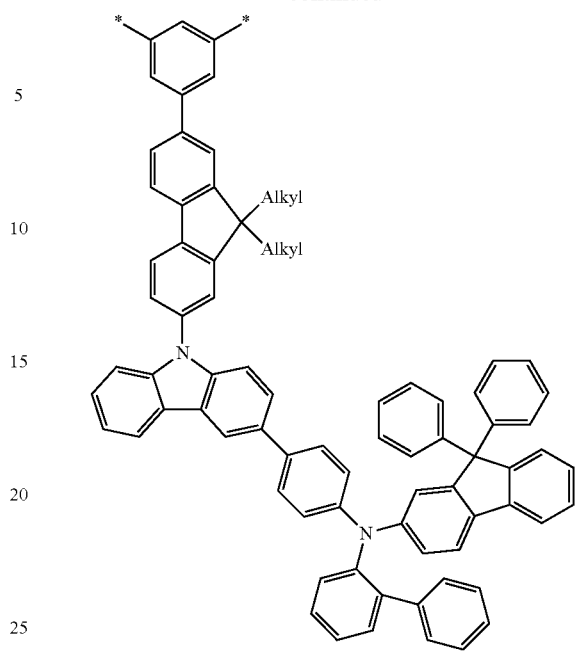
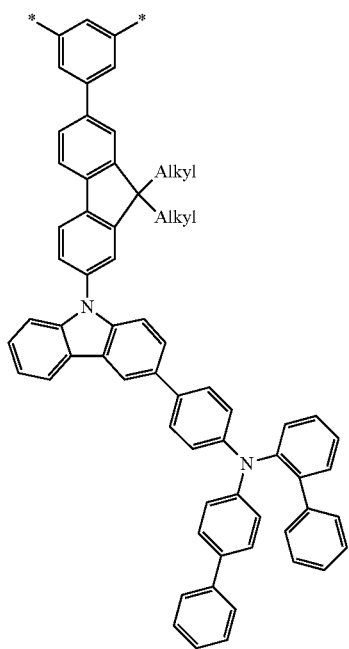
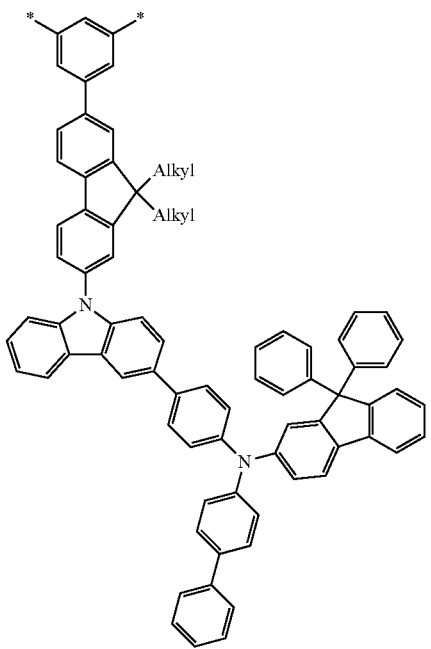

31
-continued
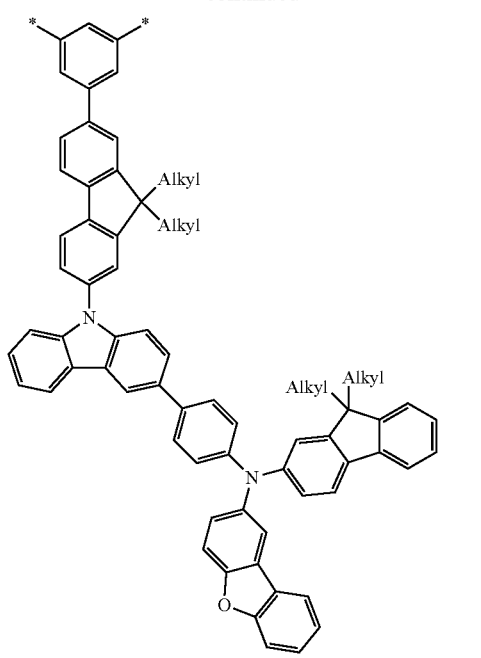
32
-continued
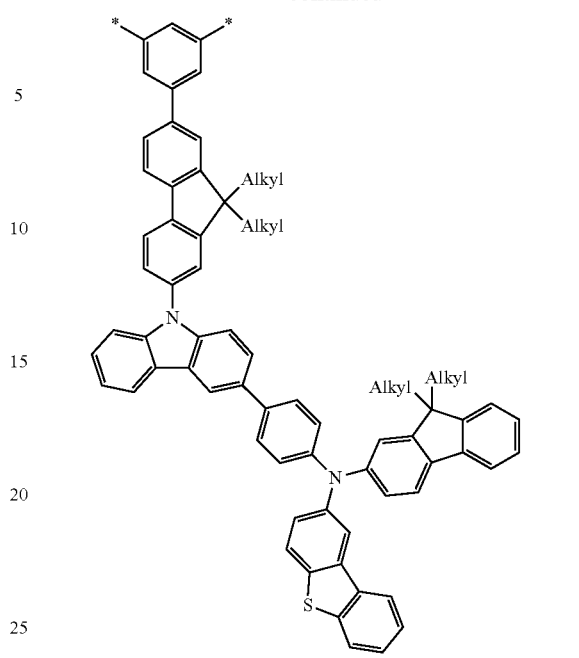
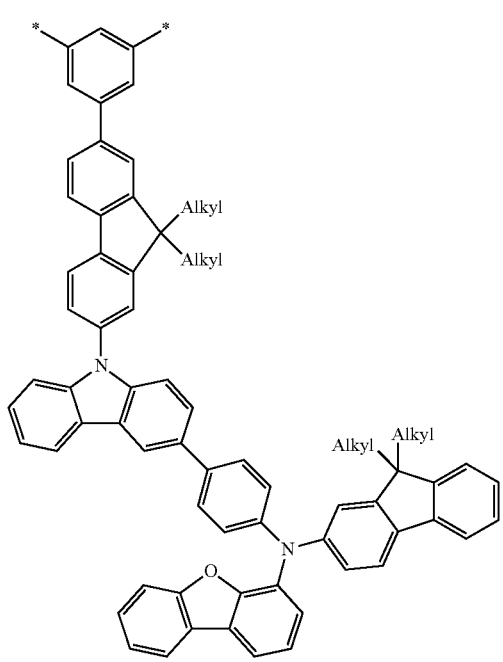
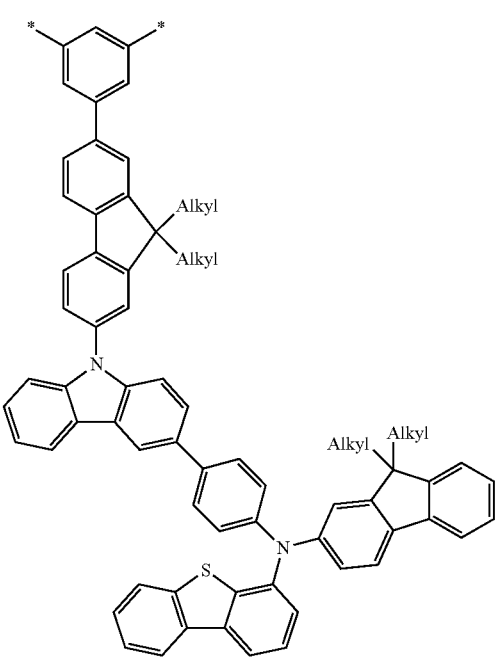

33
-continued
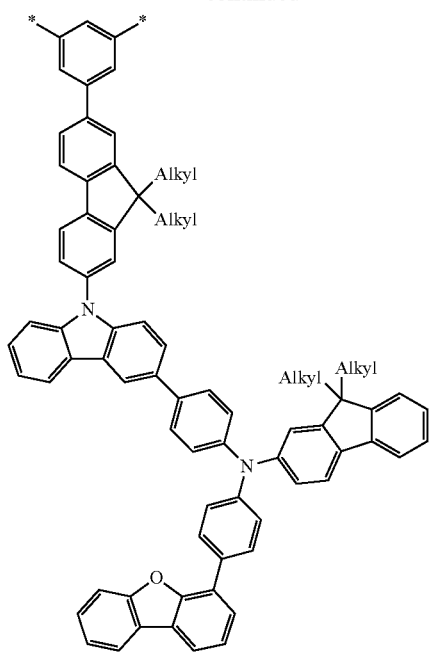
34
-continued
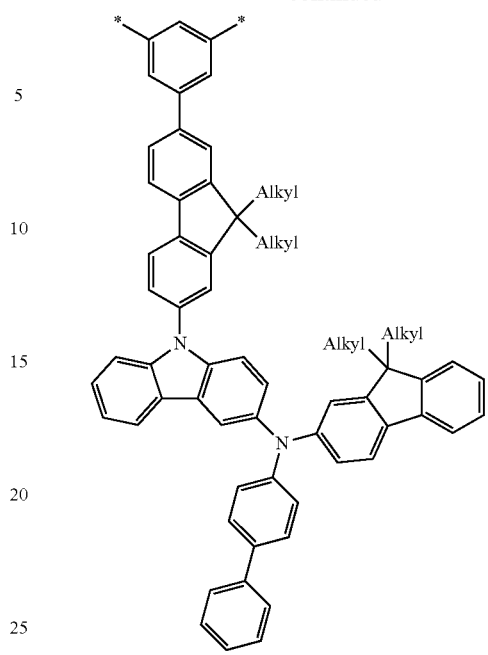
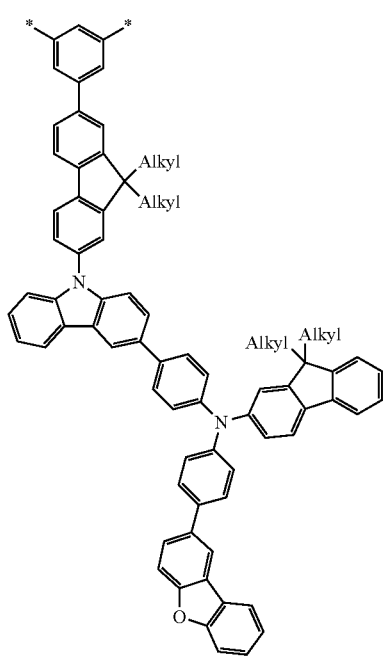
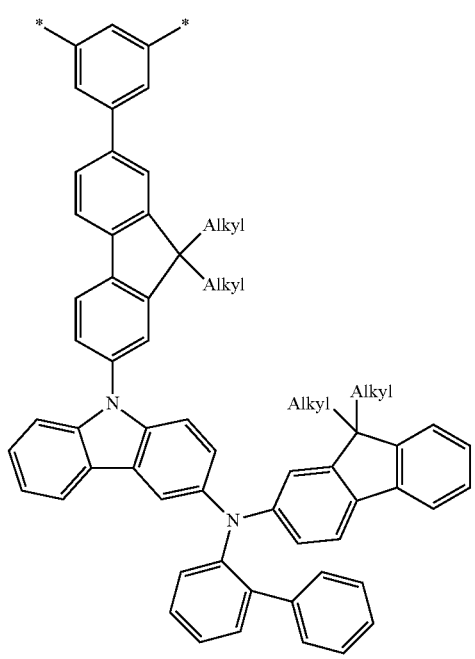

-continued

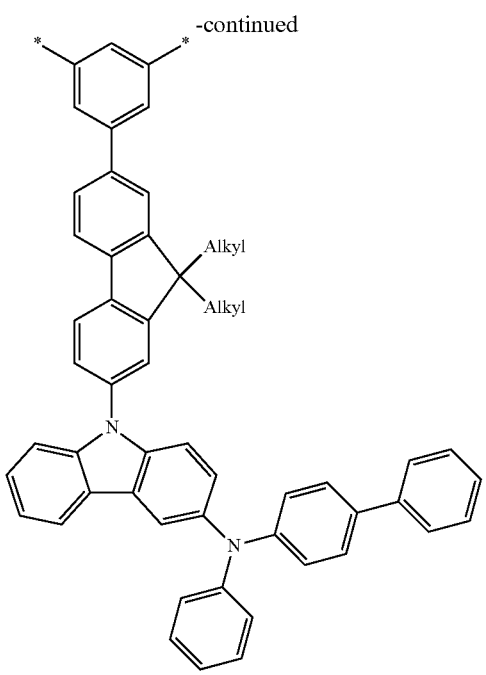

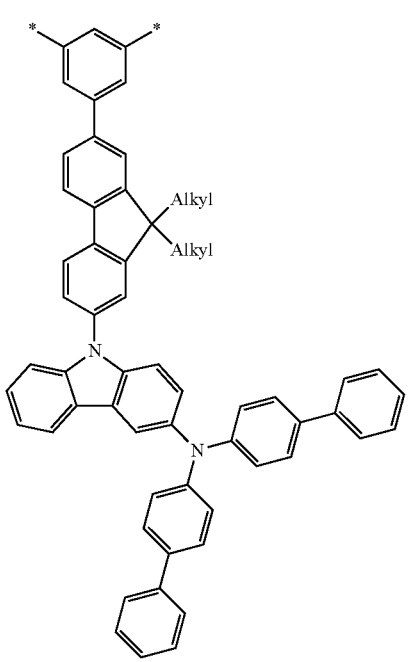

-continued

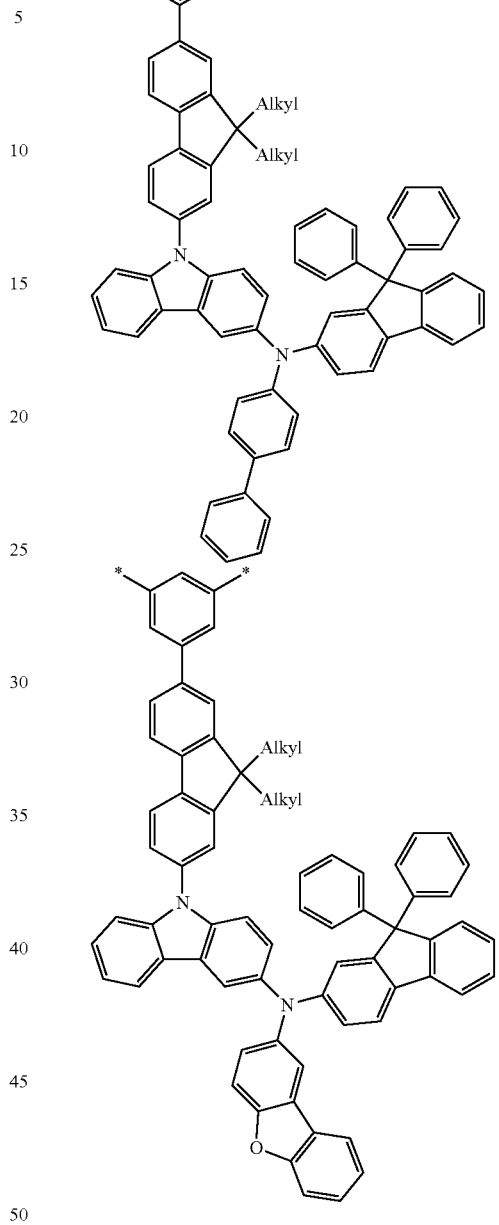

In the above chemical formulae, * is a linking portion, and "Alkyl" indicates substitution or unsubstitution with an alkyl group.

<<Y>>

The polymer compound 1 may include one type of Y or two or more types of Y as a structural unit.

The polymer compound 1 may improve solubility by including Y as a structural unit. For this reason, when the polymer compound 1 is used, a thin film may be easily formed by a coating method.

In Chemical Formula 1, Y may be a substituted or unsubstituted C6 to C60 divalent aromatic hydrocarbon group or a substituted or unsubstituted divalent aromatic heterocyclic group having 3 to 60 ring-forming atoms.

Herein, the divalent aromatic hydrocarbon group and the divalent aromatic heterocyclic group are the same as $Ar_1$ in Chemical Formula 2, except that the trivalent aromatic heterocyclic group and the trivalent aromatic heterocyclic group are changed into divalent groups, and thus the descriptions thereof are omitted.

Among them, from the viewpoint of improving solubility of the polymer compound 1, Y may desirably be a phenylene group, a fluorenediyl, a biphenylene group, a fluorenylene group, a naphthylene group, an anthracenylene group, a phenanthrylene group, a naphthacenylene group, a pyrenylene group, a terphenylene group, a tolylene group, a tert-butylphenylene group, or a (phenylpropyl)phenylene group, and more desirably a phenylene group or a fluorenediyl group.

In addition, when the divalent aromatic hydrocarbon group or the divalent aromatic heterocyclic group is substituted, the substituent is the same as the substituent of $Ar_1$ in Chemical Formula 2, and thus the descriptions thereof are omitted.

Among them, from the viewpoint of improving solubility of the polymer compound 1, the substituent may desirably be a C1 to C20 linear or branched alkyl group.

The carbon number of the alkyl group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkyl group. This is because the ligand of the quantum dot and the alkyl group present in the hole transport layer may interact with each other, thereby improving effects such as hole injectability.

In addition, when the solvent that disperses the quantum dot is a long-chain hydrocarbon-based solvent, it is desirable that the number of the alkyl group in the polymer compound is small in terms of securing a residual film ratio of the hole transport layer.

Therefore, as the alkyl group, a linear or branched C1 to C18 alkyl group is more desirable. The alkyl group may be appropriately selected according to the used quantum dot or the solvent that disperses the quantum dot.

From the viewpoint of adjusting the HOMO level, Y may desirably be of the structural units represented by Chemical Formula 2-7 to Chemical Formula 2-14. Herein, a plurality of Y's in the segment of the alternate copolymer of the structural unit represented by Chemical Formula 1 may be the same or different.

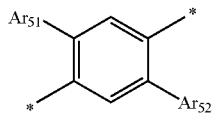
(2-7)

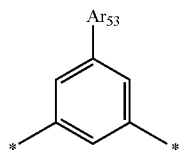
(2-8)

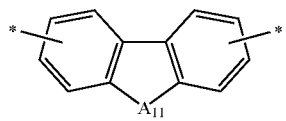
(2-9)

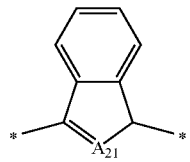
(2-10)

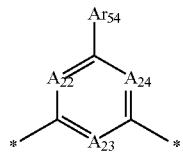
(2-11)

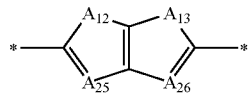
(2-12)

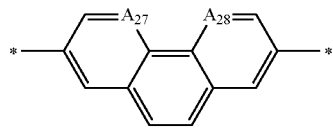
(2-13)

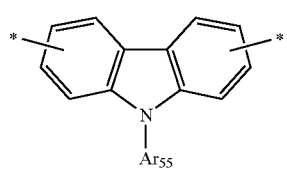
(2-14)

In Chemical Formula 2-7 to Chemical Formula 2-14, $Ar_{51}$ to $Ar_{55}$ are independently a substituted or unsubstituted C6 to C60 monovalent aromatic hydrocarbon group, a substituted or unsubstituted monovalent aromatic heterocyclic group having 3 to 60 ring-forming atoms, C1 to C20 alkyl group, or a hydrogen atom, $A_{11}$ to $A_{13}$ are independently —O—, —S—, —Se—, —$CR_3R_4$—, —$SiR_3R_4$— ($R_3$ and $R_4$ are independently a hydrogen atom, a deuterium atom, a substituted or unsubstituted alkyl group, a substituted or unsubstituted aryl group, or a substituted or unsubstituted heteroaryl group), $A_{21}$ to $A_{28}$ are independently —$CR_5$=, —N=, —$SiR_5$= ($R_5$ is hydrogen, a deuterium atom, a substituted or unsubstituted alkyl group, a substituted or unsubstituted aryl group, or a substituted or unsubstituted heteroaryl group.

The carbon number of the alkyl group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkyl group. This is because the ligand of the quantum dot and the alkyl group present in the hole transport layer may interact with each other, thereby improving effects such as hole injectability.

In addition, when the solvent that disperses the quantum dot is a long-chain hydrocarbon-based solvent, it is desirable that the number of the alkyl group in the polymer compound is small in terms of securing a residual film ratio of the hole transport layer.

Therefore, as the alkyl group, a linear or branched C1 to C18 alkyl group is more desirable. The alkyl group may be appropriately selected according to the used quantum dot or the solvent that disperses the quantum dot.

The specific examples of Y are shown below.

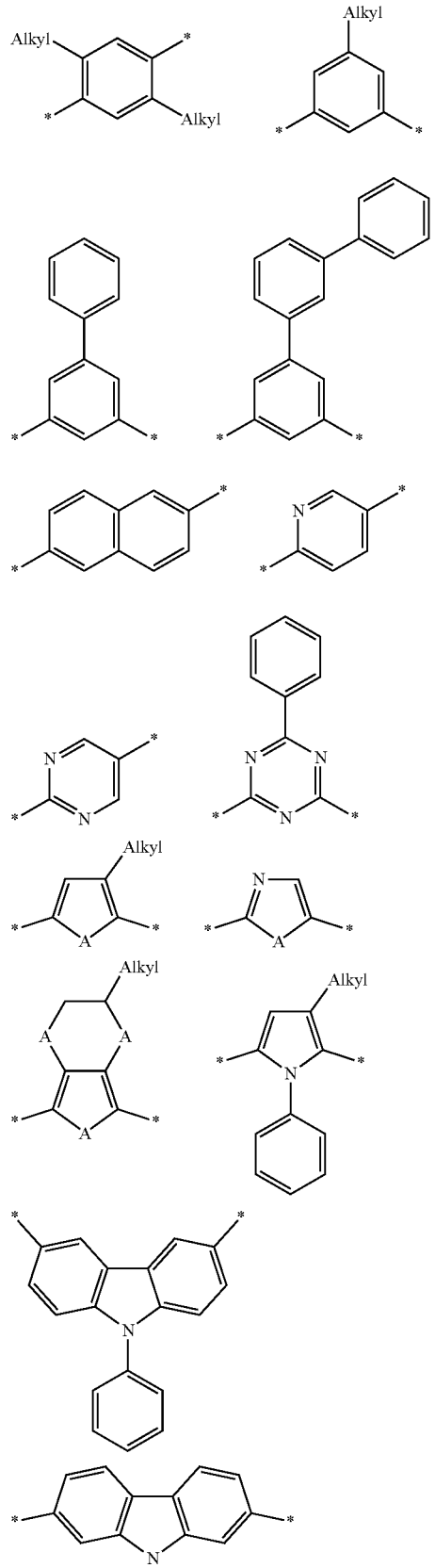

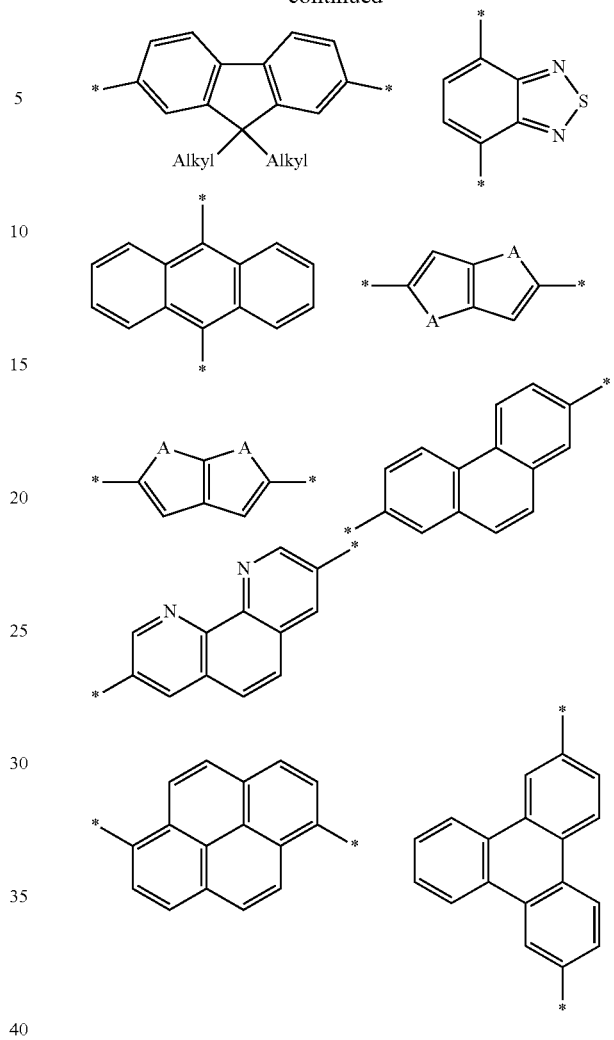

In the above chemical formulae, A is O, S, or Se, and when two or more X's exist, a plurality of X's may be same or different. In addition, * is a linking portion, and "Alkyl" indicates substitution with an alkyl group.

The polymer compound 1 is desirably represented by Chemical Formula 3. As a result, the light emitting life-span of the quantum dot light emitting device is lengthened.

In Chemical Formula 3, E is a substituted or unsubstituted C6 to C60 monovalent aromatic hydrocarbon group, or a substituted or unsubstituted monovalent aromatic heterocyclic group having 3 to 60 ring-forming atoms, m is an integer of 2 or more, and a plurality of X's and Y's may independently be the same or different.

Herein, the monovalent aromatic hydrocarbon group and the monovalent aromatic heterocyclic group are the same as $Ar_1$ in Chemical Formula 2, except that the trivalent aromatic heterocyclic group and the trivalent aromatic heterocyclic group are changed into divalent groups, and thus the descriptions thereof are omitted. In addition, when the monovalent aromatic hydrocarbon group or the monovalent aromatic heterocyclic group is substituted, the substituent is the same as the substituent of $Ar_1$ in Chemical Formula 2, and thus the descriptions thereof are omitted.

The specific example of E (end group) of Chemical Formula 3 is shown below. As an example of E, a group of the following cross-linking groups is desirable.

Cross-linking groups

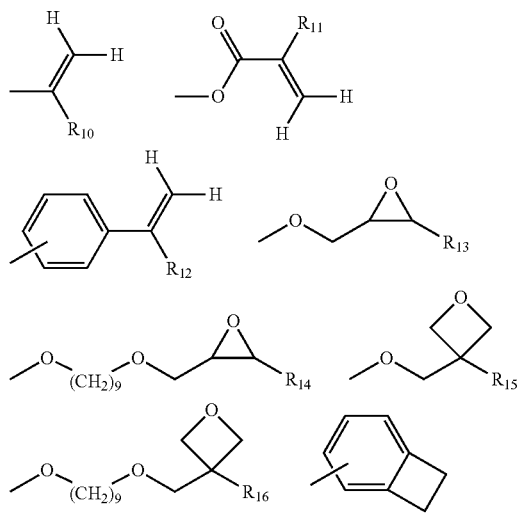

In the cross-linking groups, $R_{10}$ to $R_{16}$ are independently a hydrogen atom, or a substituted or unsubstituted C1 to C10 alkyl group, and p is an integer of 1 to 10.

Moreover, the following groups are desirable as an example of E.

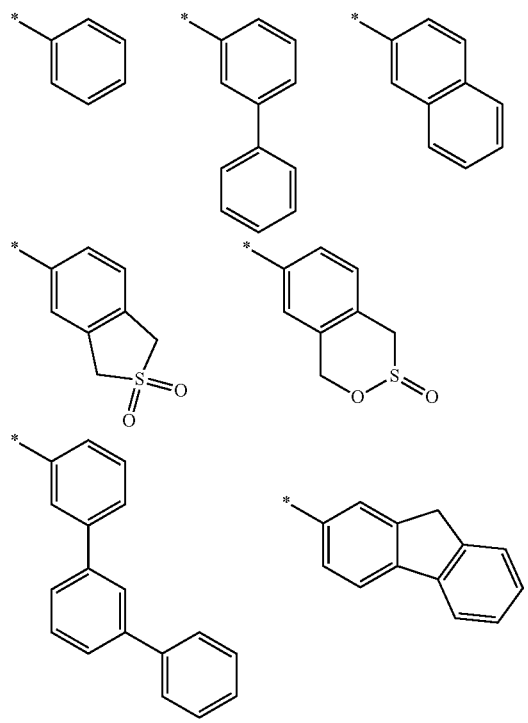

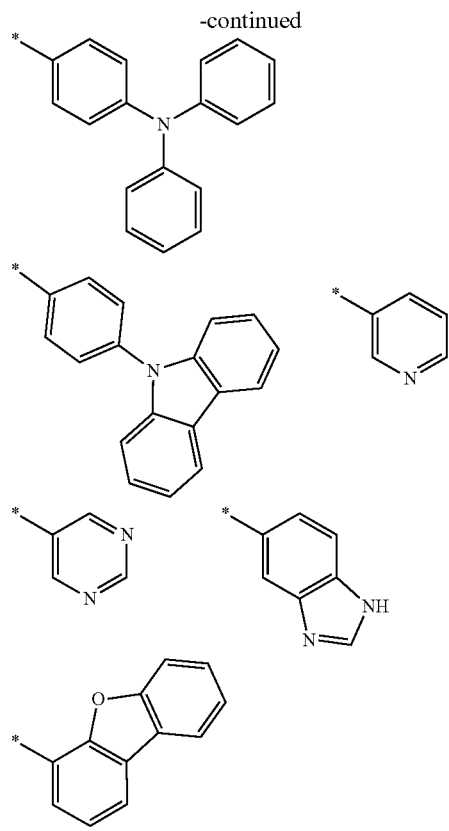

In the above chemical formulae, * is a linking portion.

Although the polymer compound 1 may be used as a material for electroluminescent (EL) devices, it is particularly effective to use as a hole transporting material for EL devices including quantum dots.

Synthesis Method of Polymer Compound 1

The polymer compound 1 may be suitably synthesized by combining well-known organic synthesis reactions. Specific synthesis method of the polymer compound 1 may be easily understood by a person of an ordinary skill in the art referring to the following examples. Specifically, the polymer compound 1 may be synthesized by copolymerizing at least one monomer 1 represented by Chemical Formula 4 and at least one monomer 2 represented by Chemical Formula 5 at a mole ratio of about 1:1. The monomer 1 and monomer 2 may be suitably synthesized by combining well-known organic synthesis reaction. In addition, the monomer 1 and monomer 2 may be identified using a well-known analysis method (for example, NMR, LC-MS).

Chemical Formula 4

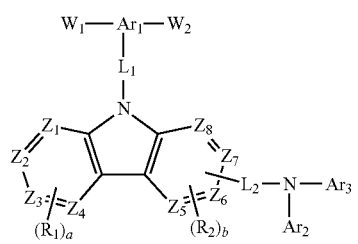

Chemical Formula 5

In Chemical Formula 4 and Chemical Formula 5, $Ar_1$, $Ar_2$, $Ar_3$, $L_1$, $L_2$, $R_1$, $R_2$, a, and b are the same as in Chemical Formula 2. $W_1$ to $W_4$ are independently a halogen atom (a fluorine atom, a chlorine atom, a bromine atom, an iodine atom, particularly a bromine atom) or the following groups.

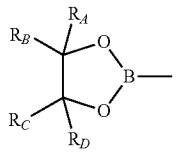

In the above chemical formulae, $R_A$ to $R_D$ are independently C1 to C3 alkyl group.

Polymer Compound 2

According to the preferred embodiment of the present disclosure, the polymer material includes a polymer compound (hereinafter, simply referred to as "polymer compound 2") including a repeating unit represented by Chemical Formula P-2. According to a more preferred embodiment, the polymer material may be the polymer compound 2.

The polymer compound 2 is a compound including a repeating unit represented by Chemical Formula P-2.

Chemical Formula P-2

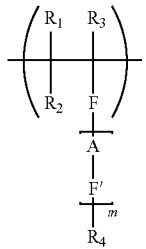

(P-2)

In Chemical Formula P-2, $R_1$, $R_2$, and $R_3$ are independently a hydrogen atom, a substituted or unsubstituted C1 to C10 alkyl group, or a substituted or unsubstituted ring-forming C6 to C30 aryl group, m is an integer of 1 to 20, F and F' are independently a divalent group having a fluorene structure including aza-fluorene, and A is a divalent group represented by Chemical Formula (P-21), Chemical Formula (P-21)

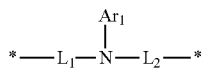

(P-21)

wherein, in Chemical Formula (P-21), $L_1$ and $L_2$ are independently a single bond, a substituted or unsubstituted C1 to C20 alkylene group, a substituted or unsubstituted ring-forming C3 to C16 cycloalkylene group, a substituted or unsubstituted ring-forming C6 to C30 arylene group, a substituted or unsubstituted C1 to C20 oxyalkylene group, a substituted or unsubstituted ring-forming C3 to C16 oxycycloalkylene group, a substituted or unsubstituted ring-forming C6 to C30 oxyarylene group, a substituted or unsubstituted C7 to C40 aralkylene group, a substituted or unsubstituted ring-forming C5 to C30 heteroarylene group, a substituted or unsubstituted C1 to C20 aminoalkylene group, a substituted or unsubstituted ring-forming C6 to C30 aminoarylene group, or a silylene group substituted with an alkyl group or an aryl group, $Ar_1$ is hydrogen, a substituted or unsubstituted C1 to C20 alkyl group, a substituted or unsubstituted ring-forming C3 to C16 cycloalkyl group, a substituted or unsubstituted ring-forming C6 to C30 aryl group, a substituted or unsubstituted C1 to C20 alkoxy group, a substituted or unsubstituted ring-forming C3 to C16 cycloalkoxy group, a substituted or unsubstituted ring-forming C6 to C30 aryloxy group, a substituted or unsubstituted C7 to C40 aralkyl group, a substituted or unsubstituted ring-forming C5 to C30 heteroaryl group, an alkylamino group including a substituted or unsubstituted C1 to C20 alkyl group, a substituted or unsubstituted ring-forming C6 to C30 arylamino group, or a cyclic substituent formed by linking these substituents with $L_1$ or $L_2$,

** is a linking portion with another substituent, and $R_4$ is hydrogen, a halogen atom, a hydroxy group, an amino group, a nitro group, a cyano group, a substituted or unsubstituted silyl group, a substituted or unsubstituted C1 to C20 alkyl group, a substituted or unsubstituted ring-forming C3 to C16 cycloalkyl group, a substituted or unsubstituted ring-forming C6 to C30 aryl group, a substituted or unsubstituted C1 to C20 alkoxy group, a substituted or unsubstituted ring-forming C3 to C16 cycloalkoxy group, a substituted or unsubstituted ring-forming C6 to C30 aryloxy group, a substituted or unsubstituted C7 to C40 aralkyl group, a substituted or unsubstituted ring-forming C5 to C30 heteroaryl group, an alkylamino group including a substituted or unsubstituted C1 to C20 alkyl group, or a substituted or unsubstituted ring-forming C6 to C30 arylamino group.

The carbon number of the alkyl group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkyl group. This is because the ligand of the quantum dot and the alkyl group present in the hole transport layer may interact with each other, thereby improving effects such as hole injectability.

In addition, when the solvent that disperses the quantum dot is a long-chain hydrocarbon-based solvent, it is desirable that the number of the alkyl group in the polymer compound is small in terms of securing a residual film ratio of the hole transport layer.

Therefore, as the alkyl group, a linear or branched C1 to C18 alkyl group is more desirable. The alkyl group may be appropriately selected according to the used quantum dot or the solvent that disperses the quantum dot.

In addition, the carbon number of the alkoxy group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkoxy group. This is because the ligand of the quantum dot and the alkoxy group present in the hole transport layer may interact with each other, thereby improving effects such as hole injectability.

In addition, when the solvent that disperses the quantum dot is a long-chain hydrocarbon-based solvent, it is desirable that the number of the alkoxy group in the polymer compound is small in terms of securing a residual film ratio of the hole transport layer.

Therefore, as the alkoxy group, a linear or branched C1 to C18 alkoxy group is more desirable. These alkoxy groups may be appropriately selected according to the used quantum dot or the solvent that disperses the quantum dot.

Specifically, the substituent represented by F and F' may independently be represented by Chemical Formula (P-22).

Chemical Formula (P-22)

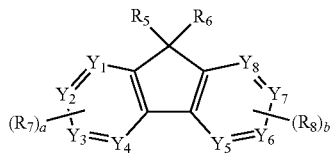

(P-22)

In Chemical Formula (P-22), $R_5$ to $R_8$ are independently hydrogen atom, a halogen atom, a hydroxy group, an amino group, a nitro group, a cyano group, a substituted or unsubstituted silyl group, a substituted or unsubstituted C1 to C20 alkyl group, a substituted or unsubstituted ring-forming C3 to C16 cycloalkyl group, a substituted or unsubstituted ring-forming C6 to C30 aryl group, a substituted or unsubstituted C1 to C20 alkoxy group, a substituted or unsubstituted ring-forming C3 to C16 cycloalkoxy group, a substituted or unsubstituted ring-forming C6 to C30 aryloxy group, a substituted or unsubstituted C7 to C40 aralkyl group, a substituted or unsubstituted ring-forming C5 to C30 heteroaryl group, a substituted or unsubstituted C1 to C20 alkylamino group, a substituted or unsubstituted ring-forming C6 to C30 arylamino group, or a cyclic substituent formed by linking adjacent groups of these substituent, a and b are independently an integer of 1 to 4, and $Y_1$ to $Y_8$ are independently one of a carbon atom or a nitrogen atom.

The linking portion of the substituent represented by Chemical Formula (P-22) and another substituent of the main chain, A and $R_4$, and the like may be arbitrary and may be bound at any one substitution position.

The carbon number of the alkyl group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkyl group. This is because the ligand of the quantum dot and the alkyl group present in the hole transport layer may interact with each other, thereby improving effects such as hole injectability.

In addition, when the solvent that disperses the quantum dot is a long-chain hydrocarbon-based solvent, it is desirable that the number of the alkyl group in the polymer compound is small in terms of securing a residual film ratio of the hole transport layer.

Therefore, as the alkyl group, a linear or branched C1 to C18 alkyl group is more desirable. The alkyl group may be appropriately selected according to the used quantum dot or the solvent that disperses the quantum dot.

In addition, the carbon number of the alkoxy group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkoxy group. This is because the ligand of the quantum dot and the alkoxy group present in the hole transport layer may interact with each other, thereby improving effects such as hole injectability.

In addition, when the solvent that disperses the quantum dot is a long-chain hydrocarbon-based solvent, it is desirable that the number of the alkoxy group in the polymer compound is small in terms of securing a residual film ratio of the hole transport layer.

Therefore, as the alkoxy group, a linear or branched C1 to C18 alkoxy group is more desirable. These alkoxy groups may be appropriately selected according to the used quantum dot or the solvent that disperses the quantum dot.

More specifically, the substituent represented by Chemical Formula (P-22) may be any substituted or unsubstituted substituent of the following substituent groups.

Substituent groups

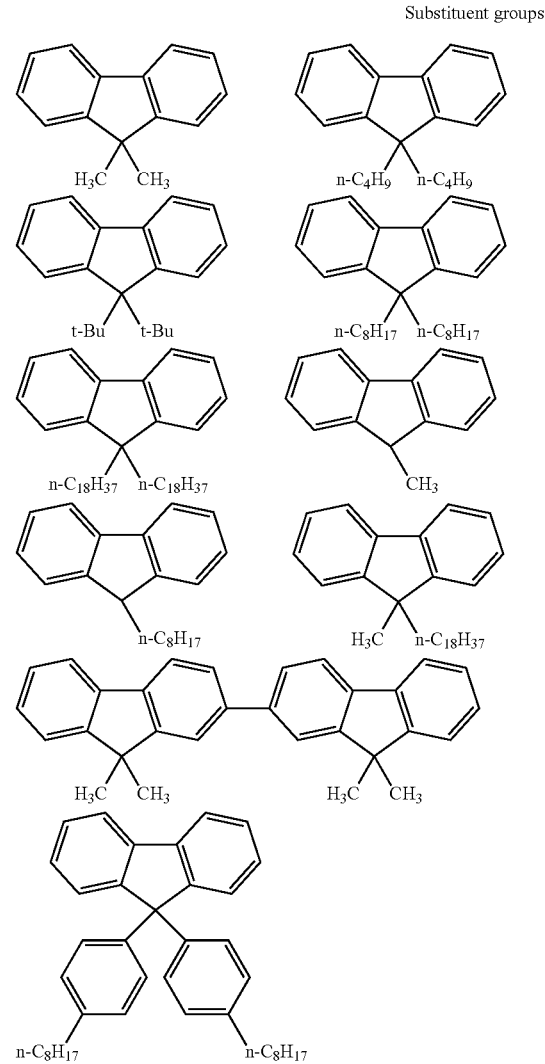

-continued
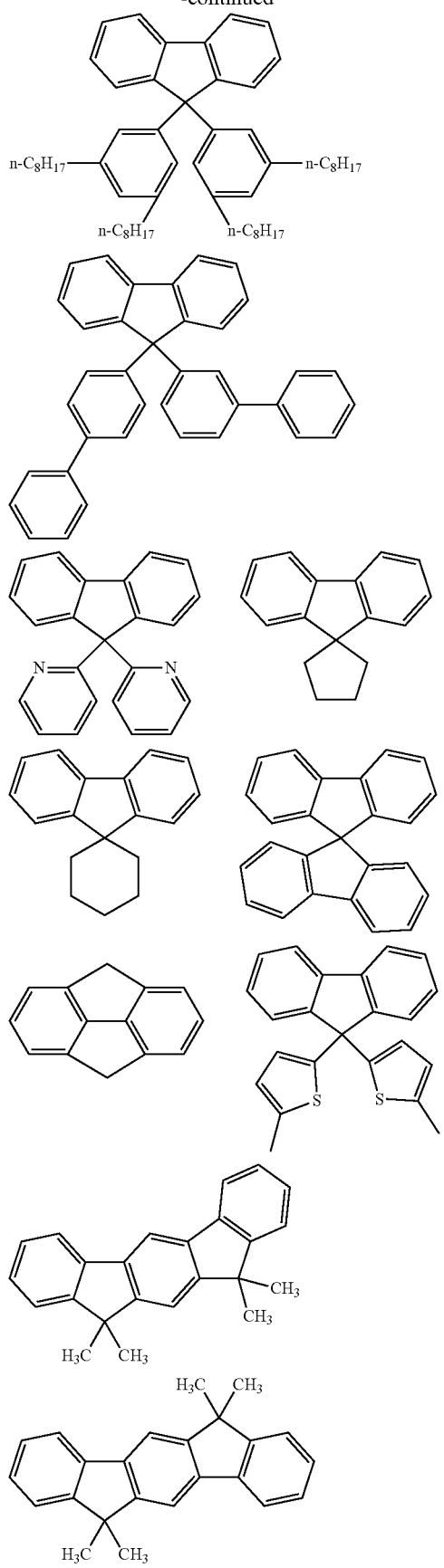
-continued
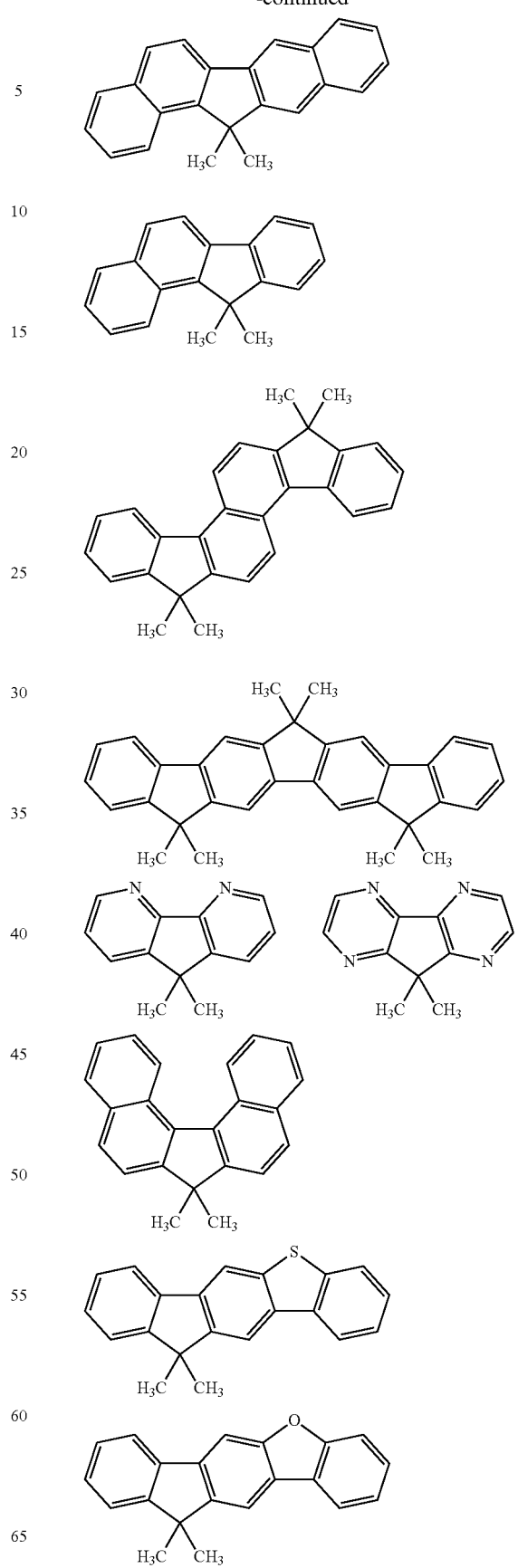

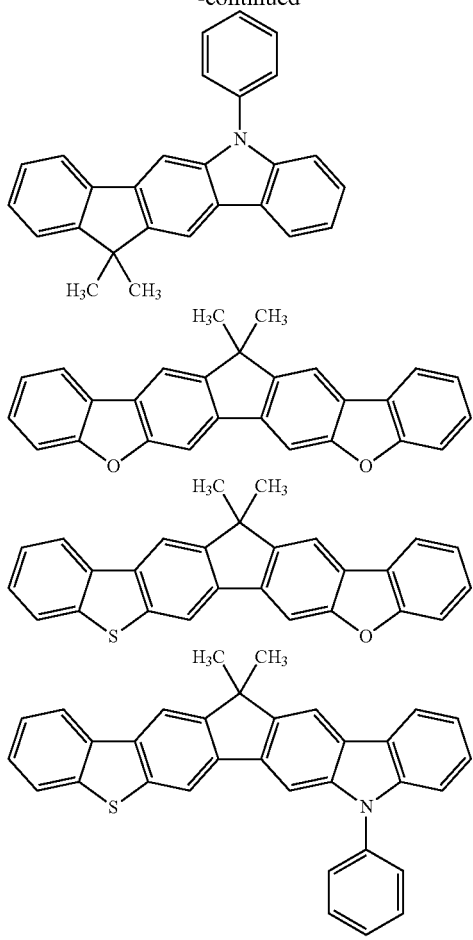

The substituent represented by Chemical Formula (P-21) may be for example, an aliphatic amino group or an aromatic amino group, or may form a cyclic structure in which $Ar_1$ and $L_1$ or $L_2$ are linked to each other.

In addition, in Chemical Formula (P-21), $L_1$ and $L_2$ may be a substituted or unsubstituted fluorenylene group, a substituted or unsubstituted aminoalkylene group, or a substituted or unsubstituted aminoarylene group. That is, the polymer compound 2 according to the present embodiment may have a structure in which a substituent having a fluorene structure and a substituent having an amine structure are alternately bonded, or a structure in which a substituent having a fluorene structure or an amine structure is continuously bonded.

Since the fluorene structure is directly bound to the side chain portion of the polymer, the polymer compound 2 having the aforementioned structure has high bond dissociation energy between carbons of the polymer, and high current flow durability and electron resistance. Accordingly, the quantum dot EL device using the polymer compound 2 according to the present embodiment may improve light emitting life-span.

Here, specific examples of structural units (repeating units) of the polymer compound 2 according to the present embodiment are as follows. However, the structural units of the polymer compound 2 are not limited to the structures illustrated below. m may be for example, an integer of 1 to 10.

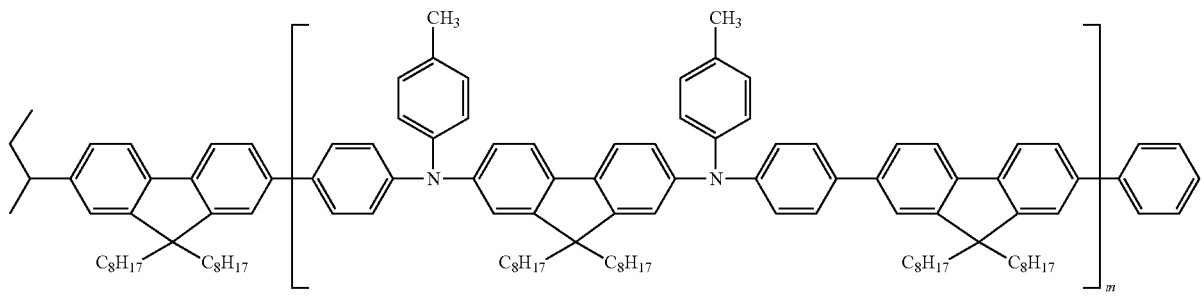

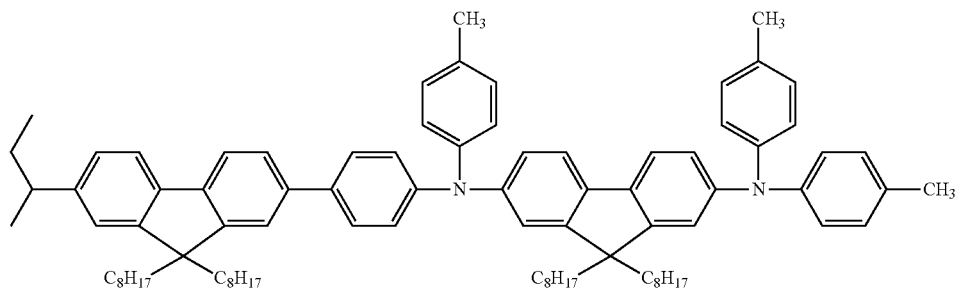

-continued
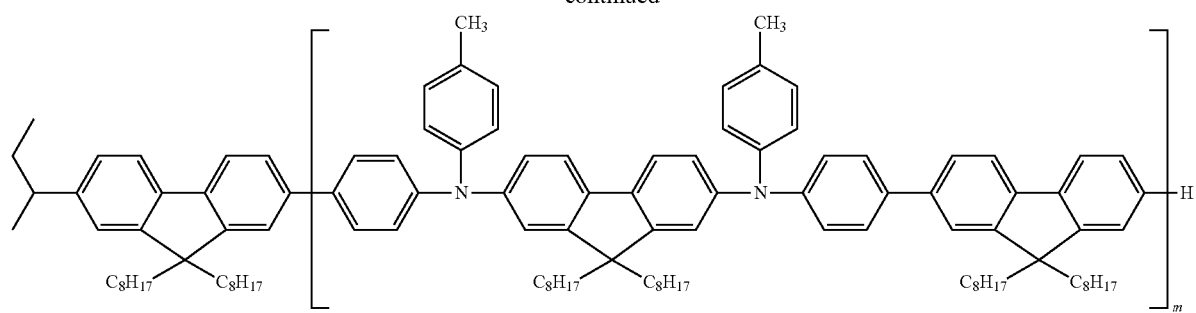
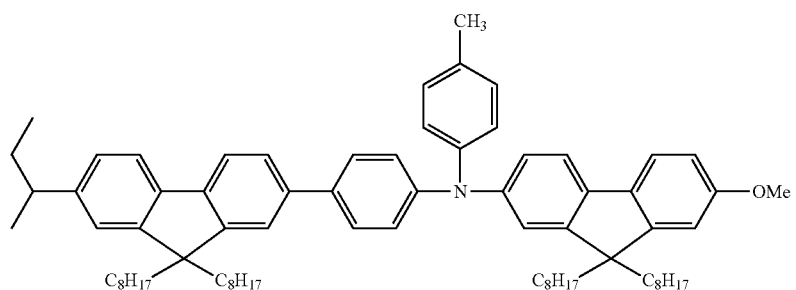
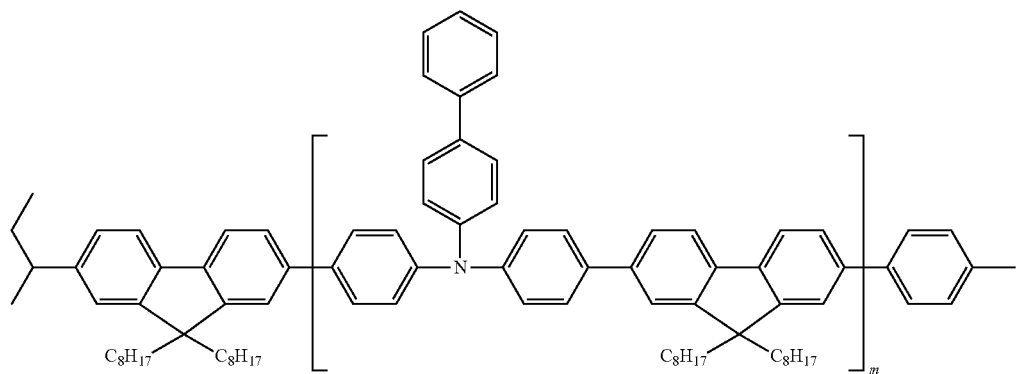
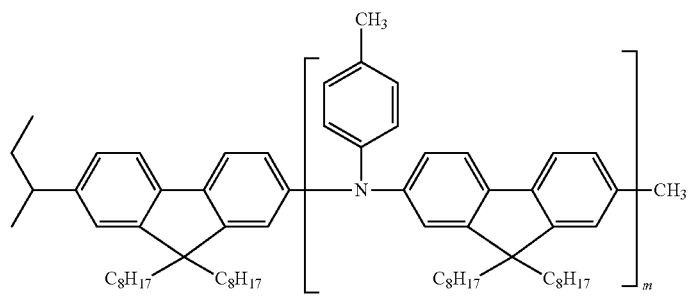
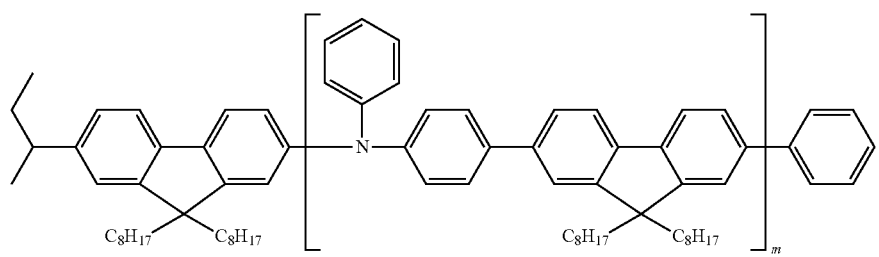

-continued
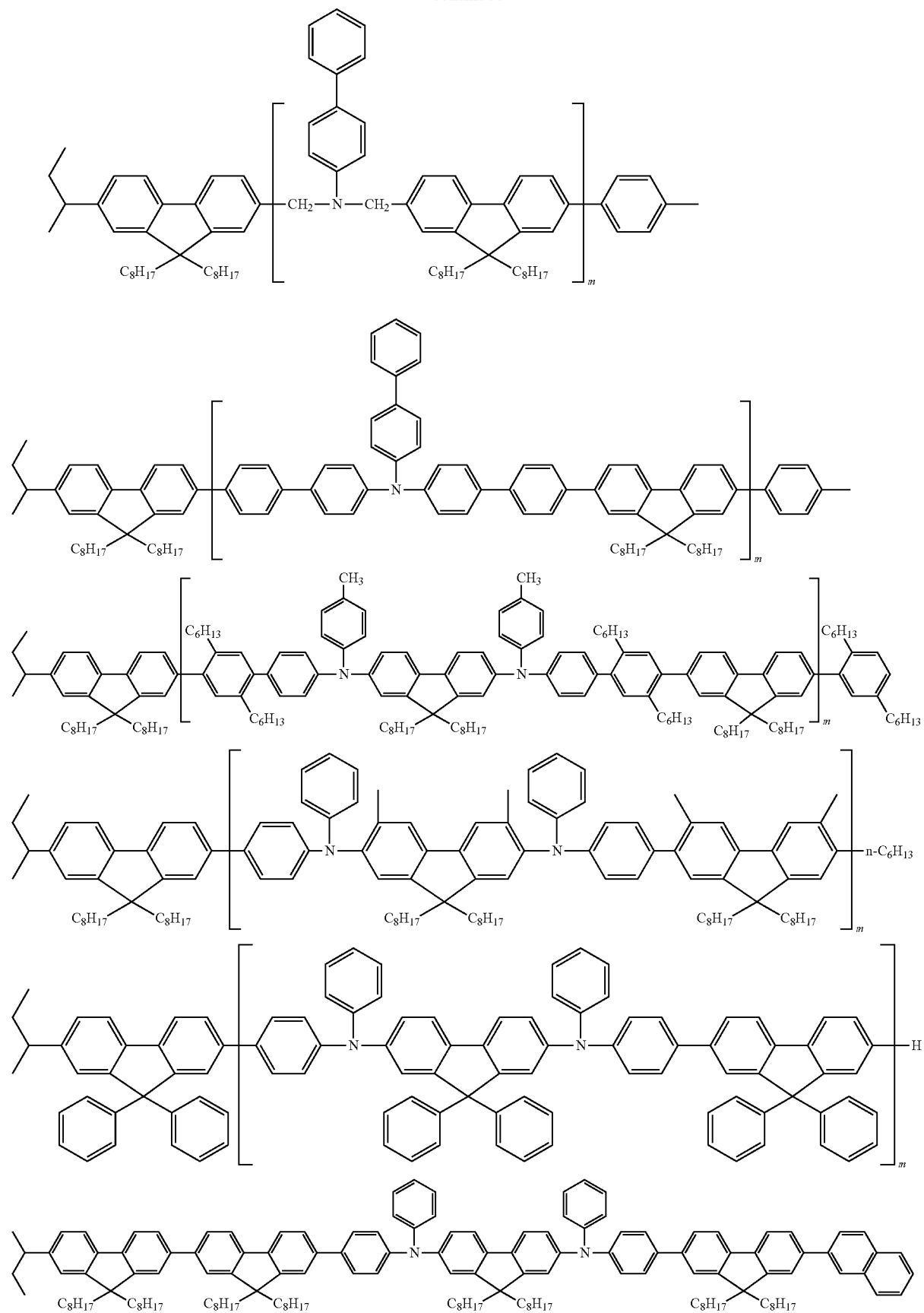

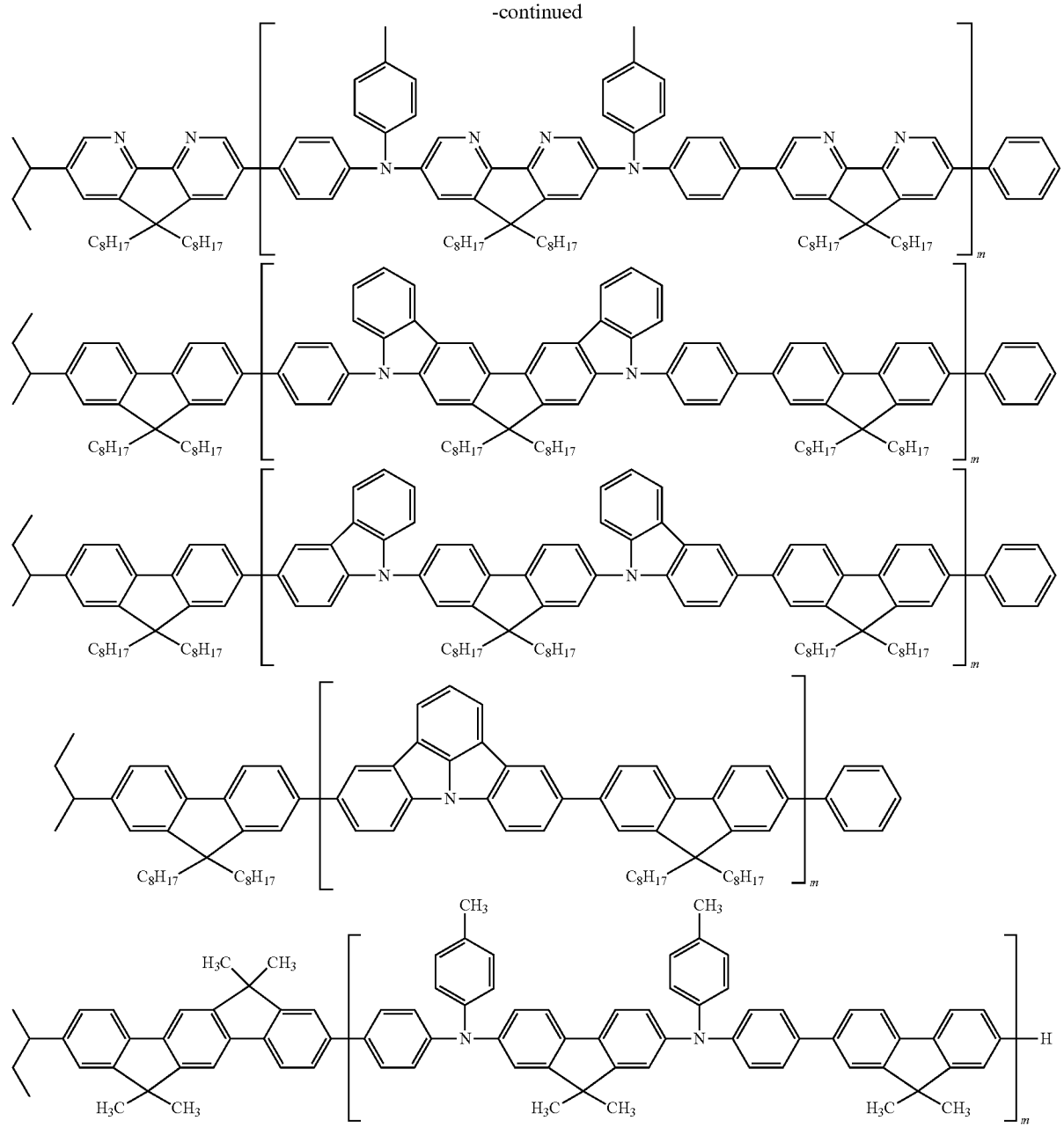

In addition, the polymer compound 2 according to the present embodiment is more desirably a copolymer formed by copolymerization with a polymerizable comonomer (comonomer) having at least one cross-linking group. The cross-linking group of the polymerizable comonomer is specifically a cross-linking group of the following cross-linking groups.

Cross-linking groups

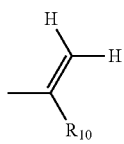 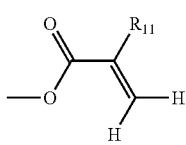

-continued

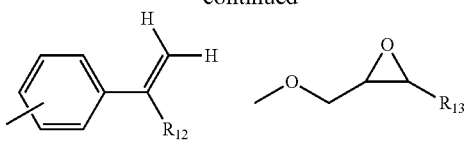

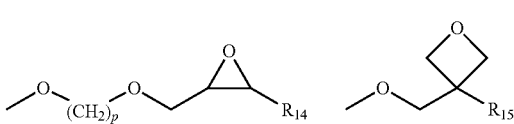

In the cross-linking groups, $R_{10}$ to $R_{16}$ are independently a hydrogen atom, or a substituted or unsubstituted C1 to C10 alkyl group, and p is an integer of 1 to 10.

When the polymer compound 2 according to the present embodiment is the copolymer with the polymerizable comonomer having the cross-linking group, the polymer compound 2 may form an insoluble film in a solvent by being cross-linked by heat or the like after film formation. Thereby, the polymer compound 2 according to the present embodiment may suppress dissolution and mixing of the materials between the laminated layers, and thus it easier to form a laminate structure.

A ratio of the polymerizable comonomer having the cross-linking group may be desirably greater than or equal to about 1 mole percent (mol %) and less than or equal to about 50 mol % based on a total amount of the entire monomers forming the polymer compound 2. Within this range, a film insoluble in a solvent may be formed by a cross-linking reaction. In addition, the effect of improving the light emitting life-span in the quantum dot EL device is increased. The ratio of the polymerizable comonomer having the cross-linking group may be desirably greater than or equal to about 5 mol % and less than or equal to about 15 mol %, and more desirably about 10 mol % based on a total amount of the entire monomers forming the polymer compound 2.

Here, the polymerizable comonomer having the cross-linking group is more desirably specifically a compound represented by Chemical Formula P-23.

(P-23)

In Chemical Formula P-23, $R_{17}$, $R_{18}$, and $R_{19}$ are independently hydrogen atom, a substituted or unsubstituted C1 to C10 alkyl group, or a substituted or unsubstituted ring-forming C6 to C30 aryl group, $R_{20}$, $R_{21}$, $R_{22}$, $R_{23}$, and $R_{24}$ are independently hydrogen atom, a halogen atom, a hydroxy group, an amino group, a nitro group, a cyano group, a substituted or unsubstituted silyl group, a substituted or unsubstituted C1 to C20 alkyl group, a substituted or unsubstituted ring-forming C3 to C16 cycloalkyl group, a substituted or unsubstituted ring-forming C6 to C30 aryl group, a substituted or unsubstituted C1 to C20 alkoxy group, a substituted or unsubstituted cyclic C3 to C16 cycloalkoxy group, a substituted or unsubstituted ring-forming C6 to C30 aryloxy group, a substituted or unsubstituted C7 to C40 aralkyl group, a substituted or unsubstituted ring-forming C5 to C30 heteroaryl group, an alkylamino group having a substituted or unsubstituted C1 to C20 alkyl group, or a substituted or unsubstituted ring-forming C6 to C30 arylamino group, or a cyclic substituent formed by linking adjacent substituents to each other, $L_3$ is a single bond, a substituted or unsubstituted C1 to C20 alkylene group, a substituted or unsubstituted ring-forming C3 to C16 cycloalkylene group, a substituted or unsubstituted ring-forming C6 to C30 arylene group, a substituted or unsubstituted C1 to C20 oxyalkylene group, a substituted or unsubstituted ring-forming C3 to C16 oxycycloalkylene group, a substituted or unsubstituted ring-forming C6 to C30 oxy arylene group, a substituted or unsubstituted C7 to C40 aralkylene group, a substituted or unsubstituted ring-forming C5 to C30 heteroarylene group, a substituted or unsubstituted C1 to C20 aminoalkylene group, a substituted or unsubstituted ring-forming C6 to C30 aminoarylene group, or a silylene group substituted with an alkyl group or an aryl group, and at least one of $R_{20}$, $R_{21}$, $R_{22}$, or $R_{23}$ $R_{24}$ is a cross-linking group of the above cross-linking groups.

The carbon number of the alkyl group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkyl group. This is because the ligand of the quantum dot and the alkyl group present in the hole transport layer may interact with each other, thereby improving effects such as hole injectability.

In addition, when the solvent that disperses the quantum dot is a long-chain hydrocarbon-based solvent, it is desirable that the number of the alkyl group in the polymer compound is small in terms of securing a residual film ratio of the hole transport layer.

Therefore, as the alkyl group, a linear or branched C1 to C18 alkyl group is more desirable. The alkyl group may be appropriately selected according to the used quantum dot or the solvent that disperses the quantum dot.

The carbon number of the alkoxy group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkoxy group. This is because the ligand of the quantum dot and the alkoxy group present in the hole transport layer may interact with each other, thereby improving effects such as hole injectability.

In addition, when the solvent that disperses the quantum dot is a long-chain hydrocarbon-based solvent, it is desirable that the number of the alkoxy group in the polymer compound is small in terms of securing a residual film ratio of the hole transport layer.

Therefore, as the alkoxy group, a linear or branched C1 to C18 alkoxy group is more desirable. These alkoxy groups may be appropriately selected according to the used quantum dot or the solvent that disperses the quantum dot.

In addition, $L_3$ may specifically be a substituent represented by Chemical Formula P-24 or a substituent represented by Chemical Formula (P-21).

$$* \!-\!\!\left[ A' - F'' \right]_q\!\!-$$

(P-24)

In Chemical Formula P-24,

N is a substituent represented by the above General Formula P-21,

F″ is a substituent represented by the above General Formula P-22, q is an integer of 1 to 20, and \* is a linking portion with substituted fluorenylene group by $R_{20}$ and $R_{21}$.

When $L_3$ is a substituent represented by Chemical Formula P-24 or Chemical Formula (P-21), the polymerizable comonomer having the cross-linking group may have the same structure as the structure represented by Chemical Formula P-2. As a result, the polymer compound 2 according to the present embodiment may further improve the light emitting life-span of the quantum dot EL device.

Here, the specific example of the structural unit (repeating unit) corresponding to a polymerizable copolymer having at least one cross-linking group is shown below. However, the structural units corresponding to the polymerizable copolymer having at least one cross-linking group are not limited to the following structures. Hereinafter, m and n may be for example, an integer of 1 to 10.

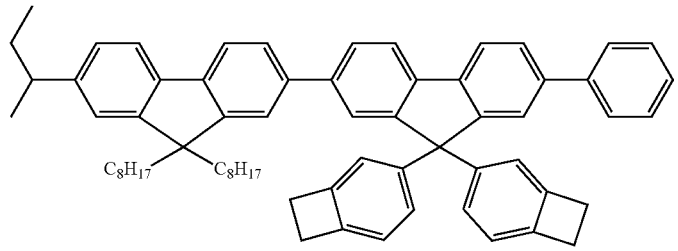

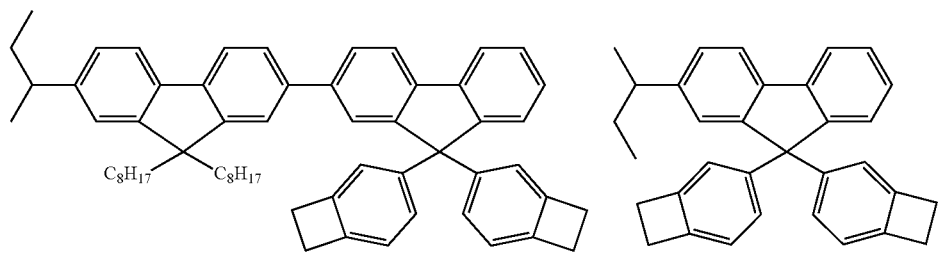

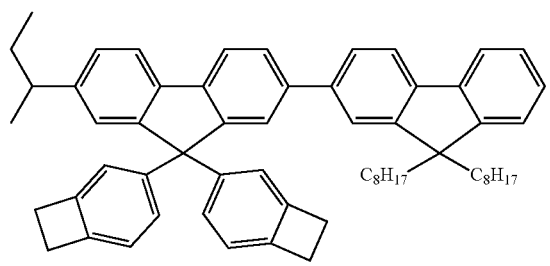

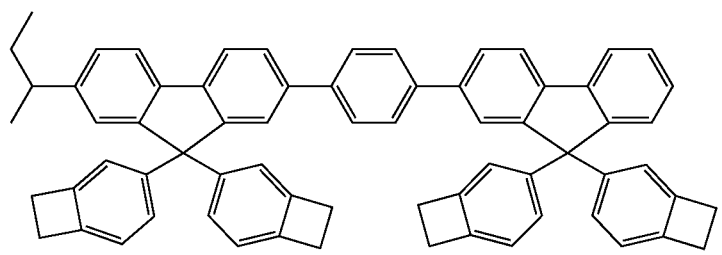

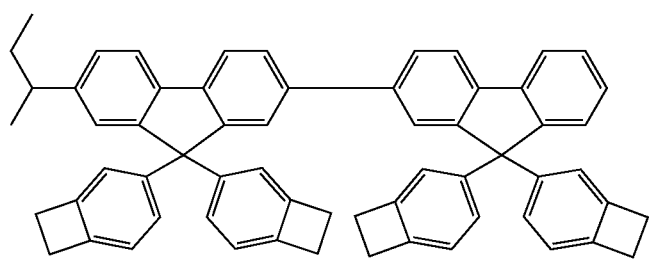

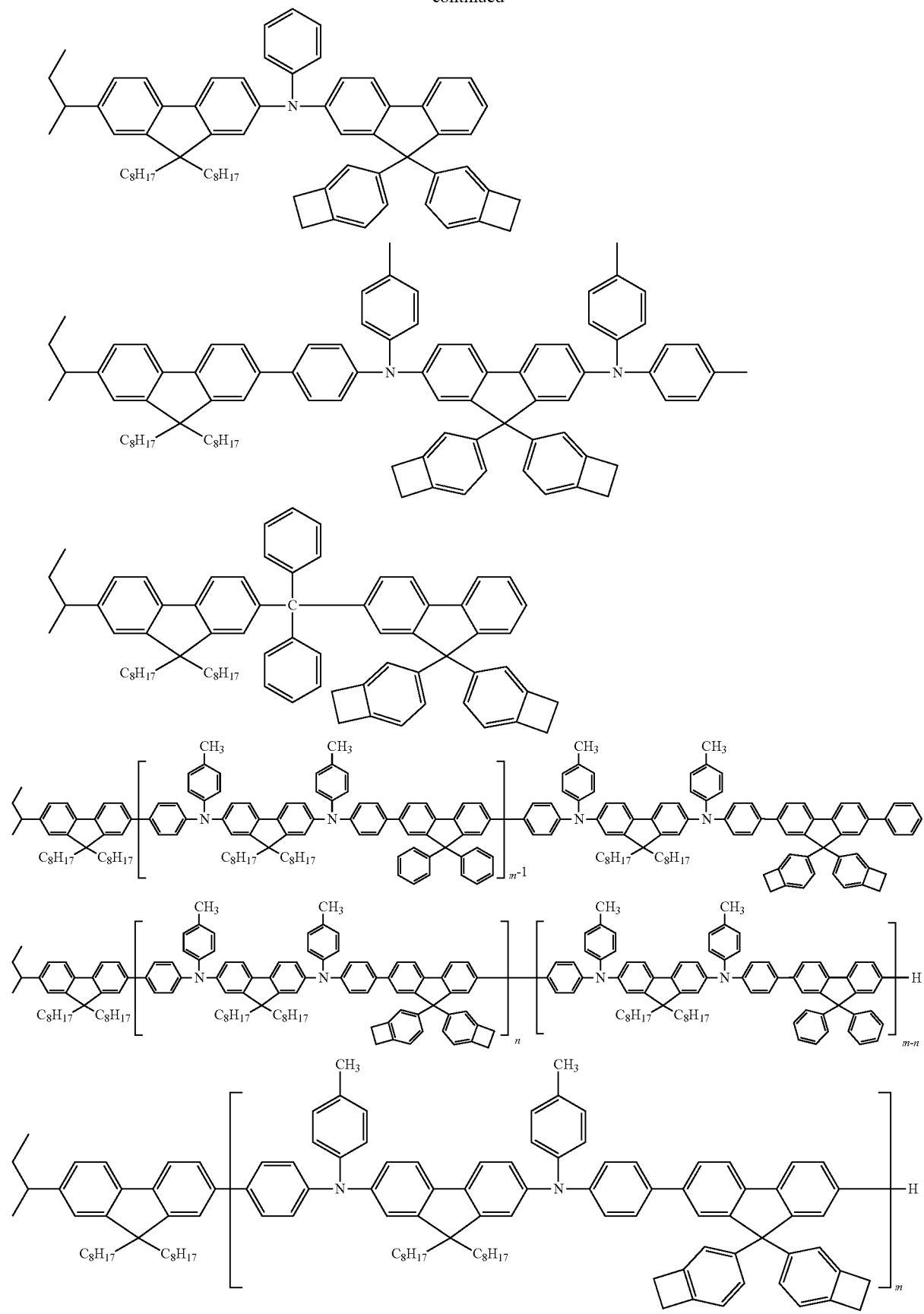

-continued
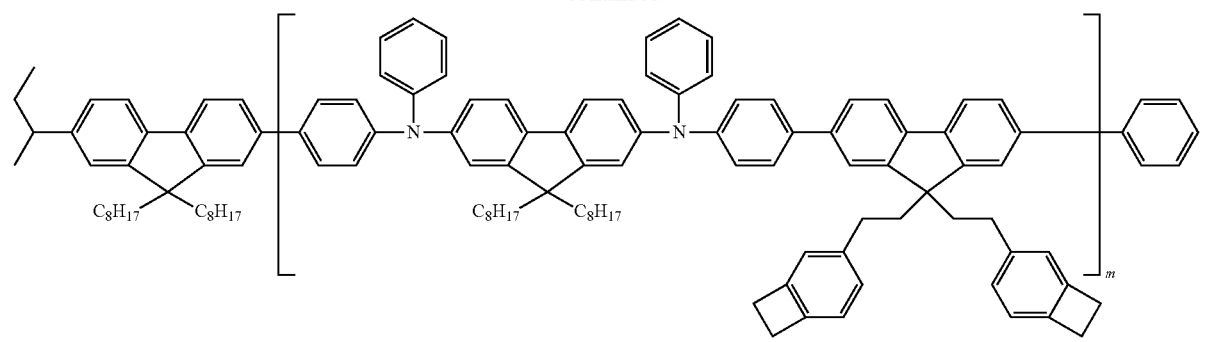
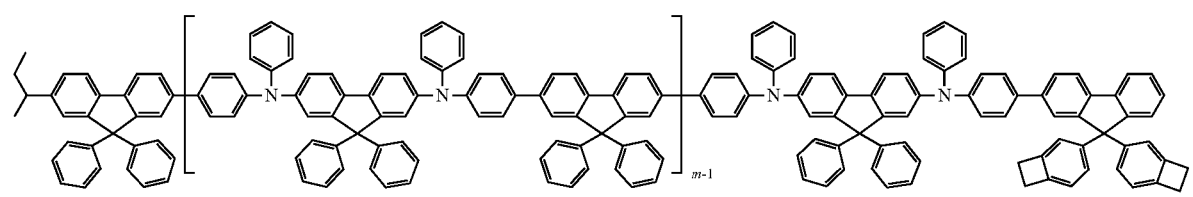
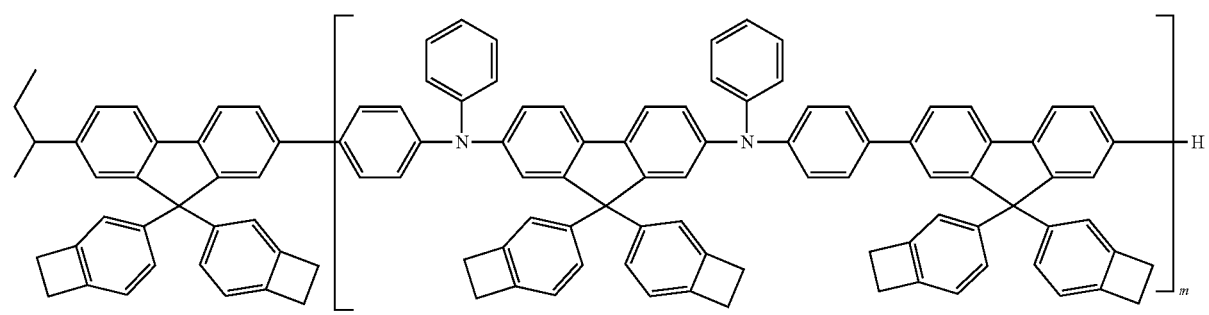
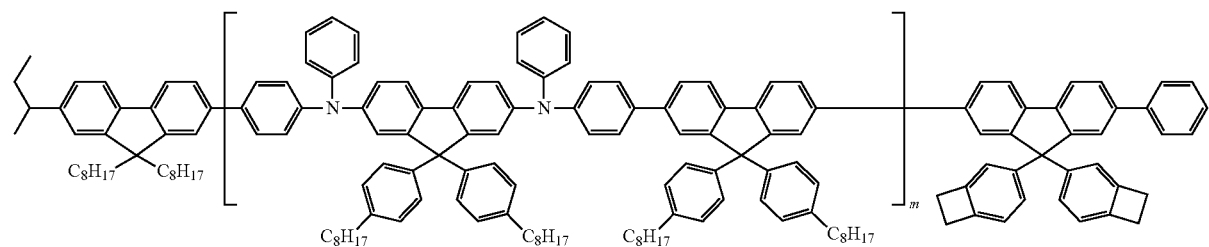
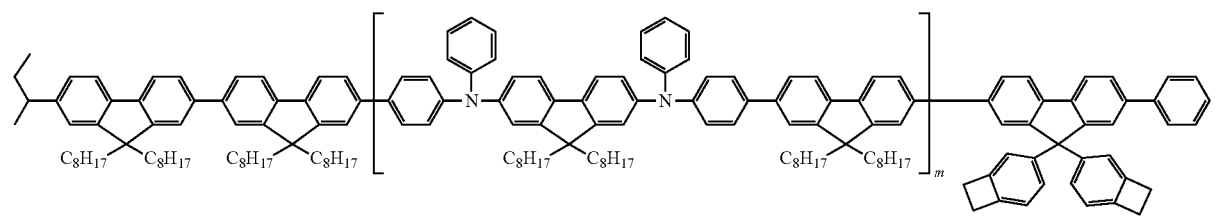
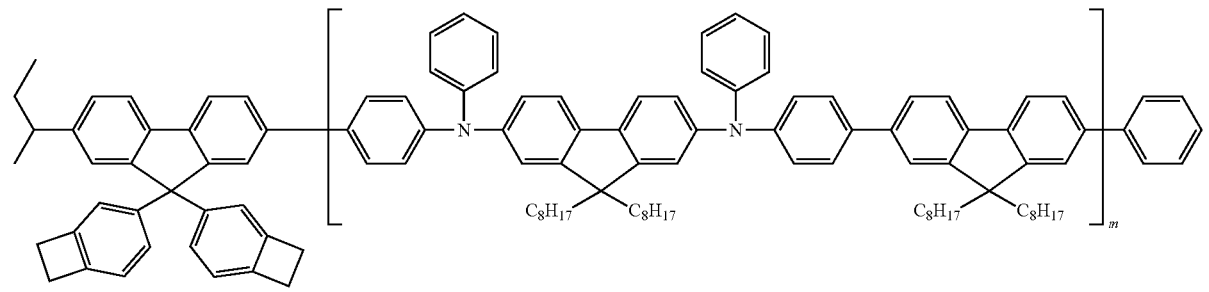

-continued

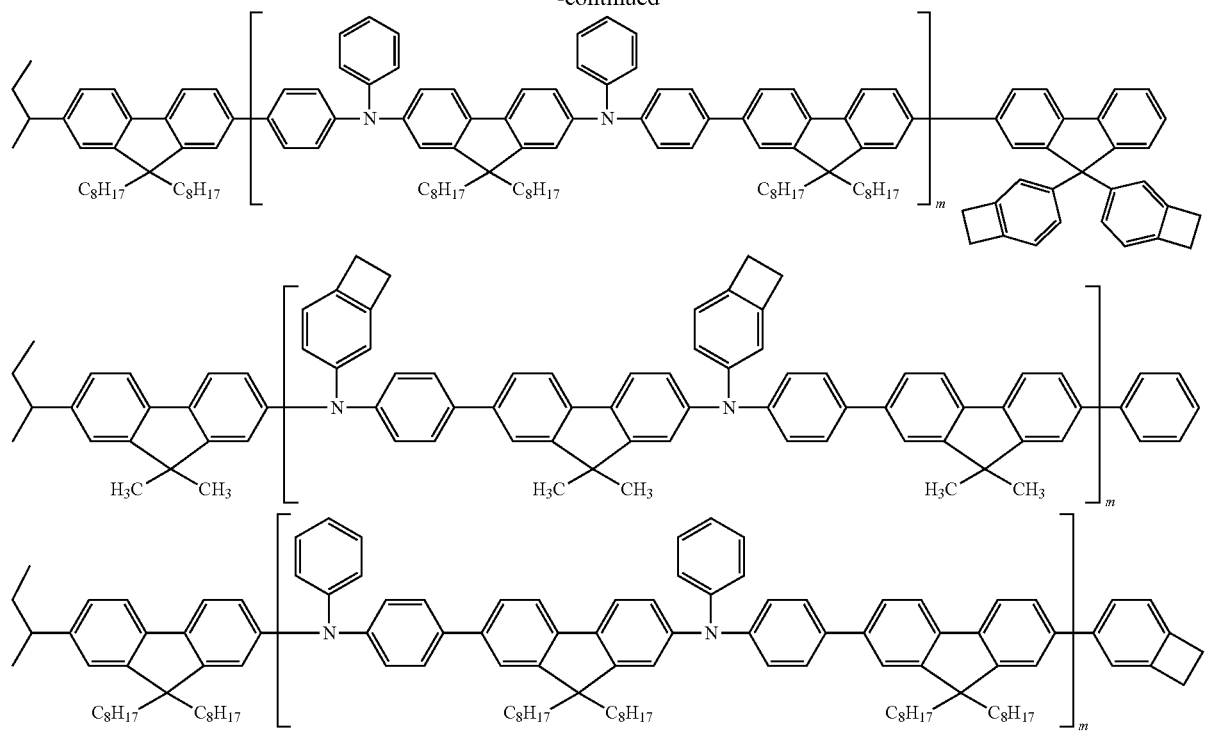

As described above, the polymer compound 2 according to the present embodiment may improve the light emitting life-span of the quantum dot EL device. In addition, the polymer compound 2 according to the present embodiment may also improve a coating film stability by forming the copolymer with the polymerizable comonomer having the cross-linking group. Therefore, it is possible to improve light emitting characteristics and stability when the quantum dot EL device is formed by the laminate structure.

Polymer Compound 3

According to a preferred embodiment of the present invention, the polymer material may include a polymer compound represented by Chemical Formula I or Chemical Formula I' (hereinafter also referred to as "polymer compound 3"). In a more preferred embodiment, the polymer material is polymer compound 3.

1. Definition and Explanation of Terminologies

Before describing the details of the embodiments, some terminologies are defined or explained.

When used in the present embodiment, the term "alkyl" may be, for example, a branched and linear saturated aliphatic hydrocarbon group. Unless specifically stated, the term is also intended to include cyclic groups. Examples of the alkyl group may be methyl, ethyl, propyl, isopropyl, butyl, isobutyl, sec-butyl, tert-butyl, pentyl, isopentyl, neopentyl, cyclopentyl, hexyl, cyclohexyl, isohexyl, and the like. As the term "alkyl", both substituted and unsubstituted hydrocarbon groups may also be mentioned. In some embodiments, the alkyl group may be mono-, di-, and tri-substituted group. One example of a substituted alkyl group is trifluoromethyl. In addition, the other substituted alkyl group is formed of one or a plurality of substituents described in the present embodiment. In some embodiments, the alkyl group has 1 to 20 carbon atoms. In other embodiments, this group has 1 to 6 carbon atoms. The term is intended to include heteroalkyl groups. The heteroalkyl group may have from 1 to 20 carbon atoms.

The term "aryl" means an aromatic carbon ring moiety which may be monocycle or polycycle (bicycle or higher) condensed to each other or linked to each other by a covalent bond. Any desirably ring position of the aryl moiety may be linked by a covalent bond to the defined chemical structure. Examples of the aryl moiety include phenyl, 1-naphthyl, 2-naphthyl, dihydronaphthyl, tetrahydronaphthyl, biphenyl, anthryl, phenanthryl, fluorenyl, indanyl, biphenylenyl, acenaphthenyl, acenaphthylenyl, and the like, but are not limited to. In some embodiments, the aryl group may have 6 to 60 carbon atoms; in some embodiments, may have 6 to 30 carbon atoms. The term is intended to include heteroaryl groups. The heteroaryl group may include 4 to 50 carbon atoms; in some embodiments, 4 to 30 carbon atoms.

The term "alkoxy" is intended to mean the group —OR (wherein, R is alkyl).

The term aryloxy is intended to mean the group —OR (wherein, R is aryl).

Unless specifically mentioned, all groups may be substituted or unsubstituted.

When referring to a layer, material, member, or structure, the term "charge transport" means that such a layer, material, member, or structure promotes transport of charge through the thickness of the member, member, or structure relatively efficiently and with a small charge loss. A hole transporting material promotes positive charges; an electron transporting material promotes negative charges. The light emitting material may also have several charge transport characteristics, but the term "charge transport layer, material, member, or structure" is not intended to include a layer, material, member, or structure whose main function is light emitting.

The term "compound" is a non-charged material composed of molecules that further include an atom, and means a material that cannot separate atoms from their molecules by physical means without destroying the chemical bond. The term is intended to include oligomers and polymers.

The term "cross-linking group" or "cross-linking group" is intended to mean a group capable of causing cross-linking by exposure to heat treatment or radiation. In some embodiments, radiation is UV or visible light.

The prefix "fluoro" is intended to indicate that one of the groups or a plurality of hydrogens is replaced by fluorine.

The prefix "hetero" represents one or a plurality of carbon atoms replaced by another atom. In some embodiments, the heteroatom may be O, N, S, or a combination thereof.

The term "silyl" refers to the group $R_3Si$— (wherein, R is H, D, C1 to C20 alkyl, fluoroalkyl, or aryl). In some embodiments, one or a plurality of carbons of the R alkyl groups is substituted with Si. In some embodiments, the silyl group is $(hexyl)_2Si(Me)CH_2CH_2Si(Me)_2$- and $[CF_3(CF_2)_6CH_2CH_2]_2SiMe$-.

The term "siloxane" means the group $(RO)_3Si$— (wherein, R is H, D, C1 to C20 alkyl, or fluoroalkyl).

The polymer compound 3 has Chemical Formula I or Chemical Formula I':

that the number of the alkyl group in the polymer compound is small in terms of securing a residual film ratio of the hole transport layer.

Therefore, as the alkyl group, a linear or branched C1 to C18 alkyl group is more desirable. The alkyl group may be appropriately selected according to the used quantum dot or the solvent that disperses the quantum dot.

The carbon number of the alkoxy group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkoxy group. This is because the ligand of the quantum dot and the alkoxy group present in the hole transport layer may interact with each other, thereby improving effects such as hole injectability.

In addition, when the solvent that disperses the quantum dot is a long-chain hydrocarbon-based solvent, it is desirable that the number of the alkoxy group in the polymer compound is small in terms of securing a residual film ratio of the hole transport layer.

Therefore, as the alkoxy group, a linear or branched C1 to C18 alkoxy group is more desirable. These alkoxy groups

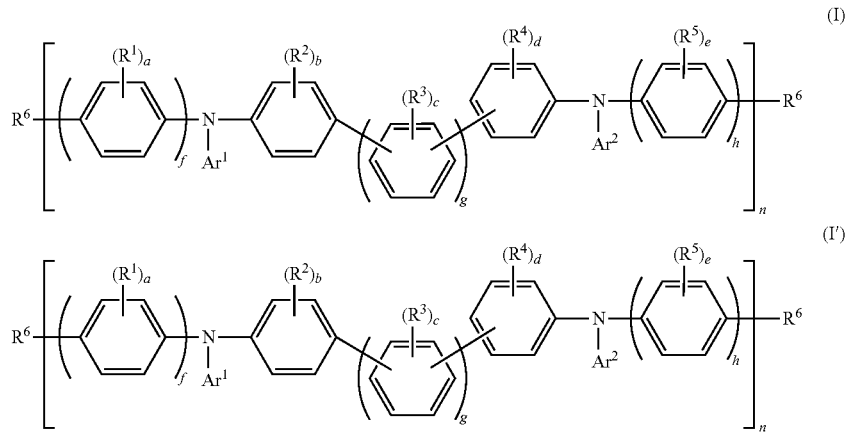

In Chemical Formula I or Chemical Formula I':
$Ar^1$ and $Ar^2$ are the same or different and an aryl group;
$R^1$ to $R^5$ are independently the same or different and are D, F, alkyl, aryl, alkoxy, silyl, or a cross-linking group;
$R^6$ is the same or different and is H, D, or a halogen;
a, b, c, d, and e are independently an integer of 0 to 4;
f is 1 or 2;
g is 0, 1, or 2;
h is 1 or 2; and
n is an integer of greater than 0.

The carbon number of the alkyl group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkyl group. This is because the ligand of the quantum dot and the alkyl group present in the hole transport layer may interact with each other, thereby improving effects such as hole injectability.

In addition, when the solvent that disperses the quantum dot is a long-chain hydrocarbon-based solvent, it is desirable may be appropriately selected according to the used quantum dot or the solvent that disperses the quantum dot.

In some embodiments, n=1 and $R^6$ is a halogen. Such a polymer compound 3 may be useful as a monomer for the formation of a polymer compound. In some embodiments, the halogen is Cl or Br; in some embodiments, Br.

In some embodiments, n=1 and $R^6$ is H or D.

In some embodiments, the polymer compound 3 having Chemical Formula I or Chemical Formula I' may be deuterated. The term "deuterated" is intended to mean that at least one H is replaced by D. The term "deuterated analog" refers to a structure analog of any compound or group in which one or a plurality of available hydrogens are replaced by deuterium. In the deuterated compounds or deuterated analogs, the deuterium is at least 100 times the natural presence level. In some embodiments, the polymer compound 3 is at least 10% deuterated. "% deuterated" or "% deuteration" means a ratio of deuteron relative to a sum of proton and deuteron, expressed as a percentage. In some embodiments, the polymer compound 3 may be at least 20% deuterated; in some embodiments, it may be at least 30% deuterated; in some embodiments, it may be at least 40% deuterated; in some embodiments, it may be at least 50% deuterated; in some embodiments, it may be at least 60% deuterated; in some embodiments, it may be at least 70% deuterated; in some embodiments, it may be at least 80% deuterated; in some embodiments, it may be at least 90% deuterated; and in some embodiments, it may be 100% deuterated.

The deuterated material may be difficult to be decomposed by a hole, an electron, an exciton, or a combination thereof. Deuteration may potentially prevent degradation of compounds during device operation, which may lead to an improvement in device life-span. In general, this improvement is achieved without sacrificing other device characteristics. In addition, deuterated compounds frequently have greater air resistance than non-deuterated analogs. This may result in greater process resistance both in the preparation and purification of materials and in the formation of electronic devices using these materials.

In some embodiments, the polymer compound 3 of Chemical Formula I or Chemical Formula I' may have Chemical Formula Ia, Chemical Formula Ia

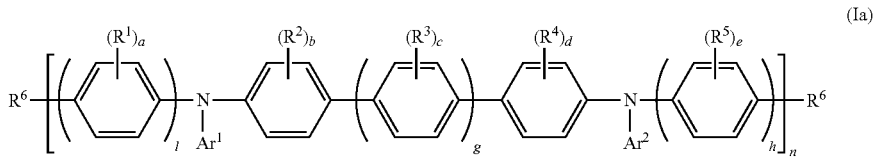

wherein, $R^1$ to $R^6$, $Ar^1$, $Ar^2$, a to h, and n are the same as defined in Chemical Formula I.

In some embodiments, $Ar^1$ and $Ar^2$ are aryl groups having no condensed ring. In some embodiments, $Ar^1$ and $Ar^2$ has Chemical Formula a, Chemical Formula a

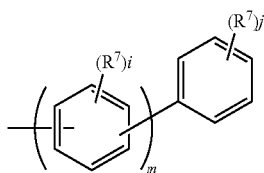

wherein:
$R^7$ is the same or different and is D, alkyl, alkoxy, siloxane, and silyl;
i is the same or different and is an integer of 1 to 4;
j is an integer of 0 to 5; and
m is an integer of 1 to 5.

The carbon number of the alkyl group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkyl group. This is because the ligand of the quantum dot and the alkyl group present in the hole transport layer may interact with each other, thereby improving effects such as hole injectability.

In addition, when the solvent that disperses the quantum dot is a long-chain hydrocarbon-based solvent, it is desirable that the number of the alkyl group in the polymer compound is small in terms of securing a residual film ratio of the hole transport layer.

Therefore, as the alkyl group, a linear or branched C1 to C18 alkyl group is more desirable. The alkyl group may be appropriately selected according to the used quantum dot or the solvent that disperses the quantum dot.

The carbon number of the alkoxy group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkoxy group. This is because the ligand of the quantum dot and the alkoxy group present in the hole transport layer may interact with each other, thereby improving effects such as hole injectability.

In addition, when the solvent that disperses the quantum dot is a long-chain hydrocarbon-based solvent, it is desirable that the number of the alkoxy group in the polymer compound is small in terms of securing a residual film ratio of the hole transport layer.

Therefore, as the alkoxy group, a linear or branched C1 to C18 alkoxy group is more desirable. These alkoxy groups may be appropriately selected according to the used quantum dot or the solvent that disperses the quantum dot.

In some embodiments, $Ar^1$ and $Ar^2$ may have Chemical Formula b,

Chemical Formula b

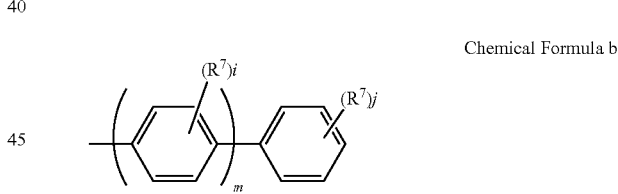

wherein:
$R^7$ is the same or different and is D, alkyl, alkoxy, siloxane, and silyl;
i is the same or different and is an integer of 1 to 4;
j is an integer of 0 to 5; and
m is an integer of 1 to 5.

The carbon number of the alkyl group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkyl group. This is because the ligand of the quantum dot and the alkyl group present in the hole transport layer may interact with each other, thereby improving effects such as hole injectability.

In addition, when the solvent that disperses the quantum dot is a long-chain hydrocarbon-based solvent, it is desirable that the number of the alkyl group in the polymer compound is small in terms of securing a residual film ratio of the hole transport layer.

Therefore, as the alkyl group, a linear or branched C1 to C18 alkyl group is more desirable. The alkyl group may be appropriately selected according to the used quantum dot or the solvent that disperses the quantum dot.

The carbon number of the alkoxy group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkoxy group. This is because the ligand of the quantum dot and the alkoxy group present in the hole transport layer may interact with each other, thereby improving effects such as hole injectability.

In addition, when the solvent that disperses the quantum dot is a long-chain hydrocarbon-based solvent, it is desirable that the number of the alkoxy group in the polymer compound is small in terms of securing a residual film ratio of the hole transport layer.

Therefore, as the alkoxy group, a linear or branched C1 to C18 alkoxy group is more desirable. These alkoxy groups may be appropriately selected according to the used quantum dot or the solvent that disperses the quantum dot.

In an embodiment having Chemical Formulae a and b, at least one of i and j is not zero. In some embodiments, m=1 to 3.

In some embodiments, $Ar^1$ and $Ar^2$ are phenyl, biphenyl, terphenyl, deuterated derivatives thereof, and derivatives thereof having one or more substituents such as alkyl, alkoxy, silyl, or cross-linking groups.

In some embodiments, $R^1$ to $R^5$ are D or C1 to C10 alkyl. In some embodiments, the alkyl group may be deuterated.

In some embodiments, a=e=0. In some embodiments, a=e=4 and $R^1$ and $R^5$ are D.

In some embodiments, b>0 and at least one $R^2$ is alkyl. In some embodiments, the alkyl group may be deuterated. In some embodiments, b=4 and one $R^2$ is alkyl and the remainder is D.

In some embodiments, c>0 and at least one $R^3$ is alkyl. In some embodiments, the alkyl group may be deuterated. In some embodiments, c=4 and one $R^3$ is alkyl and the remainder is D.

In some embodiments, c=4, two $R^3$'s are alkyl and two $R^3$'s are D.

In some embodiments, d>0 and at least one $R^4$ is alkyl. In some embodiments, the alkyl group may be deuterated. In some embodiments, d=4, one $R^4$ is alkyl and the remainder is D.

In some embodiments, f=h=2.

In some embodiments, g=1.

The carbon number of the alkyl group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkyl group. This is because the ligand of the quantum dot and the alkyl group present in the hole transport layer may interact with each other, thereby improving effects such as hole injectability.

In addition, when the solvent that disperses the quantum dot is a long-chain hydrocarbon-based solvent, it is desirable that the number of the alkyl group in the polymer compound is small in terms of securing a residual film ratio of the hole transport layer.

Therefore, as the alkyl group, a linear or branched C1 to C18 alkyl group is more desirable. The alkyl group may be appropriately selected according to the used quantum dot or the solvent that disperses the quantum dot.

The carbon number of the alkoxy group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkoxy group. This is because the ligand of the quantum dot and the alkoxy group present in the hole transport layer may interact with each other, thereby improving effects such as hole injectability.

In addition, when the solvent that disperses the quantum dot is a long-chain hydrocarbon-based solvent, it is desirable that the number of the alkoxy group in the polymer compound is small in terms of securing a residual film ratio of the hole transport layer.

Therefore, as the alkoxy group, a linear or branched C1 to C18 alkoxy group is more desirable. These alkoxy groups may be appropriately selected according to the used quantum dot or the solvent that disperses the quantum dot.

In some embodiments, the polymer compound 3 having Chemical Formula I or Chemical Formula I' has high triplet energy. The term "triplet energy" means the lowest excitation triplet state of a material as an eV unit. The triplet energy is reported as a positive number and represents the energy of the triplet state with respect to the ground state, usually the singlet state. The light emitting organic metal material emits light from an exited state having mixed singlet and triplet characteristics, and is referred to as "phosphorescence" in the present embodiment. When an organic metal phosphorescent material is used in the light emitting layer, the presence of a material having a low triplet energy causes quenching of energy phosphorescent radiation exceeding 2.0 eV. This leads to deteriorated efficiency. The quenching may occur when a material such as a host material, and the like, are in an electroluminescent layer, or in a layer adjacent to the electroluminescent layer such as a hole transport layer, and the like. In some embodiments, a material having Chemical Formula I or Chemical Formula I' has a triplet energy level greater than about 2.1 eV; in some embodiments, it has a triplet energy level greater than about 2.2 eV; in some embodiments, it has a triplet energy level greater than about 2.45 eV; and in some embodiments, it has a triplet energy level greater than about 2.6 eV. The triplet energy may be calculated deductively, or may be measured using pulse radiation decomposition or low temperature luminescence spectroscopy, or either.

Some non-limiting examples of the polymer compound 3 having Chemical Formula I or Chemical Formula I' include the following compounds R to EE.

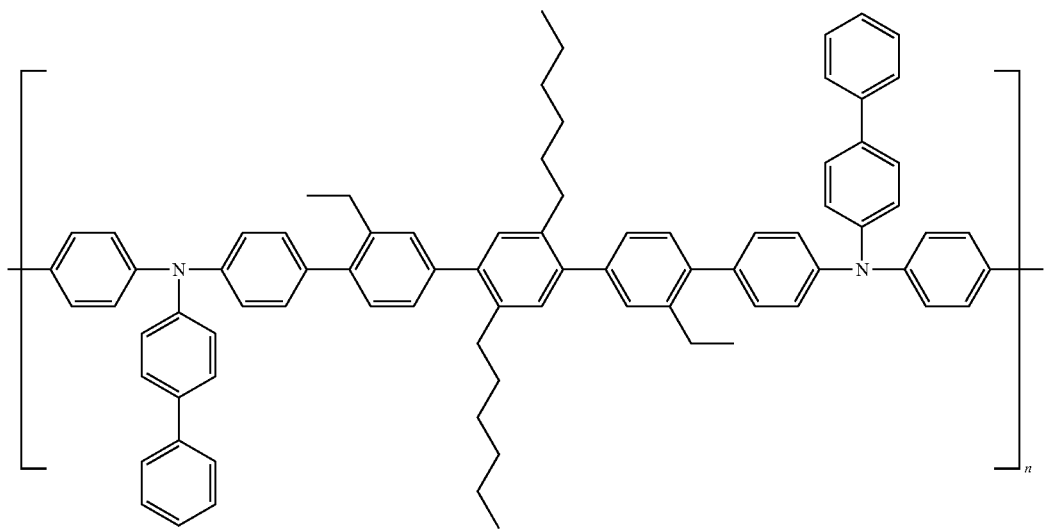
Compound R
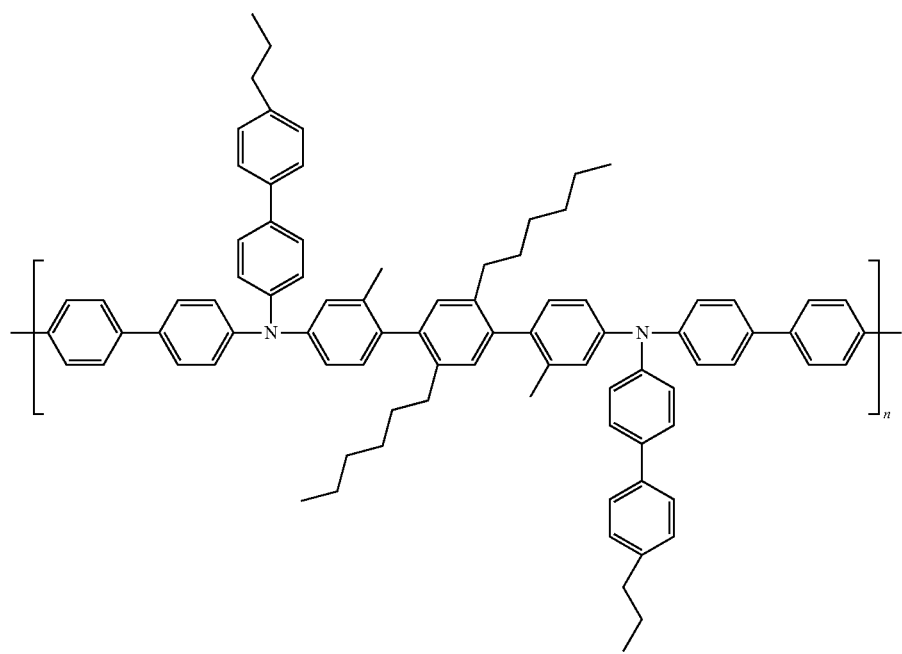
Compound S

Compound T
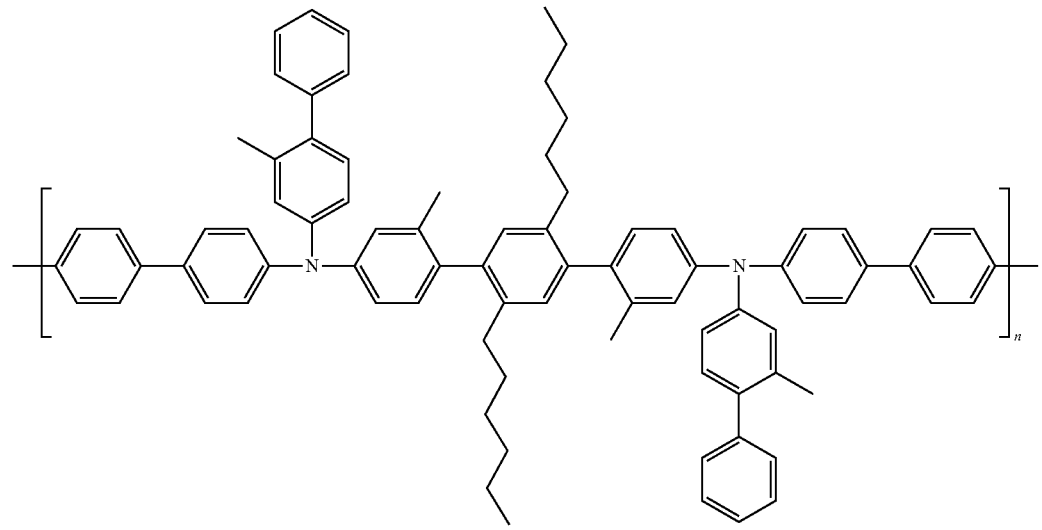
Compound U
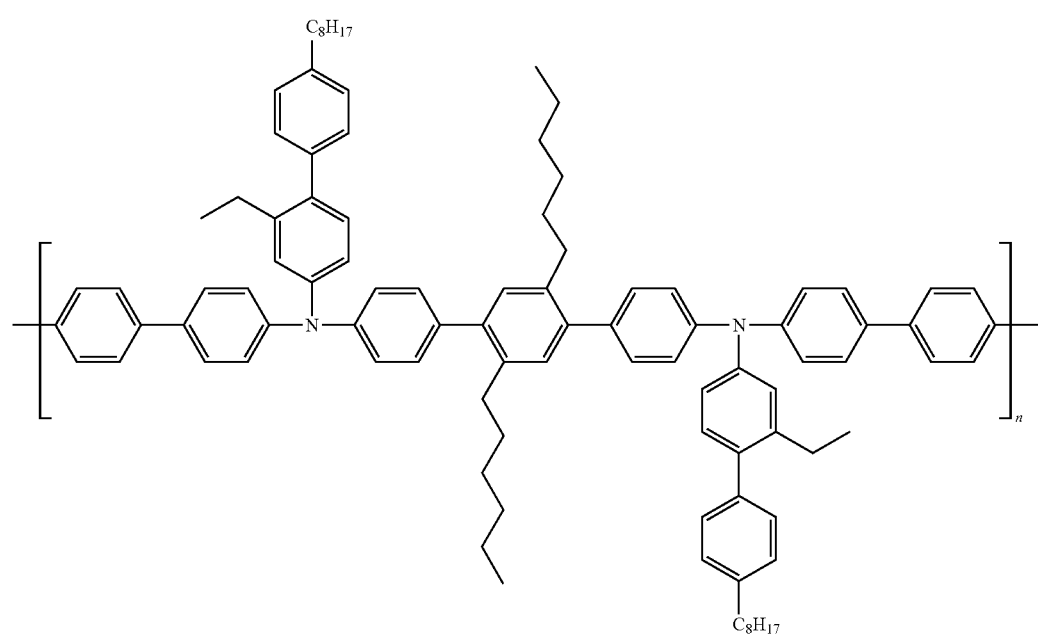
Compound V
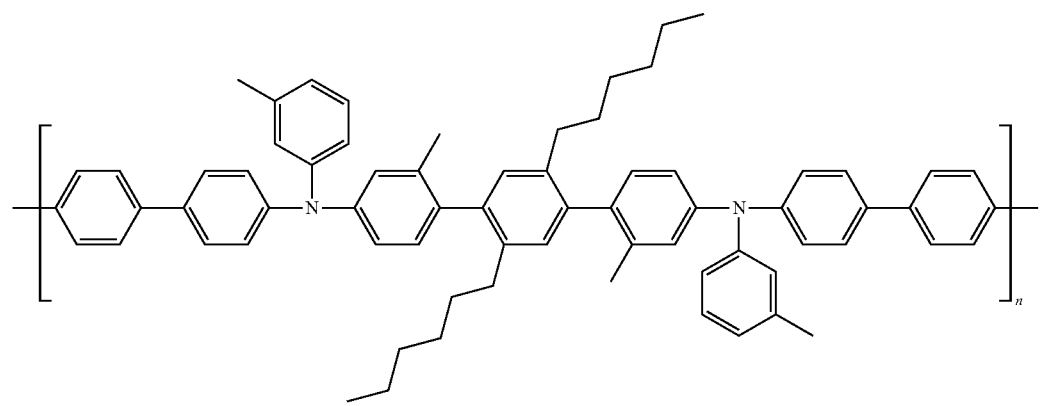

Compound W
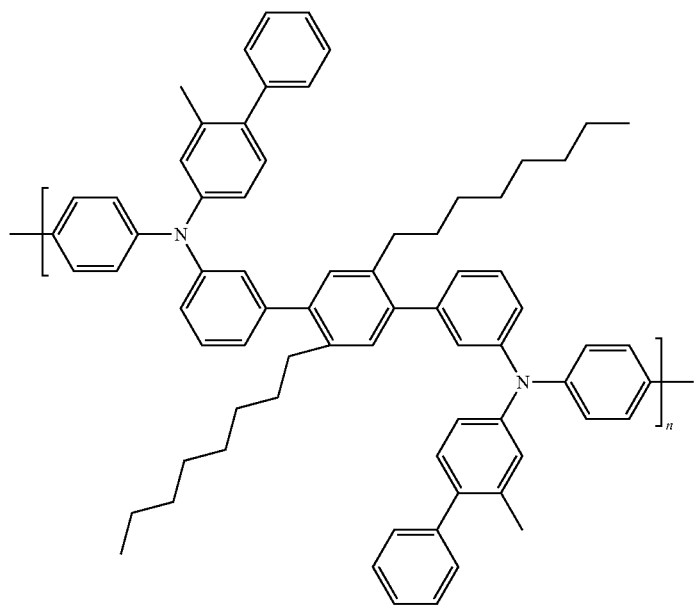
Compound X
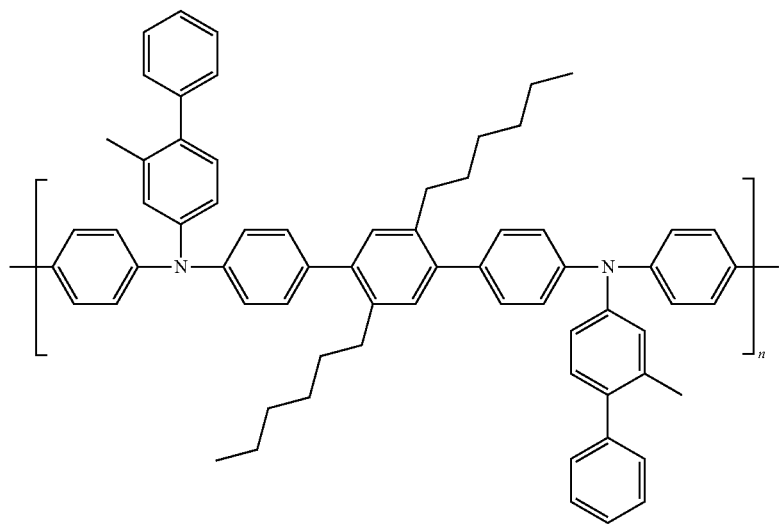

-continued
Compound Y
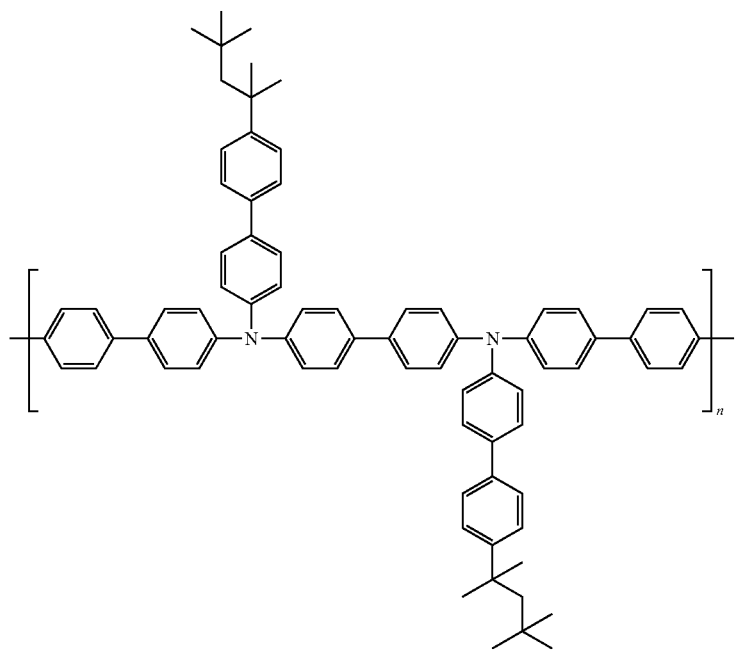
Compound Z
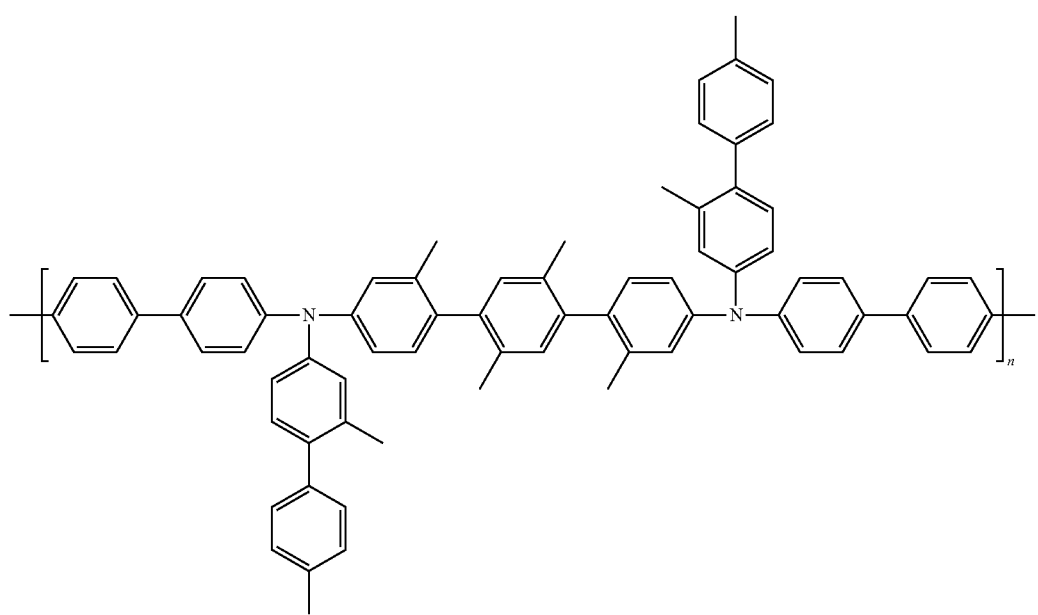

-continued
Compound AA
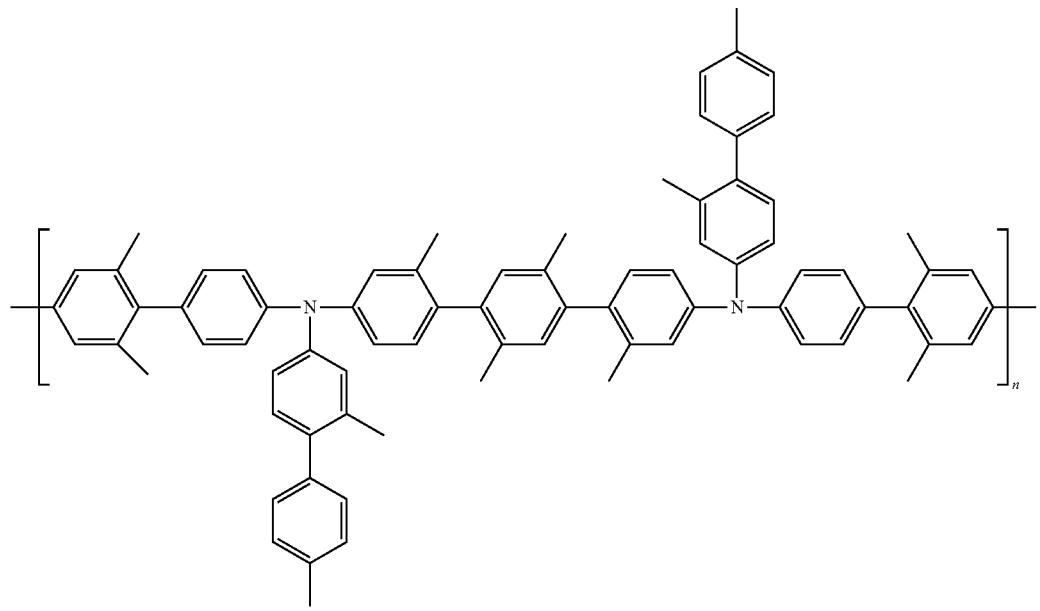
Compound BB
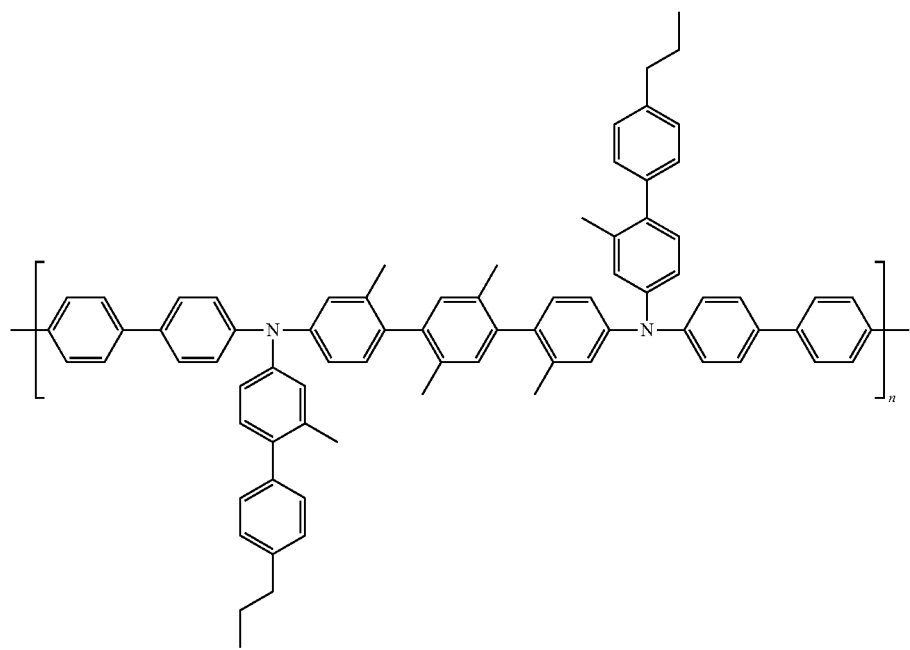

-continued
Compound CC
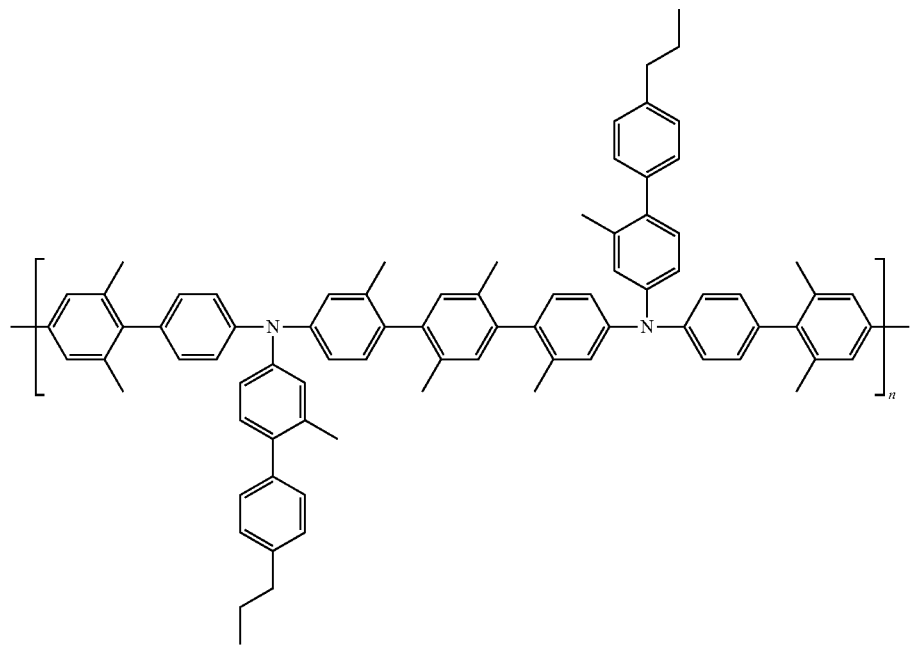
Compound DD
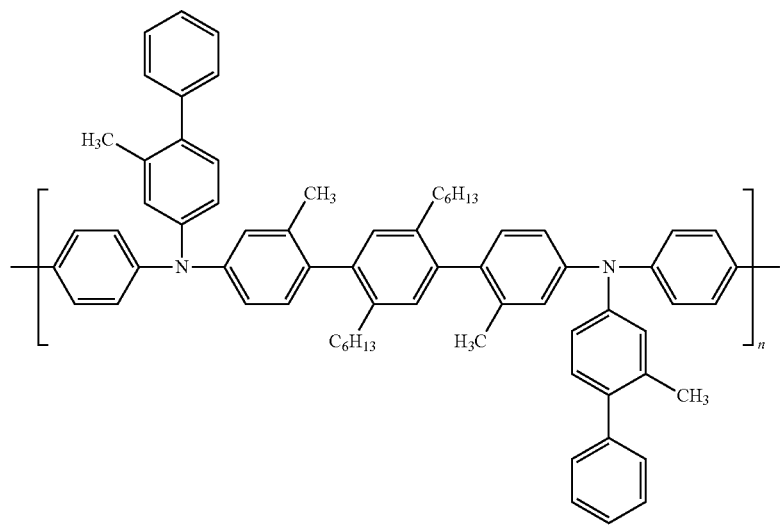

Compound EE

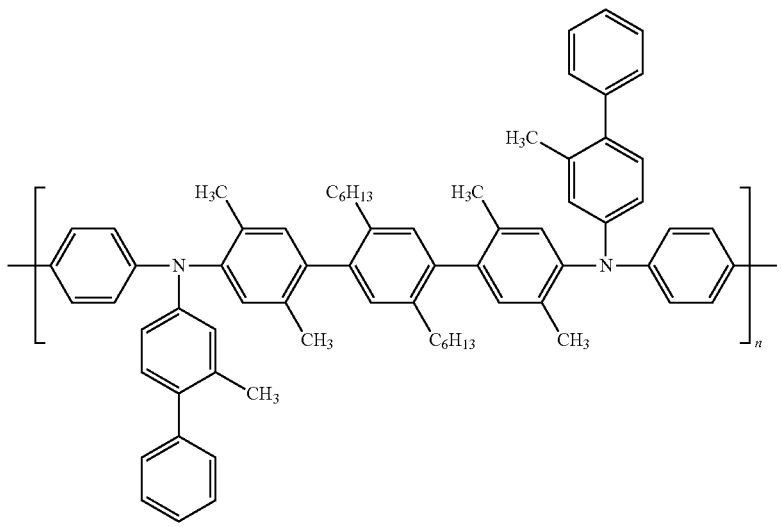

The polymer compound 3 may be prepared using any technique that produces C—C or C—N bonds. Various techniques such as Suzuki, Yamamoto, Stille, and Pd- or Ni-catalyzed C—N coupling, and the like are known. The deuterated compound may be prepared in a similar manner using a deuterated precursor material or may be more generally prepared by treating a non-deuterated compound with a deuterated solvent such as d6-benzene under the presence of a Lewis acid H/D exchange catalyst, such as aluminum trichloride or ethyl aluminum dichloride, and the like.

The polymer compound 3 of the present embodiment may be used as a hole transporting material, as an electroluminescent material and as a host for an electroluminescent material. This polymer compound 3 has similar hole mobility and HOMO/LUMO energy as the efficient small molecular hole transport compound such as N, N'-diphenyl-N, N'-bis (3-methylphenyl)-[1,1'-biphenyl]-4,4'-diamine (TPD)

The compound such as TPD should be generally applied using deposition techniques.

Polymer Compound 4

According to the preferred embodiment of the present disclosure, the polymer material includes a polymer compound represented by Chemical Formula I (hereinafter also referred to as "polymer compound 4"). In a more preferred embodiment, the polymer material is polymer compound 4.

The polymer compound 4 may be represented by Chemical Formula I-2:

Chemical Formula I-2

(I-2)

In the chemical formula,

A is a monomer unit including at least one triarylamine group,

B' is a monomer unit having at least three linking points in the copolymer,

C' is an aromatic monomer unit or its deuterated analog,

E is the same or different and is independently H, D, a halide, an alkyl group, a silyl group, a germanyl group, an aryl group, an arylamino group, a siloxane group, a cross-linking group, a deuterated alkyl group, a deuterated silyl group, a deuterated germanyl group, a deuterated aryl group, a deuterated arylamino group, a deuterated siloxane group, or a deuterated cross-linking group, and a, b, and c are mole fractions, the same or different, $a+b+c=1$, and a and b are not zero.

Chemical Formula I-2 may be represented by Chemical Formula I-2'.

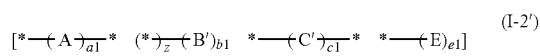
(I-2')

In Chemical Formula I-2', a1, b1, c1, and e1 satisfy $a1+b1+c1+e1=1$ and a1 and b1 are mole fractions of reactive monomers which are not zero, z is an integer of 3 or more,

* represents a linking point in the copolymer, and

A, B', C', and E are the same as defined above.

The monomer units A, B', and C' are all different.

The monomer units A, B', and C' may independently have a substituent D, F, CN, an alkyl group, a fluoroalkyl group, an aryl group, a heteroaryl group, an amino group, a silyl group, a germanyl group, an alkoxy group, an aryloxy group, a fluoroalkoxy group, a siloxane group, a siloxy group, a deuterated alkyl group, a deuterated partly fluorinated alkyl group, a deuterated aryl group, a deuterated heteroaryl group, a deuterated amino group, a deuterated silyl group, a deuterated germanyl group, a deuterated alkoxy group, a deuterated aryloxy group, a deuterated fluoroalkoxy group, a deuterated siloxane group, a deuterated siloxy group, and a cross-linking group, and a combination thereof.

When E is not H, D, or a halide, E may have a substituent D, F, CN, an alkyl group, a fluoroalkyl group, an aryl group, a heteroaryl group, an amino group, a silyl group, a germanyl group, an alkoxy group, an aryloxy group, a fluoroalkoxy group, a siloxane group, a siloxy group, a deuterated alkyl group, a deuterated partly fluorinated alkyl group, a deuterated aryl group, a deuterated heteroaryl group, a deuterated amino group, a deuterated silyl group, a deuterated germanyl group, a deuterated alkoxy group, a deuterated aryloxy group, a deuterated fluoroalkoxy group, a deuterated siloxane group, a deuterated siloxy group, and a cross-linking group, and a combination thereof.

All embodiments of A, B', C' and E described in Chemical Formula I-2 are applied to Chemical Formula I-2' in the same manner.

In some embodiments of Chemical Formula I-2, A, B, and optional C are controlled as a regular alternate pattern.

In some embodiments of Chemical Formula I-2, A, B, and optional C are controlled as a block of homogeneous monomers.

In some embodiments of Chemical Formula I-2, A, B', and optional C are randomly disposed.

The carbon number of the alkyl group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkyl group. This is because the ligand of the quantum dot and the alkyl group present in the hole transport layer may interact with each other, thereby improving effects such as hole injectability.

In addition, when the solvent that disperses the quantum dot is a long-chain hydrocarbon-based solvent, it is desirable that the number of the alkyl group in the polymer compound is small in terms of securing a residual film ratio of the hole transport layer.

Therefore, as the alkyl group, a linear or branched C1 to C18 alkyl group is more desirable. The alkyl group may be appropriately selected according to the used quantum dot or the solvent that disperses the quantum dot.

The carbon number of the alkoxy group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkoxy group. This is because the ligand of the quantum dot and the alkoxy group present in the hole transport layer may interact with each other, thereby improving effects such as hole injectability.

In addition, when the solvent that disperses the quantum dot is a long-chain hydrocarbon-based solvent, it is desirable that the number of the alkoxy group in the polymer compound is small in terms of securing a residual film ratio of the hole transport layer.

Therefore, as the alkoxy group, a linear or branched C1 to C18 alkoxy group is more desirable. These alkoxy groups may be appropriately selected according to the used quantum dot or the solvent that disperses the quantum dot.

In some embodiments, distributions of monomer segments may be manipulated to optimize properties of the compounds represented by Chemical Formula I-2 for use in electronic devices. In some embodiments, different distributions may result in different degrees of discontinuous packing that ultimately determines the involved film forming properties.

In some embodiments, the copolymer represented by Chemical Formula I-2 may be deuterated. The term "deuterated" is intended to mean that at least one hydrogen ("H") is replaced by deuterium ("D"). The term "deuterated analog" refers to a structure analog of any compound or group in which one or more available hydrogens are replaced by deuterium. In the deuterated copolymer or the deuterated analog, the deuterium is at least 100 times the natural presence level. In some embodiments, the copolymer is at least 10% deuterated. "% deuterated" means a ratio of deuteron relative to a sum of proton and deuteron, expressed as a percentage. In some embodiments, the copolymer is at least 10% deuterated. In some embodiments, the polymer compound 3 may be at least 20% deuterated; in some embodiments, it may be at least 30% deuterated; in some embodiments, it may be at least 40% deuterated; in some embodiments, it may be at least 50% deuterated; in some embodiments, it may be at least 60% deuterated; in some embodiments, it may be at least 70% deuterated; in some embodiments, it may be at least 80% deuterated; in some embodiments, it may be at least 90% deuterated; and in some embodiments, it may be 100% deuterated.

The deuterium may be present in one or more of monomer units A, 13', and C'. The deuterium may be present in the copolymer main chain, pendant groups, or both.

The monomer unit A is an aromatic monomer unit including at least one triarylamino group.

The monomer unit A is a bifunctional monomer unit and has only two linking points in the copolymer.

In some embodiments, the monomer unit A may be represented by Chemical Formula II.

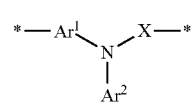

(II)

In the chemical formula, $Ar^1$ is the same or different and is independently an aryl group or a deuterated aryl group;

$Ar^2$ is the same or different and is independently an aryl group or a deuterated aryl group;

X is the same or different and is independently a single bond, an aryl group, and a deuterated aryl group; and

* indicates a linking point in the copolymer.

In some embodiments, the monomer unit A may be represented by Chemical Formula III.

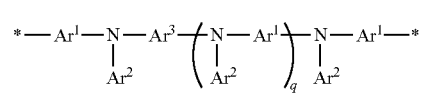

(III)

In the chemical formula, $Ar^1$ is the same or different and is independently an aryl group or a deuterated aryl group;

$Ar^2$ is the same or different and is independently an aryl group or a deuterated aryl group;

$Ar^3$ is the same or different and is independently an aryl group or a deuterated aryl group;

q is an integer of greater than or equal to 0; and

* indicates a linking point in the copolymer.

In some embodiments, the monomer unit A may be represented by Chemical Formula III-a.

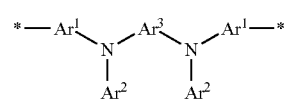

(III-a)

In the chemical formula, $Ar^1$, $Ar^2$, $Ar^3$, and * are the same as defined in Chemical Formula III.

In some embodiments, the monomer unit A may be represented by Chemical Formula III-b.

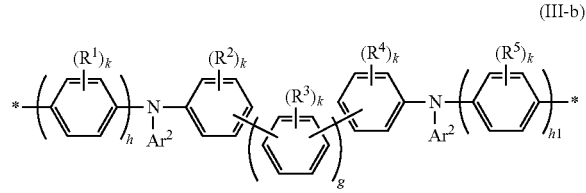

(III-b)

In the chemical formula, $Ar^2$ is the same or different and is independently an aryl group or a deuterated aryl group;

$R^1$ to $R^5$ are the same or different and are independently D, F, CN, an alkyl group, a fluoroalkyl group, an aryl group, a heteroaryl group, an amino group, a silyl group, a germanyl group, an alkoxy group, an aryloxy group, a fluoroalkoxy group, a siloxane group, a siloxy group, a deuterated alkyl group, a deuterated partly fluorinated alkyl group, a deuterated aryl group, a deuterated heteroaryl group, a deuterated amino group, a deuterated silyl group, a deuterated germanyl group, a deuterated alkoxy group, a deuterated aryloxy group, a deuterated fluoroalkoxy group, a deuterated siloxane group, a deuterated siloxy group, and a cross-linking group, or adjacent $R^1$'s or adjacent $R^5$'s are linked to each other to form a condensed 5-membered or 6-membered ring;

k is the same or different and is independently an integer of 0 to 4;

g is an integer of 0 to 3;

h and h1 are the same or different and are independently 1 or 2; and

* indicates a linking point in the copolymer.

The carbon number of the alkyl group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkyl group. This is because the ligand of the quantum dot and the alkyl group present in the hole transport layer may interact with each other, thereby improving effects such as hole injectability.

In addition, when the solvent that disperses the quantum dot is a long-chain hydrocarbon-based solvent, it is desirable that the number of the alkyl group in the polymer compound is small in terms of securing a residual film ratio of the hole transport layer.

Therefore, as the alkyl group, a linear or branched C1 to C18 alkyl group is more desirable. The alkyl group may be appropriately selected according to the used quantum dot or the solvent that disperses the quantum dot.

The carbon number of the alkoxy group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkoxy group. This is because the ligand of the quantum dot and the alkoxy group present in the hole transport layer may interact with each other, thereby improving effects such as hole injectability.

In addition, when the solvent that disperses the quantum dot is a long-chain hydrocarbon-based solvent, it is desirable that the number of the alkoxy group in the polymer compound is small in terms of securing a residual film ratio of the hole transport layer.

Therefore, as the alkoxy group, a linear or branched C1 to C18 alkoxy group is more desirable. These alkoxy groups may be appropriately selected according to the used quantum dot or the solvent that disperses the quantum dot.

In some embodiments, the monomer unit A may be represented by Chemical Formula IV.

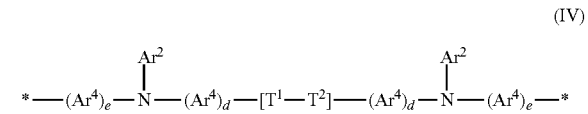

(IV)

In the chemical formula, $Ar^2$ is the same or different and is independently an aryl group or a deuterated aryl group;

$Ar^4$ is the same or different and is independently phenylene, substituted phenylene, naphthylene, substituted naphthylene, and a deuterated analog thereof;

$T^1$ and $T^2$ are the same or different and are independently a conjugated moiety linked as a non-planar structure or a deuterated analog thereof;

d is the same or different and is independently an integer of 1 to 6, e is the same or different and is independently an integer of 1 to 6, and

* indicates a linking point in the copolymer.

In some embodiments, the monomer unit A may be represented by Chemical Formula V-a or Chemical Formula V-b.

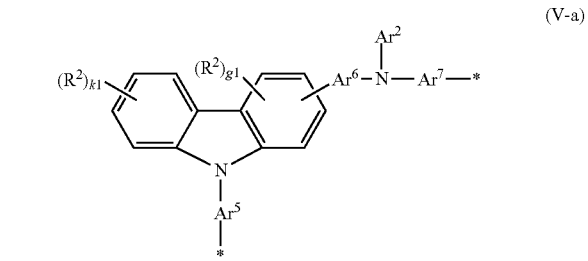

(V-a)

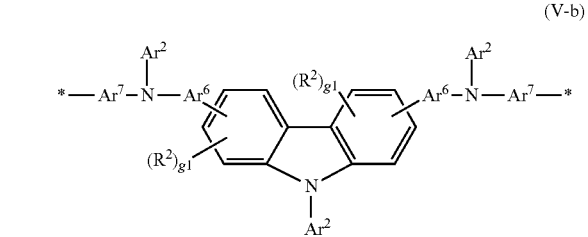

(V-b)

In the chemical formula, $Ar^2$ is an aryl group or a deuterated aryl group;

$Ar^5$, $Ar^6$, and $Ar^7$ are the same or different and are independently an aryl group or a deuterated aryl group;

$R^1$ and $R^2$ are the same or different and are independently D, F, CN, an alkyl group, a fluoroalkyl group, an aryl group, a heteroaryl group, an amino group, a silyl group, a germanyl group, an alkoxy group, an aryloxy group, a fluoroalkoxy group, a siloxane group, a siloxy group, a deuterated alkyl group, a deuterated partly fluorinated alkyl group, a deuterated aryl group, a deuterated heteroaryl group, a deuterated amino group, a deuterated silyl group, a deuterated germanyl group, a deuterated alkoxy group, a deuterated aryloxy group, a deuterated fluoroalkoxy group, a deuterated siloxane group, a deuterated siloxy group, and a cross-linking group, or adjacent groups $R^1$ and $R^2$ are linked to form a condensed ring;

k1 is an integer of 0 to 4;

g1 is the same or different and is independently an integer of 0 to 3; and

* indicates a linking point in the copolymer.

The carbon number of the alkyl group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkyl group. This is because the ligand of the quantum dot and the alkyl group present in the hole transport layer may interact with each other, thereby improving effects such as hole injectability.

In addition, when the solvent that disperses the quantum dot is a long-chain hydrocarbon-based solvent, it is desirable that the number of the alkyl group in the polymer compound is small in terms of securing a residual film ratio of the hole transport layer.

Therefore, as the alkyl group, a linear or branched C1 to C18 alkyl group is more desirable. The alkyl group may be appropriately selected according to the used quantum dot or the solvent that disperses the quantum dot.

The carbon number of the alkoxy group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkoxy group. This is because the ligand of the quantum dot and the alkoxy group present in the hole transport layer may interact with each other, thereby improving effects such as hole injectability.

In addition, when the solvent that disperses the quantum dot is a long-chain hydrocarbon-based solvent, it is desirable that the number of the alkoxy group in the polymer compound is small in terms of securing a residual film ratio of the hole transport layer.

Therefore, as the alkoxy group, a linear or branched C1 to C18 alkoxy group is more desirable. These alkoxy groups may be appropriately selected according to the used quantum dot or the solvent that disperses the quantum dot.

In some embodiments of the chemical formula, $Ar^1$ is an aryl group having at least one condensed ring.

In some embodiments of the chemical formula, $Ar^1$ may be a naphthyl group, an anthracenyl group, a naphthylphenyl group, a phenylnaphthyl group, a fluorenyl group, and a substituted derivative thereof, and a deuterated derivative thereof.

In some embodiments of the chemical formula, $Ar^1$ may be an aryl group without a condensed ring.

In some embodiments of the chemical formula, $Ar^1$ may be an aryl group or a substituted aryl group.

In some embodiments of the chemical formula, $Ar^1$ has at least one substituent of D, F, CN, an alkyl group, a fluoroalkyl group, an aryl group, a heteroaryl group, an amino group, a silyl group, a germanyl group, an alkoxy group, an aryloxy group, a fluoroalkoxy group, a siloxane group, a siloxy group, a cross-linking group, a deuterated alkyl group, a deuterated partly fluorinated alkyl group, a deuterated aryl group, a deuterated heteroaryl group, a deuterated amino group, a deuterated silyl group, a deuterated germanyl group, a deuterated alkoxy group, a deuterated aryloxy group, a deuterated fluoroalkoxy group, a deuterated siloxane group, a deuterated siloxy group, or deuterated cross-linking group. In some embodiments, the substituent is D, an alkyl group, an arylamino group, a hydrocarbon aryl group, a deuterated alkyl group, a deuterated arylamino group, or a deuterated hydrocarbon aryl group.

In some embodiments of the chemical formula, $Ar^1$ is a hydrocarbon aryl group.

In some embodiments of the chemical formula, $Ar^1$ is a heteroaryl group.

In some embodiments of the chemical formula, $Ar^1$ is represented by Chemical Formula a.

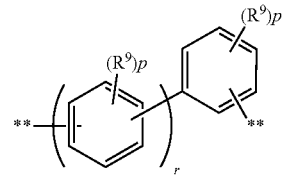

Chemical Formula a

In the chemical formula, $R^9$ is the same or different and is independently D, an alkyl group, an alkoxy group, a silyl group, a germanyl group, and a substituted derivative thereof, and a deuterated analog thereof or adjacent $R^9$'s are linked to each other to form a condensed ring;

ρ is the same or different and is independently an integer 0 to 4;

r is an integer of 1 to 5; and

** indicates a linking point.

The carbon number of the alkyl group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkyl group. This is because the ligand of the quantum dot and the alkyl group present in the hole transport layer may interact with each other, thereby improving effects such as hole injectability.

In addition, when the solvent that disperses the quantum dot is a long-chain hydrocarbon-based solvent, it is desirable that the number of the alkyl group in the polymer compound is small in terms of securing a residual film ratio of the hole transport layer.

Therefore, as the alkyl group, a linear or branched C1 to C18 alkyl group is more desirable. The alkyl group may be appropriately selected according to the used quantum dot or the solvent that disperses the quantum dot.

The carbon number of the alkoxy group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkoxy group. This is because the ligand of the quantum dot and the alkoxy group present in the hole transport layer may interact with each other, thereby improving effects such as hole injectability.

In addition, when the solvent that disperses the quantum dot is a long-chain hydrocarbon-based solvent, it is desirable that the number of the alkoxy group in the polymer compound is small in terms of securing a residual film ratio of the hole transport layer.

Therefore, as the alkoxy group, a linear or branched C1 to C18 alkoxy group is more desirable. These alkoxy groups may be appropriately selected according to the used quantum dot or the solvent that disperses the quantum dot.

In some embodiments of the above chemical formula, $Ar^1$ may be represented by Chemical Formula b.

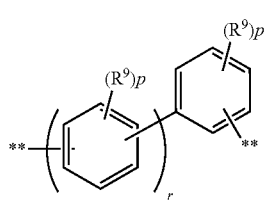

Chemical Formula b

In the chemical formula, $R^9$, p, r, and ** are the same as those defined in Chemical Formula a.

In some embodiments of the chemical formula, $Ar^1$ may be represented by Chemical Formula c.

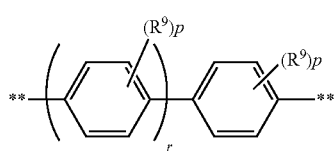

Chemical Formula c

In the chemical formula, $R^9$, p, r, and ** are the same as those defined in Chemical Formula a.

In some embodiments of the chemical formula, $Ar^1$ is a phenyl group, a biphenyl group, a terphenyl group, a 1-naphthyl group, a 2-naphthyl group, an anthracenyl group, a fluorenyl group, and a deuterated analog thereof, and derivatives having at least one substituent being a fluoro group, an alkyl group, an alkoxy group, a silyl group, a germanyl group, a siloxy group, or a cross-linking group, or a deuterated analog thereof.

The carbon number of the alkyl group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkyl group. This is because the ligand of the quantum dot and the alkyl group present in the hole transport layer may interact with each other, thereby improving effects such as hole injectability.

In addition, when the solvent that disperses the quantum dot is a long-chain hydrocarbon-based solvent, it is desirable that the number of the alkyl group in the polymer compound is small in terms of securing a residual film ratio of the hole transport layer.

Therefore, as the alkyl group, a linear or branched C1 to C18 alkyl group is more desirable. The alkyl group may be appropriately selected according to the used quantum dot or the solvent that disperses the quantum dot.

The carbon number of the alkoxy group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkoxy group. This is because the ligand of the quantum dot and the alkoxy group present in the hole transport layer may interact with each other, thereby improving effects such as hole injectability.

In addition, when the solvent that disperses the quantum dot is a long-chain hydrocarbon-based solvent, it is desirable that the number of the alkoxy group in the polymer compound is small in terms of securing a residual film ratio of the hole transport layer.

Therefore, as the alkoxy group, a linear or branched C1 to C18 alkoxy group is more desirable. These alkoxy groups may be appropriately selected according to the used quantum dot or the solvent that disperses the quantum dot.

All embodiments of $Ar^1$ are applied to $Ar^3$, $Ar^5$, $Ar^6$, and $Ar^7$ in the same manner.

In some embodiments of the chemical formula, $Ar^2$ may be an aryl group having at least one condensed ring.

In some embodiments of the chemical formula, $Ar^2$ is a naphthyl group, an anthracenyl group, a naphthylphenyl group, a phenylnaphthyl group, a fluorenyl group, and a substituted derivative thereof, or a deuterated derivative thereof.

In some embodiments of the chemical formula, $Ar^2$ is an aryl group without condensed ring.

In some embodiments of the chemical formula, $Ar^2$ may be an aryl group or a substituted aryl group.

In some embodiments of the chemical formula, $Ar^2$ may be a hydrocarbon aryl group.

In some embodiments of the chemical formula, $Ar^2$ may be a heteroaryl group.

In some embodiments of the chemical formula, $Ar^2$ may be represented by Chemical Formula d.

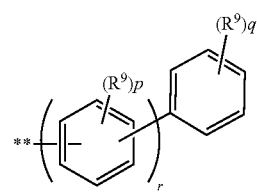

Chemical Formula d $R^9$ is the same or different and is independently D, an alkyl group, an alkoxy group, a silyl group, a germanyl group, and a substituted derivative thereof, and a deuterated analog thereof or adjacent $R^9$'s are linked to each other to form a condensed ring;

p is the same or different and is independently an integer 0 to 4;

q is an integer of 0 to 5;

r is an integer of 1 to 5; and

** indicates a linking point.

The carbon number of the alkyl group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkyl group. This is because the ligand of the quantum dot and the alkyl group present in the hole transport layer may interact with each other, thereby improving effects such as hole injectability.

In addition, when the solvent that disperses the quantum dot is a long-chain hydrocarbon-based solvent, it is desirable that the number of the alkyl group in the polymer compound is small in terms of securing a residual film ratio of the hole transport layer.

Therefore, as the alkyl group, a linear or branched C1 to C18 alkyl group is more desirable. The alkyl group may be appropriately selected according to the used quantum dot or the solvent that disperses the quantum dot.

The carbon number of the alkoxy group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkoxy group. This is because the ligand of the quantum dot and the alkoxy group present in the hole transport layer may interact with each other, thereby improving effects such as hole injectability.

In addition, when the solvent that disperses the quantum dot is a long-chain hydrocarbon-based solvent, it is desirable that the number of the alkoxy group in the polymer compound is small in terms of securing a residual film ratio of the hole transport layer.

Therefore, as the alkoxy group, a linear or branched C1 to C18 alkoxy group is more desirable. These alkoxy groups may be appropriately selected according to the used quantum dot or the solvent that disperses the quantum dot.

In some embodiments of the chemical formula, $Ar^2$ may be represented by Chemical Formula e.

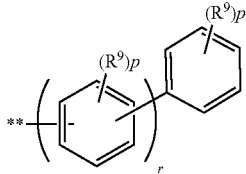

Chemical Formula e

In the chemical formula, $R^9$, p, r, and ** are the same as those defined in Chemical Formula d.

In some embodiments of the chemical formula, $Ar^2$ may be represented by Chemical Formula f.
Chemical Formula 58

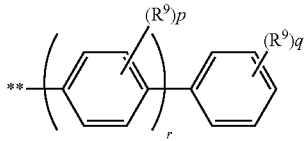

Chemical Formula f

In the chemical formula, $R^9$, p, q, r, and ** are the same as those defined in Chemical Formula d.

In some embodiments of the chemical formula, $Ar^2$ is a phenyl group, a biphenyl group, a terphenyl group, a 1-naphthyl group, a 2-naphthyl group, an anthracenyl group, a fluorenyl group, or a deuterated analog thereof, and derivatives having at least one substituent being a fluoro group, an alkyl group, an alkoxy group, a silyl group, a germanyl group, a siloxy group, or a cross-linking group, or a deuterated analog thereof.

The carbon number of the alkyl group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkyl group. This is because the ligand of the quantum dot and the alkyl group present in the hole transport layer may interact with each other, thereby improving effects such as hole injectability.

In addition, when the solvent that disperses the quantum dot is a long-chain hydrocarbon-based solvent, it is desirable that the number of the alkyl group in the polymer compound is small in terms of securing a residual film ratio of the hole transport layer.

Therefore, as the alkyl group, a linear or branched C1 to C18 alkyl group is more desirable. The alkyl group may be appropriately selected according to the used quantum dot or the solvent that disperses the quantum dot.

The carbon number of the alkoxy group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkoxy group. This is because the ligand of the quantum dot and the alkoxy group present in the hole transport layer may interact with each other, thereby improving effects such as hole injectability.

In addition, when the solvent that disperses the quantum dot is a long-chain hydrocarbon-based solvent, it is desirable that the number of the alkoxy group in the polymer compound is small in terms of securing a residual film ratio of the hole transport layer.

Therefore, as the alkoxy group, a linear or branched C1 to C18 alkoxy group is more desirable. These alkoxy groups may be appropriately selected according to the used quantum dot or the solvent that disperses the quantum dot.

In some embodiments of the chemical formulae, g=0.
In some embodiments of the chemical formulae, g=1.
In some embodiments of the chemical formulae, g>0.
In some embodiments of the chemical formulae, g1=0.
In some embodiments of the chemical formulae, g1=1.
In some embodiments of the chemical formulae, g1>0.
In some embodiments of the chemical formulae, k=0.
In some embodiments of the chemical formulae, k=1.
In some embodiments of the chemical formulae, k>0.
In some embodiments of the chemical formulae, k1=0.
In some embodiments of the chemical formulae, k1=1.
In some embodiments of the chemical formulae, k1>0.
In some embodiments of the chemical formulae, p=0.
In some embodiments of the chemical formulae, p=1.
In some embodiments of the chemical formulae, p>0.
In some embodiments of the chemical formulae, q=0.
In some embodiments of the chemical formulae, q=1.
In some embodiments of the chemical formulae, q>0.
In some embodiments of the chemical formulae, r=1.
In some embodiments of the chemical formulae, r=2.
In some embodiments of the chemical formulae, r=3.
In some embodiments of the chemical formulae, $R^1$ is D or a C1 to C10 alkyl group. In some embodiments, the alkyl group may be deuterated.

In some embodiments of the chemical formulae, $R^1$ is a C1 to C10 silyl group. In some embodiments, the silyl group may be deuterated.

In some embodiments of the chemical formulae, $R^1$ is a C6 to C20 aryl group or a C6 to C20 deuterated aryl group. In some embodiments, aryl group may be hydrocarbon aryl group. In some embodiments, aryl group may be a C3 to C20 heteroaryl group.

In some embodiments of the chemical formulae, $R^1$ is an amino group. In some embodiments, the amino group may be deuterated.

All embodiments of $R^1$ are applied to $R^2$, $R^3$, $R^4$, $R^5$, and $R^9$ in the same manner.

Embodiments of the above chemical formulae may be combined with one or more another embodiment, so long as they are not mutually exclusive. A person of an ordinary skill in the art will understand which embodiments are mutually exclusive. Accordingly, a person of an ordinary skill in the art may readily determine a combination of embodiments intended by the present application.

Some non-limiting examples of the monomer unit A are shown below.

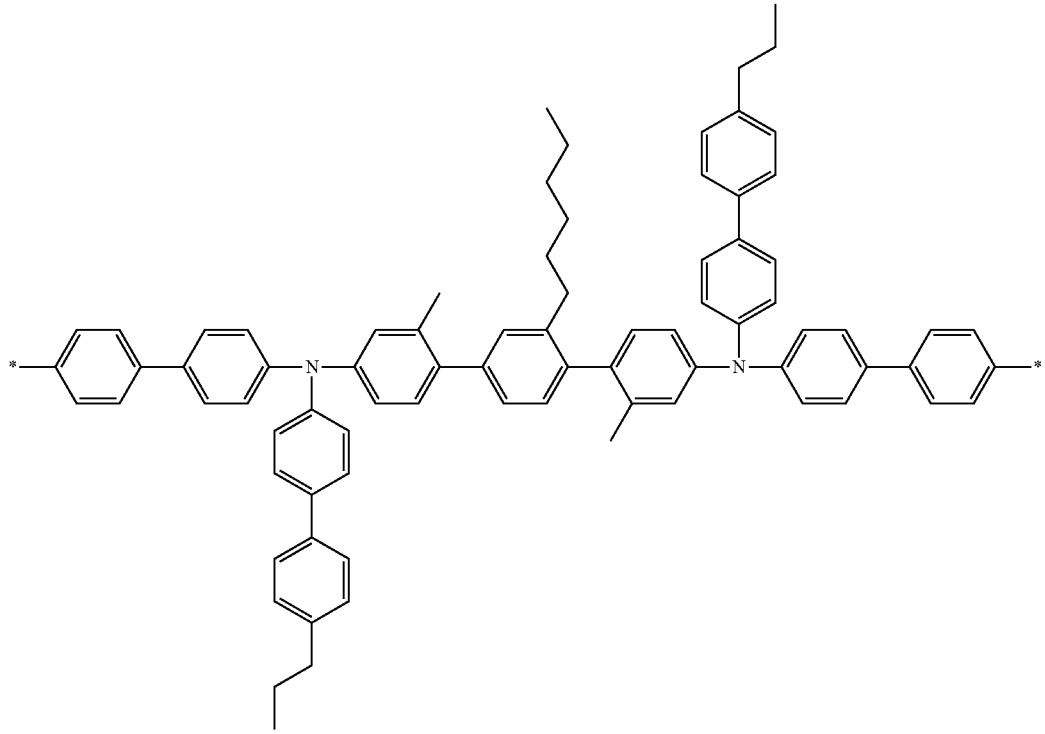

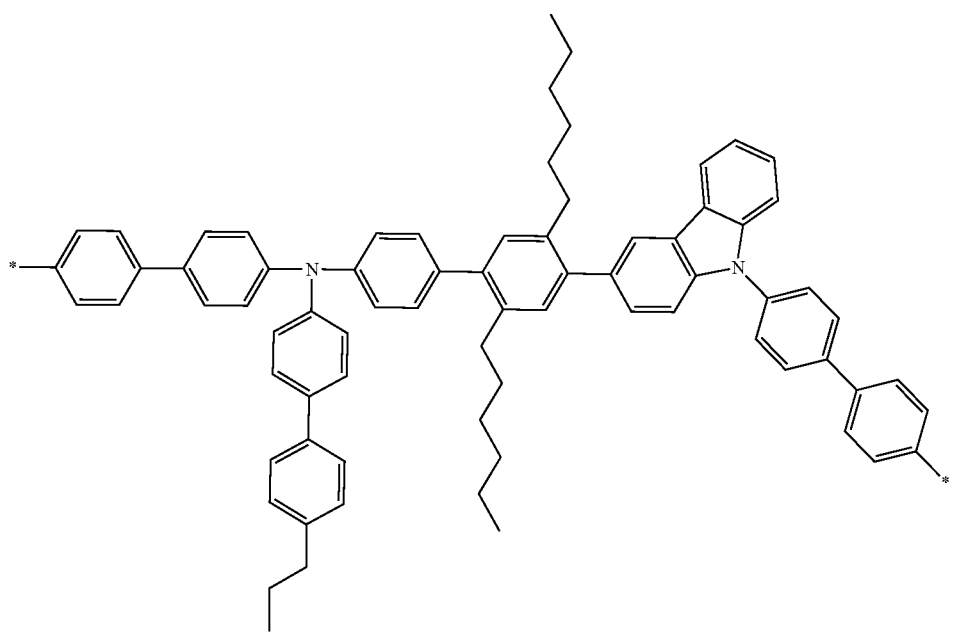

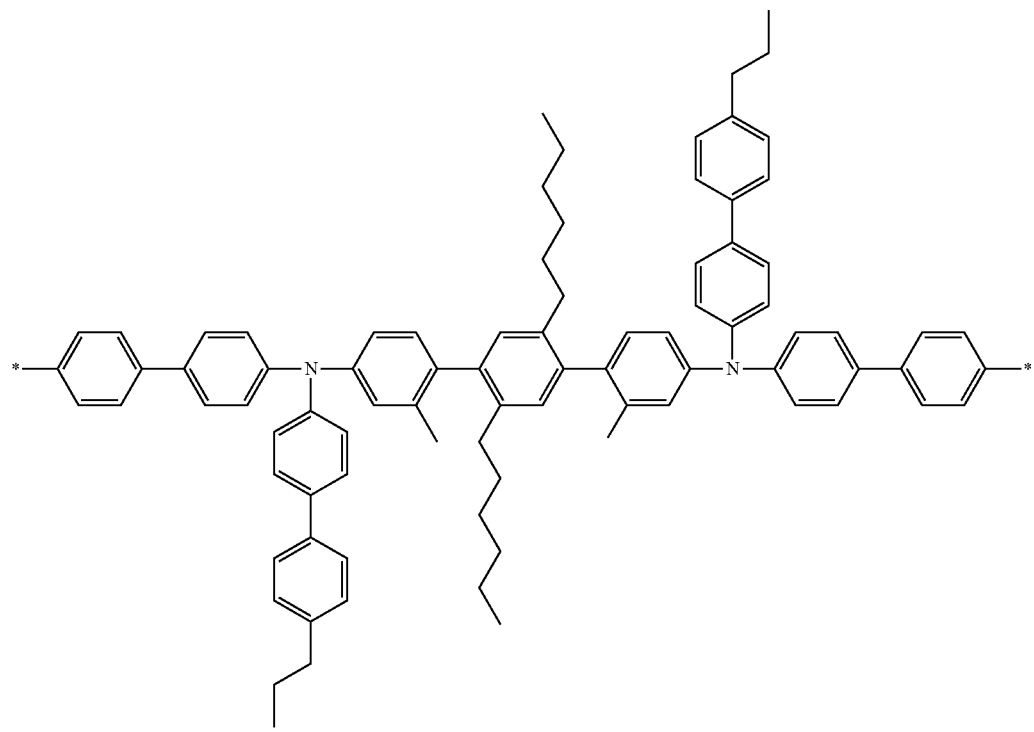
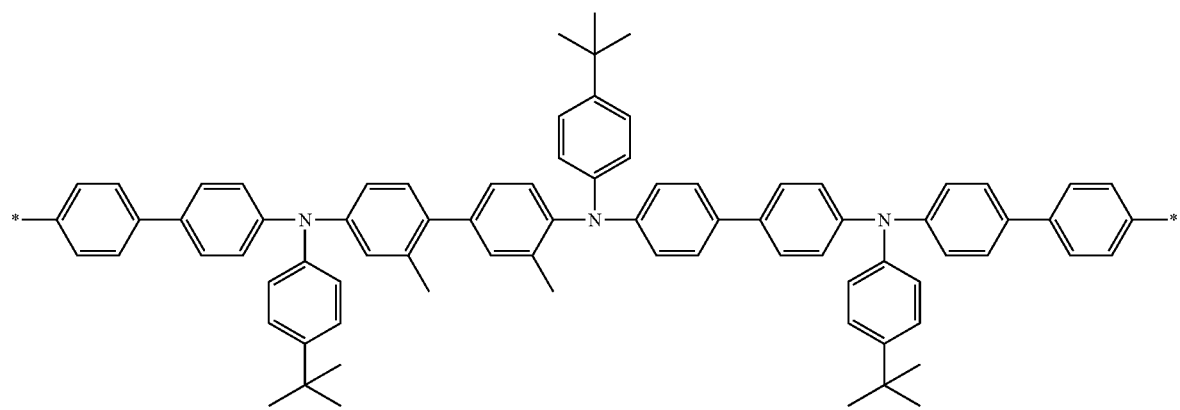

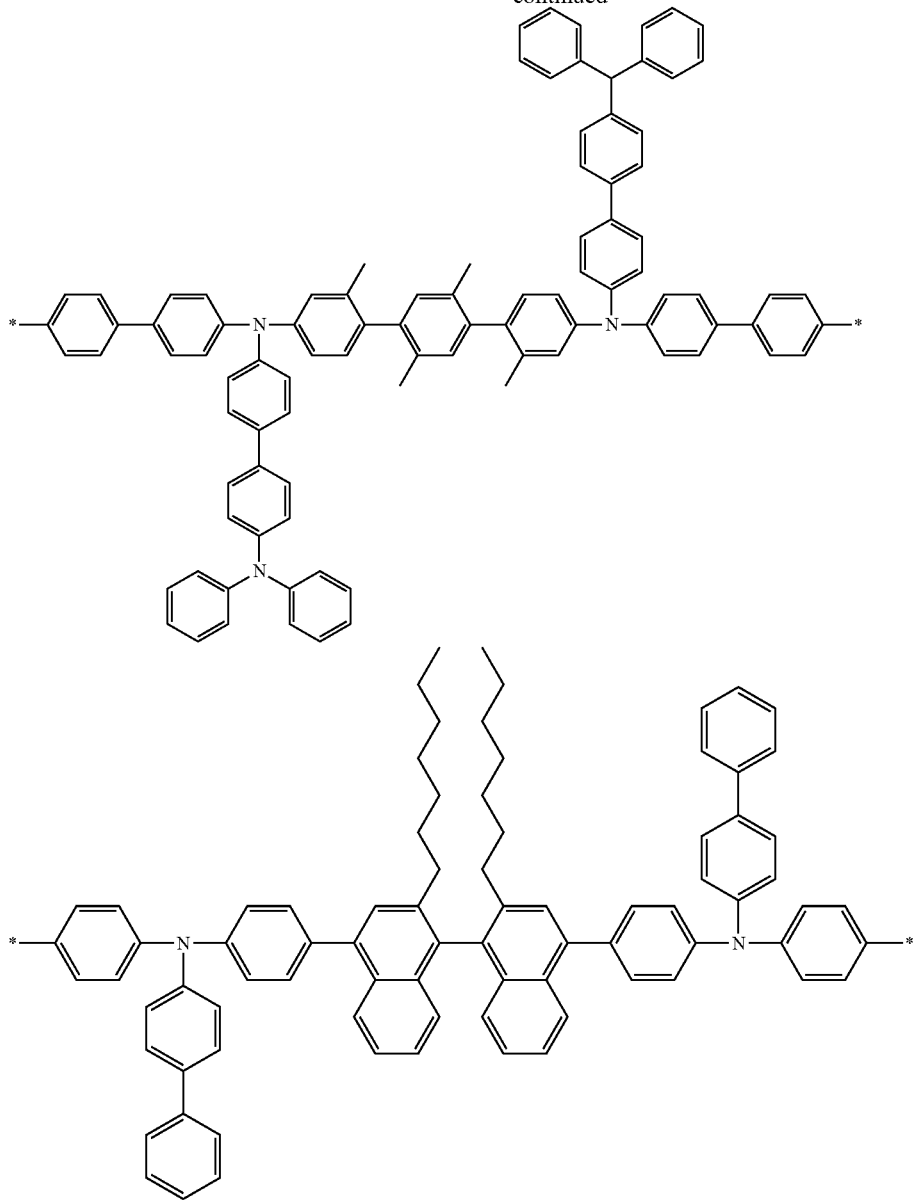

The monomer unit B' is a multi-functional branched monomer unit having at least three linking points in the copolymer.

In some embodiments, the monomer unit B' has 3 to 6 linking points.

In some embodiments, the monomer unit B' has three linking points.

In some embodiments, the monomer unit B' has four linking points.

In some embodiments, the monomer unit B' has five linking points.

In some embodiments, the monomer unit B' has six linking points.

In some embodiments, the monomer unit B' is aromatic.

In some embodiments, the monomer unit B' does not have a ring heteroatom.

In some embodiments, the monomer unit B' is an aromatic group having a branched alkyl group.

In some embodiments, the monomer unit B' is an aromatic group having a branched aromatic group.

In some embodiments, the monomer unit B' is a triarylamine group.

In some embodiments, the monomer unit B' may be represented by Chemical Formula VI.

In the chemical formula,

Z is a cyclic aliphatic moiety, an aromatic moiety, a deuterated cyclic aliphatic moiety, or a deuterated aromatic moiety which have C, Si, Ge, N, and at least three bonding positions;

Y is a single bond, an alkyl group, an aromatic moiety, a deuterated alkyl group, or a deuterated aromatic moiety, when Y is a single bond, an alkyl group, or a deuterated alkyl group, Z is an aromatic moiety or a deuterated aromatic moiety;

s is an integer ranging from 3 to the maximum number of available bonding positions of Z; and

* indicates a linking point in the copolymer.

The carbon number of the alkyl group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkyl group. This is because the ligand of the quantum dot and the alkyl group present in the hole transport layer may interact with each other, thereby improving effects such as hole injectability.

In addition, when the solvent that disperses the quantum dot is a long-chain hydrocarbon-based solvent, it is desirable that the number of the alkyl group in the polymer compound is small in terms of securing a residual film ratio of the hole transport layer.

Therefore, as the alkyl group, a linear or branched C1 to C18 alkyl group is more desirable. The alkyl group may be appropriately selected according to the used quantum dot or the solvent that disperses the quantum dot.

In some embodiments, the monomer unit B' may be represented by one of Chemical Formula VII, Chemical Formula VIII, Chemical Formula IX, Chemical Formula X, and Chemical Formula XI.

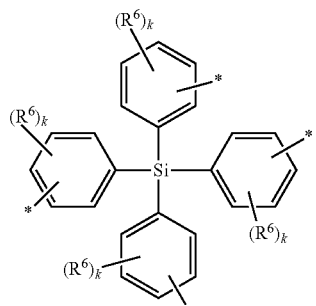

(VII)

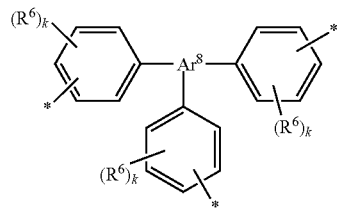

(VIII)

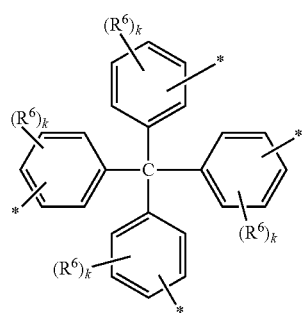

(IX)

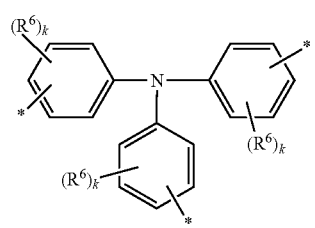

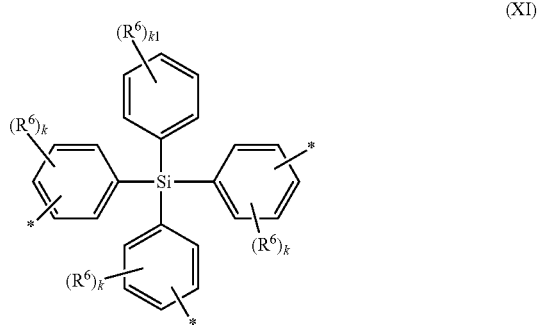

(X)

(XI)

In the chemical formulae, $Ar^8$ is an aromatic moiety or a deuterated aromatic moiety which have at least three binding positions;

$R^6$ is the same or different and is independently D, F, CN, an alkyl group, a fluoroalkyl group, an aryl group, a heteroaryl group, an amino group, a silyl group, a germanyl group, an alkoxy group, an aryloxy group, a fluoroalkoxy group, a siloxane group, a siloxy group, a deuterated alkyl group, a deuterated partly fluorinated alkyl group, a deuterated aryl group, a deuterated heteroaryl group, a deuterated amino group, a deuterated silyl group, a deuterated germanyl group, a deuterated alkoxy group, a deuterated aryloxy group, a deuterated fluoroalkoxy group, a deuterated siloxane group, a deuterated siloxy group, and a crosslinking group, or adjacent $R^6$'s are linked to each other to form a 5-membered or 6-membered condensed ring;

k is the same or different and is independently an integer ranging from 0 to 4;

k1 is an integer ranging from 0 to 5; and

* indicates a linking point in the copolymer.

The carbon number of the alkyl group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkyl group. This is because the ligand of the quantum dot and the alkyl group present in the hole transport layer may interact with each other, thereby improving effects such as hole injectability.

In addition, when the solvent that disperses the quantum dot is a long-chain hydrocarbon-based solvent, it is desirable that the number of the alkyl group in the polymer compound is small in terms of securing a residual film ratio of the hole transport layer.

Therefore, as the alkyl group, a linear or branched C1 to C18 alkyl group is more desirable. The alkyl group may be appropriately selected according to the used quantum dot or the solvent that disperses the quantum dot.

The carbon number of the alkoxy group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkoxy group. This is because the ligand of the quantum dot and the alkoxy group present in the hole transport layer may interact with each other, thereby improving effects such as hole injectability.

In addition, when the solvent that disperses the quantum dot is a long-chain hydrocarbon-based solvent, it is desirable that the number of the alkoxy group in the polymer compound is small in terms of securing a residual film ratio of the hole transport layer.

Therefore, as the alkoxy group, a linear or branched C1 to C18 alkoxy group is more desirable. These alkoxy groups may be appropriately selected according to the used quantum dot or the solvent that disperses the quantum dot.

In some embodiments of Chemical Formula VI, Z is an aromatic moiety of a compound of benzene, naphthalene, anthracene, phenanthrene and a substituted derivative thereof, and a deuterated analog thereof.

Some non-limiting examples of the monomer unit B' are shown below.

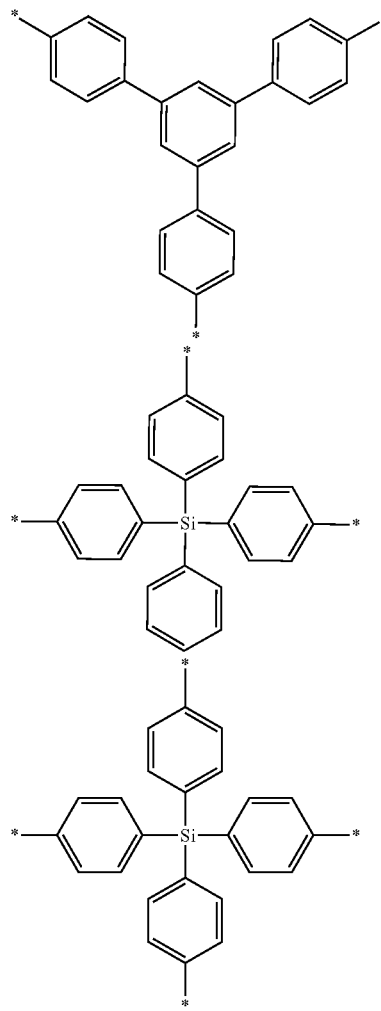

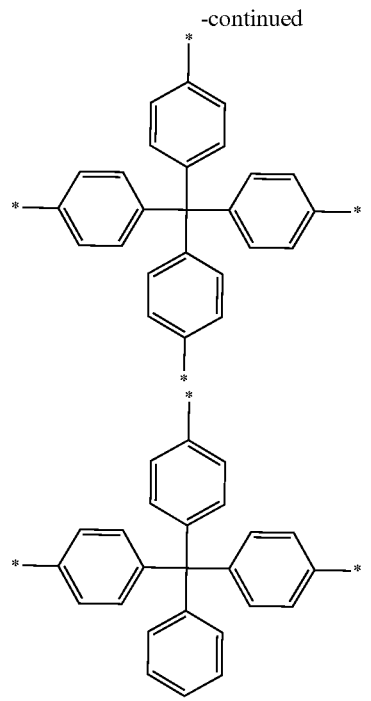

-continued

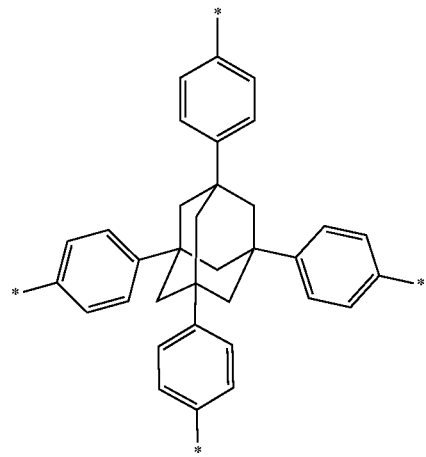

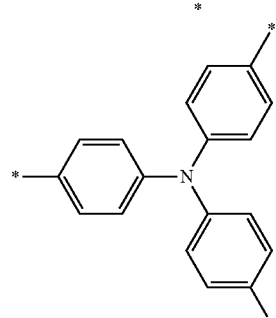

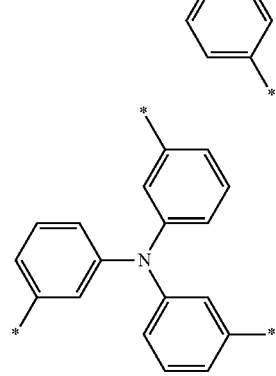

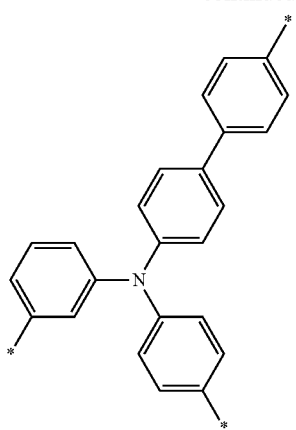
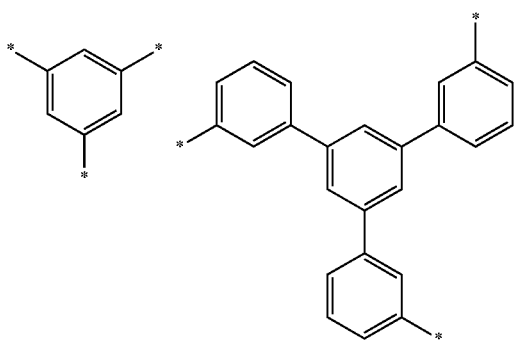 [SMILES: *c1cc(*)cc(*)c1 ; *c1cccc(-c2cc(-c3cccc(*)c3)cc(-c3cccc(*)c3)c2)c1]
The monomer unit C' is an any aromatic monomer unit.
The monomer unit C' is a bifunctional monomer unit having only two linking points.
In some embodiments, the monomer unit C' includes a cross-linking group or a deuterated cross-linking group.
In some embodiments, the monomer unit C' may be represented by one of the following chemical formulae.
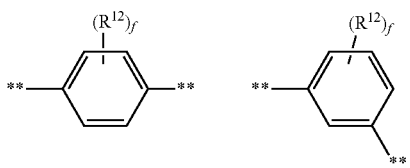
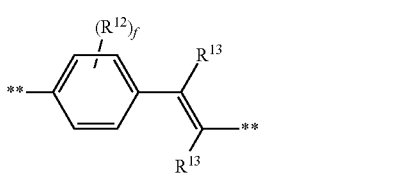
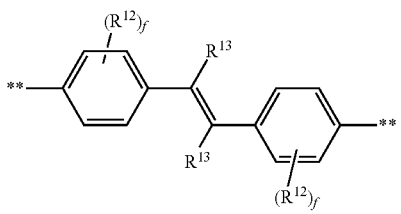
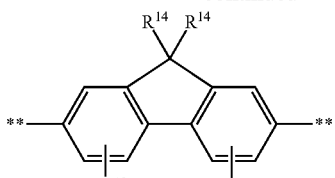
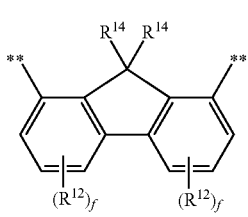
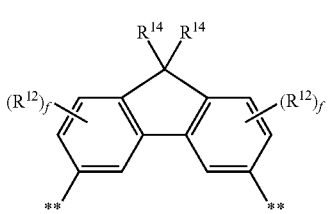
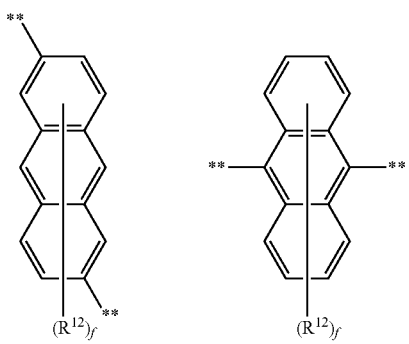
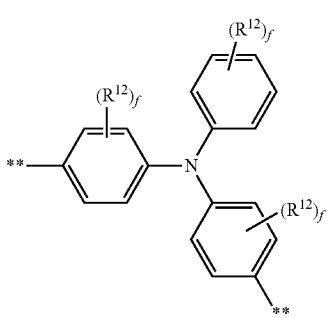
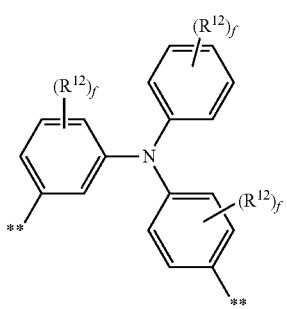

-continued

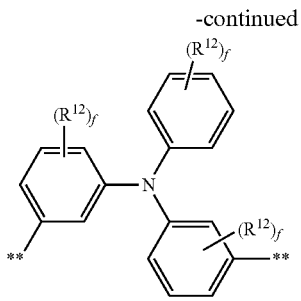

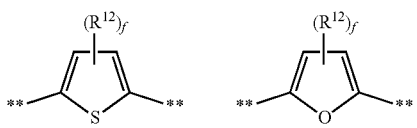

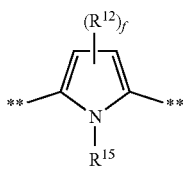

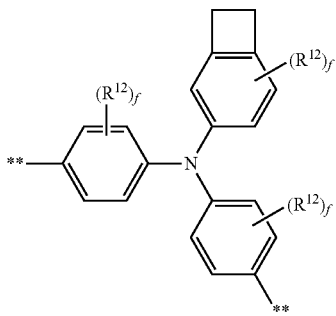

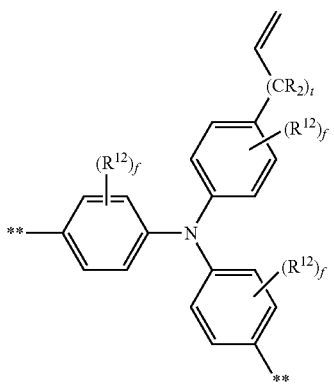

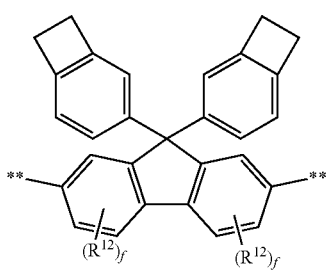

-continued

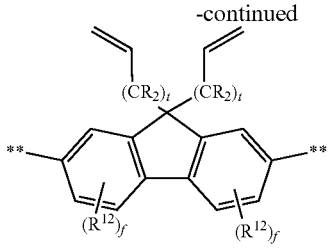

In the chemical formulae, $R^{12}$ is the same or different and is independently D, an alkyl group, a silyl group, a germanyl group, an aryl group, a deuterated alkyl group, a deuterated silyl group, a deuterated germanyl group, and a deuterated aryl group;

$R^{13}$ is the same or different and is independently H, D, an alkyl group, or a deuterated alkyl group;

$R^{14}$ is the same or different and is independently an alkyl group, an aryl group, or a deuterated analog thereof;

$R^{15}$ is the same or different and is independently an aryl group or a deuterated aryl group;

f is the same or different and is independently an integer ranging from 0 to the maximum number available as a substituent, t is an integer ranging from 0 to 20, and

** indicates a linking point.

The carbon number of the alkyl group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkyl group. This is because the ligand of the quantum dot and the alkyl group present in the hole transport layer may interact with each other, thereby improving effects such as hole injectability.

In addition, when the solvent that disperses the quantum dot is a long-chain hydrocarbon-based solvent, it is desirable that the number of the alkyl group in the polymer compound is small in terms of securing a residual film ratio of the hole transport layer.

Therefore, as the alkyl group, a linear or branched C1 to C18 alkyl group is more desirable. The alkyl group may be appropriately selected according to the used quantum dot or the solvent that disperses the quantum dot.

The carbon number of the alkoxy group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkoxy group. This is because the ligand of the quantum dot and the alkoxy group present in the hole transport layer may interact with each other, thereby improving effects such as hole injectability.

In addition, when the solvent that disperses the quantum dot is a long-chain hydrocarbon-based solvent, it is desirable that the number of the alkoxy group in the polymer compound is small in terms of securing a residual film ratio of the hole transport layer.

Therefore, as the alkoxy group, a linear or branched C1 to C18 alkoxy group is more desirable. These alkoxy groups may be appropriately selected according to the used quantum dot or the solvent that disperses the quantum dot.

In some embodiments, f is 0 to 2.

In some embodiments, t is 1 to 3.

Some non-limiting examples of any monomer unit C' are shown below.

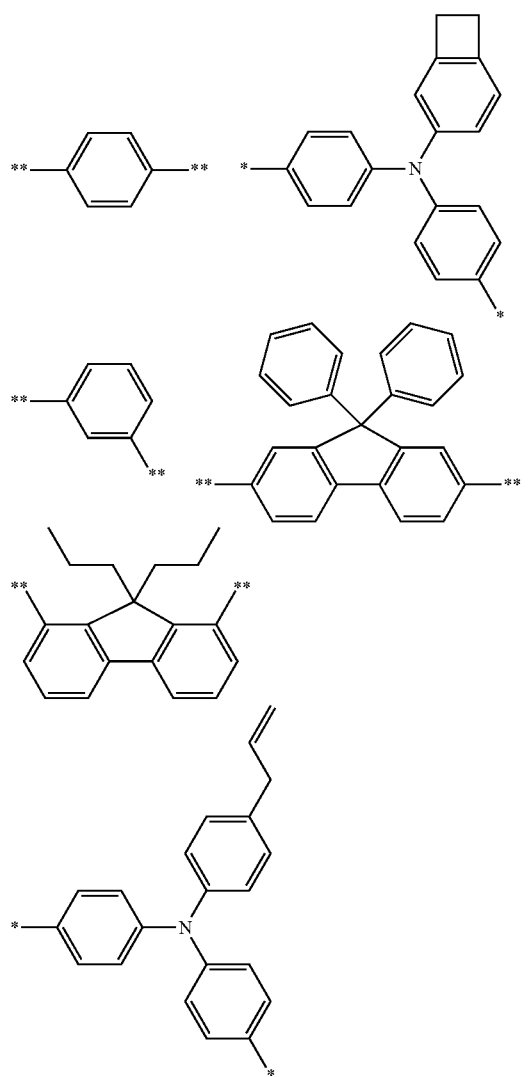

E is the end capping unit of the copolymer.

E is a mono-functional unit having only one linking point.

In some embodiments of Chemical Formula I-2, E is H or D.

In some embodiments of Chemical Formula I-2, E is a mono-functional monomer unit.

In some embodiments of Chemical Formula I-2, E is a cross-linking group or a deuterated cross-linking group.

In some embodiments of Chemical Formula I-2, E is a hydrocarbon aryl group or a deuterated hydrocarbon aryl group.

In some embodiments of Chemical Formula I-2, E is an aryl group, an arylamino group, a cross-linking group, or deuterated analogs thereof.

In some embodiments of Chemical Formula I-2, E is a phenyl group, a biphenyl group, a diphenylamino group, and a substituted derivative thereof, or a deuterated analog thereof. In some embodiments, the substituent is a C1 to C10 alkyl group, a cross-linking group, or a deuterated analog thereof.

Some of the non-limiting examples of E are shown below.

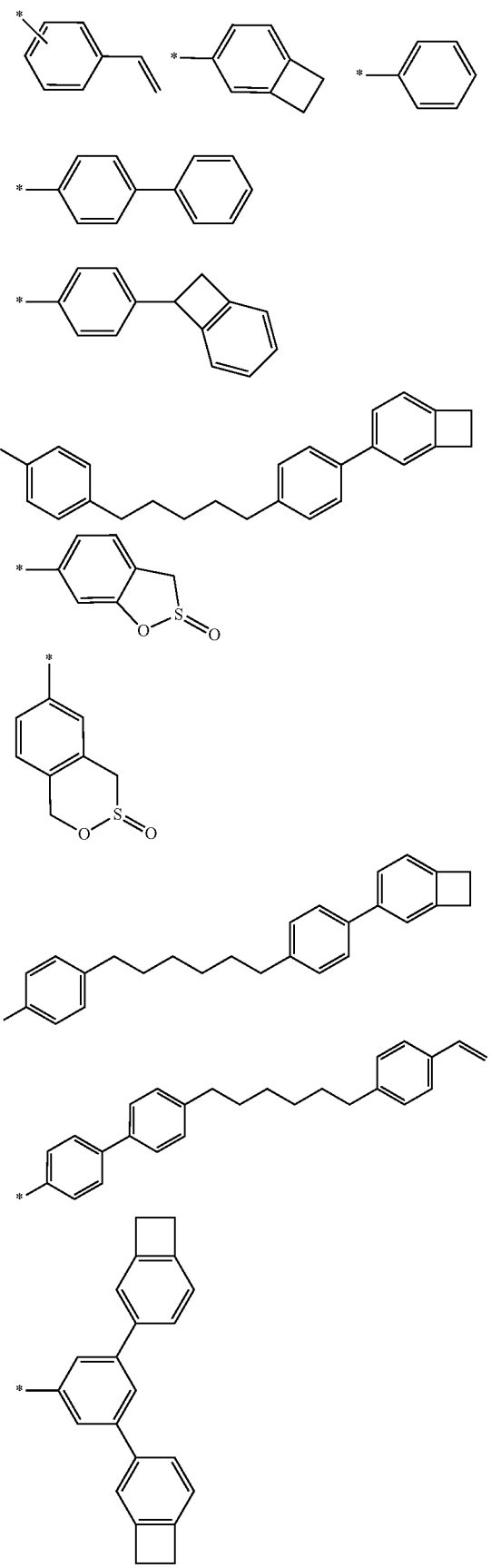

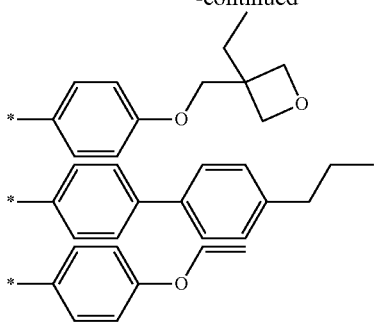

In the chemical formula, * indicates a linking point in the copolymer.

In some embodiments of Chemical Formula I-2, a≥50.

In some embodiments of Chemical Formula I-2, a=0.50 to 0.99.

In some embodiments of Chemical Formula I-2, a=0.60 to 0.90.

In some embodiments of Chemical Formula I-2, a=0.65 to 0.80.

In some embodiments of Chemical Formula I-2, b≥05; and in some embodiments, b≥0.10.

In some embodiments of Chemical Formula I-2, b=0.01 to 0.50.

In some embodiments of Chemical Formula I-2, b=0.05 to 0.45.

In some embodiments of Chemical Formula I-2, b=0.10 to 0.40.

In some embodiments of Chemical Formula I-2, b=0.20 to 0.35.

In some embodiments of Chemical Formula I-2, c=0.

In some embodiments of Chemical Formula I-2, c=0 to 0.20.

In some embodiments of Chemical Formula I-2, c=0.01 to 0.20.

In some embodiments of Chemical Formula I-2, c=0.05 to 0.15.

In some embodiments of Chemical Formula I-2, a mole ratio of A+B' relative to E is in the range of about 40:60 to about 98:2, and in some embodiments, about 50:50 to about 90:10; ad in some embodiments, about 60:40 to about 80:20.

In some embodiments of Chemical Formula I-2', a1=0.30 to 0.90.

In some embodiments of Chemical Formula I-2', a1=0.40 to 0.80.

In some embodiments of Chemical Formula I-2', a1=0.50 to 0.80.

In some embodiments of Chemical Formula I-2', b1=0.05-0.40.

In some embodiments of Chemical Formula I-2', b1=0.10 to 0.30.

In some embodiments of Chemical Formula I-2', b1=0.10 to 0.20.

In some embodiments of Chemical Formula I-2', c1=0.

In some embodiments of Chemical Formula I-2', c1=0 to 0.15.

In some embodiments of Chemical Formula I-2', c1=0.01 to 0.15.

In some embodiments of Chemical Formula I-2', c1=0.05 to 0.12.

In some embodiments of Chemical Formula I-2', e1=0.05 to 0.60.

In some embodiments of Chemical Formula I-2', e1=0.10 to 0.50.

In some embodiments of Chemical Formula I-2', e1=0.15 to 0.35.

Copolymer Type 1

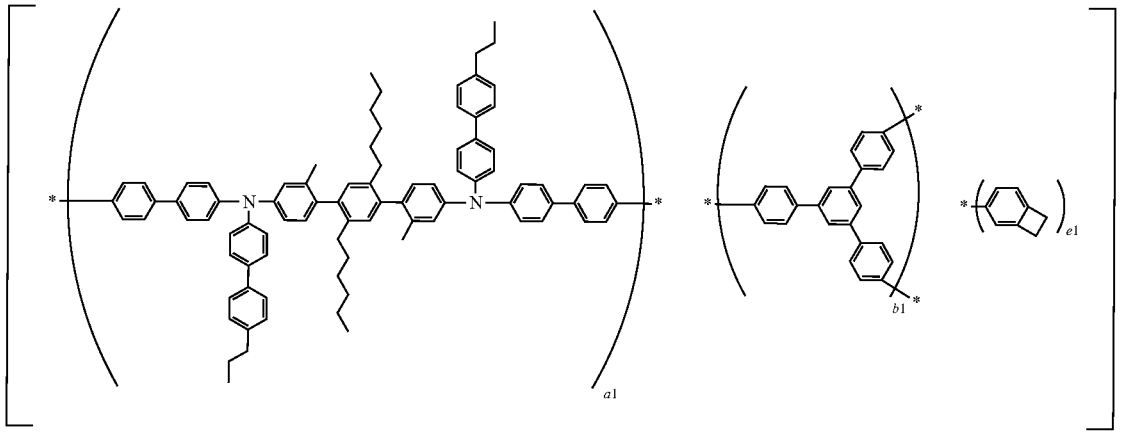

In the copolymer type 1, c1=0 and the monomer unit C' does not exist. The end capping unit E is a cross-linking group.
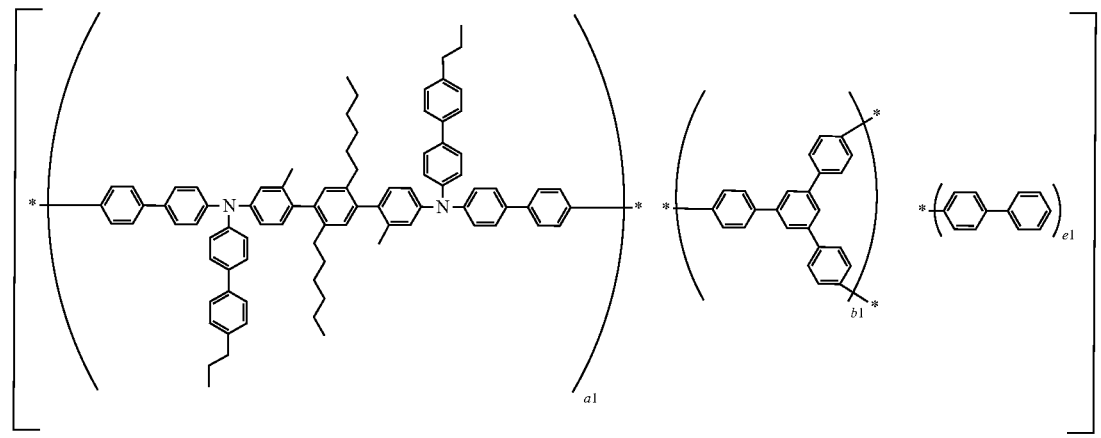
In the copolymer type 2, c1=0 and the monomer unit C' does not exist. The end capping unit E is an aryl group.
Copolymer Type 3
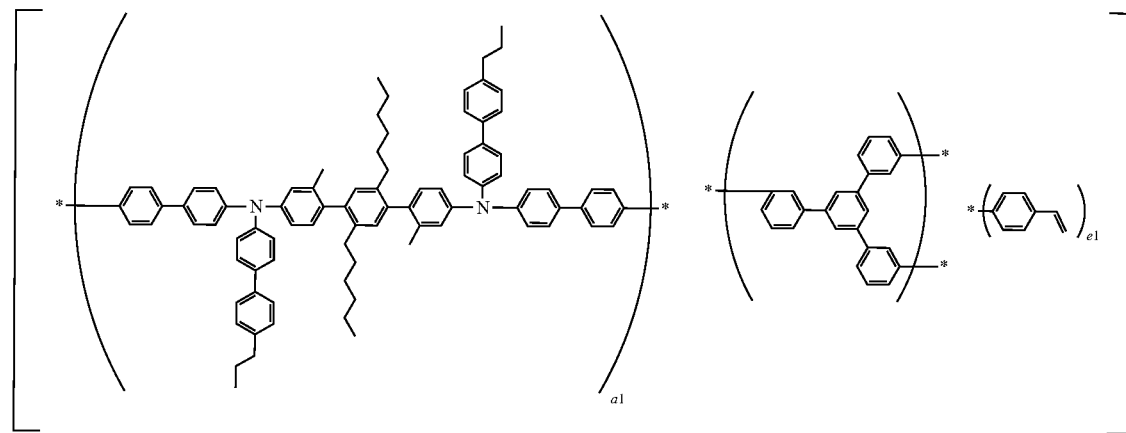
In the copolymer type 3, c1=0 and the monomer unit C' does not exist. The end capping unit E is a cross-linking group.

Copolymer Type 4
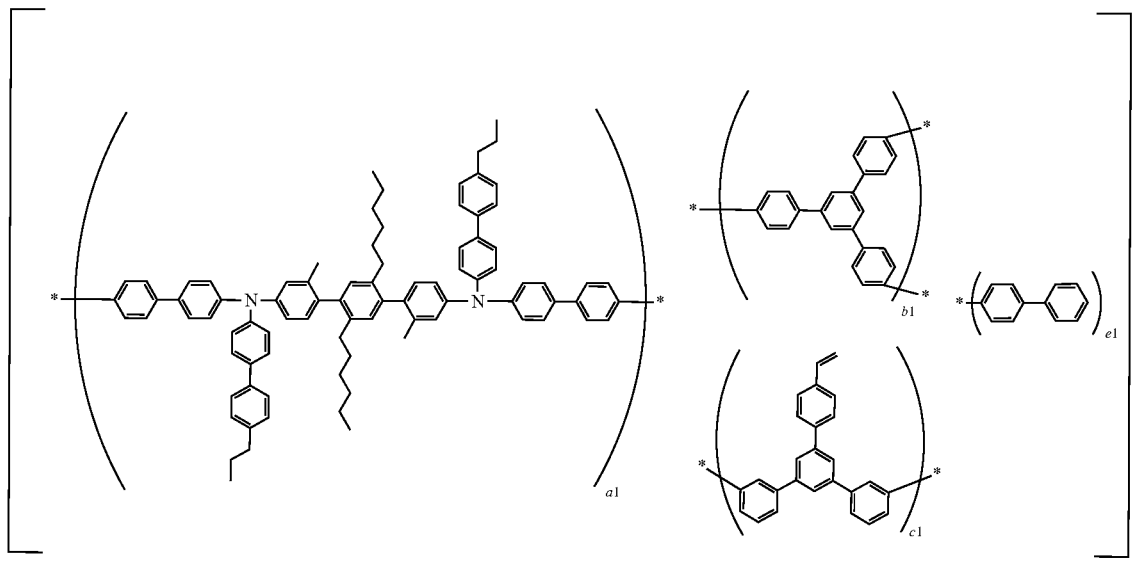
In the copolymer type 4, the monomer unit C' exists and has a cross-linking group. The end capping unit E is an aryl group.
Copolymer Type 5
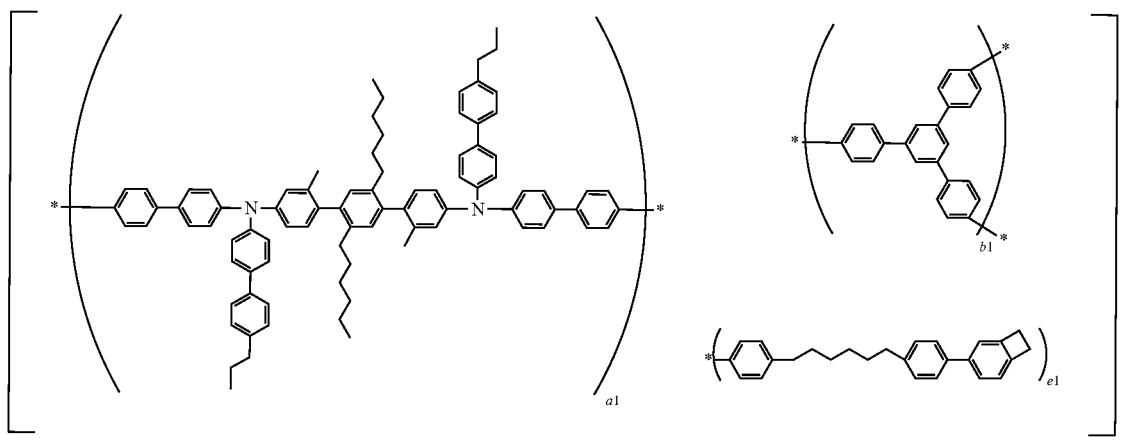
In the copolymer type 5, c1=0 and the monomer unit C' does not exist. The end capping unit E is a cross-linking group.

Copolymer Type 6
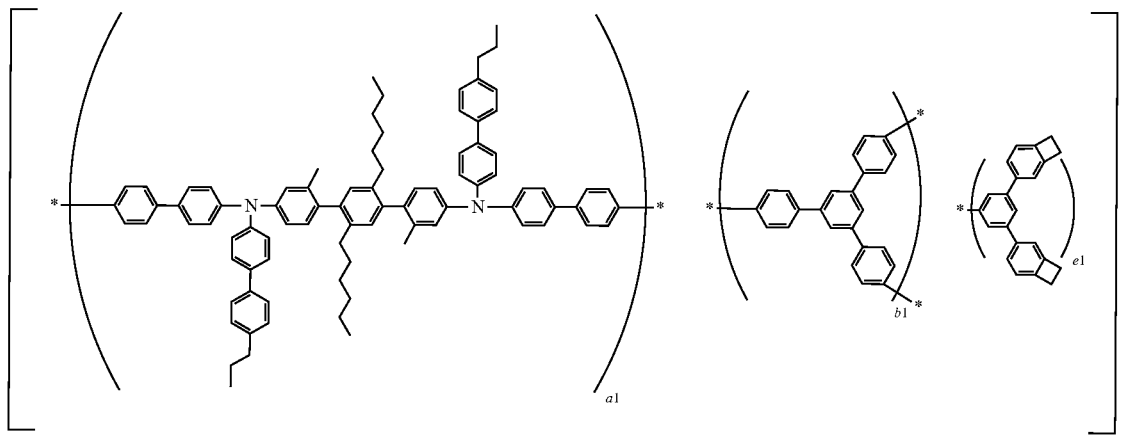
In the copolymer type 6, $c1=0$ and the monomer unit C' does not exist. The end capping unit E is a cross-linking group.
Copolymer Type 7
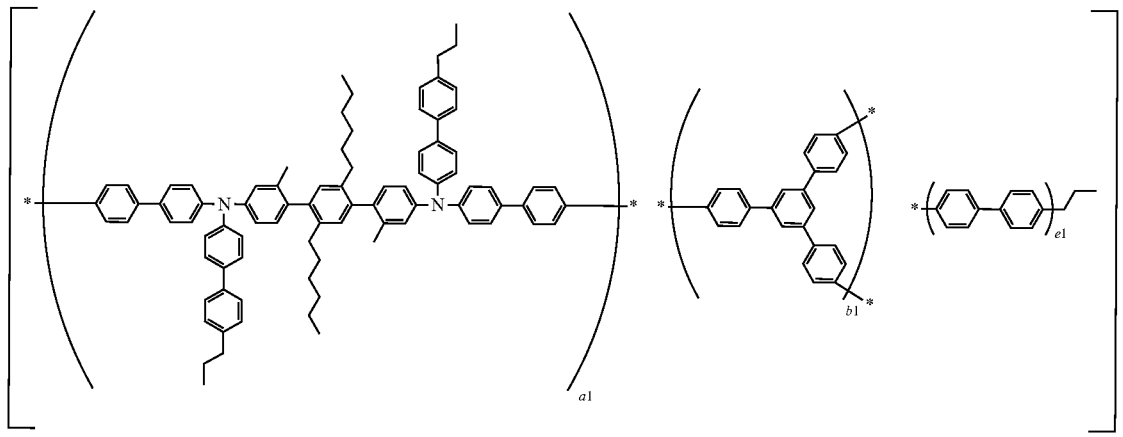
In the copolymer type 7, $c1=0$ and the monomer unit C' does not exist. The end capping unit E is an aryl group.

Copolymer Type 8
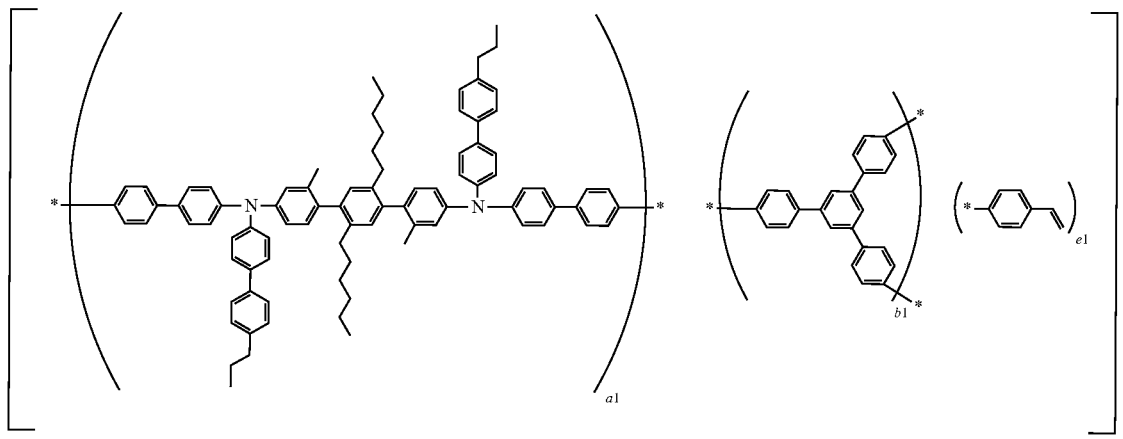
In the copolymer type 8, c1=0 and the monomer unit C' does not exist. The end capping unit E is a cross-linking group.
Copolymer Type 9
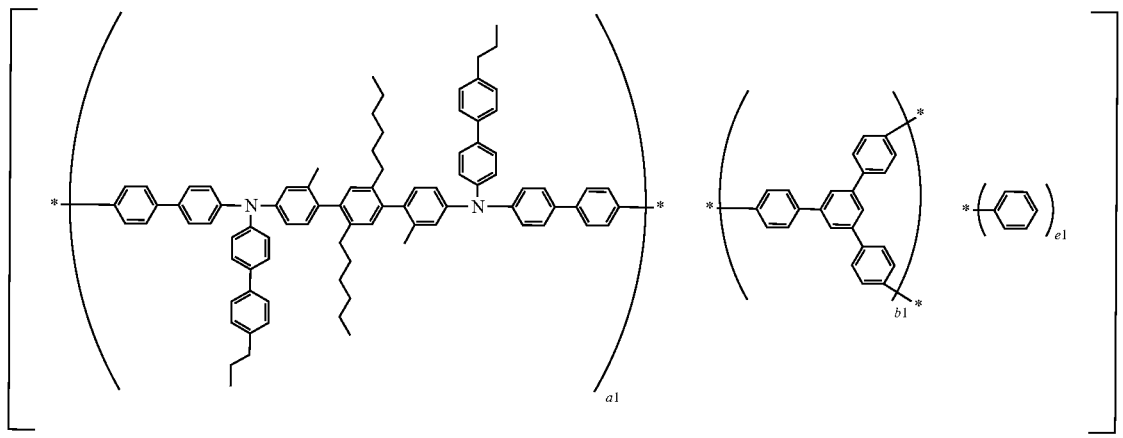
In the copolymer type 10, c1=0 and the monomer unit C' does not exist. The end capping unit E is an aryl group.

Copolymer Type 10
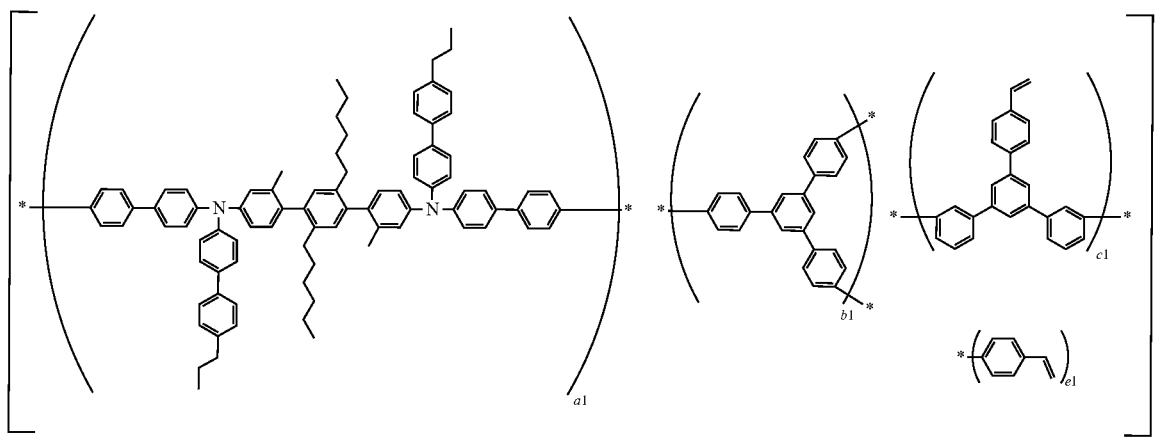
In the copolymer type 10, the monomer unit C' exists and has a cross-linking group. The end capping unit E is a cross-linking group.
Copolymer Type 11
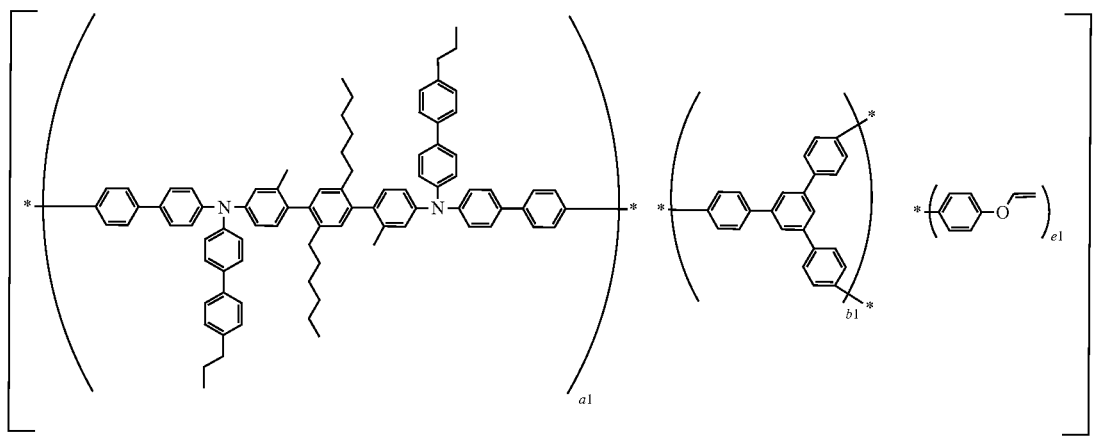
In the copolymer type 11, c1=0 and the monomer unit C' does not exist. The end capping unit E is a cross-linking group.

Copolymer Type 12
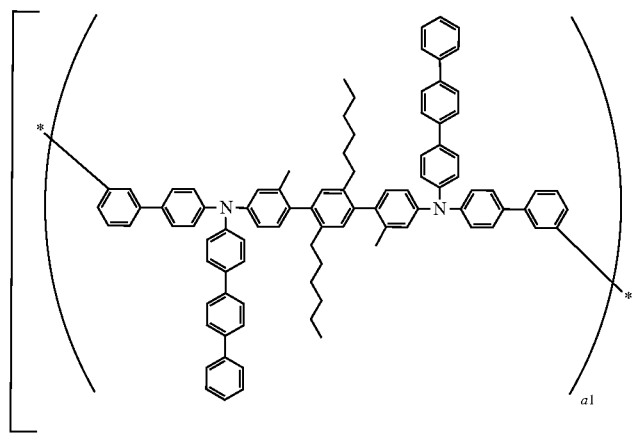
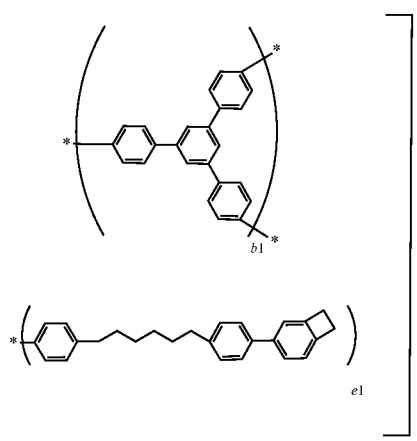
In the copolymer type 12, c1=0 and the monomer unit C' does not exist. The end capping unit E is a cross-linking group.
Copolymer Type 13
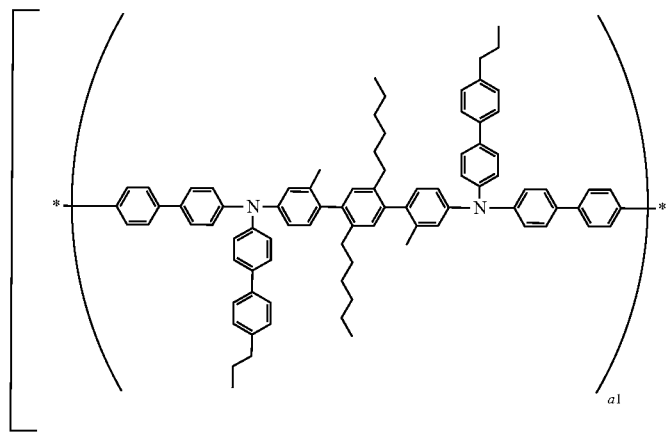
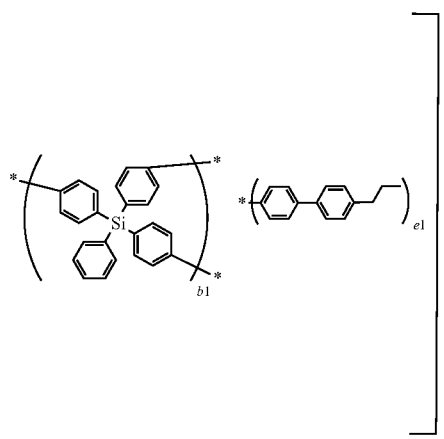
In the copolymer type 13, c1=0 and the monomer unit C' does not exist. The end capping unit E is an aryl group.

Copolymer Type 14
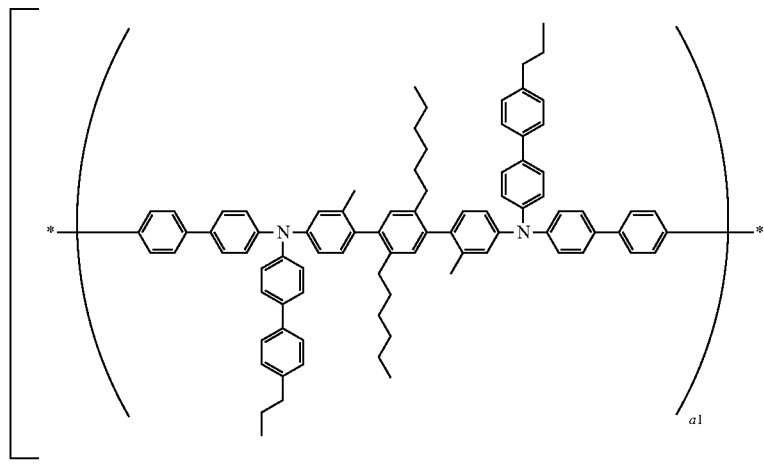
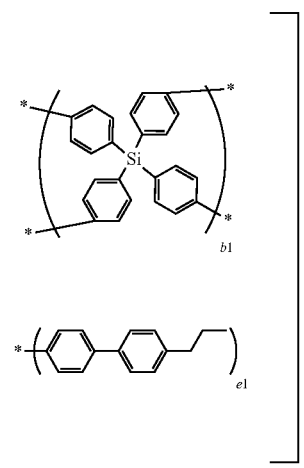
In the copolymer type 14, c1=0 and the monomer unit C' does not exist. The monomer unit B' is a 4-functional. The end capping unit E is an aryl group.
Copolymer Type 15
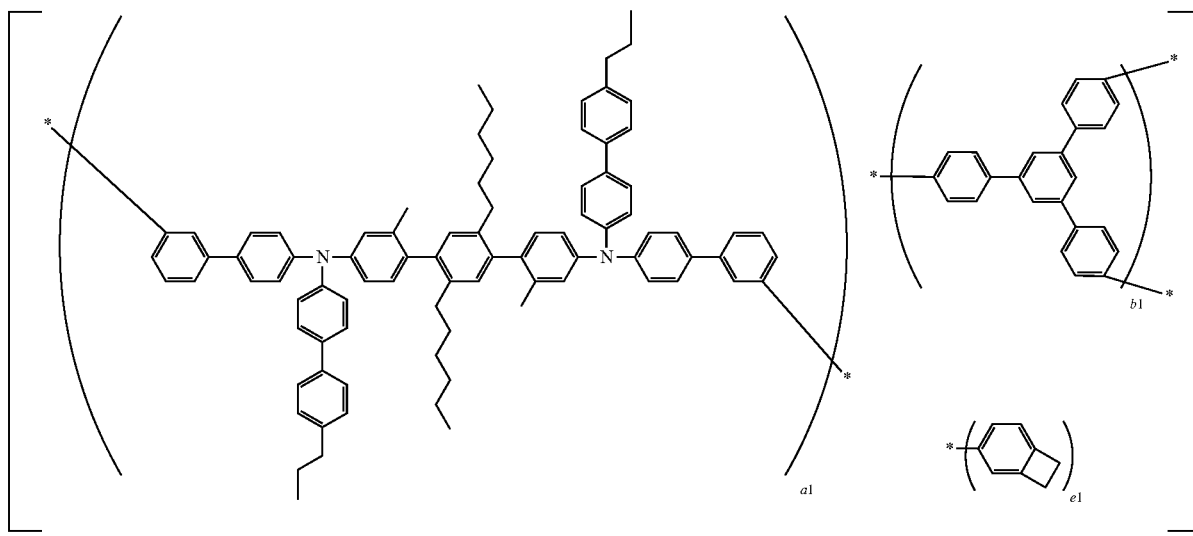
In the copolymer type 15, c1=0 and the monomer unit C' does not exist. The end capping unit E is a cross-linking group.

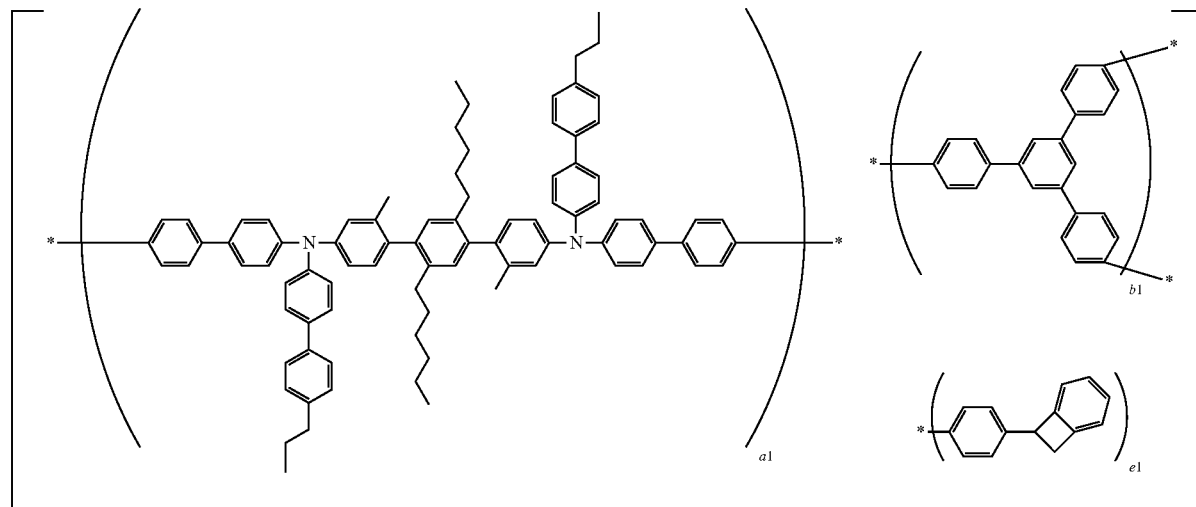
Copolymer Type 16
In the copolymer type 16, c1=0 and the monomer unit C' does not exist. The end capping unit E is a cross-linking group.
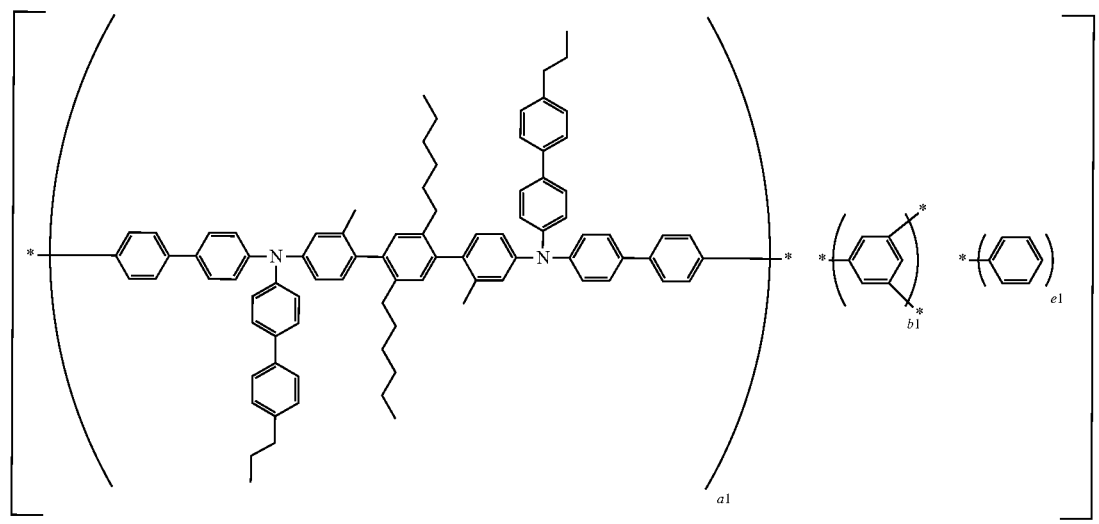
Copolymer Type 17
In the copolymer type 17, c1=0 and the monomer unit C' does not exist. The end capping unit E is an aryl group.

Copolymer Type 18
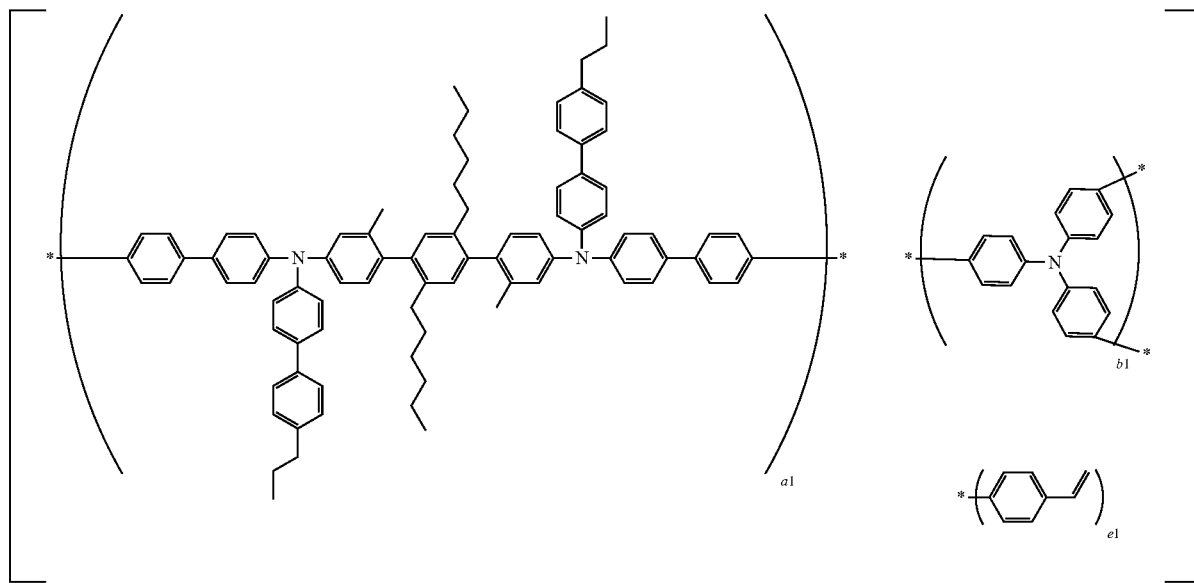
In the copolymer type 18, c1=0 and the monomer unit C' does not exist. The end capping unit E is a cross-linking group.
Copolymer Type 19
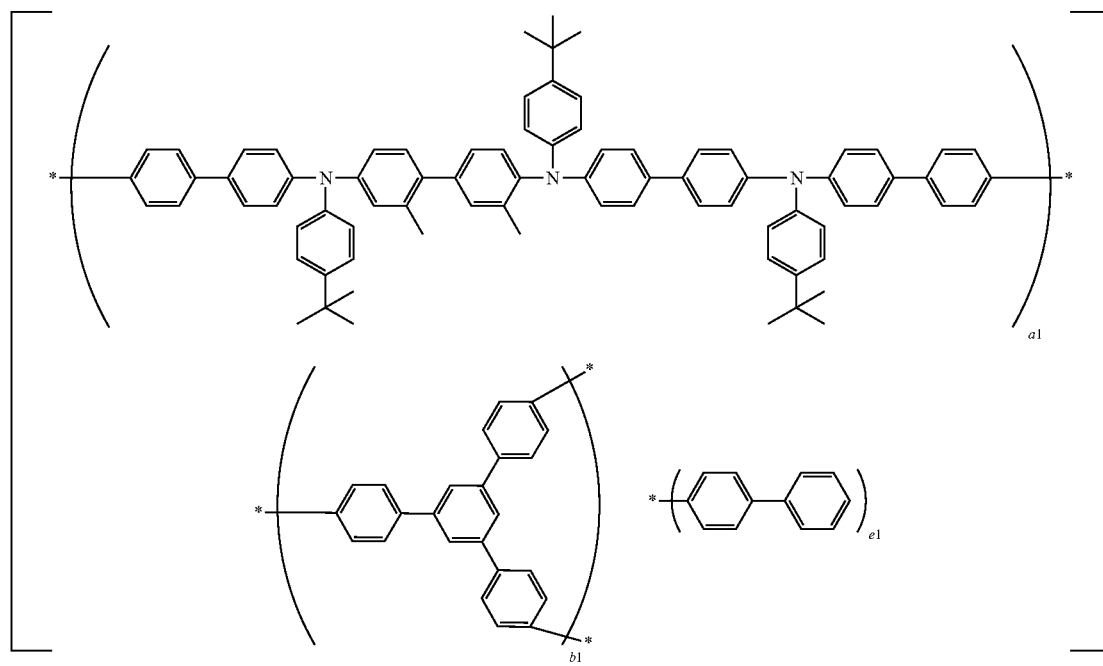
In the copolymer type 19, c1=0 and the monomer unit C' does not exist. The end capping unit E is an aryl group.

Copolymer Type 20

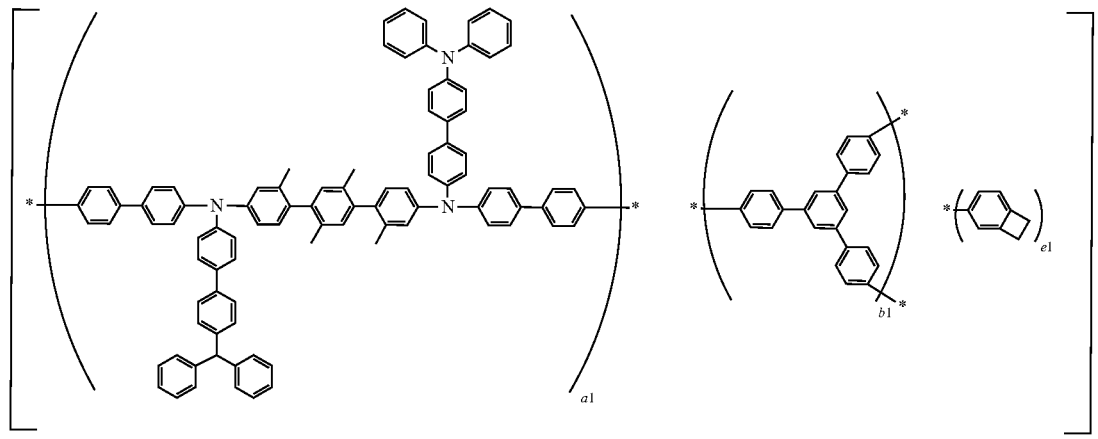

In the copolymer type 20, c1=0 and the monomer unit C' does not exist. The end capping unit E is a cross-linking group.

Copolymer Type 21

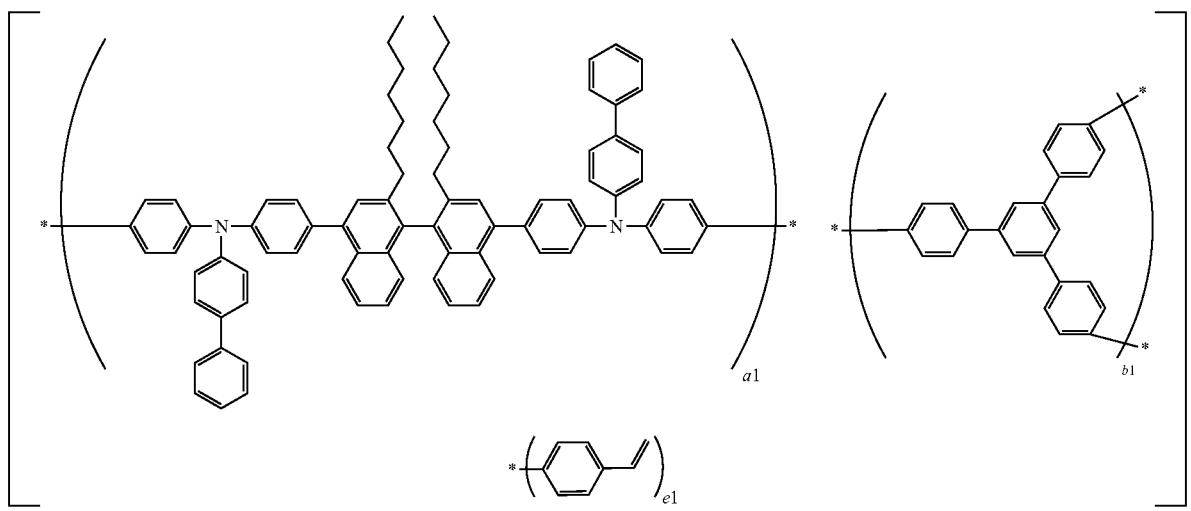

In the copolymer type 21, c1=0 and the monomer unit C' does not exist. The end capping unit E is a cross-linking group.

The copolymer of Chemical Formula I-2 may be produced using a technique for producing C—C or C—N bonds or a known polymerization technique. Various such techniques are known, for example, Suzuki, Yamamoto, Stille and metal-catalyzed CN coupling using metal catalysts, and metal catalyzed oxidative direct arylation using metal catalysts.

The deuterated compound may be prepared in a similar manner using a deuterated precursor material or may be more generally prepared by treating a non-deuterated compound with a deuterated solvent such as d6-benzene under the presence of a Lewis acid H/D exchange catalyst, such as aluminum trichloride or ethyl aluminum dichloride, and the like.

The molecular weight control technology of the polymer and copolymer is known in the field. The molecular weight of the copolymer described in this disclosure may usually be controlled by a ratio of monomers in the polymerization reaction. Depending on the embodiment, the molecular weight may be controlled using a quenching reaction.

In some embodiments, the polymer compound 4 has an intrinsic viscosity of less than about 60 milliliters per gram (mug). A lower viscosity is particularly useful for inkjet printing applications, since a higher concentration solution may be dispensed. Depending on the embodiment, the copolymers in this disclosure have an intrinsic viscosity of less than about 50 mL/g, less than about 40 mL/g, or less than about 30 mL/g. Depending on the embodiment, the copolymers may be greater than or equal to about 20 mL/g and less than or equal to about 60 mL/g, greater than or equal to about 20 mL/g and less than or equal to about 50 mL/g, or greater than or equal to about 20 mL/g and less than or equal to about 40 mL/g.

Polymer Compound 5

According to a preferred embodiment of the present disclosure, the polymer material includes a polymer compound 5 having a structural unit (5-A) represented by Chemical Formula (5-1). According to a more preferred embodiment, the polymer material is the polymer compound 5 having a structural unit (5-A) represented by Chemical Formula (5-1).

The polymer compound 5 (silicon-containing arylamine polymer) according to the present embodiment has a structural unit (5-A) represented by Chemical Formula (5-1):

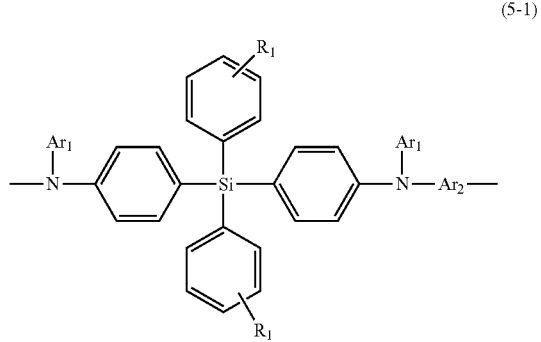

(5-1)

The polymer compound 5 may include one type of the structural unit (5-A), or may include two or more types of the structural units (5-A).

In this disclosure, the aforementioned structural unit (5-A) represented by Chemical Formula (5-1) is also simply referred to as "structural unit (5-A)" or "structural unit (5-A) according to the present embodiment". Similarly, in this disclosure, a polymer having the structural unit (5-A) represented by Chemical Formula (5-1) is also simply referred to as "polymer compound 5", "polymer compound 5 according to the present embodiment", "silicon-containing arylamine polymer" or "silicon-containing arylamine polymer according to the present embodiment".

In the structural unit (5-A) of Chemical Formula (5-1), a silicon atom cleaves conjugation of the main chain. Thus, in the case of the polymer, it is possible to increase a triplet energy level and achieve high current efficiency. Therefore, by using the polymer compound 5, it is possible to manufacture an electroluminescence device exhibiting a high luminous efficiency. In the structural unit (5-A), the main chain is cleaved by silicon atoms. For this reason, the polymer compound 5 exhibits properties of a low molecular compound similar to the quantum dot and energy level even if it is polymerized. For this reason, by using the polymer compound 5, a low driving voltage may be achieved. Thus, polymer compound 5 has a high triplet energy level and may achieve high current efficiency. Therefore, the electroluminescence device manufactured using the polymer compound 5 may exhibit high luminous efficiency. In addition, the polymer compound 5 may suppress an increase in a driving voltage. Therefore, the electroluminescence device manufactured using the polymer compound 5 may exhibit high luminous efficiency with a low driving voltage. In addition, since the polymer compound 5 has improved film formability and solvent solubility, it is possible to form a film in a wet (coating) method. Therefore, by using the polymer compound 5, a large area of the electroluminescence device and high productivity may be obtained. The above mechanism is speculative, and the present disclosure is independent of the mechanism.

In Chemical Formula (5-1), $Ar_1$ may independently be a C6 to C25 aromatic hydrocarbon group which may be optionally substituted or a C12 to C25 heterocyclic aromatic group which may be optionally substituted. Herein, examples of the C6 to C25 aromatic hydrocarbon group may include, for example, a monovalent group derived from aromatic hydrocarbon such as benzene (phenyl group), pentane, indene, naphthalene, anthracene, azulene, heptylene, acenaphthene, phenalene, fluorene, anthraquinoline, phenanthrene, biphenyl, terphenyl, tetraphenyl, pentaphenyl, hexaphenyl, pyrene, 9,9-diphenylfluorene, 9,9'-spirobi[fluorene], 9,9-dialkylfluorene, and the like, but are not limited thereto. In addition, examples of the C12 to C25 heterocyclic aromatic group include, but are not limited to, for example, a monovalent group derived a heterocyclic aromatic compound such as acridine, phenazine, benzoquinoline, benzisoquinoline, phenanthridine, phenanthroline, anthraquinone, fluorenone, dibenzofuran, dibenzothiophene, carbazole, imidazophenanthridine, benzimidazofuran, tridine, azadibenzofuran, 9-phenylcarbazole, azacarbazole, azadibenzothiophene, diazadibenzofuran, diazacarbazole, diazadibenzothiophene, xanthone, dioxanthone, pyridine, quinoline, anthraquinoline, and the like. Of these, at least one $Ar_1$ is desirably a monovalent group derived from a compound of benzene, fluorene, biphenyl, p-terphenyl, 9,9-diphenylfluorene, 9,9'-spirobi[fluorene], dibenzofuran, dibenzothiophene, or 9-phenylcarbazole. More desirably, both $Ar_1$'s are desirably monovalent groups derived from compounds of benzene, fluorene, biphenyl, p-terphenyl, 9,9-diphenylfluorene, 9,9'-spirobi[fluorene], dibenzofuran, dibenzothiophene, or 9-phenylcarbazole. In particular, both $Ar_1$'s are desirably biphenyl. With such $Ar_1$, a higher triplet energy level, a lower driving voltage, and higher efficiency may be achieved. In the desirable form described above, $Ar_1$ may be unsubstituted or any one hydrogen atom of $Ar_1$ may be replaced by a substituent.

Herein, when any one hydrogen atom of $Ar_1$ is replaced, the number of introduction of the substituent may be for example, desirably 1 to 3, more desirably 1 or 2, and particularly desirably 1, but is not particularly limited thereto. In the case where $Ar_1$ has a substituent, the binding position of the substituent is not particularly limited. The substituent is desirably positioned as far as possible from the nitrogen atom of the main chain to which $Ar_1$ links. By having a substituent in such a position, it is possible to achieve a higher triplet energy level, a lower driving voltage, and higher efficiency.

In addition, when any one of the hydrogen atoms of $Ar_1$ is replaced, the substituent is not particularly limited, but may include a halogen atom (fluorine atom, chlorine atom, bromine atom, iodine atom), an alkyl group, a cycloalkyl group, a hydroxyalkyl group, an alkoxyalkyl group, an alkoxy group, a cycloalkoxy group, an alkenyl group, an alkynyl group, an amino group, an aryl group, an aryloxy group, an alkylthio group, a cycloalkylthio group, an arylthio group, an alkoxycarbonyl group, an aryloxycarbonyl group, a hydroxyl group (—OH), a carboxyl group (—COOH), a thiol group (—SH), a cyano group (—CN), and the like. In the above, they are not substituted with the same substituent. That is, the alkyl group as the substituent is not substituted by the alkyl group.

Herein, the alkyl group may be either linear or branched, but desirably includes a C1 to C20 linear or branched alkyl group. Specifically, it may be a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isopropylpropyl group, a 1-ethyl-3-methylbutyl group, an n-octyl group, a 2-ethylhexyl group, a 3-methyl-1-isopropylbutyl group, a 2-methyl-1-isopropylbutyl group, a 1-tert-butyl-2-methylpropyl group, an n-nonyl group, a 3,5,5-trimethylhexyl group, an n-decyl group, an isodecyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, and the like.

The carbon number of the alkyl group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkyl group. This is because the ligand of the quantum dot and the alkyl group present in the hole transport layer may interact with each other, thereby improving effects such as hole injectability.

In addition, when the solvent that disperses the quantum dot is a long-chain hydrocarbon-based solvent, it is desirable that the number of the alkyl group in the polymer compound is small in terms of securing a residual film ratio of the hole transport layer.

Therefore, as the alkyl group, a linear or branched C1 to C18 alkyl group is more desirable. The alkyl group may be appropriately selected according to the used quantum dot or the solvent that disperses the quantum dot.

Examples of the cycloalkyl group include for example, a cyclopropyl group, a cyclobutyl group, a cyclopentyl group, and a cyclohexyl group.

As the hydroxyalkyl group, for example, the alkyl group may be substituted with 1 to 3 (desirably 1 or 2, and particularly desirably 1) hydroxy groups (for example, hydroxymethyl group, hydroxyethyl group).

As the alkoxyalkyl group, for example, the alkyl group may be substituted with 1 to 3 (desirably 1 or 2 and particularly desirably 1) alkoxy groups.

The alkoxy group may be, for example, a methoxy group, an ethoxy group, a propoxy group, an isopropoxy group, a butoxy group, a pentyloxy group, a hexyloxy group, a heptyloxy group, an octyloxy group, a nonyloxy group, a decyloxy group, an undecyloxy group, a dodecyloxy group, a tridecyloxy group, a tetradecyloxy group, a pentadecyloxy group, a hexadecyloxy group, a heptadecyloxy group, an octadecyloxy group, a 2-ethylhexyloxy group, a 3-ethylpentyloxy group, and the like.

The carbon number of the alkoxy group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkoxy group. This is because the ligand of the quantum dot and the alkoxy group present in the hole transport layer may interact with each other, thereby improving effects such as hole injectability.

In addition, when the solvent that disperses the quantum dot is a long-chain hydrocarbon-based solvent, it is desirable that the number of the alkoxy group in the polymer compound is small in terms of securing a residual film ratio of the hole transport layer.

Therefore, as the alkoxy group, a linear or branched C1 to C18 alkoxy group is more desirable. These alkoxy groups may be appropriately selected according to the used quantum dot or the solvent that disperses the quantum dot.

The cycloalkoxy group may include, for example, a cyclopropoxy group, a cyclobutoxy group, a cyclopentyloxy group, a cyclohexyloxy group, and the like.

The alkenyl group may include, for example, a vinyl group, an allyl group, a 1-propenyl group, an isopropenyl group, a 1-butenyl group, a 2-butenyl group, a 3-butenyl group, a 1-pentenyl group, a 2-pentenyl group, a 3-pentenyl group, a 1-hexenyl group, a 2-hexenyl group, a 3-hexenyl group, a 1-heptenyl group, a 2-heptenyl group, a 5-heptenyl group, a 1-octenyl group, a 3-octenyl group, a 5-octenyl group, and the like.

The alkynyl group may include, for example, an acetylenyl group, a 1-propynyl group, a 2-propynyl group, a 1-butynyl group, a 2-butynyl group, a 3-butynyl group, a 1-pentynyl group, a 2-pentynyl group, a 3-pentynyl group, 1-hexynyl group, a 2-hexynyl group, a 3-hexynyl group, a 1-heptynyl group, a 2-heptynyl group, a 5-heptynyl group, a 1-octynyl group, a 3-octynyl group, a 5-octynyl group, and the like.

The aryl group may include, for example, a phenyl group, a naphthyl group, a biphenyl group, a fluorenyl group, an anthryl group, a pyrenyl group, an azulenyl group, an acenaphthylenyl group, a terphenyl group, or a phenanthryl group.

The aryloxy group may include, for example, a phenoxy group, or a naphthyloxy group.

The alkylthio group may include, for example, a methylthio group, an ethylthio group, a propylthio group, a pentylthio group, a hexylthio group, an octylthio group, a dodecylthio group, and the like.

The cycloalkylthio group may include, for example, a cyclopentylthio group or a cyclohexylthio group.

The arylthio group may include, for example, a phenylthio group, a naphthylthio group, and the like.

The alkoxycarbonyl group may include, for example, a methyloxy carbonyl group, an ethyloxy carbonyl group, a butyloxy carbonyl group, an octyloxy carbonyl group, a dodecyloxycarbonyl group, and the like.

The aryloxycarbonyl group may include, for example, a phenyloxycarbonyl group, a naphthyloxycarbonyl group, and the like.

That is, in the desirable form of the present embodiment, $Ar_1$ is independently a group of the following groups. In the following structures, $R_{111}$ to $R_{133}$ are independently a hydrogen atom, a C1 to C12 linear or branched alkyl group, or a C6 to C25 aromatic hydrocarbon group which may be optionally substituted. Herein, the C1 to C12 linear or branched alkyl group may be, for example, a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isopropylpropyl group, a 1-ethyl-3-methylbutyl group, an n-octyl group, a 2-ethylhexyl group, a 3-methyl-1-isopropylbutyl group, a 2-methyl-1-isopropylbutyl group, a 1-tert-butyl-2-methylpropyl group, an n-nonyl group, a 3,5,5-trimethylhexyl group, an n-decyl group, an isodecyl group, an n-undecyl group, a 1-methyldecyl group, an n-dodecyl group, and the like. In addition, the C6 to C25 aromatic hydrocarbon group may include, for example, the same examples as defined in $Ar_1$, but is not particularly limited thereto. In terms of higher triplet energy levels and lower driving voltages, $R_{111}$ to $R_{133}$ are desirably a hydrogen atom or a linear or branched C2 to C10 alkyl group. More desirably, $R_{111}$ to $R_{133}$ are hydrogen or a C3 to C6 linear alkyl group.

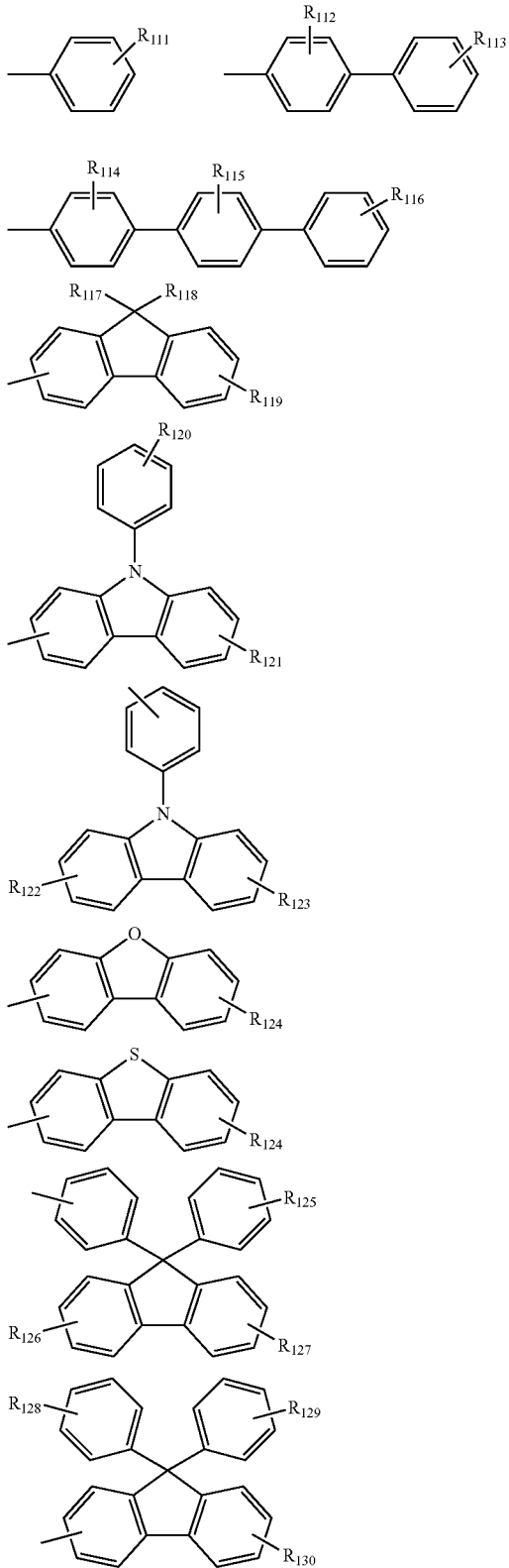

In Chemical Formula (5-1), $Ar_2$ indicates a C6 to C25 divalent aromatic hydrocarbon group which may be optionally substituted or a C12 to C25 divalent heterocyclic aromatic group which may be optionally substituted. Herein, the C6 to C25 divalent aromatic hydrocarbon group may include, for example, a divalent group derived from C6 to C25 aromatic hydrocarbon defined in $Ar_1$, but is not particularly limited thereto. Similarly, the C12 to C25 divalent heterocyclic aromatic group may include, for example, a divalent group derived from the C12 to C25 heterocyclic aromatic compound defined in $Ar_1$, but is not particularly limited thereto. Of these, $Ar_2$ is desirably a divalent group derived from benzene, biphenyl, terphenyl, tetraphenyl, pentaphenyl, hexaphenyl, fluorene, 9-phenylcarbazole, dibenzofuran, dibenzothiophene, 9,9-diphenylfluorene, and 9,9'-spirobi[fluorene]. More desirably, $Ar_2$ is desirably a divalent group derived from phenyl, biphenyl, terphenyl, tetraphenyl, pentaphenyl, or fluorene. In particular, $Ar_2$ is desirably a divalent group derived from biphenyl, p-terphenyl, p-tetraphenyl, or p-pentaphenyl. $Ar_2$ is desirably a divalent group derived from p-pentaphenyl. Such $Ar_2$ may achieve a higher triplet energy level, a lower driving voltage, and higher efficiency. In the desirable form described above, $Ar_2$ may be unsubstituted or any one hydrogen atom of $Ar_2$ may be replaced by a substituent.

Herein, when any one or more hydrogen atom of $Ar_2$ is replaced, the number of the substituent is not particularly limited, but may be for example, desirably 1 to 3, more desirably 1 or 2, and particularly desirably 1. In the case where $Ar_2$ has a substituent, the binding position of the substituent is not particularly limited. For example, in the case of a plurality of substituents, the substituents are desirably in the same aromatic ring or heterocycle, more desirably in the same aromatic ring, and particularly desirably in the same phenyl ring. For example, when two substituents are present in the p-phenylene group, the two substituents may be present at any of positions 2 and 3, positions 2 and 5, and positions 3 and 5, but desirably at positions 2 and 5, and positions 3 and 5, and particularly desirably at positions 3 and 5. In the case where a plurality of substituents are present in a plurality of aromatic rings or heterocycles linked to each other, the substituents desirably exist in an aromatic ring or heterocycle near the center. By having the substituent in such a position, it is possible to achieve a higher triplet energy level, a lower driving voltage, and higher efficiency.

In addition, when any one of the hydrogen atoms of $Ar_2$ is replaced, the substituent is not particularly limited, but may include the same examples as $Ar_1$.

That is, in the desirable form of the present disclosure, $Ar_2$ is a divalent group of the following groups. In the following structures, $R_{211}$ to $R_{269}$ are independently a hydrogen atom, a C1 to C12 linear or branched alkyl group, or a C6 to C25 aromatic hydrocarbon group which may be optionally substituted. Herein, the C1 to C12 linear or branched alkyl group, or the C6 to C25 aromatic hydrocarbon group which may be optionally substituted is not particularly limited, but may include the same example as $R_{111}$ to $R_{133}$. In terms of higher triplet energy levels and lower driving voltages, $R_{211}$ to $R_{269}$ are desirably a hydrogen atom or a linear or branched C2 to C10 alkyl group. More desirably, $R_{211}$ to $R_{269}$ are hydrogen or a C3 to C6 linear alkyl group.
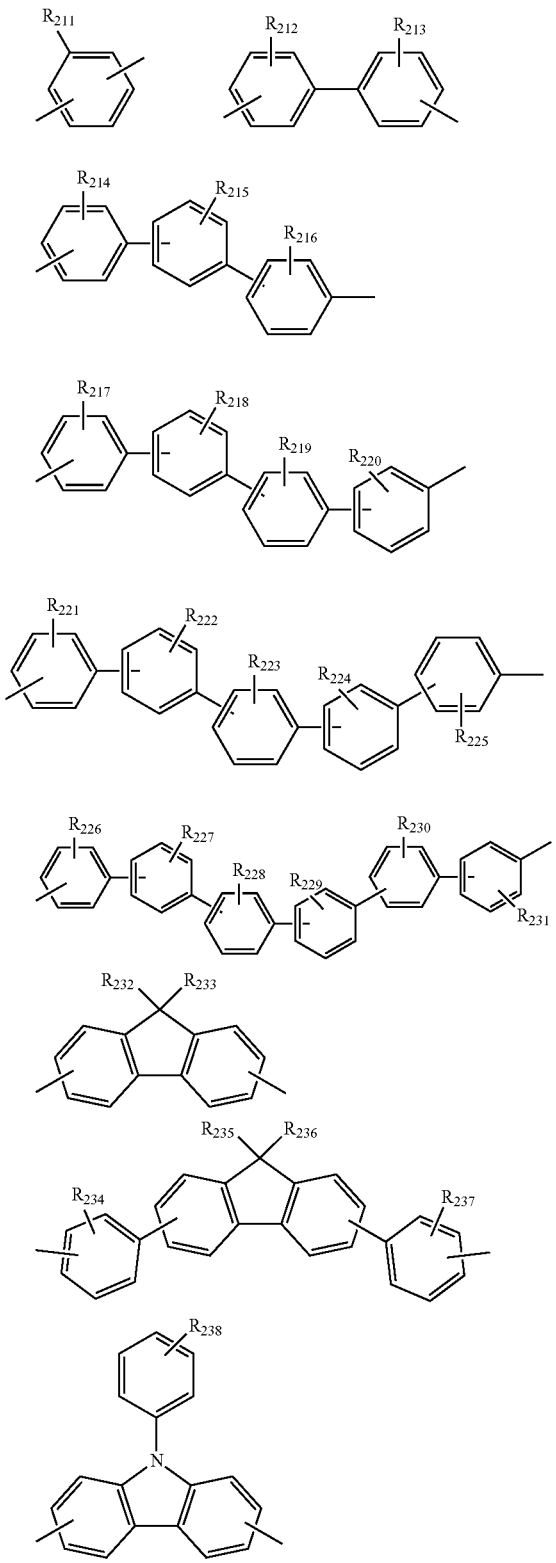
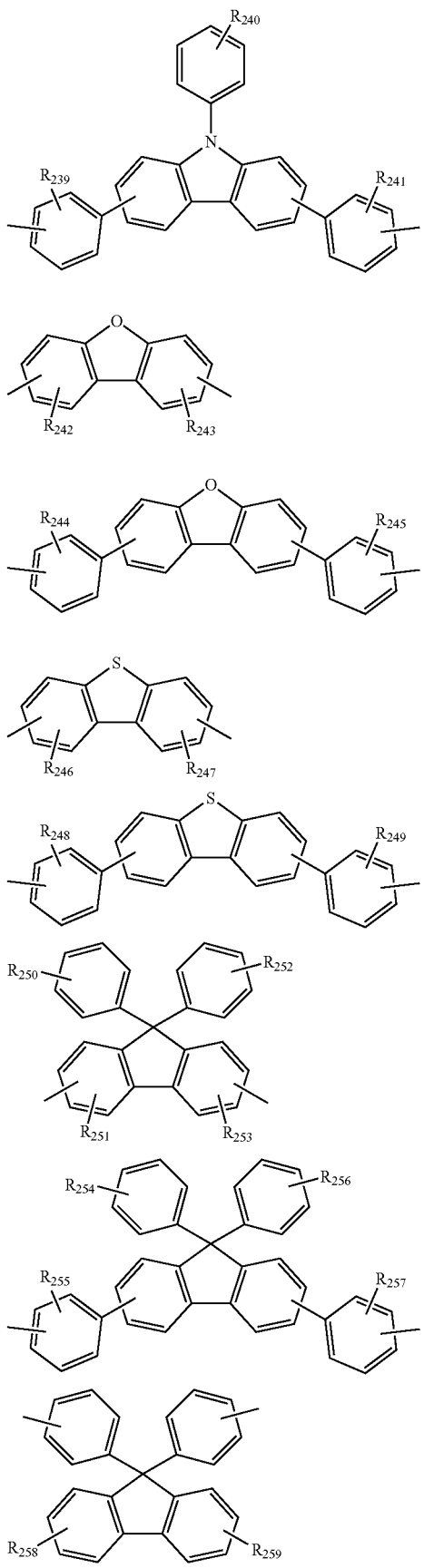

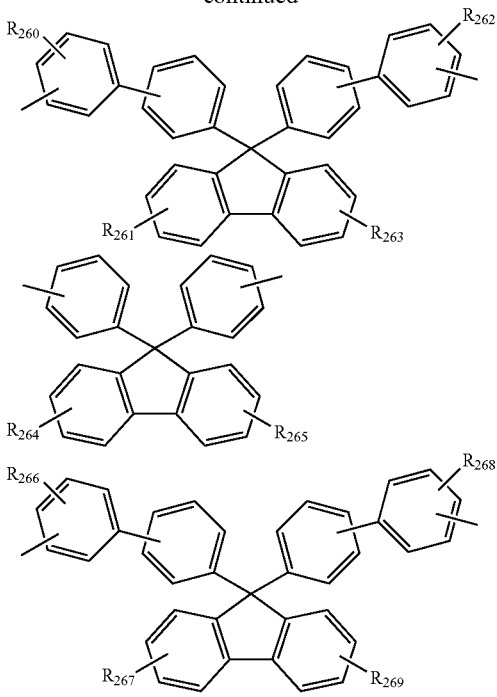

In addition, in Chemical Formula (5-1), $R_1$ is independently a hydrogen atom, a C1 to C12 linear, branched, or cyclic hydrocarbon group, or a C6 to C25 divalent aromatic hydrocarbon group which may be optionally substituted. Herein, the C1 to C12 linear, branched, or cyclic hydrocarbon group may include, for example, linear or branched alkyl group, alkenyl group, alkynyl group, and cycloalkyl group, but is not particularly limited thereto. When $R_1$ is an alkenyl group or an alkynyl group, the carbon number of $R_1$ is greater than or equal to 2 and less than or equal to 12. Similarly, when $R_1$ is a cycloalkyl group, the carbon number of $R_1$ is greater than or equal to about 3 and less than or equal to about 12.

The C1 to C12 alkyl group may include, for example, a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isopropylpropyl group, a 1-ethyl-3-methylbutyl group, an n-octyl group, a 2-ethylhexyl group, a 3-methyl-1-isopropylbutyl group, a 2-methyl-1-isopropylbutyl group, a 1-tert-butyl-2-methylpropyl group, an n-nonyl group, a 3,5,5-trimethylhexyl group, an n-decyl group, an isodecyl group, an n-undecyl group, a 1-methyldecyl group, an n-dodecyl group, and the like.

The C2 to C12 alkenyl group may include a vinyl group, an allyl group, a 1-propenyl group, a 2-butenyl group, a 1,3-butenthienyl group, a 2-pentenyl group, an isopropenyl group, and the like.

The C2 to C12 alkynyl group may include, for example, an ethynyl group, or a propargyl group.

The C3 to C12 cycloalkyl group may include, for example, a cyclopropyl group, a cyclobutyl group, a cyclopentyl group, a cyclohexyl group, and the like.

Of these, $R_1$ is independently a hydrogen atom or a C1 to C12 linear or branched alkyl group. In terms of a higher triplet energy level and a lower driving voltage, $R_1$ is more desirably a hydrogen atom or a C3 to C6 linear alkyl group.

In addition, a polymerization degree of the structural unit (5-A) may be, for example, an integer from 10 to 1,000, but is not particularly limited thereto. In terms of a higher triplet energy level and a lower driving voltage, the polymerization degree of the structural unit (5-A) is desirably greater than or equal to about 5 and less than or equal to about 500, more desirably greater than or equal to about 10 and less than or equal to about 300, and particularly desirably greater than or equal to about 10 and less than or equal to about 150.

In the present embodiment, in terms of further improvement of the triplet energy level and hole transport capability, and further decreasing a driving voltage, the structural unit (5-A) represented by Chemical Formula (5-1) is desirably the structural units represented by Chemical formula (5-A-1) to Chemical formula (5-A-4). Desirably, the structural unit (5-A) is a structural unit represented by Chemical Formula (5-A-1). In the following description, "Alkyl" means "unsubstituted or substituted with an alkyl group". Desirably, "Alkyl" means unsubstitution (i.e., Alkyl=hydrogen atom) or substitution with a linear or branched C1 to C18 alkyl group. More desirably, "Alkyl" means unsubstitution or substitution with a linear or branched C3 to C6 alkyl group. In addition, "Alkyl" may be the same alkyl group or a different alkyl group.

5-A-1

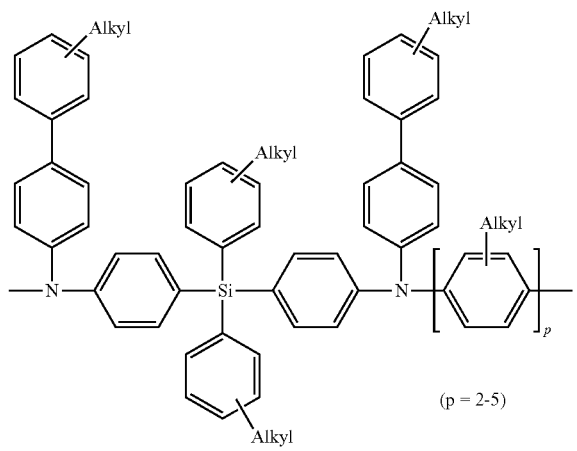

(p = 2-5)

-continued

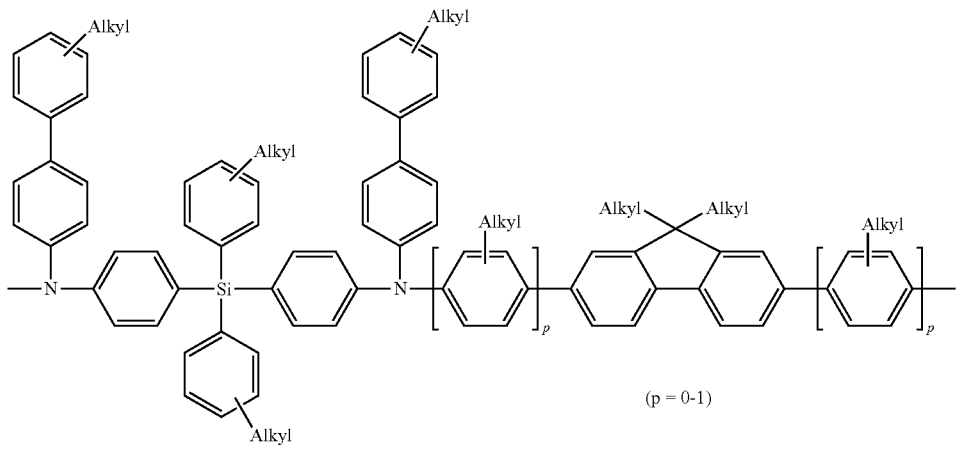

5-A-2

(p = 0-1)

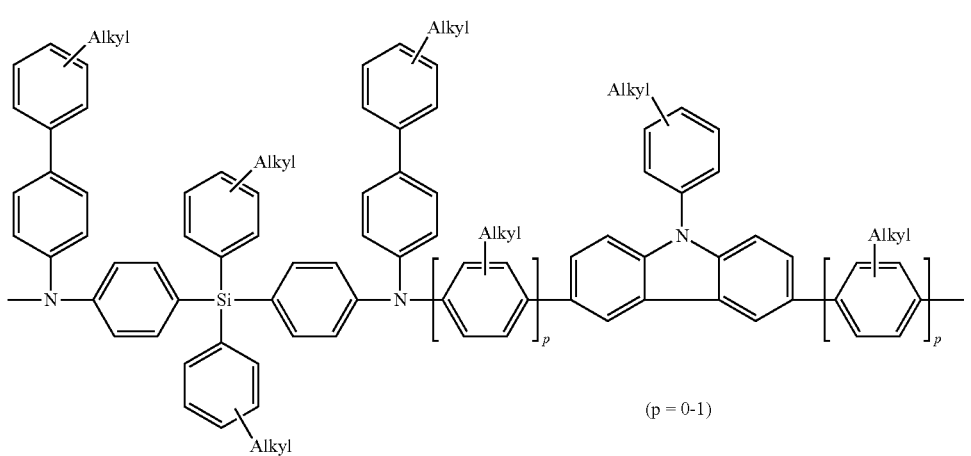

5-A-3

(p = 0-1)

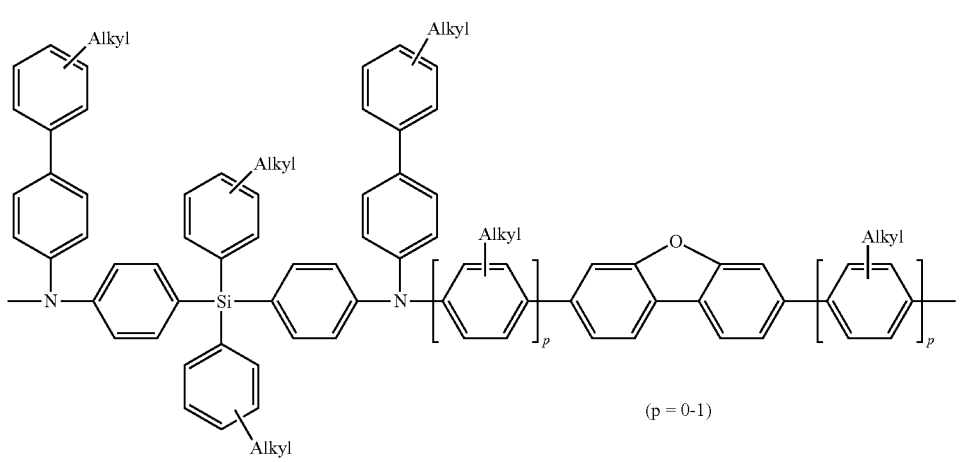

5-A-4

(p = 0-1)

A composition of the structural unit (5-A) in the polymer compound 5 of the present embodiment is not particularly limited. Considering the effect of further improving the hole transport capability of the layer (for example, hole injection layer, hole transport layer) formed using the obtained polymer compound 5, the structural unit (5-A) may be desirably included in an amount of greater than equal to about 10 mol % and less than or equal to about 100 mol %, more desirably greater than equal to about 50 mol % and less than or equal to about 100 mol %, and particularly desirably about 100 mol % based on a total structural unit constituting the polymer compound 5. That is, in the desirable form of the present embodiment, the structural unit (5-A) is included in a ratio of greater than or equal to about 10 mol % and less than or equal to about 100 mol % based on a total structural unit. In the more desirable form of the present embodiment, the structural unit (5-A) is included in a ratio of greater than or equal to about 50 mol % and less than or equal to about 100 mol % based on a total structural unit. In the particularly desirable form of the present embodiment, the polymer compound 5 consists of structural units (5-A) alone. When the polymer compound 5 includes two or more structural units (5-A), a content of the structural unit (5-A) means the total amount of the structural units (5-A).

As described above, the polymer compound 5 of the present embodiment may be composed of the structural unit (5-A) alone. Alternatively, the polymer compound 5 of the present embodiment may further include a structural unit other than the structural unit (5-A). In the case of including other structural units, other structural units are not particularly limited as long as they do not inhibit effects of the polymer compound 5 (particularly high triplet energy level, low driving voltage, etc.). Specifically, the structural unit represented by Chemical Formula (5-2) may be exemplified. The structural unit represented by Chemical Formula (5-2) is also referred to as "structural unit (5-B)".

Structural unit (5-B)

Chemical Formula (5-2)

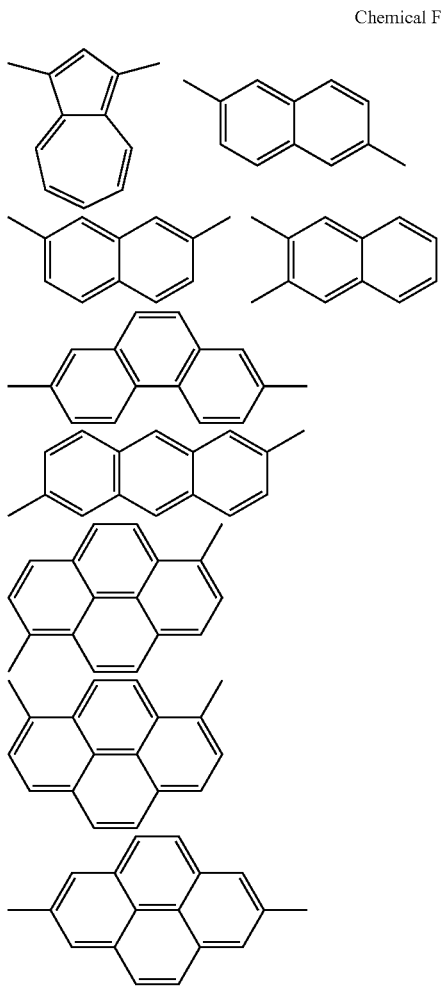

The composition of the structural unit (5-B) in the polymer compound 5 of the present embodiment is not particularly limited. Considering the ease of film formation by the obtained polymer compound and the further improvement effect of the film strength, the structural unit (5-B) is desirably included in an amount of greater than or equal to about 1 mol % and less than or equal to about 10 mol % based on a total structural unit constituting the polymer compound 5. When the polymer compound 5 includes two or more structural units (5-B), a content of the structural unit (5-B) means the total amount of the structural units (5-B).

When the polymer compound 5 is composed of two or more structural units, the structure of the polymer compound 5 is not particularly limited. The polymer compound 5 may be any of a random copolymer, an alternate copolymer, a periodic copolymer, and a block copolymer.

The main chain terminal end of the polymer compound 5 of the present embodiment is not particularly limited, but is usually hydrogen depending on the type of the used raw material.

The polymer compound 5 of the present embodiment may be synthesized by using a known organic synthesis method. The specific synthesis method of the polymer compound 5 of the present embodiment may be easily understood by a person of an ordinary skill in the art referring to the following examples. Specifically, the polymer compound 5 of the present embodiment may be prepared by a polymerization reaction using at least one monomer 5-1 represented by Chemical Formula (5-1), or by a copolymerization reaction at least one monomer 5-1 represented by Chemical Formula (5-1) and the other structural units. The monomers used for the polymerization of the polymer compound 5 may be synthesized by appropriately combining a known synthesis reaction, and their structures may be confirmed by known methods (for example, NMR, LC-MS, etc.).

(5-1′)

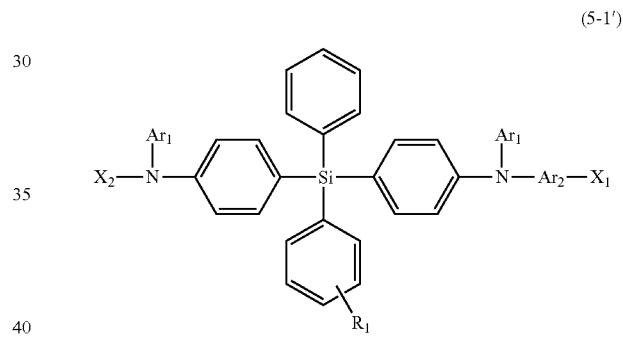

In Chemical Formula (5-1), $Ar_1$, $Ar_2$, and $R_1$ are the same as defined in Chemical Formula (5-1). In addition, $X_1$ and $X_2$ are independently a halogen atom (a fluorine atom, a chlorine atom, a bromine atom, an iodine atom, particularly a bromine atom) or a group having the following structure. In the following structure, $R_A$ to $R_D$ are independently a C1 to C3 alkyl group. Desirably, $R_A$ to $R_D$ may be a methyl group.

(Polymer Compound 6)

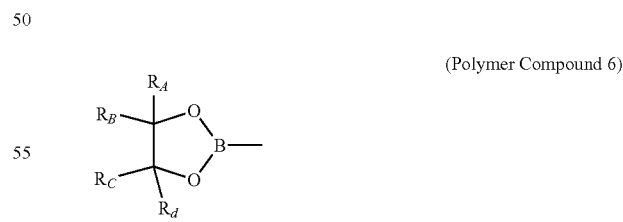

According to a preferred embodiment of the present disclosure, the polymer material includes a polymer compound (hereinafter referred to simply as "polymer compound 6") having at least one of a structural unit (6-1) represented by Chemical Formula (6-1) and a structural unit (6-2) represented by Chemical Formula (6-2). According to a more preferred embodiment, the polymer material may be a polymer compound 6.

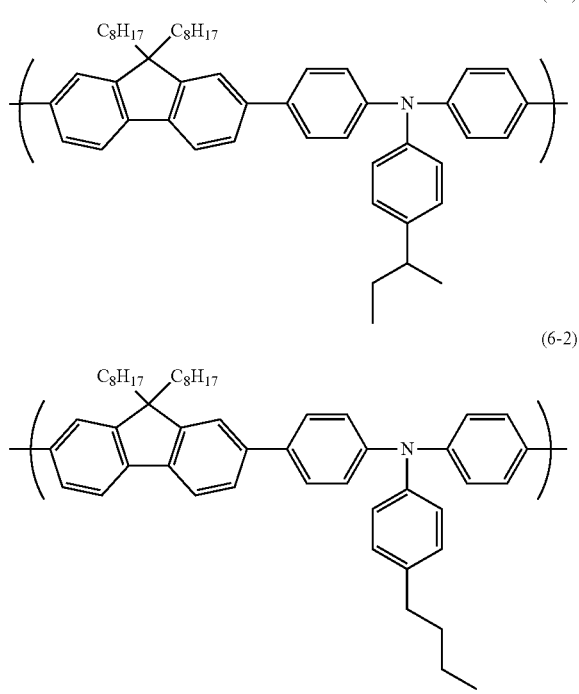

(6-1)

(6-2)

The polymer compound 6 may be a homopolymer (poly (9,9-dioctylfluorene-co-N-(4-butylphenyl)-diphenylamine, TFB)) having the structural unit (6-1) alone. It may also be a homopolymer having the structural unit (6-2) alone. Furthermore, a copolymer which has the structural unit (6-1) and structural unit (6-2) may be used.

Low Molecular Material

The hole transport layer according to the present disclosure includes a low molecular material along with the polymer material. The low molecular material is present in the hole transport layer to fill the so-called gap of the polymer material, and the low molecular compound is not mixed in the light emitting layer. As a result, a compact hole transport layer may be formed, and the hole transport capability of the hole transport layer is improved. The quantum dot EL device having such a hole transport layer has improved luminous efficiency and light emitting lifespan.

The low molecular material desirably is a hole transporting material or a wide gap material. In addition, the low molecular material may desirably be included among one or more types of polymer materials.

A molecular weight of the low molecular material may desirably be greater than or equal to about 100 g/mole and less than or equal to about 1,500 g/mole. Within such a range, the film may be solidified and sublimation purification may be easily performed, so that a high purity product may be easily obtained. In addition, since appropriate molecular sizes may be obtained, filling effect between the gaps of the polymer may be more improved. The molecular weight of the low molecular material is desirably greater than or equal to about 500 g/mole and less than or equal to about 1,500 g/mole, and desirably greater than or equal to about 600 g/mole and less than or equal to about 1,300 g/mole.

The molecular weight of the low molecular material is a sum of the atom weight of each atom.

The low molecular material of the present embodiment may be synthesized by using a known organic synthesis method. The specific synthesis method of the low molecular material of the present embodiment may be easily understood by a person of an ordinary skill in the art. The structure of the low molecular material may be confirmed by a known method (for example, NMR, LC-MS, etc.).

The low molecular material of the present embodiment may desirably include at least one of the hole transporting material and the wide gap material. By adding the low molecular material, a film density may be increased to improve hole transport capability and optimize carrier balance. When the low molecular material is a hole transporting material and a wide gap material, the low molecular material is not easily degraded when the device is driven, which is more desirable.

Hereinafter, low molecular compounds 1 to 6, which are a desirable embodiment of the low molecular material, are described. The low molecular material may be used alone or in combination of 2 or more types.

Low Molecular Compounds 1 and 2

According to the preferred embodiment of the present disclosure, the low molecular material may include at least one of a low molecular compound represented by Chemical Formula (L1) (hereinafter also referred to as "low molecular compound 1") and a low molecular compound represented by Chemical Formula (L2) (hereinafter, also referred to as "low molecular compound 2"). The low molecular compounds 1 and 2 are hole transporting materials and when used in combination with the polymer material, the low molecular compounds 1 and 2 exist to enter the gap of the polymer material. Therefore, a more dense hole transport layer may be provided and the hole transport capability of the hole transport layer may be improved. In addition, since the hole transport capability of the low molecular compounds 1 and 2 themselves, which are the hole transporting materials to be added, is imparted to the hole transport layer, an effect of further improving hole transport properties may be obtained.

According to a more desirable embodiment, the low molecular material is at least one type of the low molecular compound 1 and the low molecular compound 2.

Hereinafter, the low molecular compound 1 and the low molecular compound 2 are described.

Low Molecular Compound 1

The low molecular compound 1 is a compound represented by Chemical Formula (L1).

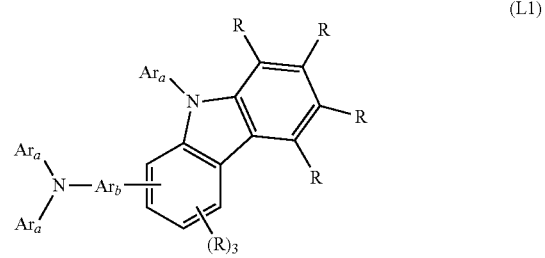

(L1)

In Chemical Formula (L1), R is independently a hydrogen atom, a deuterium atom, or a monovalent organic group. In Chemical Formula (L1), a plurality of R's, preferably adjacent R's, may be linked to each other to form a ring. In view of further improving the effect of the present disclosure, in Chemical Formula (L1), R may desirably be a hydrogen atom.

Specific examples of the monovalent organic group may include an alkyl group, a cycloalkyl group, an alkenyl group, an alkynyl group, an aryl group, a heteroaryl group, an acyl group, an alkoxycarbonyl group, an amino group, an alkoxy group, a cycloalkyloxy group, an aryloxy group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, a silyl group, a sulfonyl group, a sulfinyl group, an ureide group, a phosphoric acid amide group, a halogen atom, a hydroxyl group, a mercapto group, a cyano group, a sulfo group, a carboxyl group, a nitro group, a hydroxamic acid group, a sulfino group, a hydrazino group, or an imino group.

The carbon number of the alkyl group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkyl group. This is because the ligand of the quantum dot and the alkyl group present in the hole transport layer may interact with each other, thereby improving effects such as hole injectability.

In addition, when the solvent that disperses the quantum dot is a long-chain hydrocarbon-based solvent, it is desirable that the number of the alkyl group in the polymer compound is small in terms of securing a residual film ratio of the hole transport layer.

Therefore, as the alkyl group, a linear or branched C1 to C18 alkyl group is more desirable. The alkyl group may be appropriately selected according to the used quantum dot or the solvent that disperses the quantum dot.

The carbon number of the alkoxy group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkoxy group. This is because the ligand of the quantum dot and the alkoxy group present in the hole transport layer may interact with each other, thereby improving effects such as hole injectability.

In addition, when the solvent that disperses the quantum dot is a long-chain hydrocarbon-based solvent, it is desirable that the number of the alkoxy group in the polymer compound is small in terms of securing a residual film ratio of the hole transport layer.

Therefore, as the alkoxy group, a linear or branched C1 to C18 alkoxy group is more desirable. These alkoxy groups may be appropriately selected according to the used quantum dot or the solvent that disperses the quantum dot.

In Chemical Formula L1, $Ar_a$ may be a group represented by Chemical Formula (L1-a). In Chemical Formula L1, a plurality of Ara's may be the same or different, but are desirably different. In Chemical Formula L1, a plurality of $Ar_a$'s, preferably adjacent $Ar_a$'s may be linked to each other to form a ring.

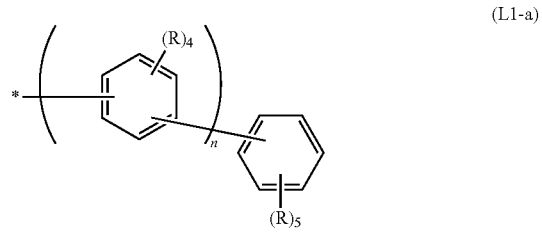

(L1-a)

In Chemical Formula (L1-a), R is independently a hydrogen atom, a deuterium atom, or a monovalent organic group. In Chemical Formula (L1-a), a plurality of R's, preferably adjacent R's, may be linked to each other to form a ring. Herein, the monovalent organic group may include, for example, a linear or branched C1 to C24 alkyl group, but is not particularly limited thereto. In addition, in Chemical Formula (L1-a), n is an integer of 0 to 3, desirably 0 to 2, and more desirably 0 or 1. In addition, in Chemical Formula (L1-a), * represents a linking portion with an adjacent atom.

Specific examples of the linear or branched C1 to C24 alkyl group may be a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isopropylpropyl group, a 1-ethyl-3-methylbutyl group, an n-octyl group, a 2-ethylhexyl group, a 3-methyl-1-isopropylbutyl group, a 2-methyl-1-isopropylbutyl group, a 1-tert-butyl-2-methylpropyl group, an n-nonyl group, a 3,5,5-trimethylhexyl group, an n-decyl group, an isodecyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, an n-eicosyloxy group, an n-heneicosyl group, an n-docosyl group, an n-tricosyl group, and an n-tetracosyl group.

The carbon number of the alkyl group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkyl group. This is because the ligand of the quantum dot and the alkyl group present in the hole transport layer may interact with each other, thereby improving effects such as hole injectability.

In addition, when the solvent that disperses the quantum dot is a long-chain hydrocarbon-based solvent, it is desirable that the number of the alkyl group in the polymer compound is small in terms of securing a residual film ratio of the hole transport layer.

Therefore, as the alkyl group, a linear or branched C1 to C18 alkyl group is more desirable. The alkyl group may be appropriately selected according to the used quantum dot or the solvent that disperses the quantum dot.

From the viewpoint of further improving the effect of the present disclosure, $Ar_a$ may be desirably a group represented by Group L1-A. In Group L1-A, R' may be a C1 to C24 linear or branched alkyl group and desirably a C1 to C16 linear alkyl group. In Group L1-A, * represents a linking portion with an adjacent atom.

(Group L1-A)

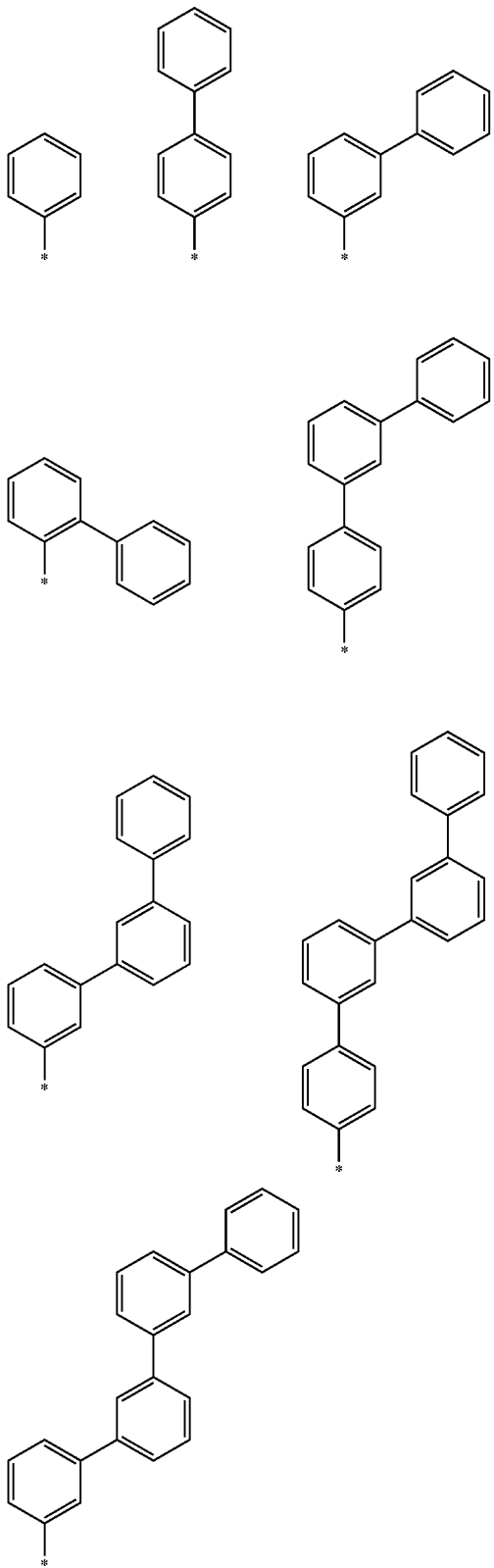

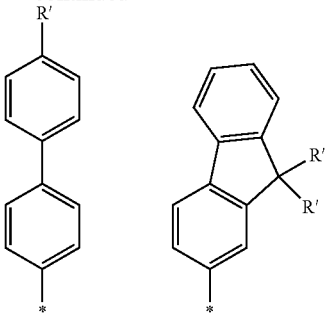

From the viewpoint of further improving the effect of the present disclosure, $Ar_a$ may be desirably a group of Group L1-A'. In Group L1-A', dodecyl indicates an n-dodecyl group. In addition, * represents a linking portion with an adjacent atom.

(Group L1-A')

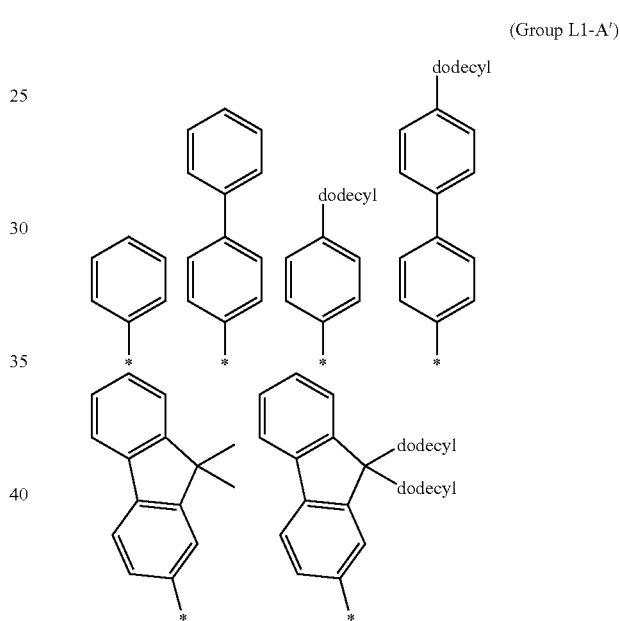

In Chemical Formula L1, Arb is a group represented by Chemical Formula (L1-b).

(L1-b)

In Chemical Formula (L1-b), R is independently a hydrogen atom, a deuterium atom, or a monovalent organic group. In Chemical Formula (L1-b), a plurality of R's, preferably adjacent R's, may be linked to each other to form a ring. From the viewpoint of further improving the effect of the present disclosure, in Chemical Formula (L1-b), R is desirably a hydrogen atom.

In Chemical Formula (L1-b), m is an integer of 0 to 2, desirably 1 or 2, and more desirably 1. In Chemical Formula (L1-b), * represents a linking portion with an adjacent atom.

In Chemical Formula L1, Arb is desirably a group of Group L1-B. In Group L1-B, R' is independently a C1 to C24 linear or branched alkyl group. In Group L1-B, a plurality of R', preferably adjacent R' may be linked to each other to form a ring. In Group L1-B, * represents a linking portion with an adjacent atom. Among them, from the viewpoint of further improving the effect of the present disclosure, Arb may be desirably a para-phenylene group.

The carbon number of the alkyl group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkyl group. This is because the ligand of the quantum dot and the alkyl group present in the hole transport layer may interact with each other, thereby improving effects such as hole injectability.

In addition, when the solvent that disperses the quantum dot is a long-chain hydrocarbon-based solvent, it is desirable that the number of the alkyl group in the polymer compound is small in terms of securing a residual film ratio of the hole transport layer.

The alkyl group may be more desirably a linear or branched C1 to C18 alkyl group. The alkyl group may be appropriately selected according to the used quantum dot or the solvent that disperses the quantum dot.

(Group L1-B)

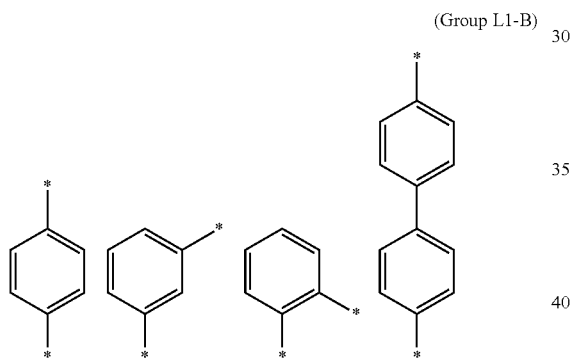

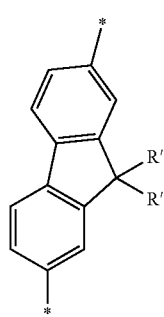

The low molecular compound 1 may be desirably a compound represented by any one of Chemical Formula (L1-1) to Chemical Formula (L1-3).

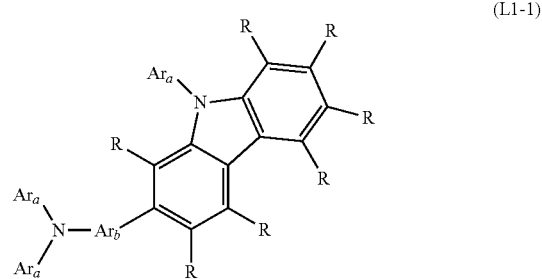
(L1-1)

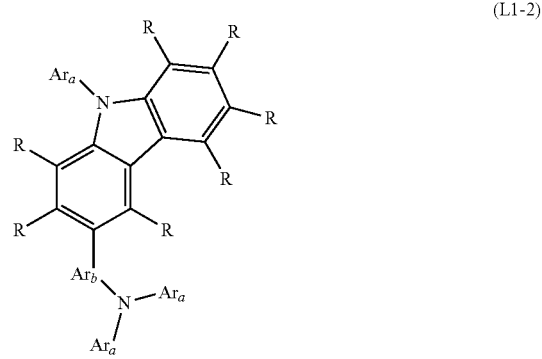
(L1-2)

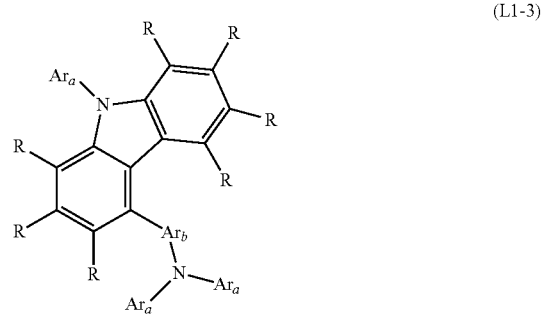
(L1-3)

In Chemical Formula (L1-1) to Chemical Formula (L1-3), the definitions of R, $Ar_a$, and $Ar_b$ are the same as those in Chemical Formula (L1).

Specific examples of the low molecular compound 1 may be a compound represented by the following chemical formulae. The low molecular compound 1 may be used alone or in a combination of two or more types.

157
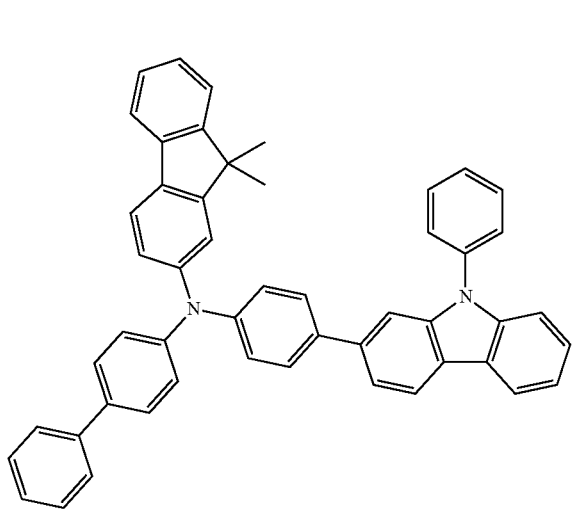
158
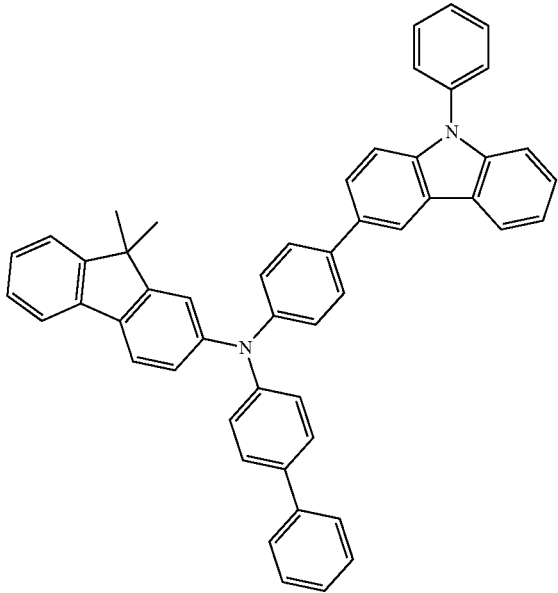
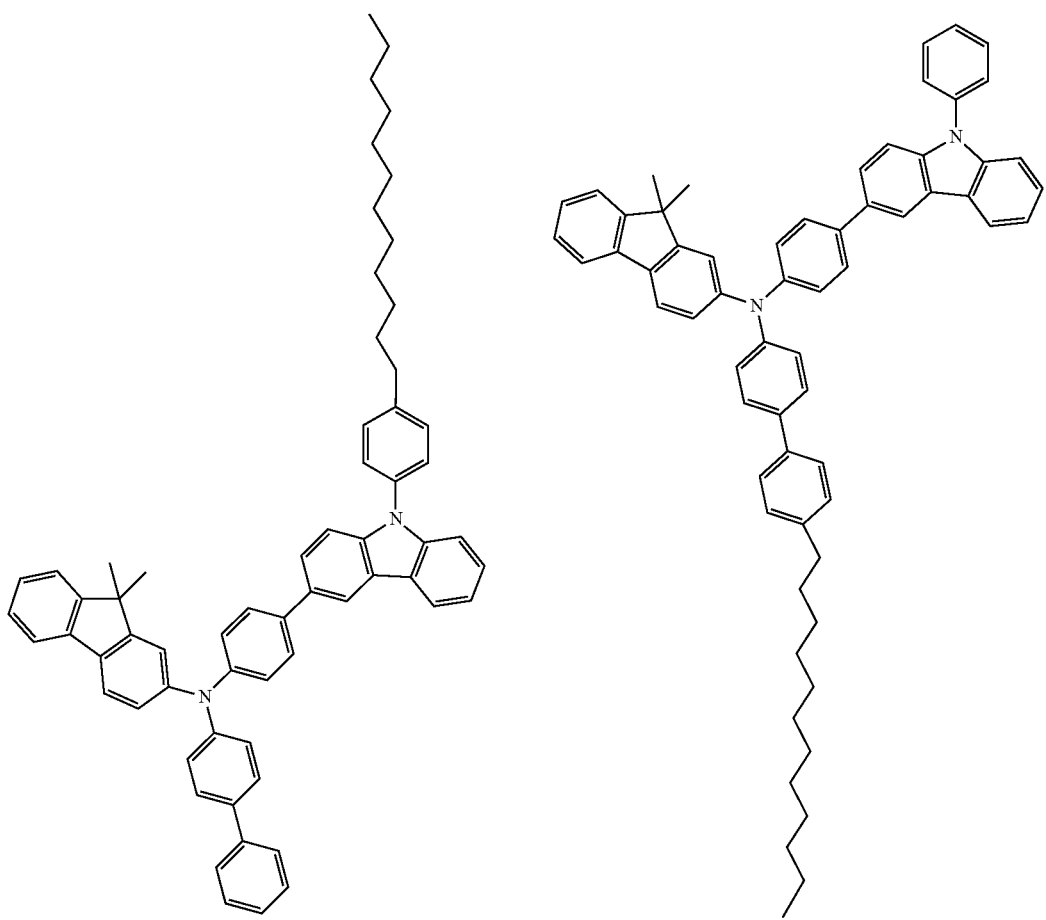

-continued
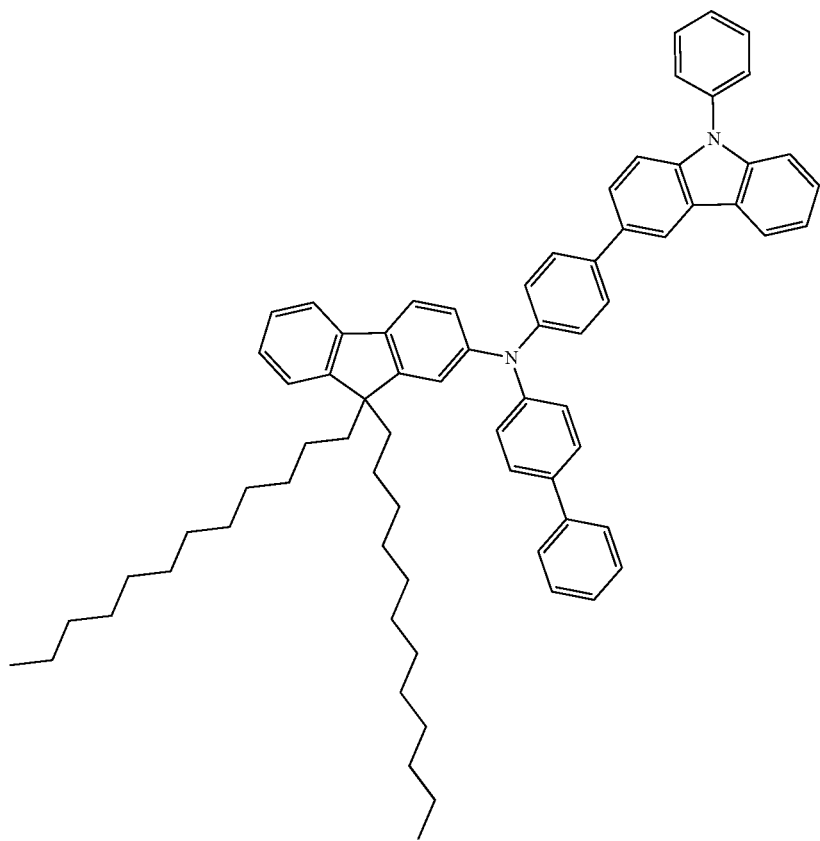
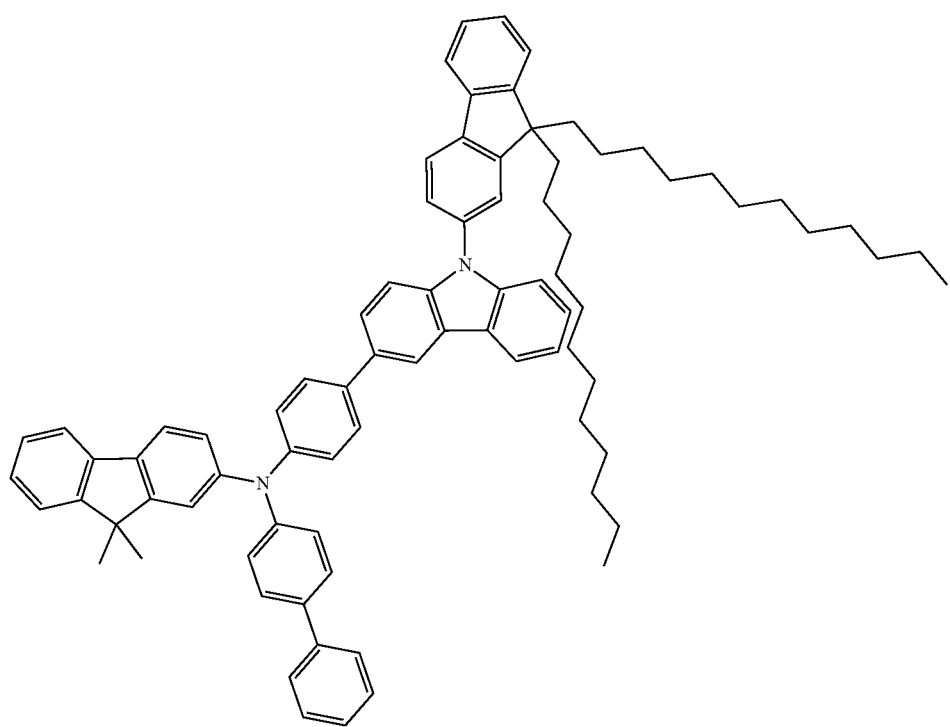

The low molecular compound 1 may be synthesized by using a known organic synthesis method.

Low Molecular Compound 2

Low molecular compound 2 is a compound represented by Chemical Formula (L2).

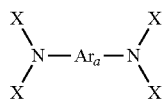
(L2)

In Chemical Formula (L2), $Ar_a$ is a group represented by Chemical Formula (L2-a).

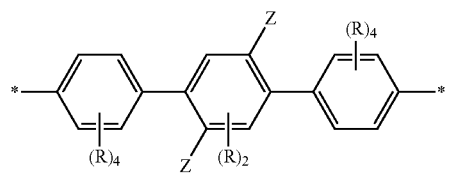
(L2-a)

In Chemical Formula (L2-a), R is independently a hydrogen atom, a deuterium atom, or a monovalent organic group. In Chemical Formula (L2-a), a plurality of R's, preferably adjacent R's, may be linked to each other to form a ring. In Chemical Formula (L2-a), Z may be a C1 to C12 linear or branched alkyl group, and desirably C4 to C12 linear alkyl group. In Chemical Formula (L2-a), * represents a linking portion with an adjacent atom.

From the viewpoint of further improving the effect of the present disclosure, in Chemical Formula (L2), $Ar_a$ may be desirably a group represented by Chemical Formula (L2-a').

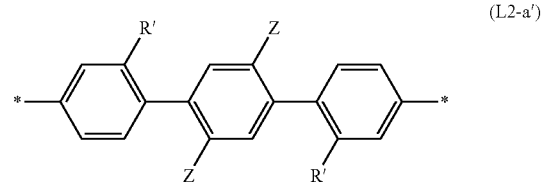
(L2-a')

In Chemical Formula (L2-a'), Z is the same define as in Chemical Formula (L2-a). In Chemical Formula (L2-a'), R' is hydrogen or a methyl group. In Chemical Formula (L2-a'), * represents a linking portion with an adjacent atom.

From the viewpoint of further improving the effect of the present disclosure, $Ar_a$ may be desirably a group of Group L2-A. In Group L2-A, * represents a linking portion with an adjacent atom.

(Group L2-A)

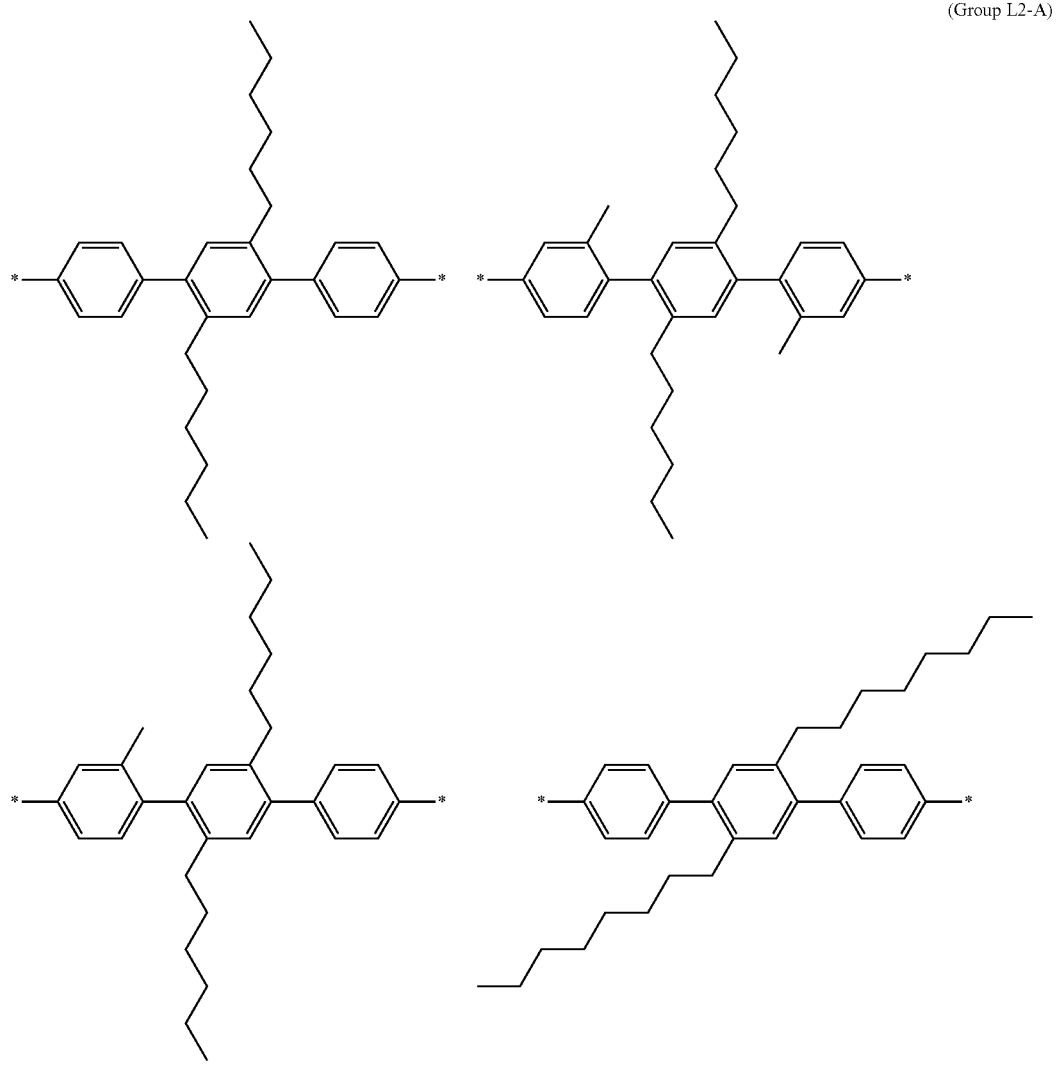

-continued

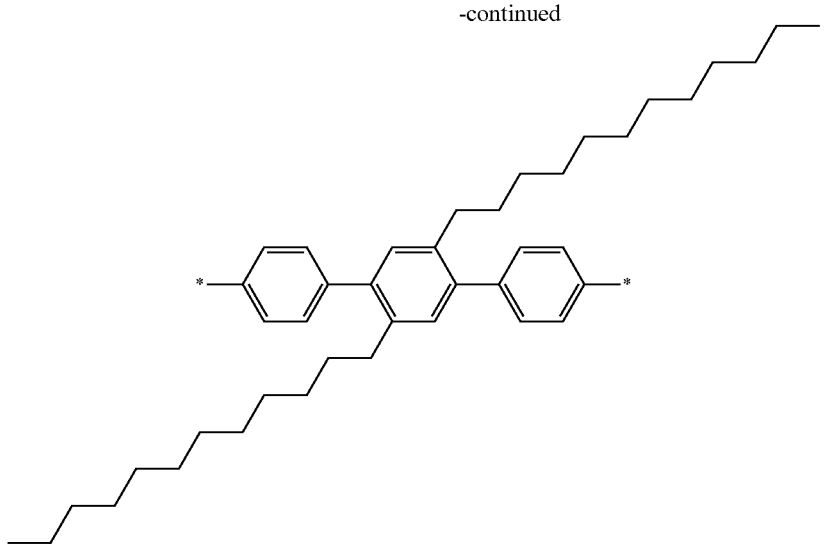

In Chemical Formula (L2), X is a group represented by Chemical Formula (L2-b). In Chemical Formula (L2), a plurality of X's may be the same or different. In Chemical Formula (L2), a plurality of X's, preferably adjacent X's, may be linked to each other to form a ring.

(L2-b)

In Chemical Formula (L2-b), R is independently a hydrogen atom, a deuterium atom, or a monovalent organic group. In Chemical Formula (L2-b), a plurality of R's, preferably adjacent R's, may be linked to each other to form a ring. In addition, in Chemical Formula (L2-b), n is an integer of 0 to 3, desirably 0 to 2, and more desirably 0 or 1. In addition, in Chemical Formula (L2-b), * represents a linking portion with an adjacent atom.

From the viewpoint of further improving the effect of the present disclosure, X may be desirably a group of Group L2-B. In Group L2-B, R' may independently be a C1 to C24 linear or branched alkyl group. In Group L2-B, a plurality of R', preferably adjacent R', may be linked to each other to form a ring. In Group L2-B, * represents a linking portion with an adjacent atom.

The carbon number of the alkyl group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkyl group. This is because the ligand of the quantum dot and the alkyl group present in the hole transport layer may interact with each other, thereby improving effects such as hole injectability.

In addition, when the solvent that disperses the quantum dot is a long-chain hydrocarbon-based solvent, it is desirable that the number of the alkyl group in the polymer compound is small in terms of securing a residual film ratio of the hole transport layer.

Therefore, as the alkyl group, a linear or branched C1 to C18 alkyl group is more desirable. The alkyl group may be appropriately selected according to the used quantum dot or the solvent that disperses the quantum dot.

Chemical Formula 108

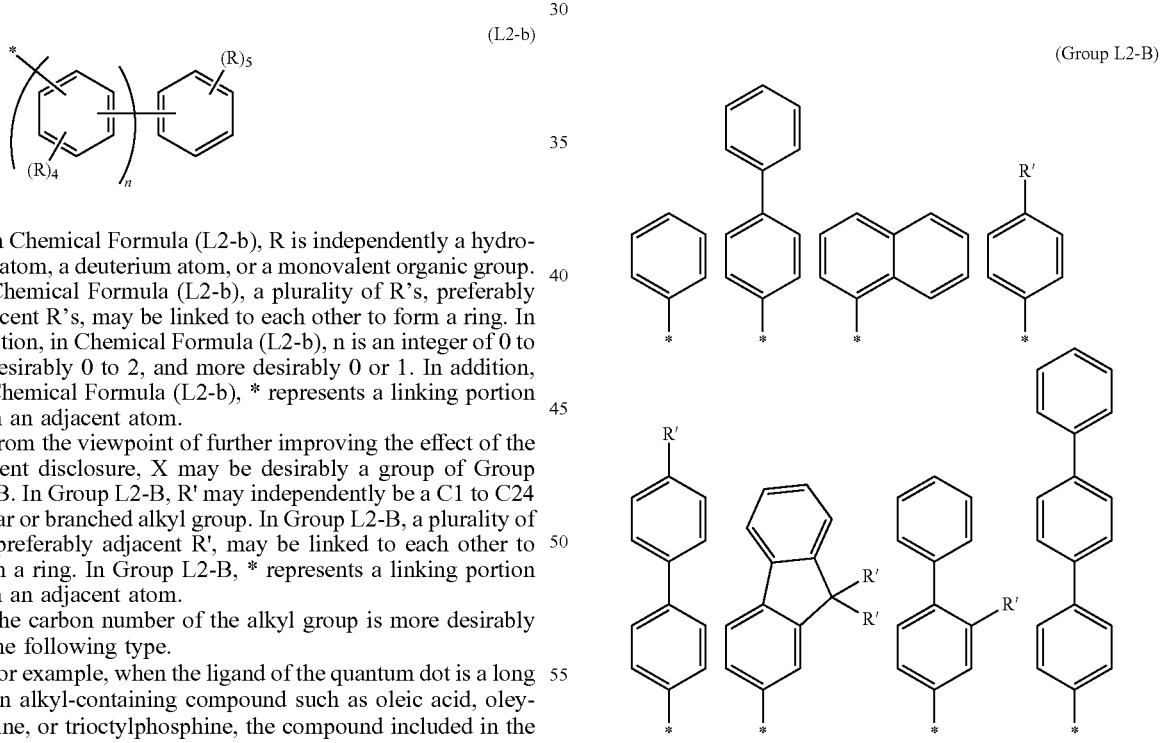

(Group L2-B)

From the viewpoint of further improving the effect of the present disclosure, in Chemical Formula (L2), the group (—$NX_2$) bound to $Ar_a$ may be desirably a group of Group L2-6'. In Chemical Formula (L2), a plurality of the groups (—$NX_2$) bound to $Ar_a$ may be the same or different. In Group $L_2$-B', * represents a linking portion with $Ar_a$ of Chemical Formula (L2).

(Group L2-B')
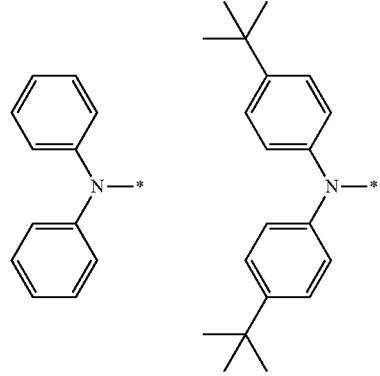
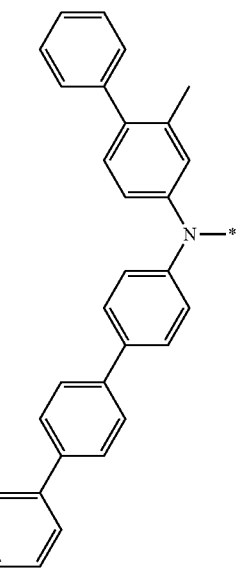
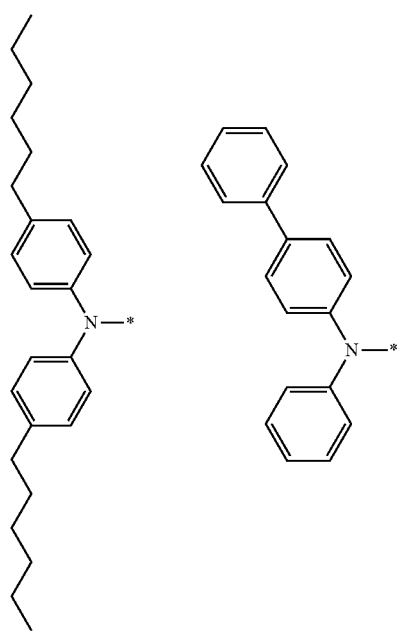
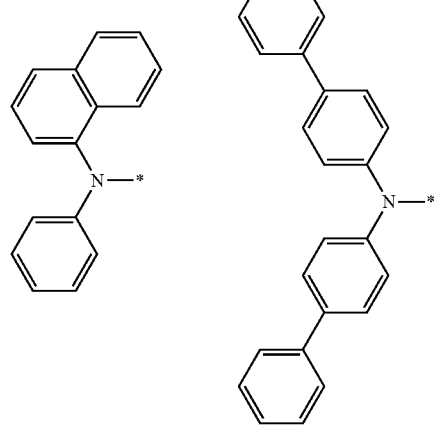
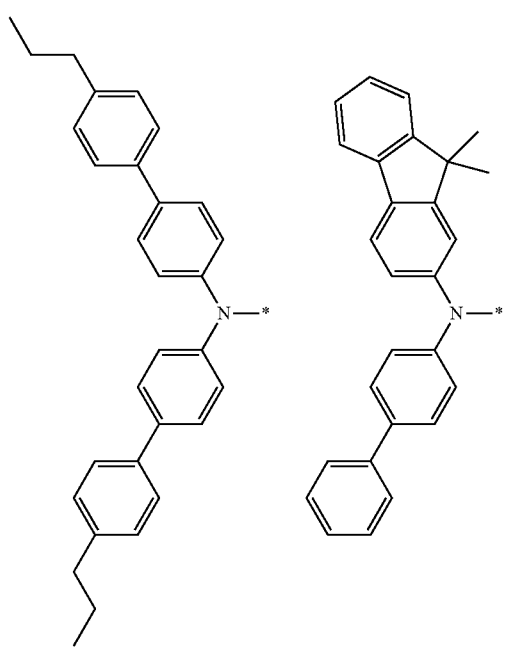

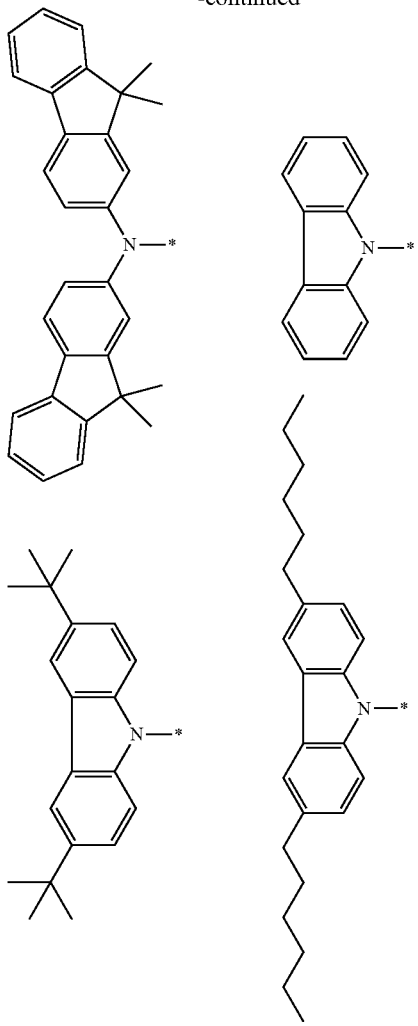
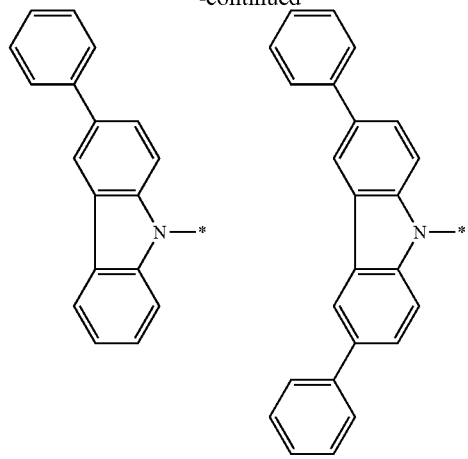
Specific examples of the low molecular compound 2 may be a compound represented by the following chemical formulae. The low molecular compound 2 may be used alone or in a combination of two or more types.
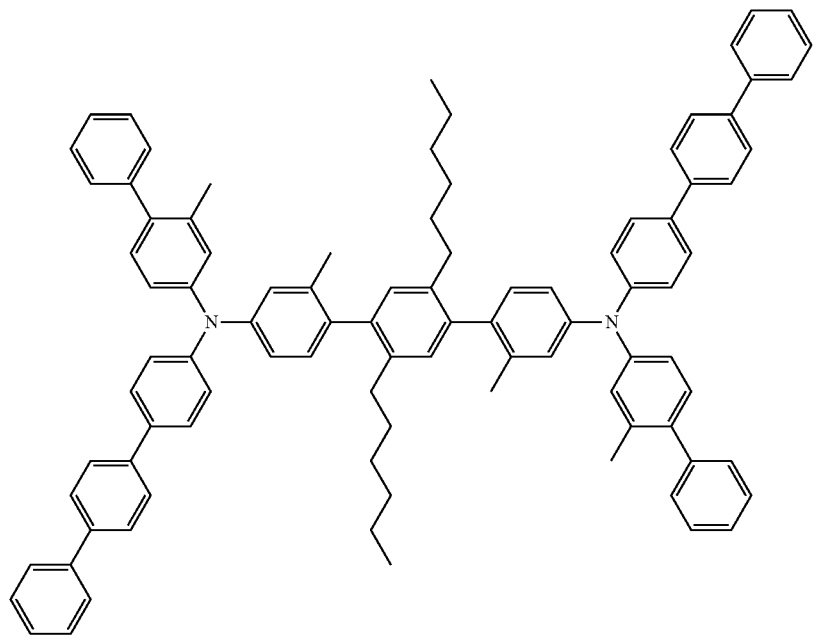

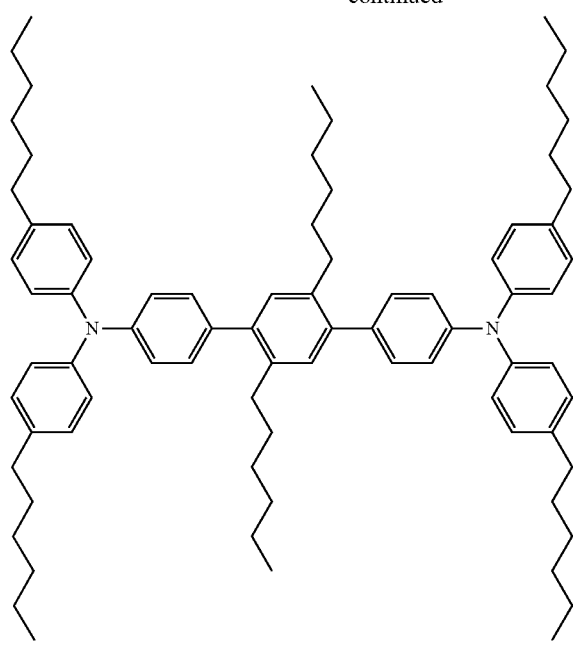
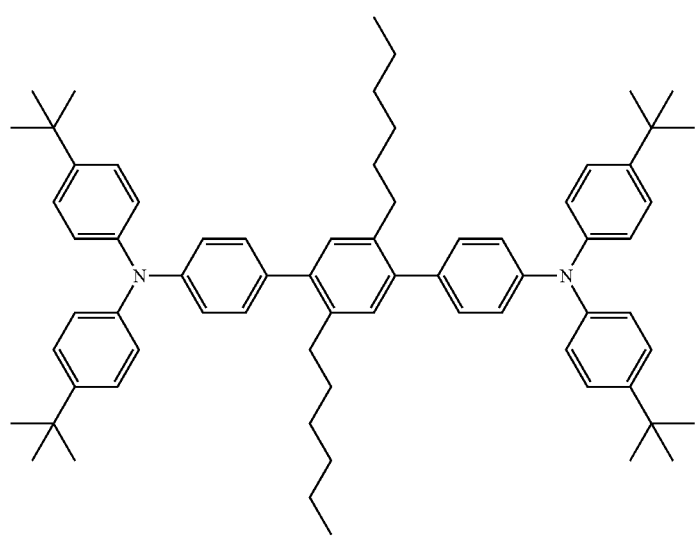

-continued
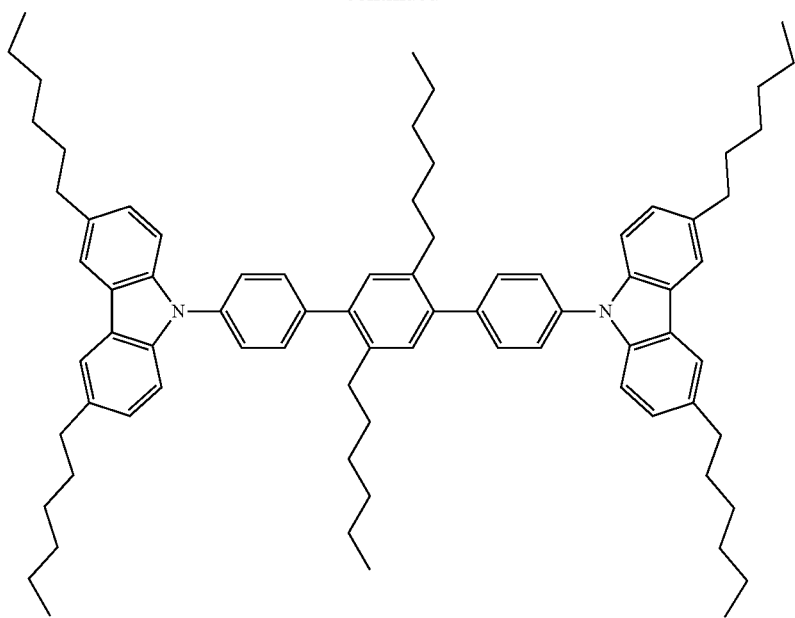
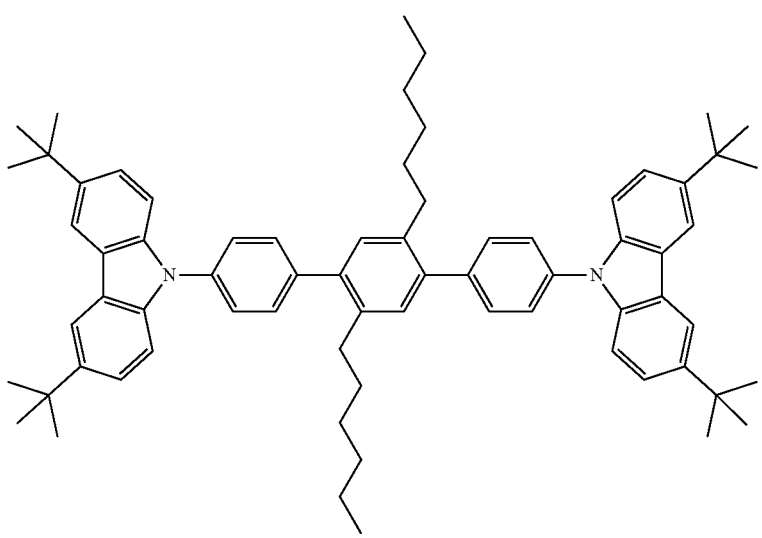

-continued

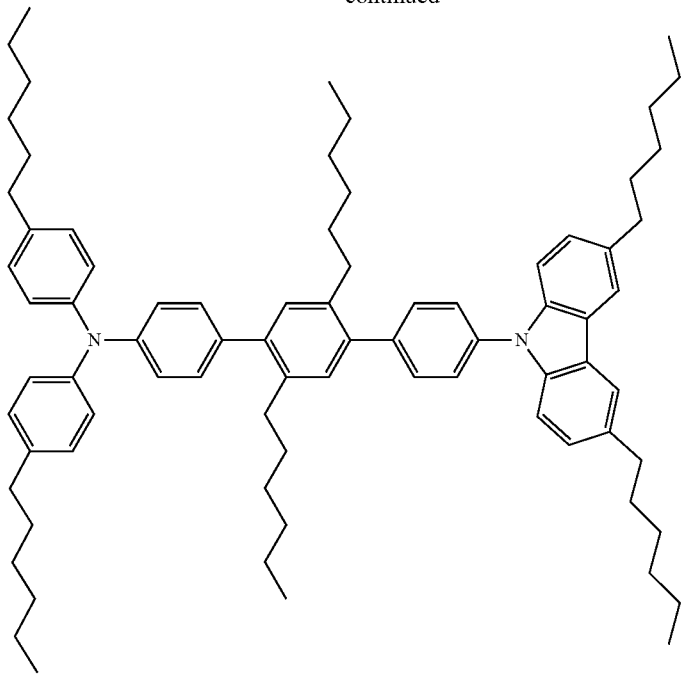

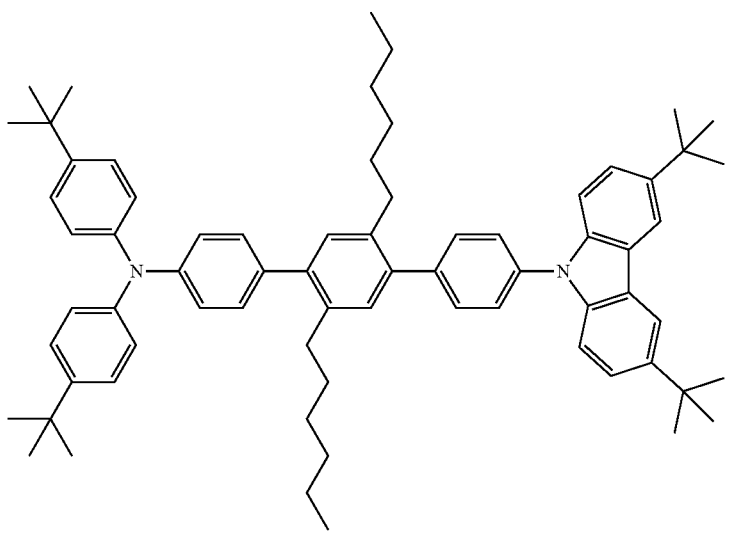

The low molecular compound 2 may be synthesized by using a known organic synthesis method.

Low Molecular Compounds 3 and 4

According to the preferred embodiment of the present disclosure, the low molecular material may include at least one of a low molecular compound represented by Chemical Formula (L3) (hereinafter, also referred to as "low molecular compound 3") and a low molecular compound represented by Chemical Formula (L4) (hereinafter, also referred to as "low molecular compound 4"). The low molecular compounds 3 and 4 are hole transporting materials and when used in combination with the polymer material, the low molecular compounds 3 and 4 exist to enter the gap of the polymer material. Therefore, a more dense hole transport layer may be provided and the hole transport capability of the hole transport layer may be improved. In addition, since the hole transport capability of the low molecular compounds 3 and 4 themselves, which are the hole transporting materials to be added, is imparted to the hole transport layer, an effect of further improving hole transport properties may be obtained.

According to a more desirable embodiment, the low molecular material is at least one of the low molecular compound 3 and the low molecular compound 4.

Hereinafter, the low molecular compound 3 and the low molecular compound 4 are described.

Low Molecular Compound 3

The low molecular compound 3 is a compound represented by Chemical Formula (L3).

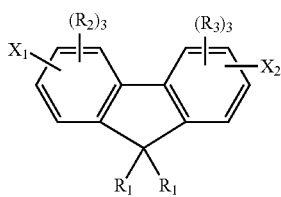

(L3)

In Chemical Formula (L3), $R_1$ to $R_3$ are independently a hydrogen atom, a monovalent hydrocarbon group, or a monovalent aromatic hydrocarbon group. $R_1$, $R_2$, and $R_3$ may independently be the same or different. In addition, in Chemical Formula (L3), two adjacent $R_1$'s may be linked to each other to form a ring. Herein, the monovalent hydrocarbon group may include, for example, a linear or branched alkyl group, alkenyl group, and alkynyl group, and a cyclic alkyl group (cycloalkyl group), and the like, but is not particularly limited thereto. The alkyl group may be desirably a C1 to C20 linear or branched alkyl group. The alkyl group may be, for example, a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isopropylpropyl group, a 1-ethyl-3-methylbutyl group, an n-octyl group, a 2-ethylhexyl group, a 3-methyl-1-isopropylbutyl group, a 2-methyl-1-isopropylbutyl group, a 1-tert-butyl-2-methylpropyl group, an n-nonyl group, a 3,5,5-trimethylhexyl group, an n-decyl group, an isodecyl group, an n-undecyl group, a 1-methyldecyl group, an n-dodecyl group, an n-tridecyl group, an n-tetradecyl group, an n-pentadecyl group, an n-hexadecyl group, an n-heptadecyl group, or an n-octadecyl group, but is not limited thereto.

The carbon number of the alkyl group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkyl group. This is because the ligand of the quantum dot and the alkyl group present in the hole transport layer may interact with each other, thereby improving effects such as hole injectability.

In addition, when the solvent that disperses the quantum dot is a long-chain hydrocarbon-based solvent, it is desirable that the number of the alkyl group in the polymer compound is small in terms of securing a residual film ratio of the hole transport layer.

Therefore, as the alkyl group, a linear or branched C1 to C18 alkyl group is more desirable. The alkyl group may be appropriately selected according to the used quantum dot or the solvent that disperses the quantum dot.

The alkenyl groups may be desirably a linear or branched C2 to C12 alkenyl groups. Such an alkenyl group may include, but is not limited to, for example, a vinyl group, an allyl group, a 1-propenyl group, a 2-butenyl group, a 1,3-butathienyl group, a 2-pentenyl group, an isopropenyl group, and the like. The alkynyl group may be desirably a linear or branched C2 to C12 alkynyl group. Such an alkynyl group may include, but is not limited to, for example, an ethynyl groups, a propargyl group, and the like. The cycloalkyl group may be desirably a C3 to C12 cycloalkyl group. Such a cycloalkyl group may include, but is not limited to, for example, a cyclopropyl group, a cyclobutyl group, a cyclopentyl group, a cyclohexyl group, and the like. In addition, the monovalent aromatic hydrocarbon group may include, for example, a C6 to C25 aromatic hydrocarbon group, and the like but is not particularly limited thereto. C6 to C25 aromatic hydrocarbon group may include, for example, a monovalent group derived from aromatic hydrocarbon such as benzene (phenyl group), pentane, indene, naphthalene, anthracene, azulene, heptylene, acenaphthene, phenalene, fluorene, anthraquinoline, phenanthrene, biphenyl, terphenyl, tetraphenyl, pentaphenyl, hexaphenyl, pyrene, 9,9-diphenylfluorene, 9,9'-spirobi[fluorene], and the like, but are not limited thereto. Among them, from the viewpoint of further improving the effect of the present disclosure, $R_1$ is independently a hydrogen atom or a C1 to C12 linear or branched alkyl group, a phenyl group, or a biphenyl group, more desirably a C3 to C10 linear or branched alkyl group, phenyl group or a biphenyl group, and particularly desirably a C5 to C8 linear alkyl group or a phenyl group. In addition, from the viewpoint of further improving the effect of the present disclosure, $R_2$ to $R_3$ are independently a hydrogen atom or a C1 to C8 linear or branched alkyl group, desirably hydrogen or a C1 to C3 linear alkyl group, and more desirably hydrogen.

That is, from the viewpoint of further improving the effect of the present disclosure, the following structure in which $X_1$ and $X_2$ of Chemical Formula (L3) are excluded (i.e., the following structure) may be desirably of the group:

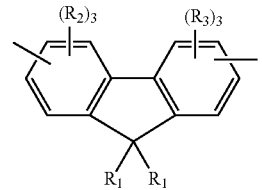

In the following description, "Alkyl" means "unsubstituted (i.e., Alkyl=hydrogen atom) or substituted with an alkyl group". Desirably, "Alkyl" means substitution with a C1 to C12 linear or branched alkyl group. More desirably, "Alkyl" means substitution with a C5 to C8 linear alkyl group. In addition, "Alkyl" may be the same alkyl group or a different alkyl group. In the following structures, * represents a linking portion with an adjacent atom.

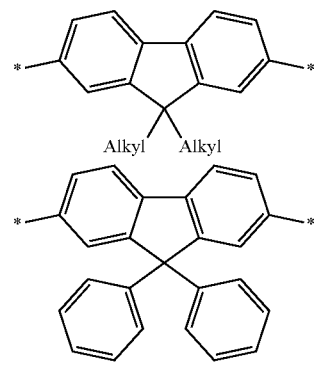

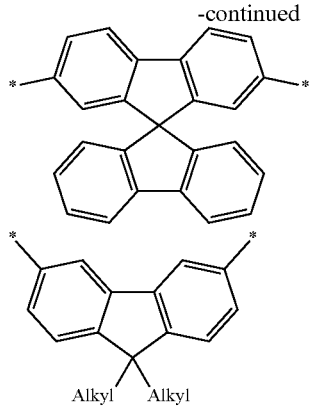

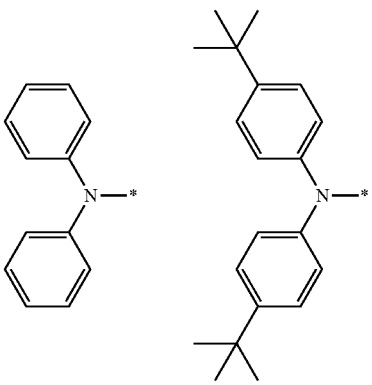
(Group L3-A)

In Chemical Formula (L3), $X_1$ may be a group represented by hydrogen or Chemical Formula (L3-a). In addition, $X_2$ is group represented by Chemical Formula (L3-a). That is, the low molecular compound 3 has one or two groups represented by Chemical Formula (L3-a). In Chemical Formula (L3-a), "*" represents a portion at which $X_1$ or $X_2$ are linked to the fluorene ring in Chemical Formula (L3)

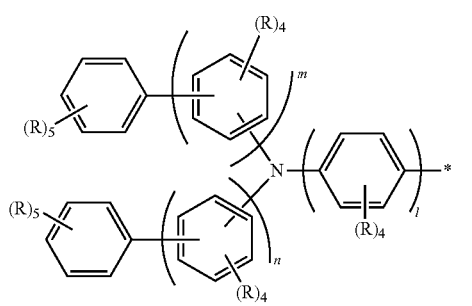
(L3-a)

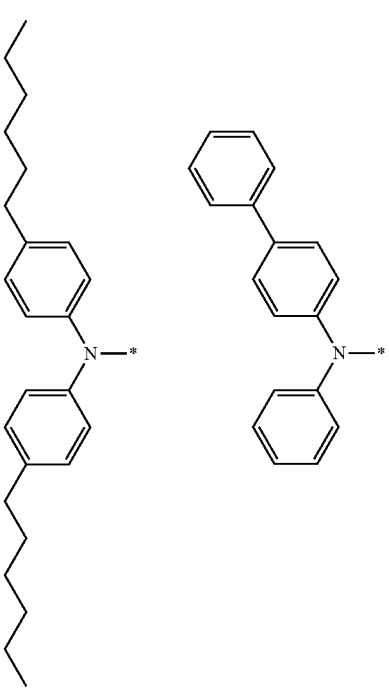

In Chemical Formula (L3-a), $R_4$ to $R_5$ are independently hydrogen atom or monovalent hydrocarbon group. A plurality, preferably adjacent $R_4$ to $R_5$ may independently be the same or different. In addition, in Chemical Formula (L3-a), adjacent groups $R_4$ to $R_5$ may be linked to each other to form a ring. Herein, specific examples of the monovalent hydrocarbon group may be the same as definitions of $R_1$ to $R_3$ in Chemical Formula (L3), but are not particularly limited thereto. Among them, from the viewpoint of further improving the effect of the present disclosure, $R_4$ to $R_5$ may independently be a hydrogen atom or a C1 to C12 linear or branched alkyl group, and desirably a hydrogen atom or a C3 to C10 linear or branched alkyl group.

In addition, in Chemical Formula (L3-a), l, m, and n are independently an integer of 0 to 3. From the viewpoint of further improving the effect of the present disclosure, l may be desirably an integer of 0 to 2, and more desirably 0 or 1. In addition, from the viewpoint of further improving the effect of the present disclosure, n and m may be desirably an integer of 0 to 2, and more desirably 0 or 2.

In Chemical Formula (L3-a), as shown in the following low molecular compound (L3-2), two phenyl groups at terminal ends may be linked to form a carbazole ring.

That is, from the viewpoint of further improving the effect of the present disclosure, the group represented by Chemical Formula (L3-a) may desirably have a structure of Group L3-A. In Group L3-A, * represents a linking portion with an adjacent atom.

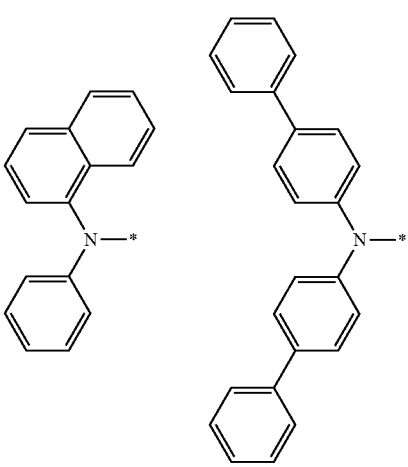

179
-continued
180
-continued
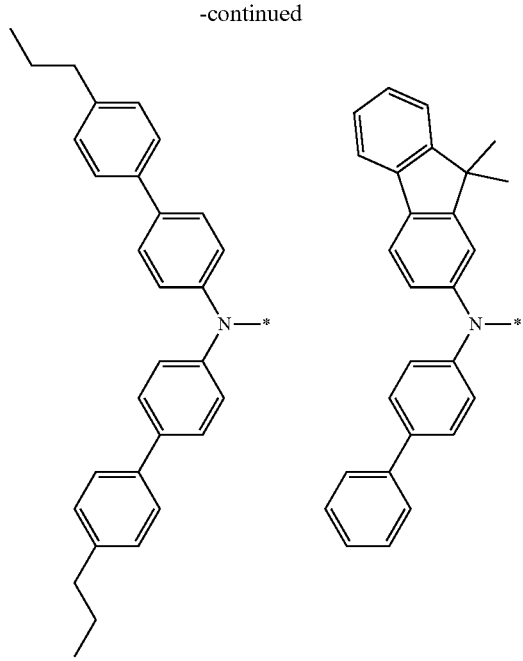
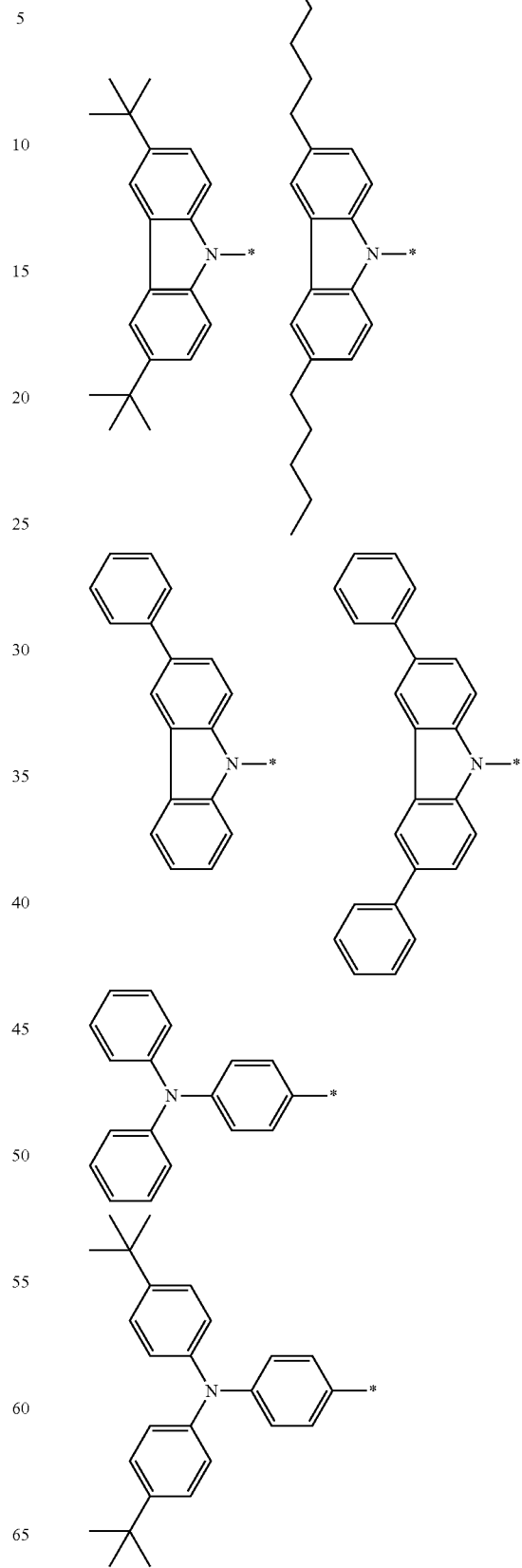
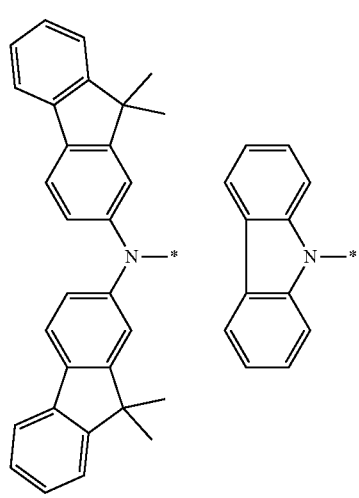

181
-continued
182
-continued
(Group L3-A)
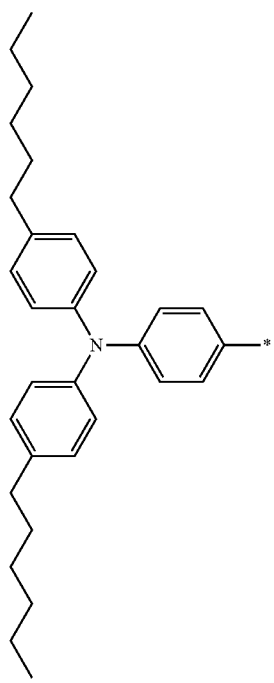
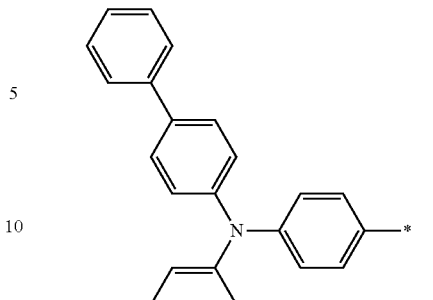
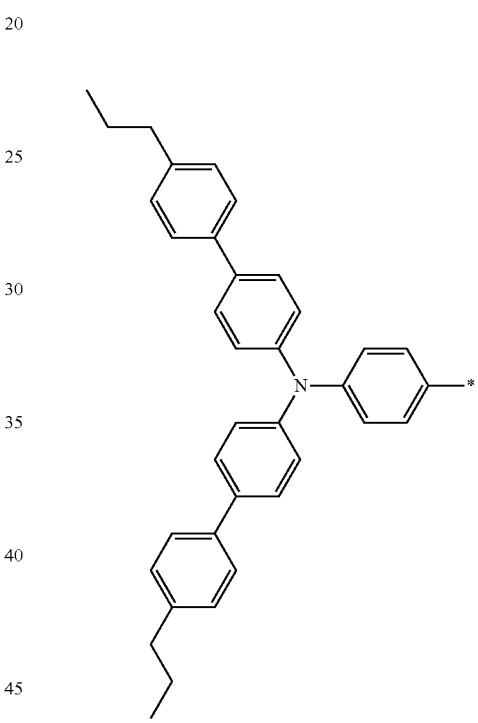
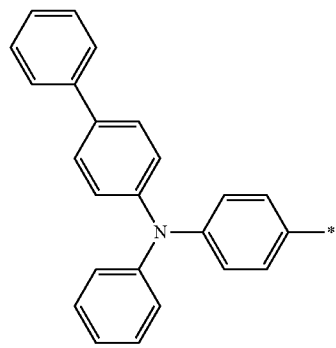
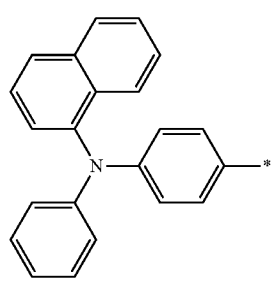
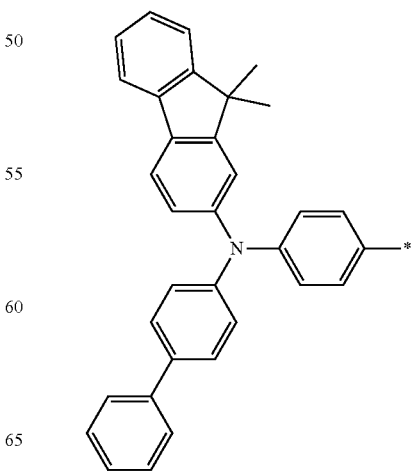

183
-continued
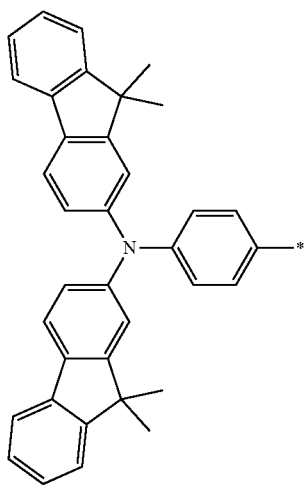
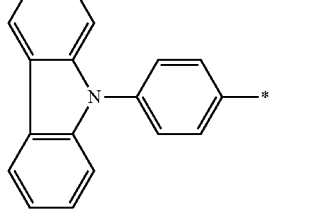
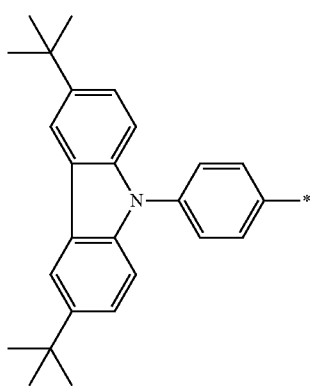
184
-continued
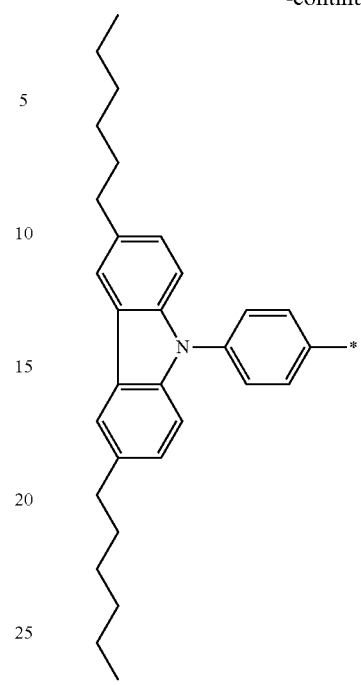
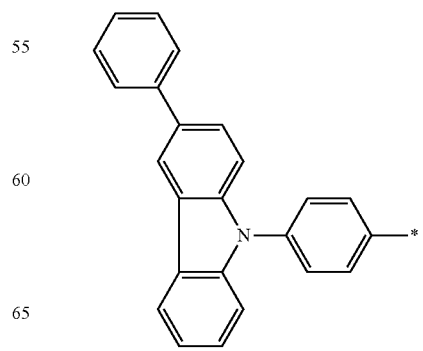

(Group L3-A)
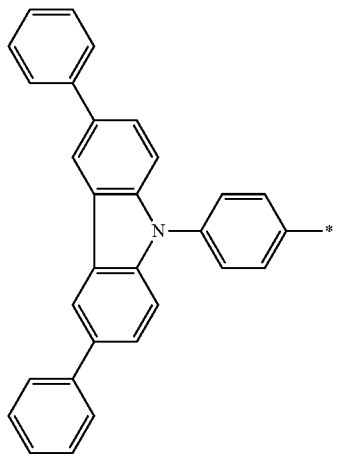
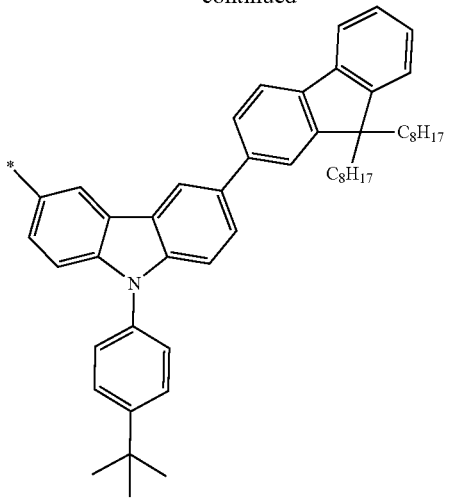
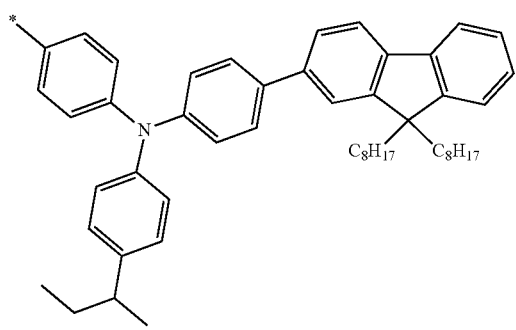
The low molecular compound 3 may desirably be a compound represented by any one of Chemical Formula (L3-1) to Chemical Formula (L3-10).
(L3-1)
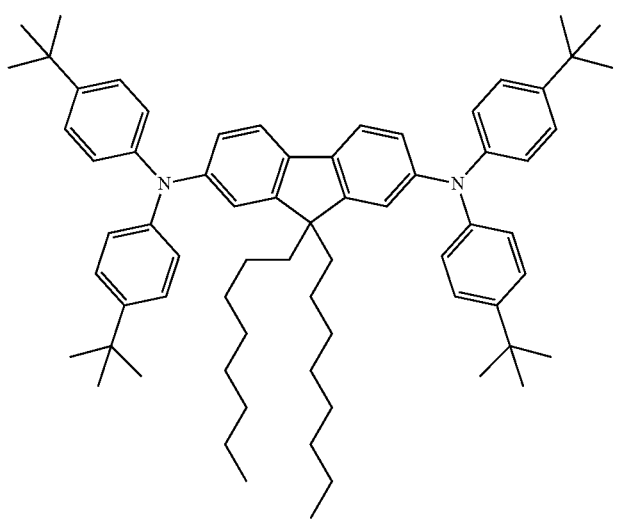

-continued
(L3-2)
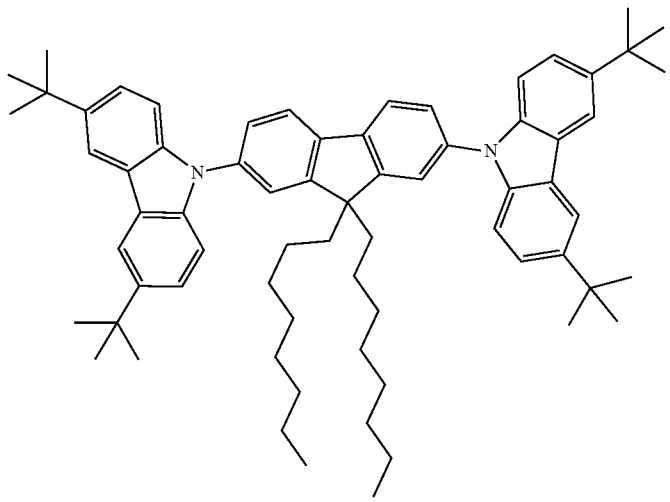
(L3-3)
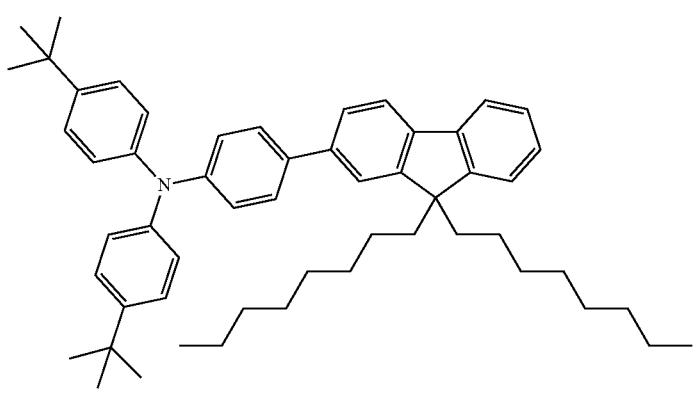
(L3-4)
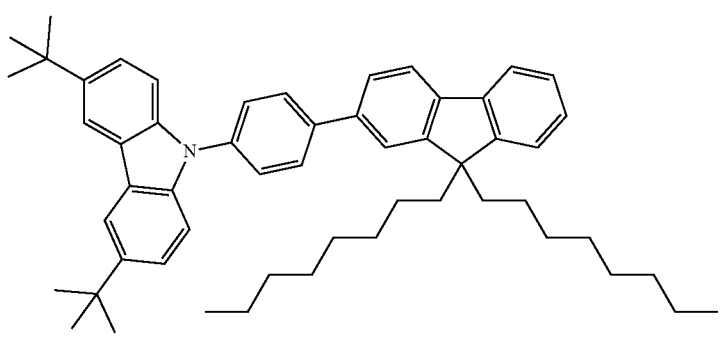

-continued
(L3-5)
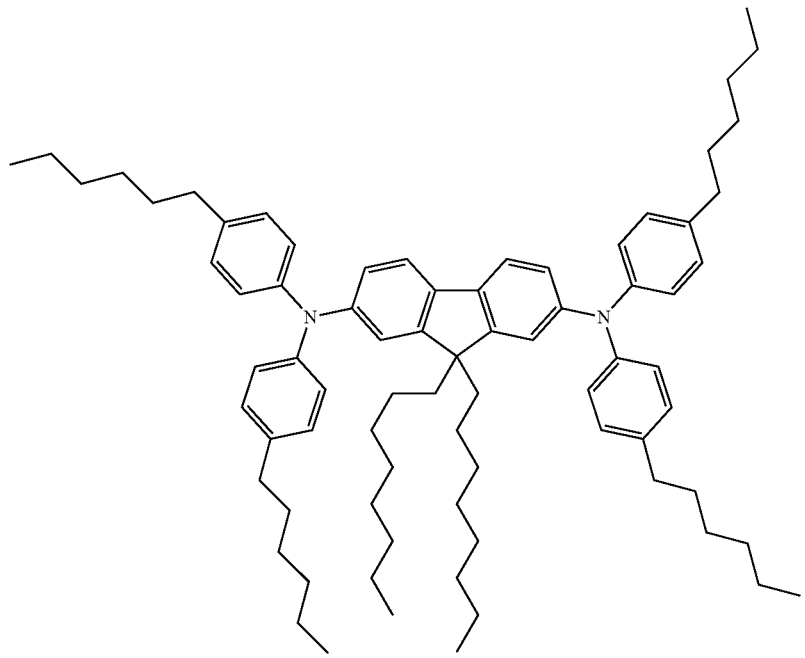
(L3-6)
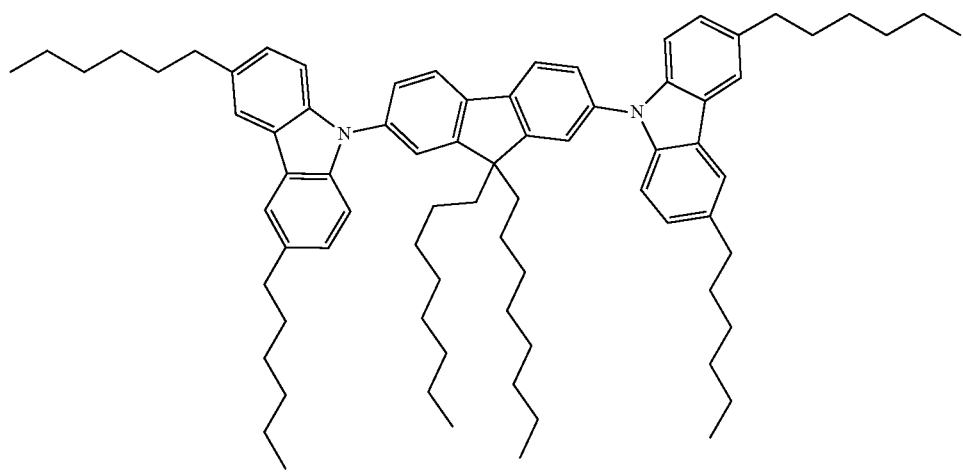
(L3-7)
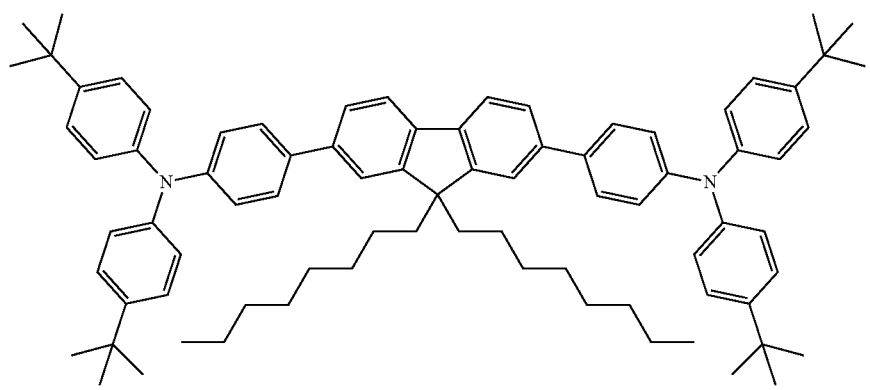

(L3-8)
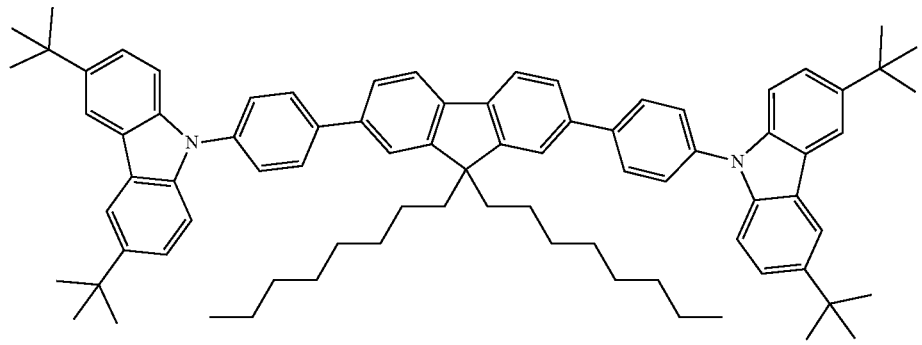
(L3-9)
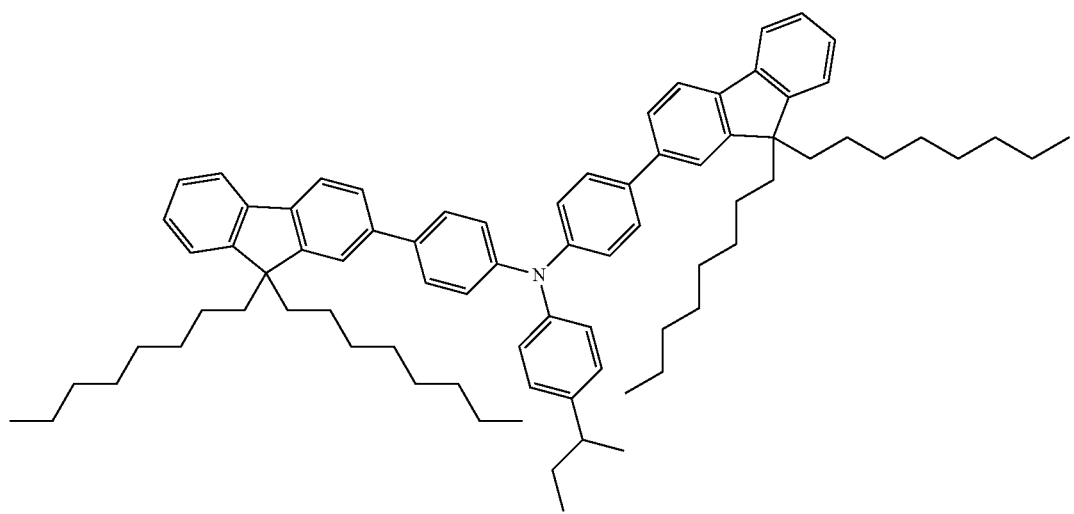
(L3-10)
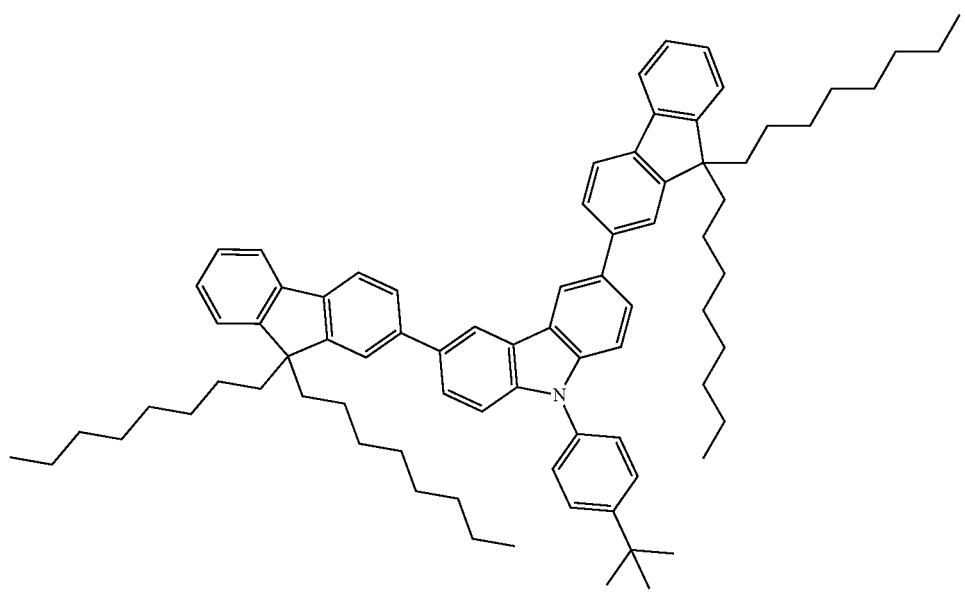

The low molecular compound 3 may be synthesized by using a known organic synthesis method.

Low Molecular Compound 4

The low molecular compound 4 is a compound represented by Chemical Formula (L4).

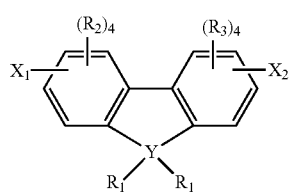

(L4)

In Chemical Formula (L4), Y is a carbon atom (C) or a silicon atom (Si).

In Chemical Formula (L4), $R_1$, $R_2$, and $R_3$ are independently a hydrogen atom, a monovalent hydrocarbon group, or a monovalent aromatic hydrocarbon group. $R_1$, $R_2$, and $R_3$ may independently be the same or different. In addition, in Chemical Formula (L4), two $R_1$'s, preferably adjacent, may be linked to each other to form a ring. Herein, since the monovalent hydrocarbon group and the monovalent aromatic hydrocarbon group are not particularly limited, but may be the same as the definitions of $R_1$ to $R_3$ in Chemical Formula (L3), and thus the descriptions thereof are omitted. Among them, from the viewpoint of further improving the effect of the present disclosure, $R_1$ may independently be a hydrogen atom or a C1 to C18 linear or branched alkyl group, a phenyl group, or a biphenyl group.

The carbon number of the alkyl group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkyl group. This is because the ligand of the quantum dot and the alkyl group present in the hole transport layer may interact with each other, thereby improving effects such as hole injectability.

In addition, when the solvent that disperses the quantum dot is a long-chain hydrocarbon-based solvent, it is desirable that the number of the alkyl group in the polymer compound is small in terms of securing a residual film ratio of the hole transport layer.

Therefore, as the alkyl group, a linear or branched C1 to C18 alkyl group is more desirable. The alkyl group may be appropriately selected according to the used quantum dot or the solvent that disperses the quantum dot.

In addition, from the viewpoint of further improving the effect of the present disclosure, $R_2$ and $R_3$ may independently be a hydrogen atom or a C1 to C18 linear or branched alkyl group.

From the viewpoint of further improving the effect of the present disclosure, the following structure in which $X_1$ and $X_2$ of Chemical Formula (L4) are excluded (i.e., the following structure) may be desirably the following structures:

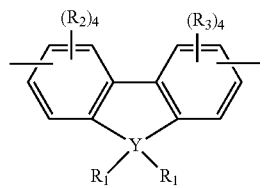

In the following description, "Alkyl" means "unsubstituted (i.e., Alkyl=hydrogen atom) or substituted with an alkyl group". Desirably, "Alkyl" means substitution with a C1 to C8 linear or branched alkyl group. More desirably, "Alkyl" means substitution with a C1 to C3 linear alkyl group. In addition, "Alkyl" may be the same alkyl group or a different alkyl group. In the following structures, * represents a linking portion with an adjacent atom.

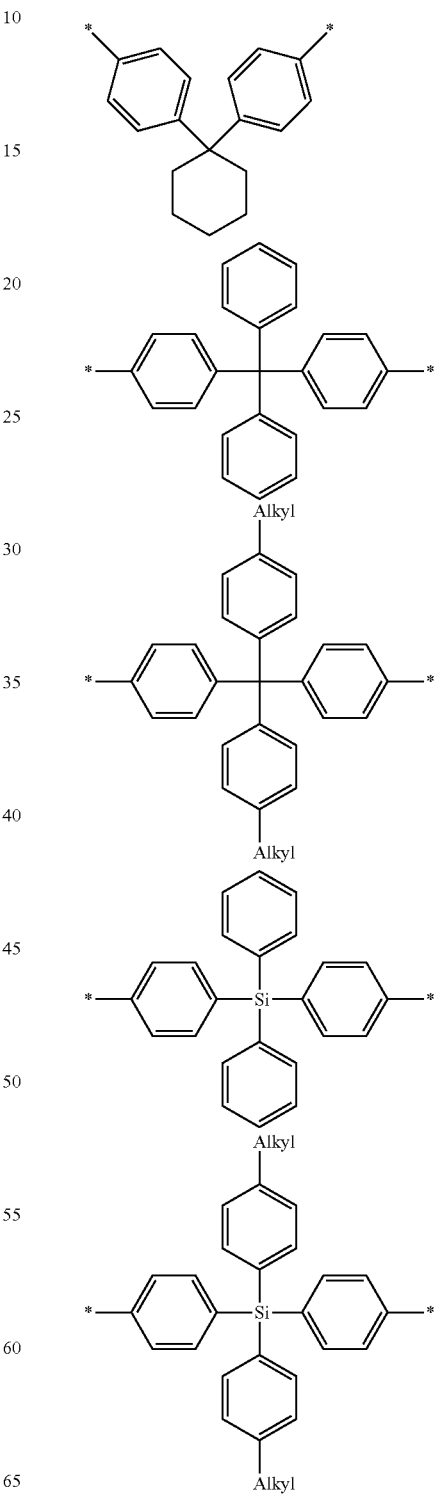

In Chemical Formula (L4), $X_1$ may be hydrogen or a group represented by Chemical Formula (L4-a). In addition, $X_2$ may be a group represented by Chemical Formula (L4-a). That is, the low molecular compound 4 has one or two groups represented by Chemical Formula (L4-a). In Chemical Formula (L4-a), "*" represents a portion at which $X_1$ or $X_2$ are linked to benzene ring (phenylene-) of Y—$(R_1)_2$ (phenylene-)$_2$ in Chemical Formula (L4). In Chemical Formula (L4-a), the definitions of $R_4$ and $R_5$, I, m, and n may be the same as the definitions of $R_4$ and $R_5$, I, m, and n of Chemical Formula (L3-a), and thus the descriptions thereof are omitted.

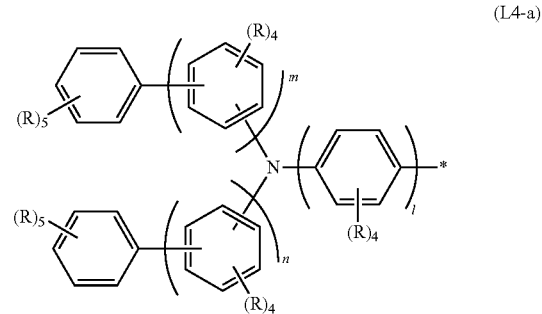

The low molecular compound 3 may desirably be a compound represented by any one of Chemical Formula (L4)-1 to Chemical Formula (L4)-2.

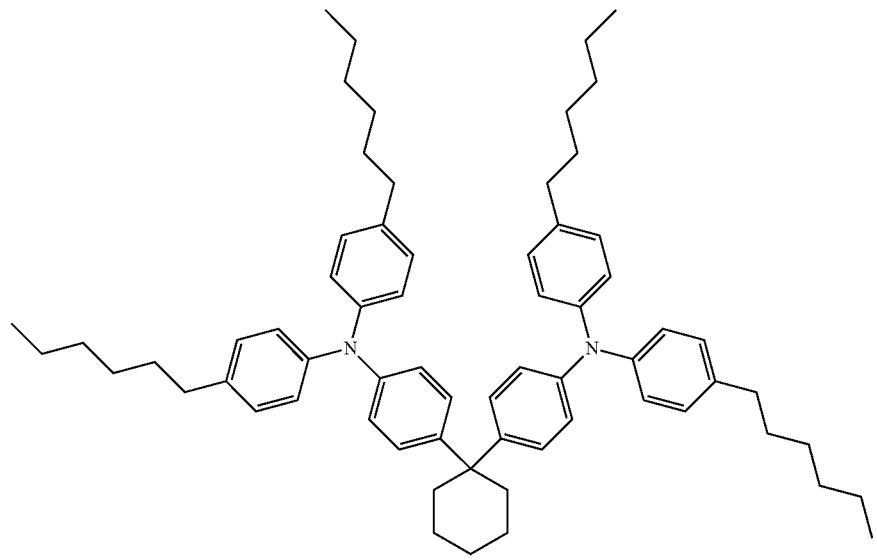

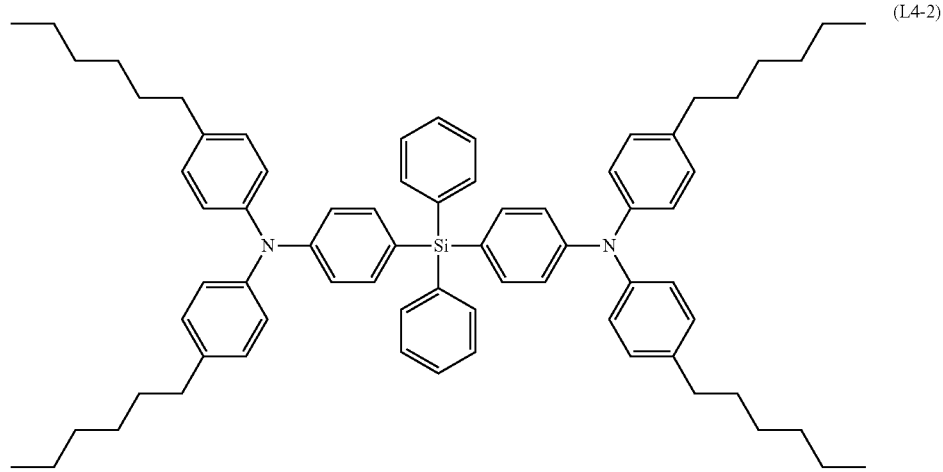

The low molecular compound 4 may be synthesized by using a known organic synthesis method.

Low Molecular Compounds 5 and 6

According to the preferred embodiment of the present disclosure, the low molecular material may include at least one of a low molecular compound represented by Chemical Formula (L5) (hereinafter, also referred to as "low molecular compound 5") and a low molecular compound represented by Chemical Formula (L6) (hereinafter, also referred to as "low molecular compound 6"). The low molecular compounds 5 and 6 are wide gap materials, and when used in combination with the polymer material, the low molecular compounds 5 and 6 exist to enter the gap of the polymer material. Therefore, a more dense hole transport layer may be provided and the hole transport capability of the hole transport layer may be improved. According to a more desirable embodiment, the low molecular material is at least one of the low molecular compound 5 and the low molecular compound 6.

Hereinafter, the low molecular compound 5 and the low molecular compound 6 are described.

Here, the wide gap material refers to a material having a HOMO-LUMO energy gap of greater than or equal to about 3.3 eV. The HOMO-LUMO energy gap is not particularly limited but desirably is less than or equal to about 4 eV. Within this range, the luminous efficiency and light emitting life-span of the quantum dot EL device may be more improved.

Low Molecular Compound 5

The wide gap material may desirably include at least one low molecular compound 5 represented by Chemical Formula (L5).

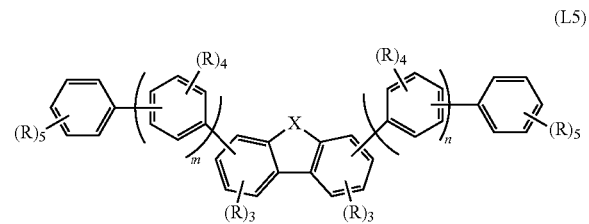

(L5)

In Chemical Formula (L5), m and n are independently an integer of 0 to 3,

R is independently a hydrogen atom, or a monovalent organic group or two or more adjacent R's may be condensed or linked to each other to form a ring, X represents O, S, NR', C(R")$_2$, and R' and R" are independently a hydrogen atom or a monovalent organic group.

In Chemical Formula (L5), the monovalent organic group constituting R is not particularly limited. For example, it may be hydrogen, a cyano group, a substituted or unsubstituted C1 to C30 alkyl group, a substituted or unsubstituted C1 to C30 alkoxy group, a substituted or unsubstituted C6 to C30 aryloxy group, an alkylamino group having a substituted or unsubstituted C1 to C30 alkyl group, a substituted or unsubstituted C6 to C30 monovalent aromatic hydrocarbon ring group, or a substituted or unsubstituted monovalent aromatic heterocyclic group having 3 to 60 ring-forming atoms.

The C6 to C30 aromatic hydrocarbon ring group constituting R may be a group derived from C6 to C30 hydrocarbon (aromatic hydrocarbon) rings having a carbon ring containing one or a plurality of aromatic rings. In addition, when the aromatic hydrocarbon ring group may include two or more rings, two or more rings may be condensed with each other. One or more hydrogen atoms present in these aromatic hydrocarbon ring groups may be substituted with a substituent.

The aromatic hydrocarbon ring constituting the aromatic hydrocarbon ring group is not particularly limited, but may specifically be benzene, pentalene, indene, naphthalene, anthracene, azulene, heptalene, acenaphthalene, phenalene, fluorene, phenanthrene, biphenyl, triphenylene, pyrene, chrysene, pycene, perylene, pentaphene, pentacene, tetraphene, hexaphene, hexacene, rubicene, trinaphthylene, heptaphene, and pyrantrene.

The monovalent aromatic heterocyclic group having 3 to 60 ring-forming atoms constituting R may be a group derived from a cycle (aromatic heterocycle) having 3 to 60 ring-forming atoms which includes at least one aromatic ring having at least one heteroatom (for example, a nitrogen atom (N), an oxygen atom (O), a phosphorus atom (P), or a sulfur atom (S)) and a remaining ring atom that is a carbon atom (C). In addition, when the aromatic heterocyclic group includes two or more rings, two or more rings may be condensation with each other. It may also be substituted with one or more hydrogen atom substituents present in these aromatic heterocyclic groups.

Herein, the number of ring-forming atoms represents the number of atoms constituting the ring itself in a compound having a structure in which the atoms are bonded in a cyclic structure (for example, monocycle, condensed ring, ring cluster). When atoms that do not form a ring (for example, hydrogen atoms that terminate the bonds of atoms that constitute the ring), or the rings is substituted by a substituent, the atoms included in the substituent are not included in the number of ring-forming atoms. For example, the carbazolyl group (substituted with carbazole ring) has the number of ring-forming atoms of 13.

The aromatic heterocycle constituting aromatic heterocyclic group may include, but is not particularly limited to, a π electron-deficient aromatic heterocycle, a π electron-excess aromatic heterocycle, π electron-deficient-Tr electron-excess mixed aromatic heterocycle in which a π electron-deficient aromatic heterocycle and a π electron excess aromatic heterocycle are mixed.

Examples of the π electron-deficient aromatic heterocycle may be pyridine, pyrazine, pyridazine, pyrimidine, triazine, quinoline, isoquinoline, quinoxaline, quinazoline, naphthyridine, acridine, phenazine, benzoquinoline, benzisoquinoline, phenanthridine, phenanthroline, benzoquinone, coumarin, anthraquinone, fluorenone, and the like.

Examples of the π electron-excess aromatic heterocycle may be furan, thiophene, benzofuran, benzothiophene, dibenzofuran, dibenzothiophene, pyrrole, indole, carbazole, and the like.

Examples of the π electron-deficient-Tr electron-excess mixed aromatic heterocycle may be imidazole, benzimidazole, pyrazole, indazole, oxazole, isoxazole, benzoxazole, benzisoxazole, thiazole, isothiazole, benzothiazole, benzoisothiazole, imidazolinone, benzimidazolinone, imidazopyridine, imidazopyrimidine, imidazophenanthridine, benzimidazophenanthridine, azadibenzofuran, azacarbazole, azadibenzothiophene, diazadibenzofuran, diazacarbazole, diazadibenzothiophene, xanthone, and dioxantone.

The C1 to C30 alkyl group constituting R is not particularly limited. For example, it may be a C1 to C30 linear or branched alkyl group. Specifically, it may be a methyl group, an ethyl group, an n-propyl group, a isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, a isohexyl group, a 1,3-dimethylbutyl group, a 1-isopropylpropyl group, a 1,2-dimethylbutyl group, an n-heptyl group, a 1,4-dimethylpentyl group, 3-ethylpentyl group, a 2-methyl-1-isopropylpropyl group, a 1-ethyl-3-methylbutyl group, an n-octyl group, a 2-ethylhexyl group, a 3-methyl-1-isopropylbutyl group, a 2-methyl-1-isopropylbutyl group, a 1-tert-butyl-2-methylpropyl group, an n-nonyl group, a 3,5,5-trimethylhexyl group, an n-decyl group, a isodecyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, an n-eicosyl group, an n-heneicosyl group, an n-docosyl group, an n-tricosyl group, and an n-tetracosyl group.

The carbon number of the alkyl group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkyl group. This is because the ligand of the quantum dot and the alkyl group present in the hole transport layer may interact with each other, thereby improving effects such as hole injectability.

In addition, when the solvent that disperses the quantum dot is a long-chain hydrocarbon-based solvent, it is desirable that the number of the alkyl group in the polymer compound is small in terms of securing a residual film ratio of the hole transport layer.

Therefore, as the alkyl group, a linear or branched C1 to C18 alkyl group is more desirable.

The alkyl group may be appropriately selected according to the used quantum dot or the solvent that disperses the quantum dot.

The C1 to C30 alkoxy group constituting R is not particularly limited. For example, it may be a C1 to C30 linear or branched alkoxy group. Specifically, it may be a methoxy group, an ethoxy group, a propoxy group, an isopropoxy group, a butoxy group, a pentyloxy group, a hexyloxy group, a heptyloxy group, an octyloxy group, a nonyloxy group, a decyloxy group, an undecyloxy group, a dodecyloxy group, a tridecyloxy group, a tetradecyloxy group, a pentadecyloxy group, a hexadecyloxy group, a heptadecyloxy group, an octadecyloxy group, a 2-ethylhexyloxy group, a 3-ethylpentyloxy group, and the like.

The carbon number of the alkoxy group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkoxy group. This is because the ligand of the quantum dot and the alkoxy group present in the hole transport layer may interact with each other, thereby improving effects such as hole injectability.

In addition, when the solvent that disperses the quantum dot is a long-chain hydrocarbon-based solvent, it is desirable that the number of the alkoxy group in the polymer compound is small in terms of securing a residual film ratio of the hole transport layer.

Therefore, as the alkoxy group, a linear or branched C1 to C18 alkoxy group is more desirable. These alkoxy groups may be appropriately selected according to the used quantum dot or the solvent that disperses the quantum dot.

The C6 to C30 aryloxy group constituting R is not particularly limited

For example, it may be a C6 to C30 monocyclic or condensed polycyclic aryloxy group that may include a heteroatom. Specifically, it may be a phenoxy group, a 1-naphthyloxy group, a 2-naphthyloxy group, a 2-azulenyloxy group, a 2-furanyloxy group, a 2-thienyloxy group, a 2-indolyloxy group, a 3-indolyloxy group, a 2-benzofuryloxy group, and a 2-benzothienyloxy group.

The alkylamino group having the C1 to C30 alkyl constituting R is not particularly limited. For example, it may be an alkylamino group having a linear or branched C1 to C30 alkyl group. Specifically, it may be an N-alkylamino group such as an N-methylamino group, an N-ethylamino group, an N-propylamino group, an N-isopropylamino group, an N-butylamino group, an N-isobutylamino group, an N-sec-butylamino group, an N-tert-butylamino group, an N-pentylamino group, or an N-hexylamino group, an N,N-dialkylamino group such as an N,N-dimethylamino group, an N-methyl-N-ethylamino group, an N,N-diethylamino group, an N,N-dipropylamino group, an N,N-diisopropylamino group, an N,N-dibutylamino group, an N,N-diisobutylamino group, an N,N-dipentylamino group, an N,N-dihexylamino group, and the like.

When the C1 to C30 alkyl group, C1 to C30 alkoxy group, C6 to C30 aryloxy group, alkylamino group having the C1 to C30 alkyl group, cyano group, C6 to C30 monovalent aromatic hydrocarbon ring group, or monovalent aromatic heterocyclic group having 3 to 60 ring-forming atoms which constitutes R is further substituted with another substituent, the substituent is not particularly limited. Another substituent may be, for example, the same as the substituent which may constitute R. That is, it may be for example hydrogen, a cyano group, a substituted or unsubstituted, C1 to C30 alkyl group, C1 to C30 alkoxy group, C6 to C30 aryloxy group, alkylamino group having a C1 to C30 alkyl group, C6 to C30 monovalent aromatic hydrocarbon ring group, or monovalent aromatic heterocyclic group having 3 to 60 ring-forming atoms. Since the description of another substituent is the same as that of R, the description is omitted.

Another substituent that further substitutes for another substituent, or next another substituent that further substitutes for another substituent is the same as another substituent that is described above.

In Chemical Formula (L5), R' and R" in NR' and C(R")$_2$ which may constitute X are not particularly limited. For example, they may be hydrogen, a cyano group, a substituted or unsubstituted C1 to C30 alkyl group, a substituted or unsubstituted C1 to C30 alkoxy group, a substituted or unsubstituted C6 to C30 aryloxy group, a substituted or unsubstituted C1 to C30 amino group, a substituted or unsubstituted C6 to C30 monovalent aromatic hydrocarbon ring group, or a substituted or unsubstituted monovalent aromatic heterocyclic group having 3 to 60 ring-forming atoms.

The description of the monovalent organic group that may constitute R and R" is the same as that described in R, and thus the description thereof is omitted.

Divalent organic groups which may constitute X other than NR' and C(R")$_2$ are not particularly limited.

Here, in the compound represented by Chemical Formula (L5), it is desirably that m and n are independently an integer of greater than or equal to 1 and less than or equal to 3. In addition, it is more desirably that m and n are independently an integer of greater than or equal to 2 and less than or equal to 3, and more desirably 3.

The compound represented by Chemical Formula (L5) is desirably a compound represented by Chemical Formula (L5-A).

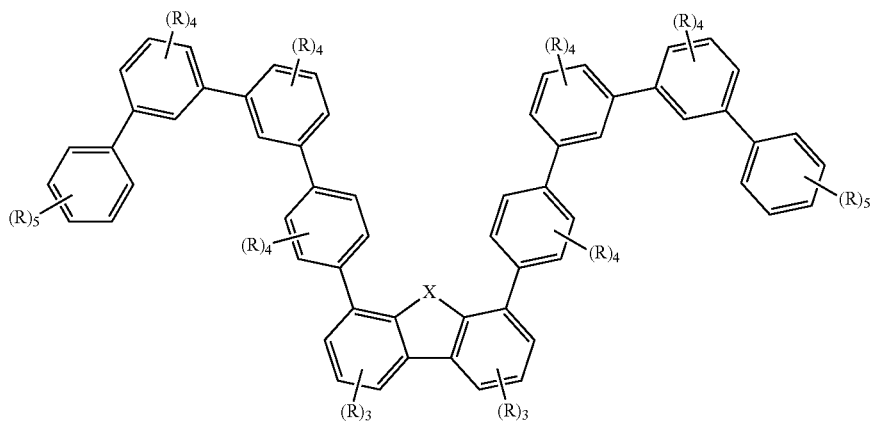

(L5-A)

In Chemical Formula (L5-A), R and X are the same as in Chemical Formula (L5).

In Chemical Formula (L5) and Chemical Formula (L5-A), R may independently be a hydrogen atom, a cyano group, an unsubstituted C1 to C30 alkyl group, an unsubstituted C1 to C30 alkoxy group, an unsubstituted C6 to C30 aryloxy group, an unsubstituted alkylamino group having a C1 to C30 alkyl group, an unsubstituted C6 to C30 monovalent aromatic hydrocarbon ring group, or an unsubstituted monovalent aromatic heterocyclic group having 3 to 60 ring-forming atoms. In addition, R may independently be a hydrogen atom, a cyano group, an unsubstituted C1 to C30 alkyl group, an unsubstituted C1 to C30 alkoxy group, an unsubstituted C6 to C30 aryloxy group, or an unsubstituted alkylamino group having a C1 to C30 alkyl group. R may be all hydrogen atoms.

In Chemical Formula (L5) and Chemical Formula (L5-A), R' may be hydrogen, a cyano group, an unsubstituted C1 to C30 alkyl group, an unsubstituted C1 to C30 alkoxy group, an unsubstituted C6 to C30 aryloxy group, an unsubstituted C1 to C30 amino group, an unsubstituted C6 to C30 monovalent aromatic hydrocarbon ring group, or an unsubstituted monovalent aromatic heterocyclic group having 3 to 60 ring-forming atoms. In addition, R' may independently be a hydrogen atom, a cyano group, an unsubstituted C1 to C30 alkyl group, an unsubstituted C1 to C30 alkoxy group, an unsubstituted C6 to C30 aryloxy group, or an unsubstituted alkylamino group having a C1 to C30 alkyl group. R' may be all hydrogen atoms.

In Chemical Formula (L5) and Chemical Formula (L5-A), R" may independently be a hydrogen atom, a cyano group, an unsubstituted C1 to C30 alkyl group, an unsubstituted C1 to C30 alkoxy group, an unsubstituted C6 to C30 aryloxy group, an unsubstituted alkylamino group having a C1 to C30 alkyl group, an unsubstituted C6 to C30 monovalent aromatic hydrocarbon ring group, or an unsubstituted monovalent aromatic heterocyclic group having 3 to 60 ring-forming atoms. In addition, R" may independently be a hydrogen atom, a cyano group, an unsubstituted C1 to C30 alkyl group, an unsubstituted C1 to C30 alkoxy group, an unsubstituted C6 to C30 aryloxy group, or an unsubstituted C1 to C30 amino group. R" may be all hydrogen atoms.

The carbon number of the alkyl group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkyl group. This is because the ligand of the quantum dot and the alkyl group present in the hole transport layer may interact with each other, thereby improving effects such as hole injectability.

In addition, when the solvent that disperses the quantum dot is a long-chain hydrocarbon-based solvent, it is desirable that the number of the alkyl group in the polymer compound is small in terms of securing a residual film ratio of the hole transport layer.

Therefore, as the alkyl group, a linear or branched C1 to C18 alkyl group is more desirable. The alkyl group may be appropriately selected according to the used quantum dot or the solvent that disperses the quantum dot.

The carbon number of the alkoxy group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkoxy group. This is because the ligand of the quantum dot and the alkoxy group present in the hole transport layer may interact with each other, thereby improving effects such as hole injectability.

In addition, when the solvent that disperses the quantum dot is a long-chain hydrocarbon-based solvent, it is desirable that the number of the alkoxy group in the polymer compound is small in terms of securing a residual film ratio of the hole transport layer.

Therefore, as the alkoxy group, a linear or branched C1 to C18 alkoxy group is more desirable. These alkoxy groups may be appropriately selected according to the used quantum dot or the solvent that disperses the quantum dot.

In Chemical Formula (L5) and Chemical Formula (L5-A), X may be desirably O, S, NR', or C(R")$_2$. Further, X may be desirably O or S, and more desirably S.

Hereinafter, the low molecular compound 5 is specifically exemplified. The present disclosure is not limited to these specific examples.

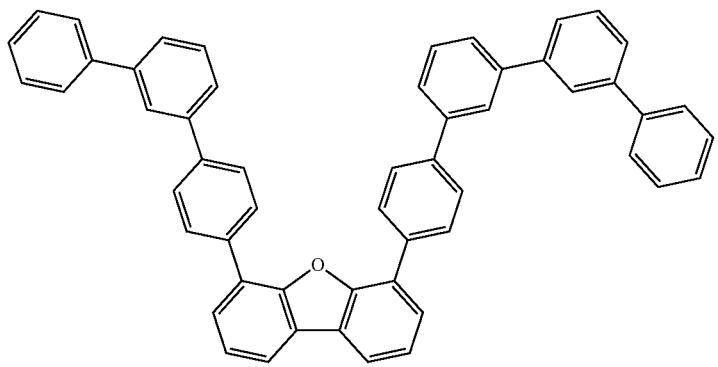
1
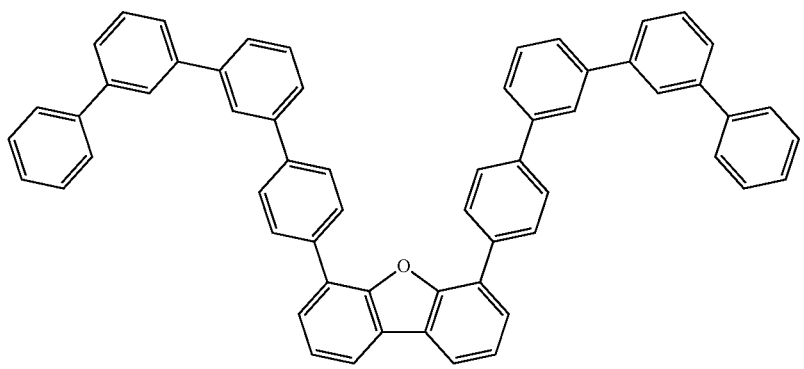
2
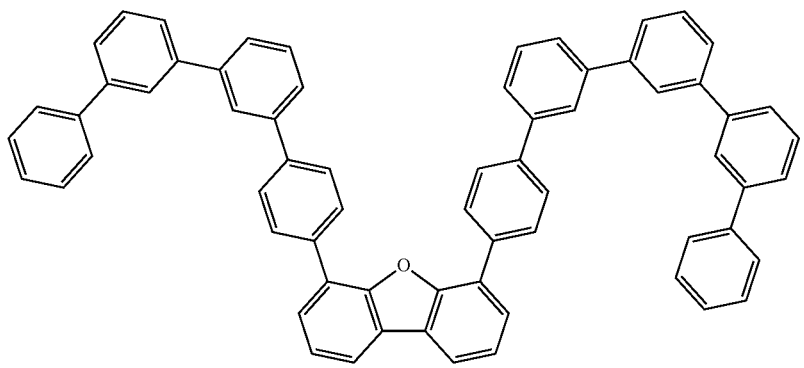
3
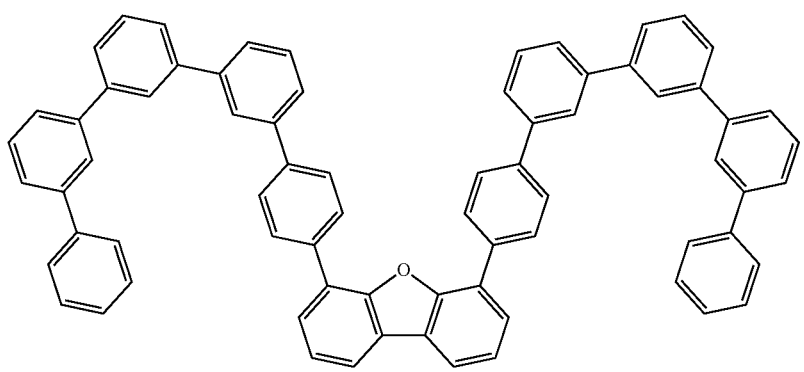
4

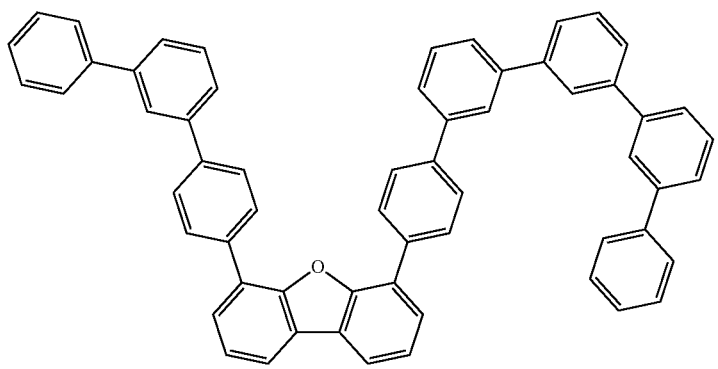
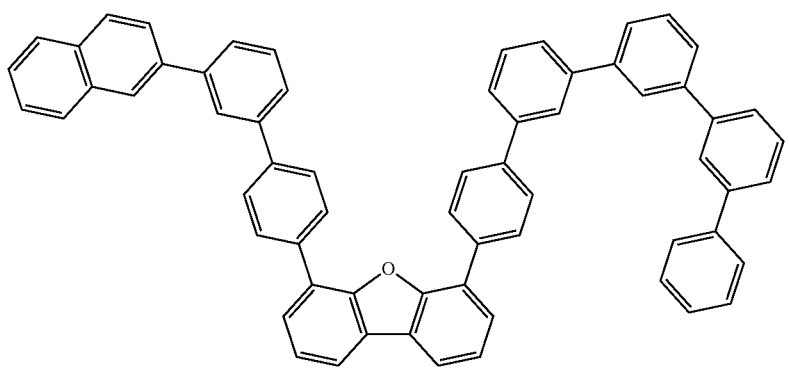
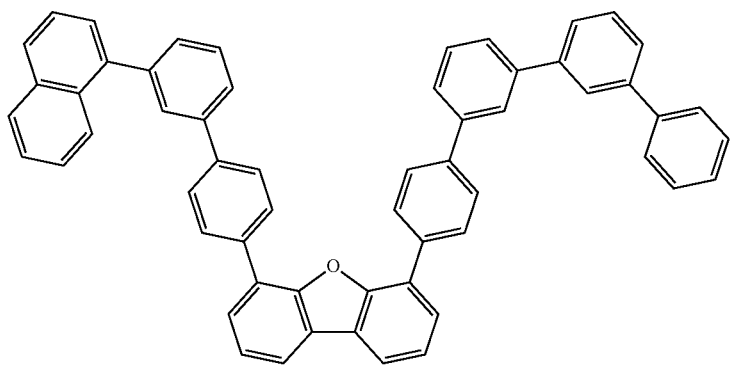
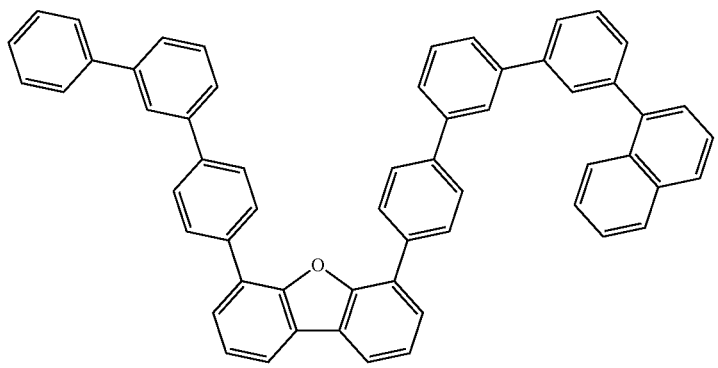

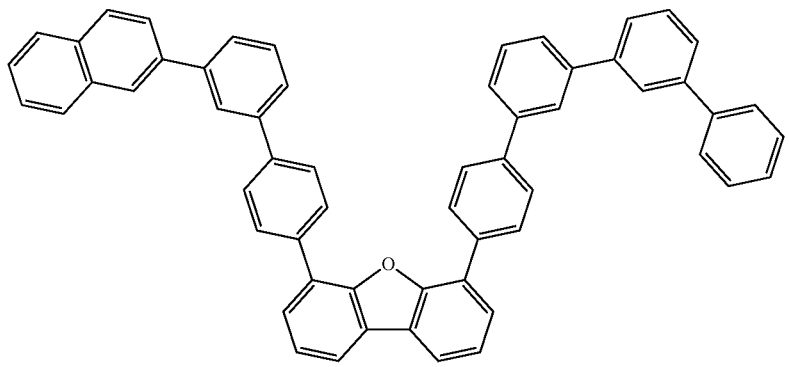
9
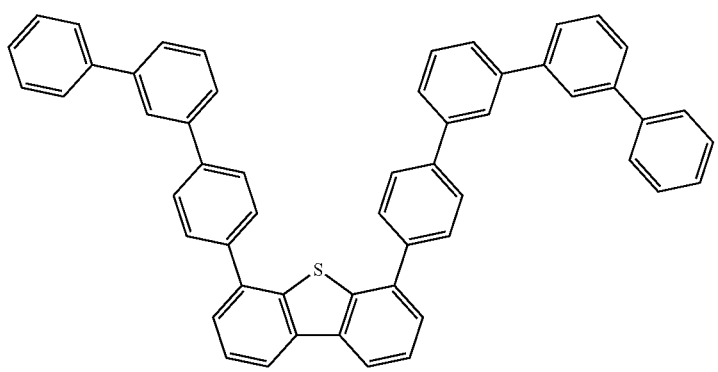
10
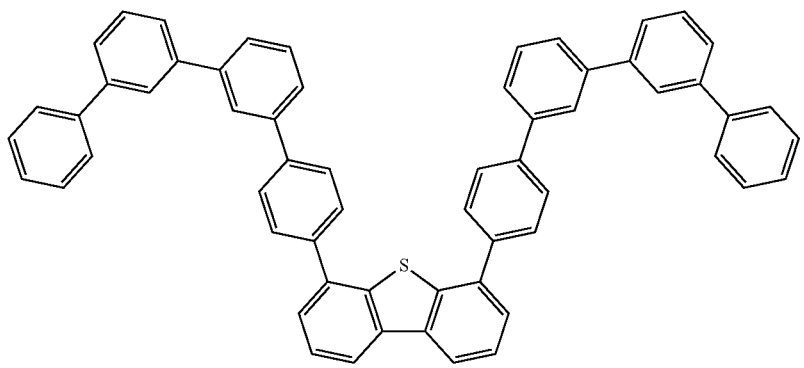
11
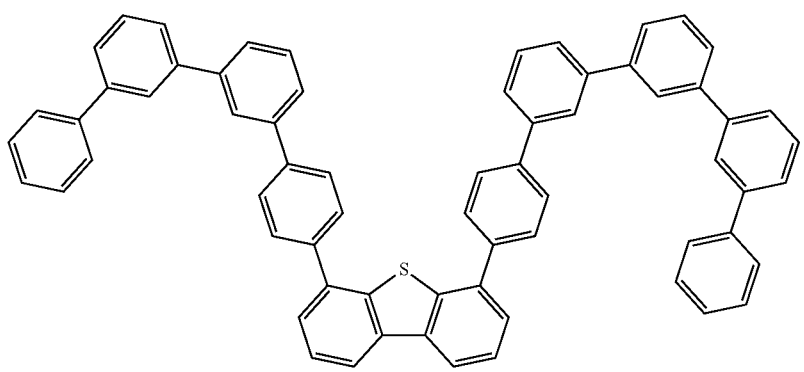
12

13
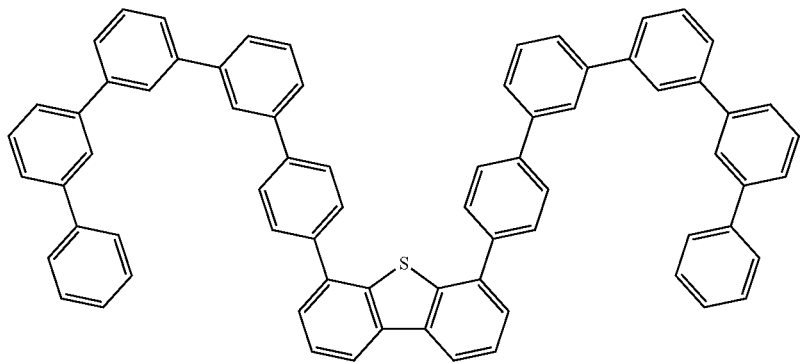
14
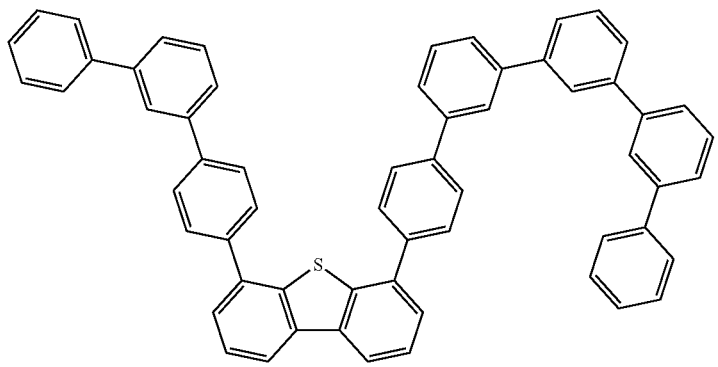
15
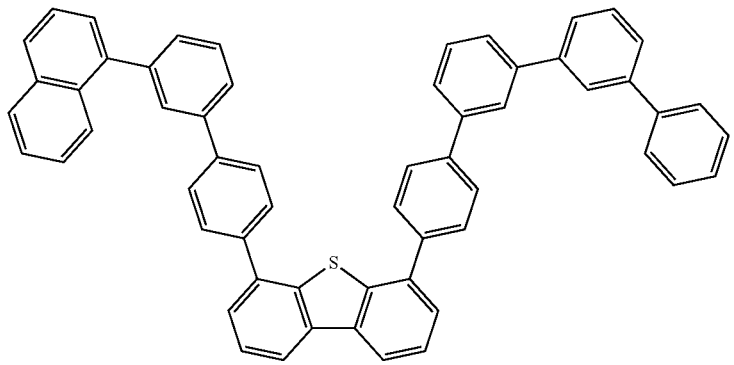
16
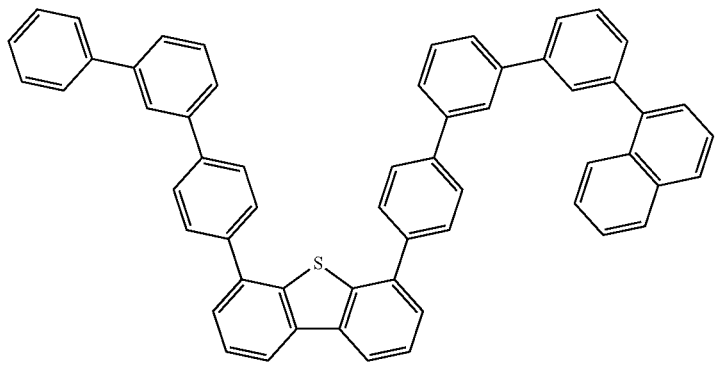

17
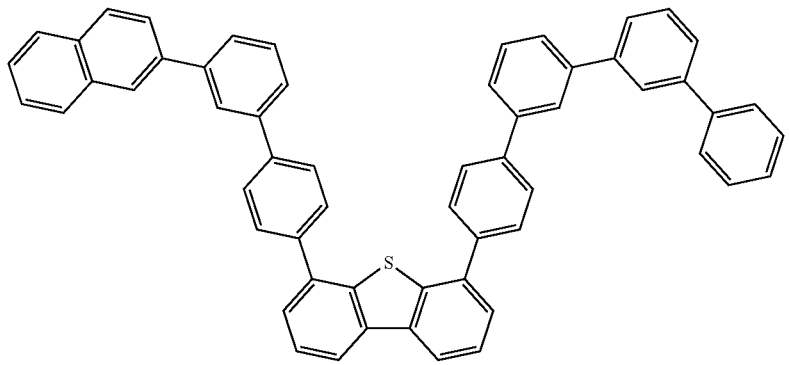
18
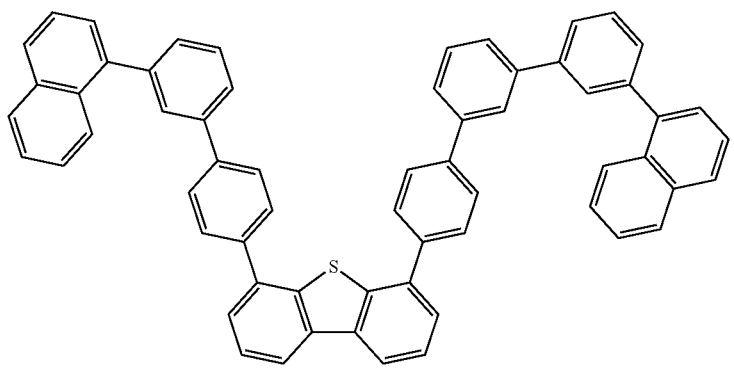
19
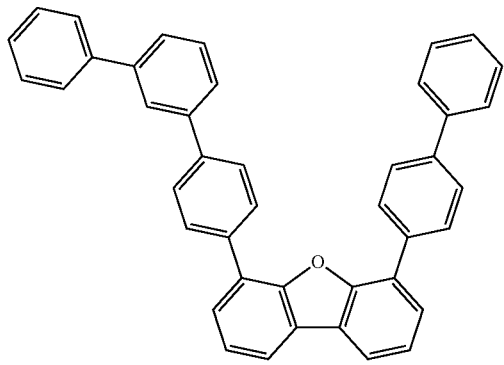
20
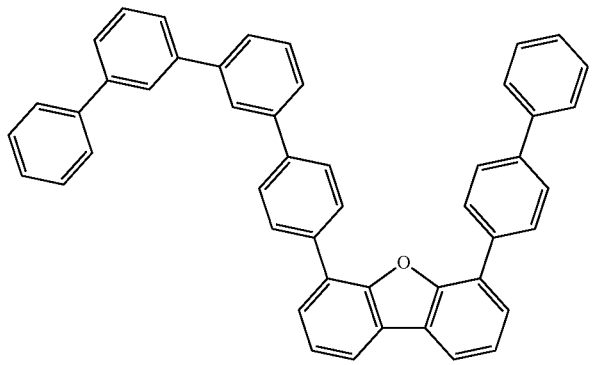

21
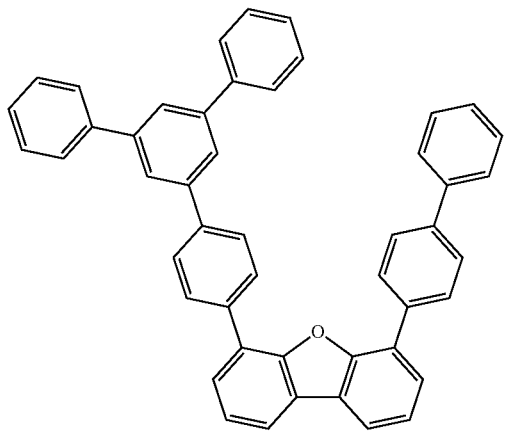
22
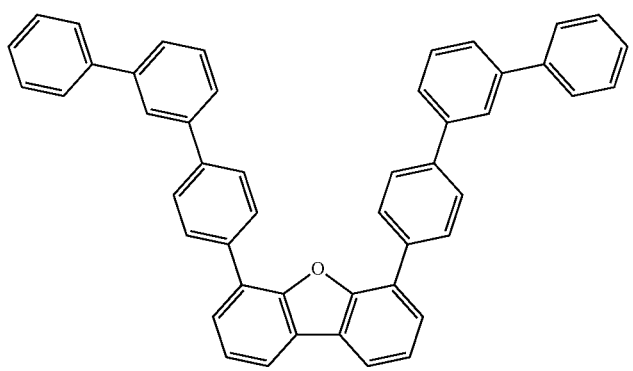
23
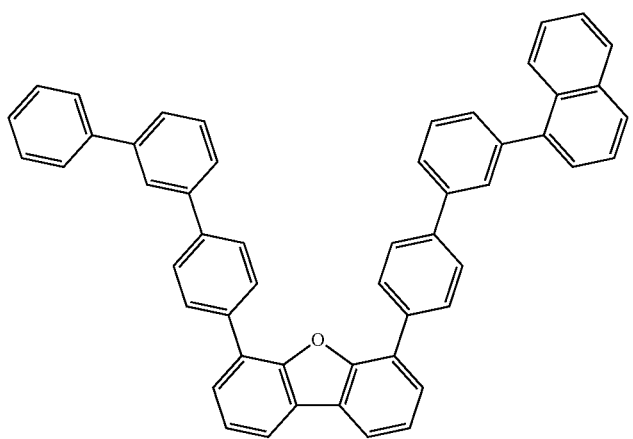

24
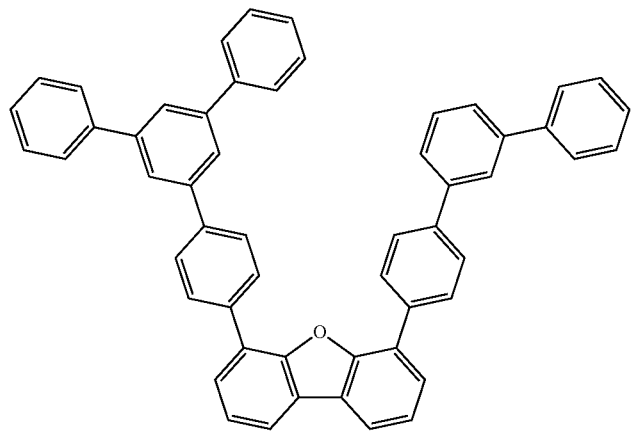
25
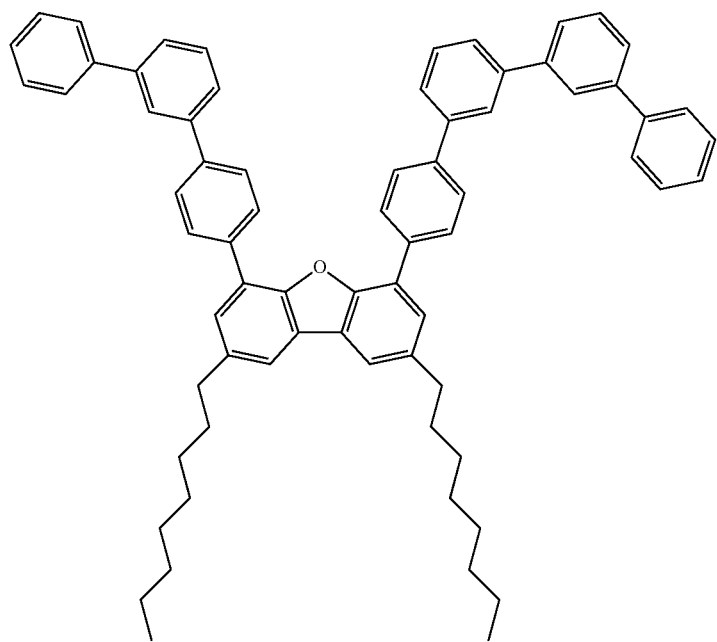
26
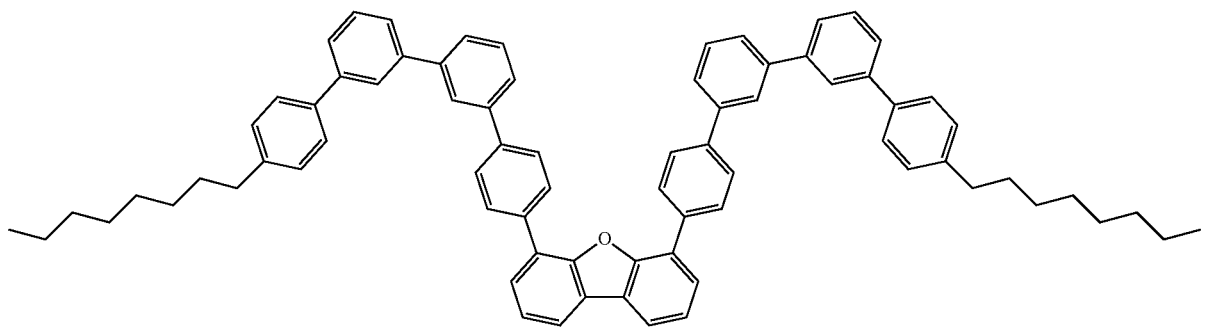

Among these, the compound 11 may particularly be desirable.

A method of preparing the low molecular compound 5 is not particularly limited, and various preparing methods including known synthesis methods may be used.

Low Molecular Compound 6

The wide gap material may desirably include at least one low molecular compound 6 represented by Chemical Formula (L6).

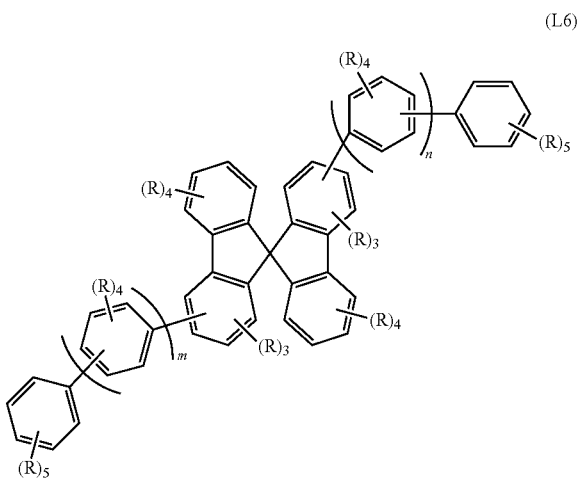

In Chemical Formula (L6), m and n are independently an integer of 0 to 3, and

R is independently a hydrogen atom, or a monovalent organic group.

In Chemical Formula (L6), two or more R's may be condensed or linked to each other to form a ring.

In Chemical Formula (L6), the monovalent organic group constituting R is not particularly limited. For example, it may be hydrogen, a cyano group, a substituted or unsubstituted C1 to C30 alkyl group, a substituted or unsubstituted C1 to C30 alkoxy group, a substituted or unsubstituted C6 to C30 aryloxy group, a substituted or unsubstituted alkylamino group having a C1 to C30 alkyl group, a substituted or unsubstituted C6 to C30 monovalent aromatic hydrocarbon ring group, or a substituted or unsubstituted monovalent aromatic heterocyclic group having 3 to 60 ring-forming atoms.

The C6 to C30 aromatic hydrocarbon ring group constituting R may be a group derived from C6 to C30 hydrocarbon (aromatic hydrocarbon) rings having a carbon ring containing one or a plurality of aromatic rings. In addition, when the aromatic hydrocarbon ring group may include two or more rings, two or more rings may be condensed with each other. One or more hydrogen atoms present in these aromatic hydrocarbon ring groups may be substituted with a substituent.

The aromatic hydrocarbon ring constituting the aromatic hydrocarbon ring group is not particularly limited, but may specifically be benzene, pentalene, indene, naphthalene, anthracene, azulene, heptalene, acenaphthalene, phenalene, fluorene, phenanthrene, biphenyl, triphenylene, pyrene, chrysene, pycene, perylene, pentaphene, pentacene, tetraphene, hexaphene, hexacene, rubicene, trinaphthylene, heptaphene, and pyrantrene.

The monovalent aromatic heterocyclic group having 3 to 60 ring-forming atoms constituting R may be a group derived from a cycle (aromatic heterocycle) having 3 to 60 ring-forming atoms which includes at least one aromatic ring having at least one heteroatom (for example, a nitrogen atom (N), an oxygen atom (O), a phosphorus atom (P), or a sulfur atom (S)) and a remaining ring atom that is a carbon atom (C). In addition, when the aromatic heterocyclic group includes two or more rings, two or more rings may be condensation with each other. It may also be substituted with one or more hydrogen atom substituents present in these aromatic heterocyclic groups.

Herein, the number of ring-forming atoms represents the number of atoms constituting the ring itself in a compound having a structure in which the atoms are bonded in a cyclic structure (for example, monocycle, condensed ring, ring cluster). When atoms that do not form a ring (for example, hydrogen atoms that terminate the bonds of atoms that constitute the ring), or the rings is substituted by a substituent, the atoms included in the substituent are not included in the number of ring-forming atoms. For example, the carbazolyl group (substituted with carbazole ring) has the number of ring-forming atoms of 13.

The aromatic heterocycle constituting aromatic heterocyclic group may include, but is not particularly limited to, a π electron-deficient aromatic heterocycle, a π electron-excess aromatic heterocycle, a π electron-deficient-Tr electron-excess mixed aromatic heterocycle in which a π electron-deficient aromatic heterocycle and a π electron excess aromatic heterocycle are mixed.

Examples of the π electron-deficient aromatic heterocycle may be pyridine, pyrazine, pyridazine, pyrimidine, triazine, quinoline, isoquinoline, quinoxaline, quinazoline, naphthyridine, acridine, phenazine, benzoquinoline, benzisoquinoline, phenanthridine, phenanthroline, benzoquinone, coumarin, anthraquinone, fluorenone, and the like.

Examples of the π electron-excess aromatic heterocycle may be furan, thiophene, benzofuran, benzothiophene, dibenzofuran, dibenzothiophene, pyrrole, indole, carbazole, and the like.

Examples of the π electron-deficient-Tr electron-excess mixed aromatic heterocycle may be imidazole, benzimidazole, pyrazole, indazole, oxazole, isoxazole, benzoxazole, benzisoxazole, thiazole, isothiazole, benzothiazole, benzisothiazole, imidazolinone, benzimidazolinone, imidazopyridine, imidazopyrimidine, imidazophenanthridine, benzimidazophenanthridine, azadibenzofuran, azacarbazole, azadibenzothiophene, diazadibenzofuran, diazacarbazole, ziazadibenzothiophene, xanthone, and dioxantone.

In a group formed by linking the two or more C6 to C30 monovalent aromatic hydrocarbon ring groups constituting R or monovalent aromatic heterocyclic groups having 3 to 60 ring-forming atoms constituting R, by a single bond, the C6 to C30 monovalent aromatic hydrocarbon ring group and the monovalent aromatic heterocyclic group having 3 to 60 ring-forming atoms are the same as described above, and thus the description thereof is omitted.

The C1 to C30 alkyl group constituting R is not particularly limited. For example, it may be a C1 to C30 linear or branched alkyl group. Specifically, it may be a methyl group, an ethyl group, an n-propyl group, a isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, a isohexyl group, a 1,3-dimethylbutyl group, a 1-isopropylpropyl group, a 1,2-dimethylbutyl group, an n-heptyl group, a 1,4-dimethylpentyl group, 3-ethylpentyl group, a 2-methyl-1-isopropylpropyl group, a 1-ethyl-3-methylbutyl group, an n-octyl group, a 2-ethylhexyl group, a 3-methyl-1-isopropylbutyl group, a 2-methyl-1-isopropylbutyl group, a 1-tert-butyl-2-methylpropyl group, an n-nonyl group, a 3,5,5-trimethylhexyl group, an n-decyl group, a isodecyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, an n-eicosyl group, an n-heneicosyl group, an n-docosyl group, an n-tricosyl group, and an n-tetracosyl group.

The carbon number of the alkyl group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkyl group. This is because the ligand of the quantum dot and the alkyl group present in the hole transport layer may interact with each other, thereby improving effects such as hole injectability.

In addition, when the solvent that disperses the quantum dot is a long-chain hydrocarbon-based solvent, it is desirable that the number of the alkyl group in the polymer compound is small in terms of securing a residual film ratio of the hole transport layer.

Therefore, as the alkyl group, a linear or branched C1 to C18 alkyl group is more desirable. The alkyl group may be appropriately selected according to the used quantum dot or the solvent that disperses the quantum dot.

The C1 to C30 alkoxy group that may form R is not particularly limited. For example, it may be C1 to C30 linear or branched alkoxy group. Specifically, it may be a methoxy group, an ethoxy group, a propoxy group, an isopropoxy group, a butoxy group, a pentyloxy group, a hexyloxy group, a heptyloxy group, an octyloxy group, a nonyloxy group, a decyloxy group, an undecyloxy group, a dodecyloxy group, a tridecyloxy group, a tetradecyloxy group, a pentadecyloxy group, a hexadecyloxy group, a heptadecyloxy group, an octadecyloxy group, a 2-ethylhexyloxy group, a 3-ethylpentyloxy group, and the like.

The carbon number of the alkoxy group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkoxy group. This is because the ligand of the quantum dot and the alkoxy group present in the hole transport layer may interact with each other, thereby improving effects such as hole injectability.

In addition, when the solvent that disperses the quantum dot is a long-chain hydrocarbon-based solvent, it is desirable that the number of the alkoxy group in the polymer compound is small in terms of securing a residual film ratio of the hole transport layer.

Therefore, as the alkoxy group, a linear or branched C1 to C18 alkoxy group is more desirable. These alkoxy groups may be appropriately selected according to the used quantum dot or the solvent that disperses the quantum dot.

The C6 to C30 aryloxy group constituting R is not particularly limited

For example, it may be a C6 to C30 monocyclic or condensed polycyclic aryloxy group that may include a heteroatom. Specifically, it may be a phenoxy group, a 1-naphthyloxy group, a 2-naphthyloxy group, a 2-azulenyloxy group, a 2-furanyloxy group, a 2-thienyloxy group, a 2-indolyloxy group, a 3-indolyloxy group, a 2-benzofuryloxy group, and a 2-benzothienyloxy group.

The alkylamino group having the C1 to C30 alkyl group constituting R is not particularly limited. For example, it may be an alkylamino group having a linear or branched C1 to C30 alkyl group. Specifically, it may be an N-alkylamino group such as an N-methylamino group, an N-ethylamino group, an N-propylamino group, an N-isopropylamino group, an N-butylamino group, an N-isobutylamino group, an N-sec-butylamino group, an N-tert-butylamino group, an N-pentylamino group, or an N-hexylamino group, an N,N-dialkylamino group such as an N,N-dimethylamino group, an N-methyl-N-ethylamino group, an N,N-diethylamino group, an N,N-dipropylamino group, an N,N-diisopropylamino group, an N,N-dibutylamino group, an N,N-diisobutylamino group, an N,N-dipentylamino group, an N,N-dihexylamino group, and the like.

When the C1 to C30 alkyl group, C1 to C30 alkoxy group, C6 to C30 aryloxy group, alkylamino group having the C1 to C30 alkyl group, C6 to C30 monovalent aromatic hydrocarbon ring group, or monovalent aromatic heterocyclic group having 3 to 60 ring-forming atoms which constitutes R is further substituted with another substituent, the substituent is not particularly limited. Another substituent may be, for example, the same as the substituent which may constitute R. That is, it may be for example hydrogen, a cyano group, a substituted or unsubstituted, C1 to C30 alkyl group, C1 to C30 alkoxy group, C6 to C30 aryloxy group, C1 to C30 amino group, C6 to C30 monovalent aromatic hydrocarbon ring group, or monovalent aromatic heterocyclic group having 3 to 60 ring-forming atoms. Since the description of another substituent is the same as that of R, the description is omitted.

Subsequent substituents that substitute for groups present in other substituents, such as another substituent that further substitutes for another substituent, or next another substituent that further substitutes for another substituent, are also the same as another substituent that is described above.

The compound represented by Chemical Formula (L6) may desirably be a compound represented by Chemical Formula (L6-A), Chemical Formula (L6-B), Chemical Formula (L6-C), or Chemical Formula (L6-D).

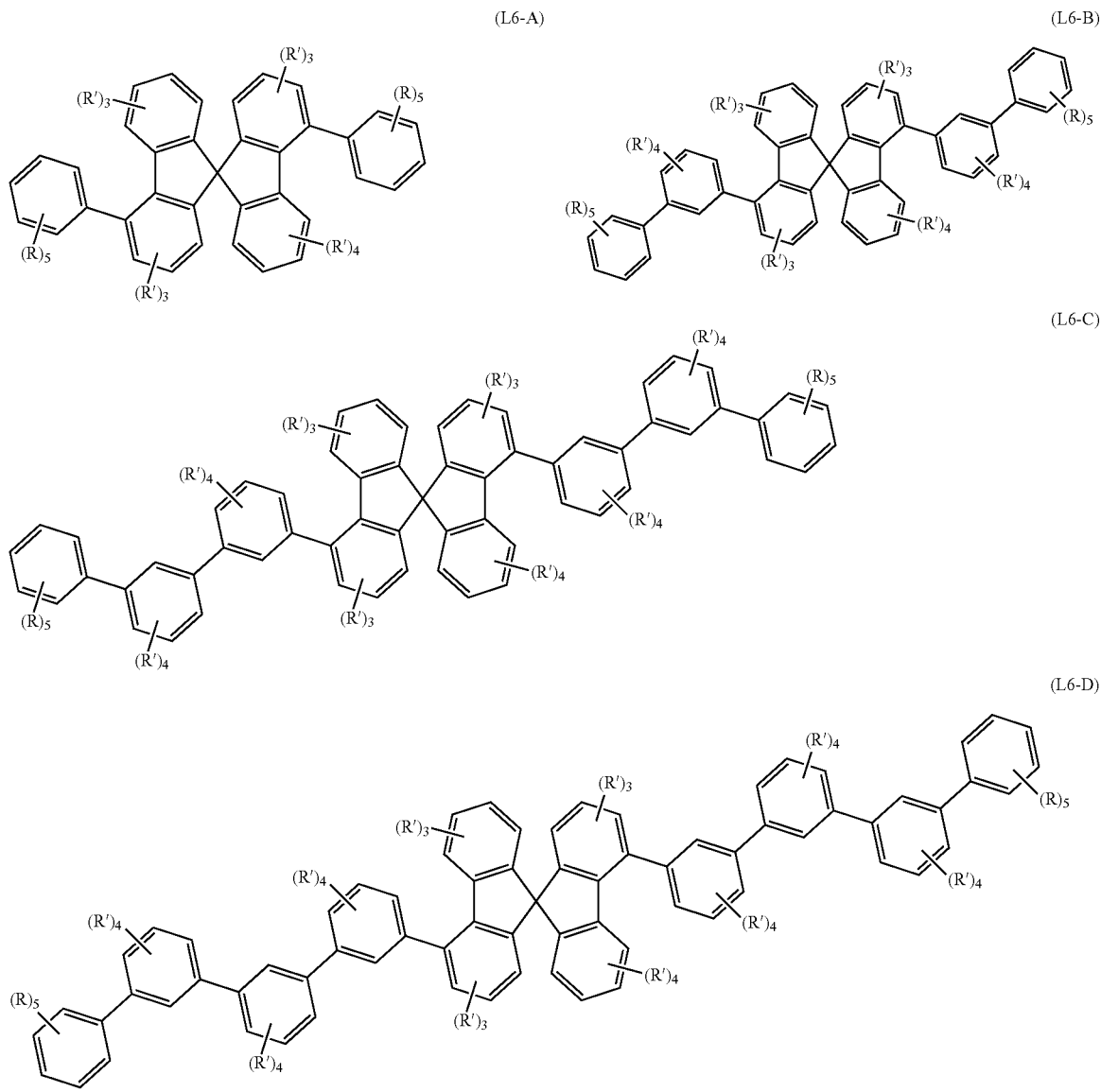

In Chemical Formula (L6-A), Chemical Formula (L6-B), Chemical Formula (L6-C), and Chemical Formula (L6-D), R is the same as Chemical Formula (L6), R' may independently be a hydrogen atom, a cyano group, a substituted or unsubstituted C1 to C30 alkyl group, a substituted or unsubstituted C1 to C30 alkoxy group, a substituted or unsubstituted C6 to C30 aryloxy group, or a substituted or unsubstituted alkylamino group having a C1 to C30 alkyl group.

In Chemical Formula (L6), Chemical Formula (L6-A), Chemical Formula (L6-B), Chemical Formula (L6-C), and Chemical Formula (L6-D), R may independently be a hydrogen atom, a cyano group, an unsubstituted C1 to C30 alkyl group, an unsubstituted C1 to C30 alkoxy group, an unsubstituted C6 to C30 aryloxy group, an unsubstituted C1 to C30 amino group, an unsubstituted C6 to C30 monovalent aromatic hydrocarbon ring group, or unsubstituted monovalent aromatic heterocyclic group having 3 to 60 ring-forming atoms. In addition, it is more desirably that R is all hydrogen atoms.

In Chemical Formula (L6-A), Chemical Formula (L6-B), Chemical Formula (L6-C), and Chemical Formula (L6-D), R' may independently be a cyano group, an unsubstituted C1 to C30 alkyl group, an unsubstituted C1 to C30 alkoxy group, an unsubstituted C6 to C30 aryloxy group, or an unsubstituted alkylamino group having a C1 to C30 alkyl group. In addition, it is more desirably that R' is all hydrogen atoms.

The carbon number of the alkyl group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkyl group. This is because the ligand of the quantum dot and the alkyl group present in the hole transport layer may interact with each other, thereby improving effects such as hole injectability.

In addition, when the solvent that disperses the quantum dot is a long-chain hydrocarbon-based solvent, it is desirable that the number of the alkyl group in the polymer compound is small in terms of securing a residual film ratio of the hole transport layer.

Therefore, as the alkyl group, a linear or branched C1 to C18 alkyl group is more desirable. The alkyl group may be appropriately selected according to the used quantum dot or the solvent that disperses the quantum dot.

The carbon number of the alkoxy group is more desirably in the following type.

For example, when the ligand of the quantum dot is a long chain alkyl-containing compound such as oleic acid, oleylamine, or trioctylphosphine, the compound included in the hole transport layer may also desirably include a compound having a long chain alkoxy group. This is because the ligand of the quantum dot and the alkoxy group present in the hole transport layer may interact with each other, thereby improving effects such as hole injectability.

In addition, when the solvent that disperses the quantum dot is a long-chain hydrocarbon-based solvent, it is desirable that the number of the alkoxy group in the polymer compound is small in terms of securing a residual film ratio of the hole transport layer.

Therefore, as the alkoxy group, a linear or branched C1 to C18 alkoxy group is more desirable. These alkoxy groups may be appropriately selected according to the used quantum dot or the solvent that disperses the quantum dot.

Among the compounds represented by Chemical Formula (L6-A), Chemical Formula (L6-B), Chemical Formula (L6-C) and Chemical Formula (L6-D), the compound represented by Chemical Formula (L6-C) may be more desirable.

The present disclosure specifically illustrates the compound represented by Chemical Formula (L6), but the present disclosure is not limited to these specific examples.

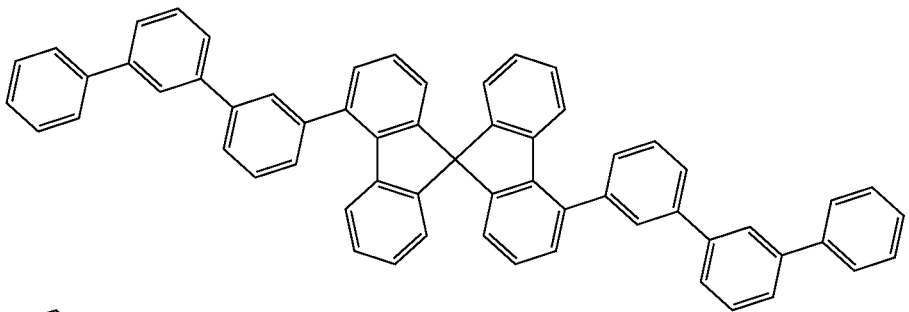

1

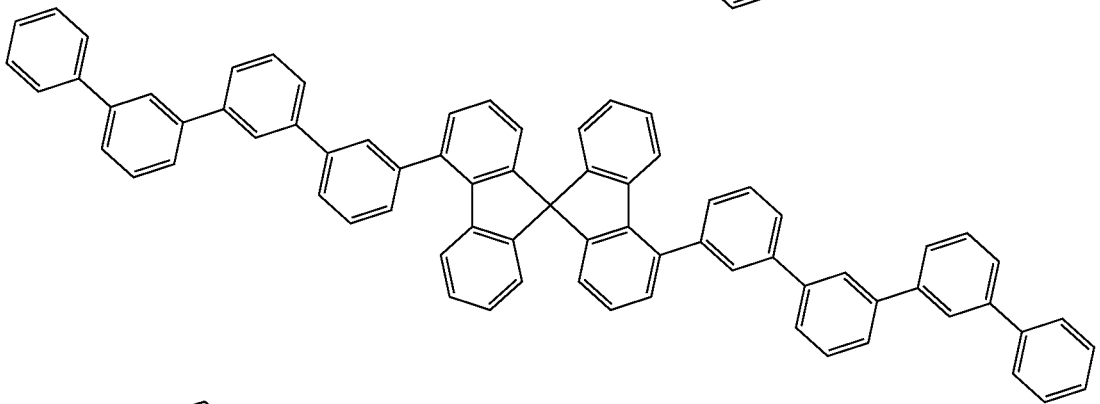

2

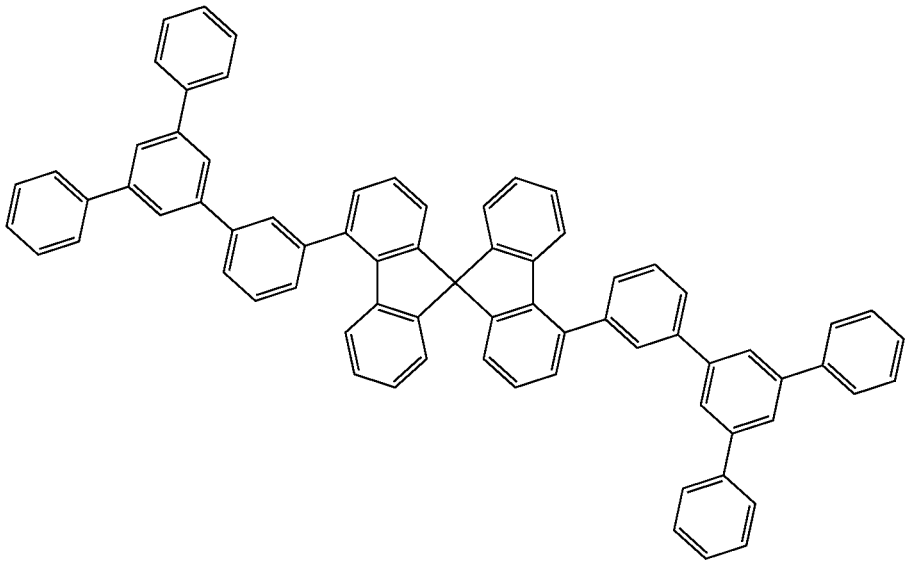

3

-continued
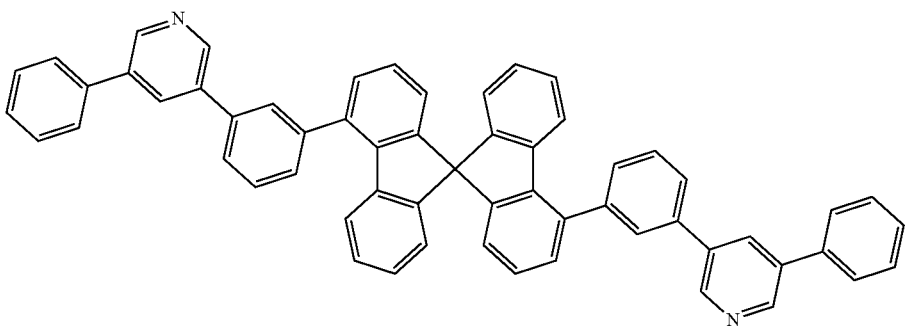
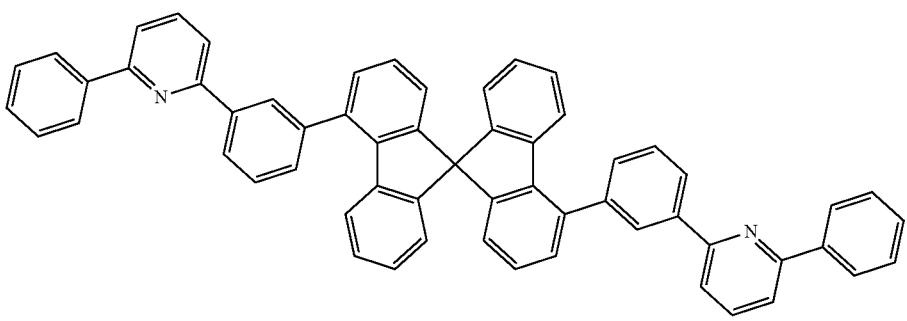
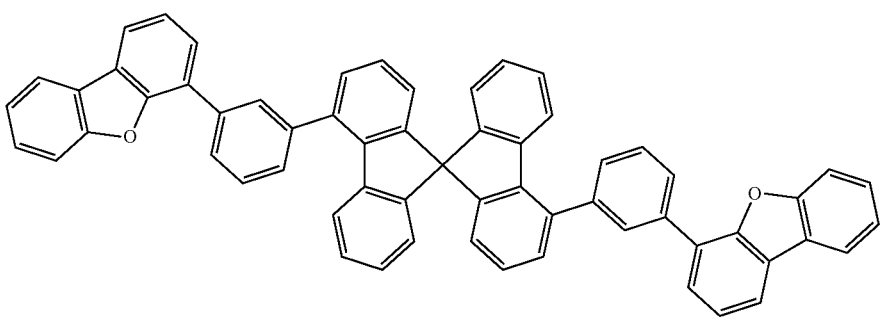
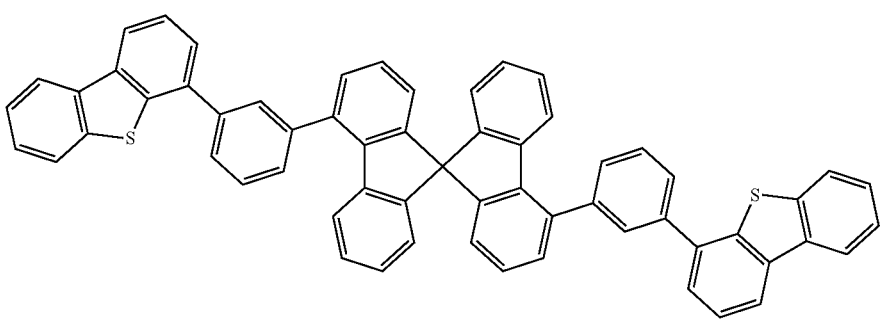
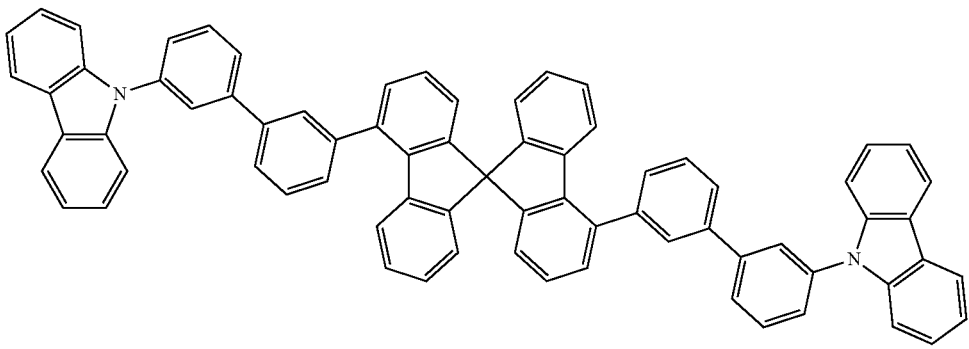

9
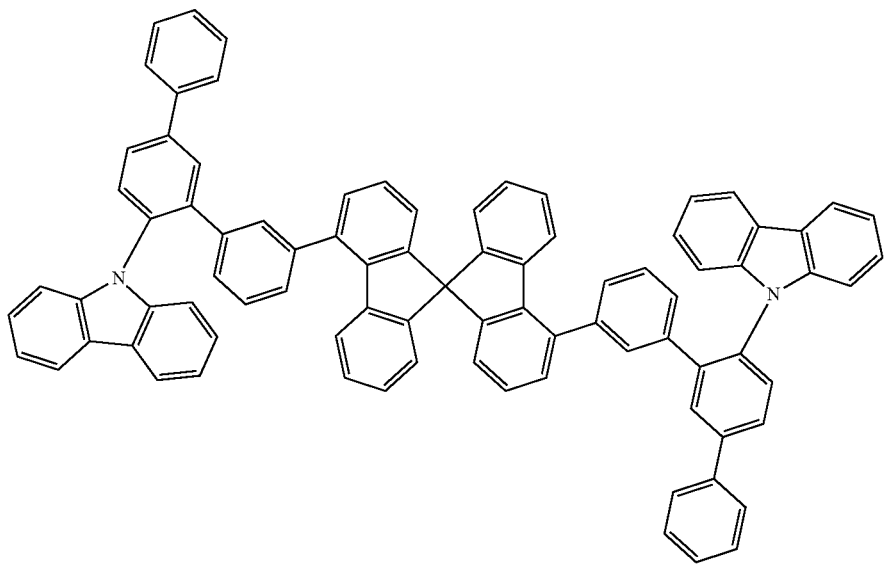
10
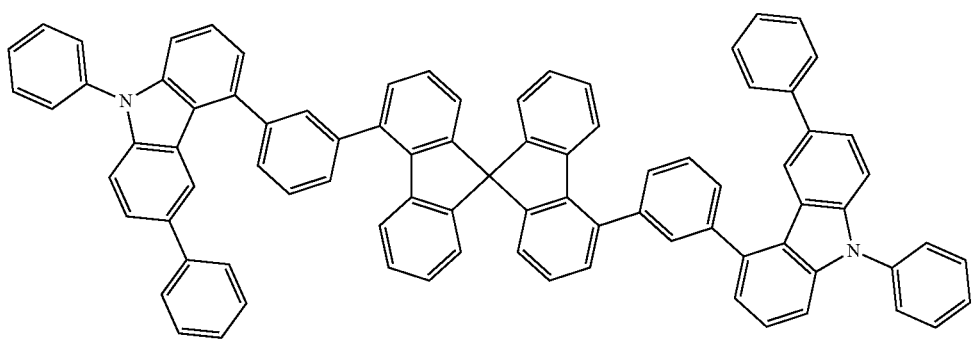
11
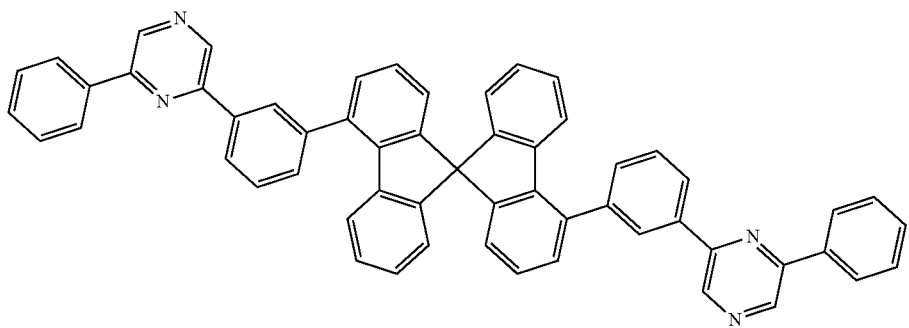
12
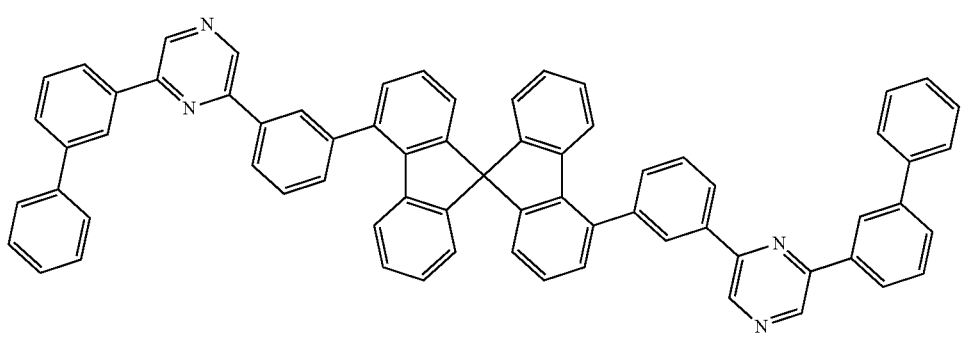

-continued
13
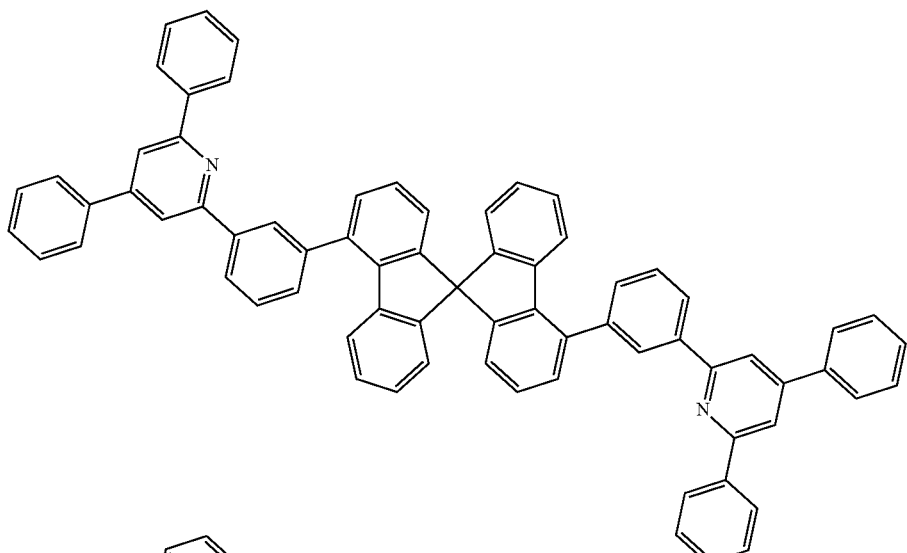
14
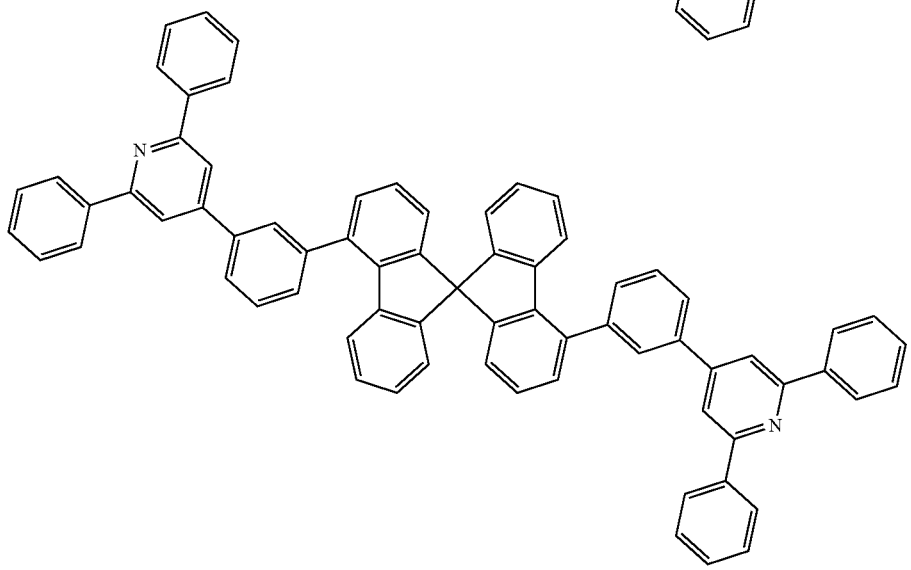
15
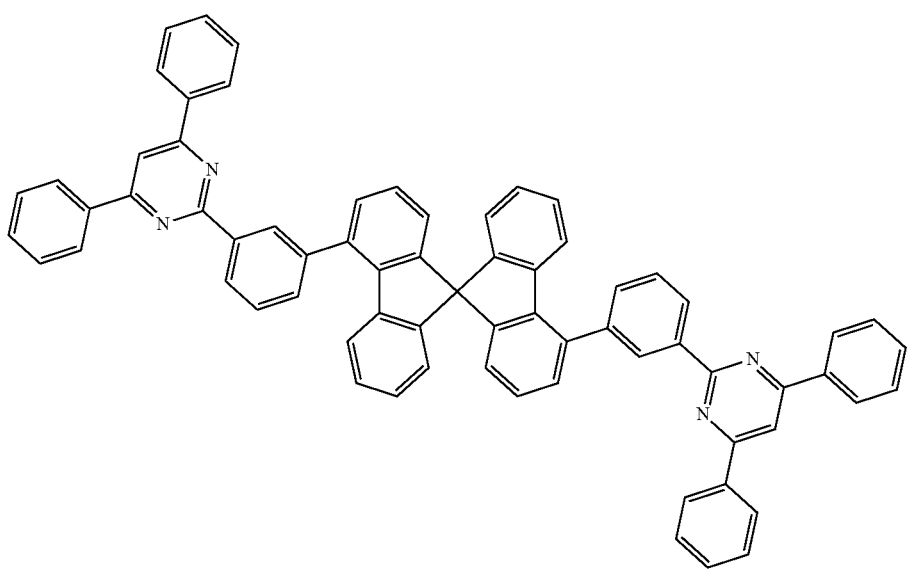

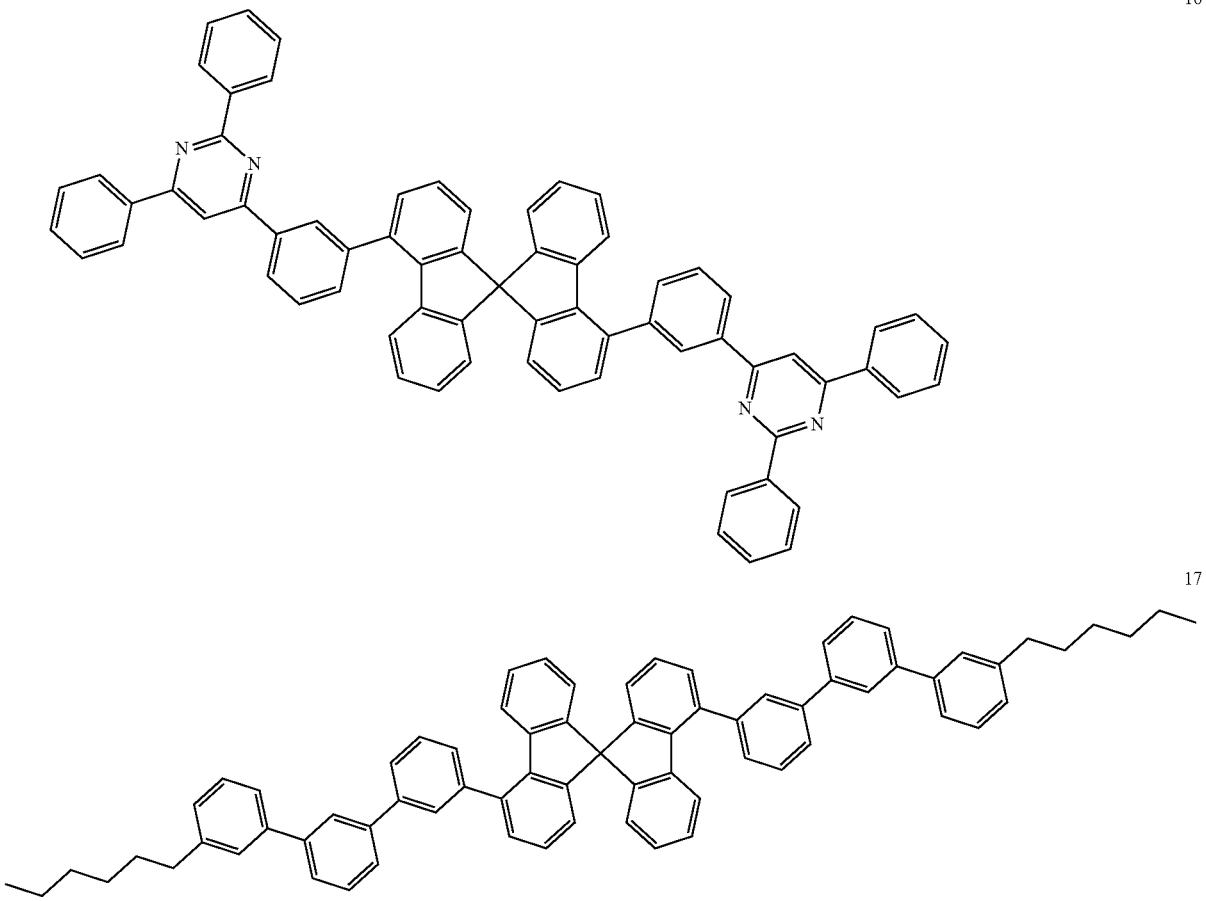

Among these, the compound 1 may particularly be desirable.

A method of preparing the low molecular compound 6 is not particularly limited, and various preparing methods including known synthesis methods may be used.

A weight ratio of the polymer material and the low molecular material in the hole transport layer is not particularly limited. However, from the viewpoint of obtaining the effect of the present disclosure more efficiently, a content ratio of the polymer material may be greater than about 60 weight percent and less than about 100 weight percent based on a total amount, 100 weight percent of the polymer material and the low molecular material. In addition, the content ratio of the polymer material is desirably greater than about 60 weight percent and less than or equal to about 95 weight percent, and particularly greater than or equal to about 70 weight percent and less than or equal to about 90 weight percent.

A combination of the polymer material and the low molecular material is not particularly limited. For example, the polymer compound 1 and the low molecular compound 1 may be combined. The polymer compound 1 and the low molecular compound 1 have similar structures. Therefore, the hole transport layer including such a combination of compounds may become more dense, and thus may improve density and hole transport capability of the hole transport layer. As a result, luminous efficiency and light emitting life-span of the quantum dot EL device may be more improved.

Quantum Dot Electroluminescence Device

Hereinafter, referring to FIG. 1, the quantum dot electroluminescence device (quantum dot EL device) according to the present embodiment is described in detail. FIG. 1 is a schematic view showing a quantum dot EL device according to the present embodiment. As shown in FIG. 1, the quantum dot EL device 100 according to the present embodiment includes a substrate 110, a first electrode 120 disposed on the substrate 110, a hole injection layer 130 disposed on the first electrode 120, a hole transport layer 140 disposed on the hole injection layer 130, a light emitting layer 150 disposed on hole transport layer 140, an electron transport layer 160 disposed on light emitting layer 150, an electron injection layer 170 disposed on electron transport layer 160, and a second electrode 180 disposed on the electron injection layer 170. The polymer material and low molecular material of the present embodiment are included in the hole transport layer 140.

The hole transport layer including the polymer material and the low molecular material of the present embodiment is desirably formed by a solution coating method. Specifically, it may be formed by a solution coating method such as a spin coating method, a casting method, a micro gravure coating method, a gravure coating method, a bar coating method, a roll coating method, a wire bar coating method, a dip coating method, a spray coating method, a screen printing method, a flexographic printing method, an offset printing method, an inkjet printing method, and the like.

As the solvent used in the solution coating method, any solvent may be used as long as it is capable of dissolving the polymer material and the low molecular material, and the solvent may be appropriately selected according to types of the used compounds. For example, the solvent may be one or more of toluene, xylene, ethylbenzene, diethylbenzene, mesitylene, propylbenzene, cyclohexylbenzene, dimethoxybenzene, anisole, ethoxytoluene, phenoxytoluene, isopropylbiphenyl, dimethylanisole, phenyl acetate, phenyl propionate, methyl benzoate, ethyl benzoate, cyclohexane, and the like. An amount of the solvent used is not particularly limited, but considering the ease of application, concentrations of the polymer material and the low molecular material may desirably be greater than or equal to about 0.1 weight percent and less than or equal to about 10 weight percent. More desirably, the concentrations of the polymer material and the low molecular material may be greater than or equal to about 0.5 weight percent and less than or equal to about 5 weight percent.

In addition, a ratio of contents of the polymer material and the low molecular material in a coating liquid (coating liquid for the hole transport layer formation) may be adjusted to obtain a desired content ratio in the hole transport layer.

After applying the coating liquid (coating liquid for forming the hole transport layer) and forming a film, the hole transport layer may be formed by heating and drying the film.

The conditions of the heating and drying are not particularly limited, but the heating and drying temperature may be desirably greater than or equal to about 50° C. and less than or equal to about 300° C., and more desirably greater than or equal to about 100° C. and less than or equal to about 200° C. In addition, the heating and drying time may desirably be 5 minutes or more and 240 minutes or less, and desirably greater than or equal to about 20 minutes and less than or equal to about 60 minutes. By carrying out the heating and drying under these conditions, the hole transport layer may be formed.

Methods of forming layers other than the hole transport layer including the polymer material and the low molecular material of the present disclosure are not particularly limited. Such layers may be formed by, for example, a vacuum deposition method, or may be formed by a solution coating method.

The substrate 110 may be a substrate used in a general quantum dot EL device. For example, the substrate 110 may be a semiconductor substrate such as a glass substrate, a silicon substrate, and the like, or a transparent plastic substrate.

On the substrate 110, a first electrode 120 is formed. The first electrode 120 is specifically a positive electrode, and is formed by a material having a large work function among a metal, an alloy, or a conductive compound. For example, the first electrode 120 may be formed as a transmissive electrode by indium tin oxide ($In_2O_3$—$SnO_2$: ITO), indium zinc oxide ($In_2O_3$—ZnO), tin oxide ($SnO_2$), zinc oxide (ZnO) or the like due to improved transparency and conductivity. The first electrode 120 may be formed as a reflective electrode by laminating magnesium (Mg), aluminum (Al), or the like on the transparent conductive layer.

On the first electrode 120, a hole injection layer 130 is formed. The hole injection layer 130 is a layer that facilitates injection of holes from the first electrode 120, and may be formed to have a thickness of specifically greater than or equal to about 10 nm and less than or equal to about 1000 nm, and more specifically greater than or equal to about 10 nm and less than or equal to about 100 nm.

The hole injection layer 130 may include a known hole injection material. The known hole injection material may include, for example, triphenylamine-containing polyetherketone (TPAPEK), 4-isopropyl-4'-methyldiphenyl iodonium tetrakis(pentafluorophenyl)borate (PPBI), N,N'-diphenyl-N, N'-bis-[4-(phenyl-m-tolyl-amino)-phenyl]-biphenyl-4,4'-diamine (DNTPD), copper phthalocyanine, 4,4',4"-tris(3-methylphenylphenylamino)triphenylamine (m-MTDATA), N,N'-di(1-naphthyl)-N,N'-diphenylbenzidine (NPB), 4,4',4"-tris(diphenylamino)triphenylamine (TDATA), 4,4',4"-tris(N,N-2-naphthylphenylamino)triphenylamine (2-TNATA), polyaniline/dodecylbenzenesulphonic acid, poly(3,4-ethylenedioxythiophene)/poly(4-styrenesulfonate) (PEDOT-PSS), or polyaniline/10-camphorsulfonic acid, and the like.

On the hole injection layer 130, a hole transport layer 140 is formed. The hole transport layer 140 is a layer having a function of transporting holes, and may be formed with a thickness of, for example, greater than or equal to about 10 nm and less than or equal to about 150 nm. The hole transport layer 140 may include the polymer material and the low molecular material of the present embodiment.

In addition to the polymer material and the low molecular material of the present embodiment, the hole transport layer 140 may include a known hole transporting material. The known hole transporting material may include, for example, 1,1-bis[(di-4-tolylamino) phenyl] cyclohexane (TAPC), a carbazole derivative such as N-phenylcarbazole, polyvinylcarbazole, and the like, N,N'-bis(3-methylphenyl)-N, N'-diphenyl-[1,1-biphenyl]-4,4'-diamine (TPD), 4,4',4"-tris(N-carbazolyl) triphenylamine (TCTA), or N,N'-di(1-naphthyl)-N,N'-diphenylbenzidine (NPB).

On the hole transport layer 140, a light emitting layer 150 is formed. The light emitting layer 150 is a layer that emits light by fluorescence, phosphorescence, and the like, and is formed using a vacuum deposition method, a spin coating method, an inkjet printing method, or the like. The light emitting layer 150 may be formed with a thickness of, for example, about 10 nm to about 60 nm, and more specifically about 20 nm to about 50 nm. As the light emitting material of the light emitting layer 150 in the present embodiment, semiconductor nanoparticles (quantum dot) may be used.

Herein, in the case of forming the light emitting layer by a solution coating method such as a spin coating method, as a solvent of the dispersion for forming the light emitting layer including quantum dots, there is no particular limitation, but a poor solvent for the hole transport layer is desirably used. By using a poor solvent, the mixing of the low molecular material in the hole transport layer into the light emitting layer may be further prevented. In addition, it is possible to construct a quantum dot EL device having a designed film thickness with good reproducibility. In addition, the smoothness of the hole transport layer surface is improved, and non-uniformity of the light emitting surface and an occurrence of leakage current may be suppressed. Therefore, the quantum dot electroluminescence device of the present disclosure has improved luminous efficiency and light emitting life-span.

Examples of the porous solvent may include a carbon-based hydrocarbon-based solvent such as hexane, cyclohexane, heptane, octane, nonane, decane, undecane, and the like, an alcohol based solvent such as methanol, ethanol, isopropyl alcohol, butanol, and the like. These poor solvents may be used alone or in combination of two or more types as a mixed solvent. In addition, depending on the adjustment of the solvent viscosity and the like, it may be used in combination with a solvent which becomes a good solvent as long as no film mixing occurs.

The light emitting layer is not particularly limited, and may include a known quantum dot material(s). Among them, a quantum dot material having a core-shell structure is desirable.

In the light emitting layer, a plurality of semiconductor nanoparticles (quantum dots) may be arranged in a monolayer or plural layer. Herein, the semiconductor nanoparticles (quantum dots) may be particles of predetermined sizes that have a quantum confinement effect. The diameter of the semiconductor nanoparticles (quantum dots) is not particularly limited but is greater than or equal to about 1 nm and less than or equal to about 10 nm.

The semiconductor nanoparticles (quantum dots) arranged in the light emitting layer may be synthesized by a wet chemical process, an organic metal chemical deposition process, a molecular beam epitaxy process, or another similar process. Among them, the wet chemical process is a method of growing a particle by putting a precursor material in an organic solvent.

In the wet chemistry process, when crystals grow, the organic solvent naturally coordinates to the surface of the quantum dot crystals and acts as a dispersing agent, thereby controlling the growth of the crystals. For this reason, in the wet chemical process, compared with gas phase deposition methods, such as metal organic chemical vapor deposition (MOCVD) and molecular beam epitaxy (MBE), growth of semiconductor nanoparticles may be easily controlled at a low cost.

The semiconductor nanoparticles (quantum dots) may adjust energy bandgaps by adjusting their sizes, so that light of various wavelengths may be obtained from the light emitting layer (quantum dot light emitting layer). Thus, a plurality of differently sized quantum dots may embody a display that discharges (or emits) light of multiple wavelengths. The sizes of the quantum dots may be selected to emit red, green, and blue light to form a color display. In addition, the sizes of the quantum dots may be combined so that various color lights emit white light.

The semiconductor nanoparticles (quantum dots) of the present disclosure have core-shell structures. A material which constitutes a core portion may be semiconductor material of a Group II-VI semiconductor compound; a Group III-V semiconductor compound; a Group IV-VI semiconductor compound; a Group IV element or compound; or a combination thereof.

Specifically, the semiconductor nanoparticles (quantum dots) of the present disclosure may be as follows.

The Group II-VI semiconductor compound is not particularly limited, but includes, for example, a binary compound of CdSe, CdTe, ZnS, ZnSe, ZnTe, ZnO, HgS, HgSe, HgTe, or a mixture thereof; a ternary compound of CdSeS, CdSeTe, CdSTe, ZnSeS, ZnTeSe, ZnSTe, HgSeS, HgSeTe, HgSTe, CdZnS, CdZnSe, CdZnTe, CdHgS, CdHgSe, CdHgTe, HgZnS, HgZnSe, HgZnTe, or a quaternary compound of CdZnSeS, CdZnSeTe, CdZnSTe, CdHgSeS, CdHgSeTe, CdHgSTe, HgZnSeS, HgZnSeTe, HgZnSTe, or a mixture thereof.

The Group III-V semiconductor compound is not particularly limited, but includes, for example, a binary compound of GaN, GaP, GaAs, GaSb, AlN, AlP, AlAs, AlSb, InN, InP, InAs, InSb, or a mixture thereof; a ternary compound of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, or a mixture thereof; or a quaternary compound of GaAlNAs, GaAlNSb, GaAlPAs, GaAlPSb, GaInNP, GaIn-NAs, GaInNSb, GaInPAs, GaInPSb, InAlNP, InAlNAs, InAlNSb, InAlPAs, InAlPSb, or a mixture thereof.

The Group IV-VI semiconductor compound is not particularly limited, but includes, for example, a binary compound of SnS, SnSe, SnTe, PbS, PbSe, PbTe, or a mixture thereof; a ternary compound of SnSeS, SnSeTe, SnSTe, PbSeS, PbSeTe, PbSTe, SnPbS, SnPbSe, SnPbTe, or a mixture thereof; or a quaternary compound of SnPbSSe, SnPbSeTe, SnPbSTe, or a mixture thereof.

The Group IV element or compound is not particularly limited, but includes, for example, a single element of Si, Ge, or a mixture thereof; and a binary compound of SiC, SiGe, or a mixture thereof.

In the core-shell structure of the semiconductor nanoparticles (quantum dots) of the present disclosure, different materials may be included. The material constituting each core and shell may be made of different semiconductor compounds. However, an energy bandgap of the material of the shell portion is desirably larger than an energy bandgap of the material of the core portion.

The material desirably used in the shell portion may depend on energy bandgaps of the material of the core portion used, but there are for example, ZnS, ZnSe, or ZnSe/ZnS.

The shell portion does not have to completely cover the whole surface of the core portion, and may be cover at least a portion of the core portion as long as there is no damage caused by the core portion being partially exposed. In addition, the core-shell structure may form a gradient structure (tilt structure) from two or more types of compounds.

For example, a process of producing a quantum dot having a core (CdSe)-shell (ZnS) structure is described. First, crystals are formed by injecting core (CdSe) precursor materials of $(CH_3)_2Cd$ (dimethyl cadmium), TOPSe (trioctylphosphine selenide) and the like into an organic solvent using TOPO (trioctylphosphine oxide) as a surfactant. At this time, after maintaining a certain time at high temperature so that the crystals grow to a certain size, the precursor materials of the shell (ZnS) are injected, to form a shell on the surface of the core already generated. As a result, a quantum dot of CdSe/ZnS capped with TOPO may be produced. In addition, by ligand exchange with oleic acid, a quantum dot of CdSe/ZnS capped with oleic acid may be produced.

The light emitting layer 150 according to the present disclosure includes very little or none of the low molecular material included in the hole transport layer 140. That the low molecular material does not appreciably mix with, or is not appreciably present in, the light emitting layer may be confirmed by measuring the residual film ratio of the hole transport layer using the following method.

Measurement of residual film ratio.

A residual film ratio of the hole transport layer is measured by the following method. The polymer coating liquid and the low molecular coating liquid used in each device are prepared in the same ratio as the hole transport layer formed in each device, and then is applied on the quartz substrate using a spin coating method. After drying at 150° C. for 30 minutes, a film having a dry film thickness of 40 nm is formed. An absorption spectrum of the obtained film is measured with a UV-Vis spectrophotometer.

A residual film ratio of the hole transport layer may be measured by the following method. That is, the low molecular coating liquid used in each device is coated on the quartz substrate using the spin coating method, and then dried at 150° C. for 30 minutes to form a film. The absorption spectrum of the formed film is measured with a UV-Vis spectrophotometer (manufactured by Shimadzu Corporation, UV-1800). A peak wavelength of the longest wavelength of the absorption spectrum is used as the reference wavelength. Next, the polymer coating liquid and the low molecular coating liquid used in each device are prepared in the same ratio as the hole transport layer formed in each device, and then is applied on the quartz substrate using a spin coating method. After drying at 150° C. for 30 minutes, a film having a dry film thickness of 40 nm is formed. An absorption spectrum after drying is measured with a UV-Vis spectrophotometer in the same manner as above.

Then, on the same film, a solvent of the light emitting layer is applied by a spin coater (rotation number: 2000 rpm), and dried at 150° C. for 30 minutes. An absorption spectrum after drying is measured with a UV-Vis spectrophotometer in the same manner as above. For this absorption spectrum, a strength ratio at the reference wavelength of the absorption spectra before and after solvent application of the light emitting layer is the residual film ratio of the hole transport layer. When the residual film ratio is greater than or equal to about 95%, it is determined that the hole transport layer and the light emitting layer may be stacked without film mixing, even if the light emitting layer is formed on the hole transport layer.

In addition, even though 5% of dissolved components are all low molecular materials, the components are diffused in a solution of the light emitting layer, a content of the low molecular materials in the light emitting layer is less than or equal to 0.1 weight percent, and thereby, the low molecular materials in the light emitting layer may not efficiently work. Accordingly, when the residual film ratio is greater than or equal to 95%, the low molecular materials may be judged to be not mingled in the light emitting layer.

The residual film ratio of the hole transport layer is greater than or equal to 95% and desirably, greater than or equal to 98%. When the residual film ratio is less than 95%, a quantum dot EL device may not be constructed to have a designed film thickness. In addition, there is a reduction in surface smoothness of the hole transport layer, non-uniformity of a light emitting surface is caused, and a leak current is easily generated. Accordingly, luminous efficiency and a light emitting life-span of a device decrease.

On the light emitting layer 150, an electron transport layer 160 is formed. The electron transport layer 160 performs a function of transporting electrons and is formed in a vacuum deposition method, a spin-coating method, an Inkjet printing method, and the like. The electron transport layer 160 may be, for example, formed to have a thickness of greater than or equal to 15 nm and less than or equal to 70 nm.

The electron transport layer 160 may be formed by using a publicly known electron transporting material. The publicly known electron transporting material may be, for example, tris(8-quinolinolato)aluminum ($Alq_3$), 8-hydroxyquinolinato)lithium (Liq), ZnMgO, a compound having a nitrogen-containing aromatic ring, and the like. Nonlimiting examples of the compound having a nitrogen-containing aromatic ring may be, for example, a compound including a pyridine ring such as 1,3,5-tri[(3-pyridyl)-phen-3-yl]benzene, a compound including a triazine ring such as (2,4,6-tris(3'-(pyridin-3-yl)biphenyl-3-yl)-1,3,5-triazine, a compound such as an imidazole ring such as 2-(4-(N-phenylbenzoimidazolyl-1-yl-phenyl)-9,10-dinaphthylanthracene, KLET-C1, KLET-02, KLET-03, KLET-10, and KLET-M1 (manufactured by Chemipro Kasei Kaisha, Ltd.), and the like.

On the electron transport layer 160, an electron injection layer 170 is formed. The electron injection layer 170 performs a function of facilitating electron injection from a second electrode 180 and is formed by using a vacuum deposition method and the like. The electron injection layer 170 may be, for example, formed to have a thickness of greater than or equal to 0.3 nm and less than or equal to 9 nm. The electron injection layer 170 may be formed of any material which is publicly known to form the electron injection layer 170. For example, the electron injection layer 170 may be formed of a lithium compound such as (8-hydroxyquinolinolato)lithium (Liq), lithium fluoride (LiF), and the like, sodium chloride (NaCl), cesium fluoride (CsF), lithium oxide ($Li_2O$), barium oxide (BaO), or the like.

On the electron injection layer 170, the second electrode 180 is formed. The second electrode 180 is formed by using a vacuum deposition method and the like. The second electrode 180 is, specifically, a cathode and formed of one having a low work function among a metal, an alloy, a conductive compound, or the like. For example, the second electrode 180 may be formed as a reflective electrode by using a metal such as silver, lithium (Li), magnesium (Mg), aluminum (Al), calcium (Ca), and the like, an alloy such as aluminum-lithium (Al—Li), magnesium-indium (Mg—In), magnesium-silver (Mg—Ag), or the like. The second electrode 180 may have a thickness of greater than or equal to about 10 nm and less than or equal to about 200 nm and specifically, greater than or equal to 50 nm and less than or equal to 150 nm. Otherwise, the second electrode 180 may be formed as a transmissive electrode by using a thin film formed of the metal material and having a thickness of less than or equal to 20 nm and a transparent conductive layer formed of indium tin oxide ($In_2O_3$—$SnO_2$), indium zinc oxide ($In_2O_3$—ZnO), and the like.

A stack structure of the quantum dot EL device 100 according to the present embodiment is not limited thereto. The quantum dot EL device 100 according to the embodiment may have other publicly known stack structures. For example, the quantum dot EL device 100 may be formed by omitting at least one among the hole injection layer 130, the hole transport layer 140, the electron transport layer 160, and the electron injection layer 170 and in addition, additionally including a different layer therefrom. In addition, each layer of the quantum dot EL device 100 may be respectively formed as a single layer or more than one layer.

For example, the quantum dot EL device 100 may further include a hole blocking layer between the hole transport layer 140 and the light emitting layer 150 to prevent diffusion of excitons or holes into the electron transport layer 160. The hole blocking layer may be, for example, formed of an oxadiazole derivative, a triazole derivative, a phenanthroline derivative, or the like.

EXAMPLES

Although the present disclosure is described in more detail using the following Examples and Comparative Examples, the technical range of the present disclosure is not limited to the following Examples. In the following Examples, unless specifically described, each operation was performed at room temperature (25° C.).

Synthesis Example 1: Synthesis of Polymer Compound P-1

A polymer compound P-1 having the following structural unit according to the following composition is synthesized based on a manufacturing method described in U.S. Patent Laid-Open Publication No. 2018/0182967. A number average molecular weight (Mn), a weight average molecular weight (Mw), and polydispersity (Mw/Mn) of the polymer compound P-1 are measured by using SEC. As a result, Mn=44,000, Mw=80,000, and Mw/Mn=1.83.

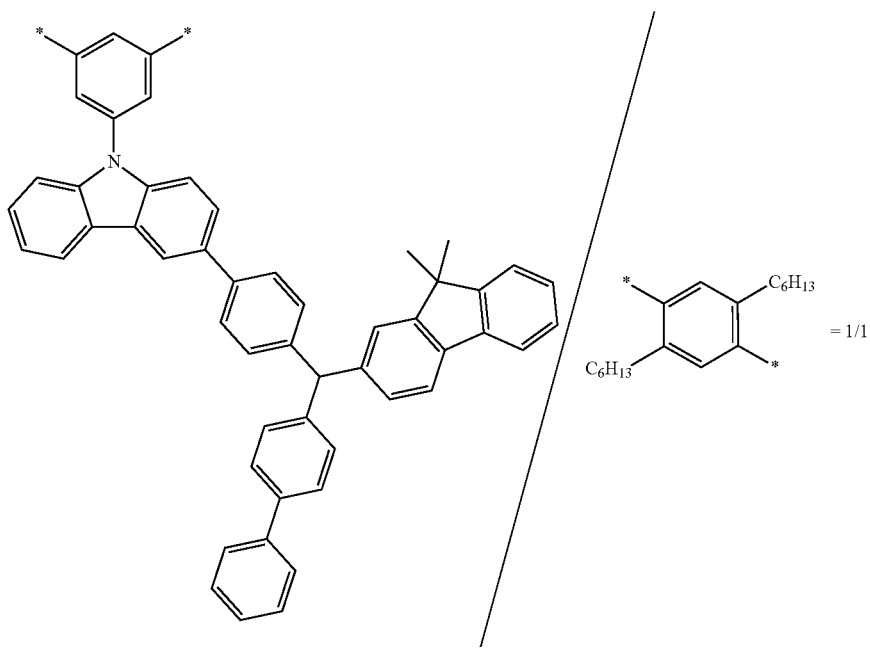

Synthesis Example 2: Synthesis of Polymer Compound P-2

A polymer compound P-2 having a structure and a composition expressed by Chemical Formula is synthesized based on a manufacturing method described in Japanese Patent Laid-Open Publication No. 2017-048290. A number average molecular weight (Mn), a weight average molecular weight (Mw), and a polydispersity (Mw/Mn) of the polymer compound P-2 are measured by using SEC. As a result, Mn=53,000, Mw=124,000, and Mw/Mn=2.3.

Polymer Compound P-2

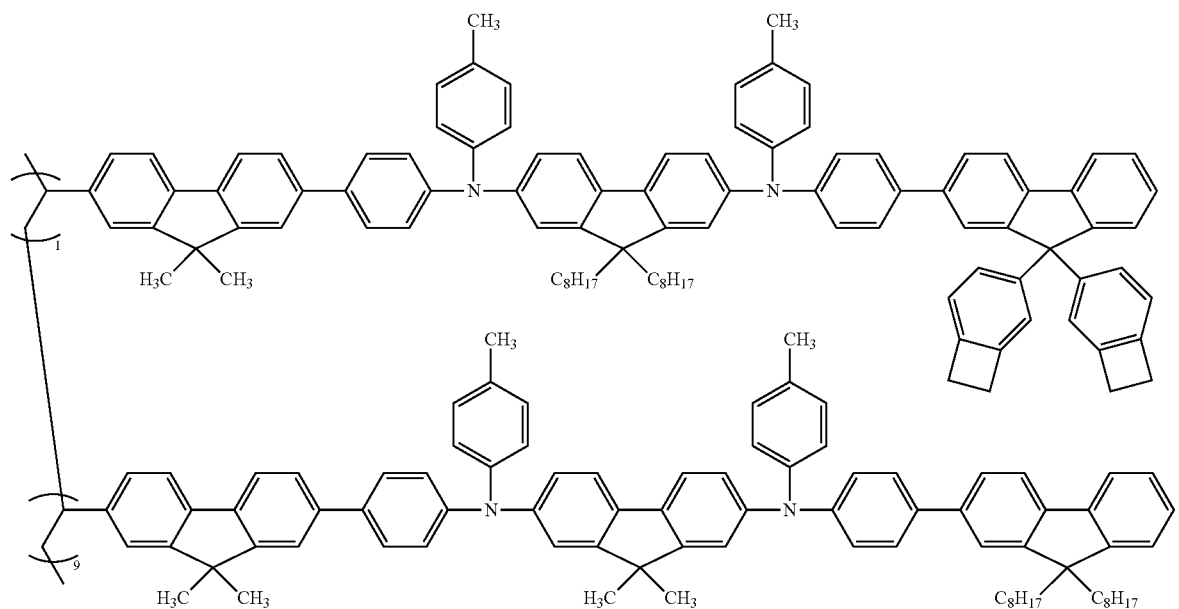

Synthesis Example 3: Synthesis of Polymer Compound P-3

A polymer compound P-3 having a structural unit expressed by Chemical Formula is synthesized in a manufacturing method described in International Laid-Open No. 2011/159872. A number average molecular weight (Mn), a weight average molecular weight (Mw), and a polydispersity (Mw/Mn) of the polymer compound P-3 are measured by using SEC. As a result, Mn=141,000, Mw=434,000, and Mw/Mn=3.

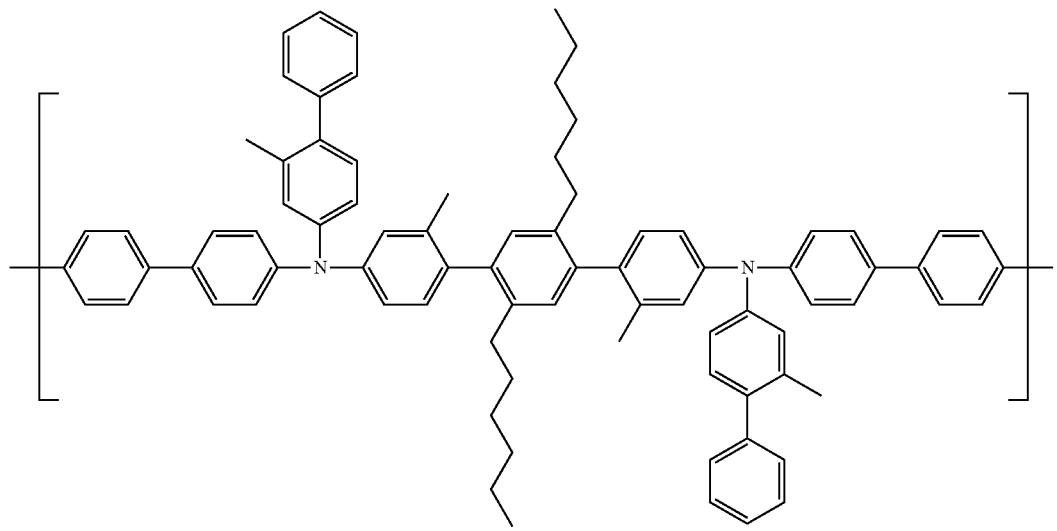

Structural unit of polymer compound P-3

Polymer Compound (TFB)

TFB (poly(9,9-dioctylfluorene-co-N-(4-butylphenyl)-diphenylamine) having a structural unit represented by Chemical Formula 6-1 is prepared. And, TFB is manufactured by Lumitech. A number average molecular weight (Mn), a weight average molecular weight (Mw), and polydispersity (Mw/Mn) of TFB are measured by using SEC. As a result, Mn=104,000, Mw=359,000, and Mw/Mn=3.4.

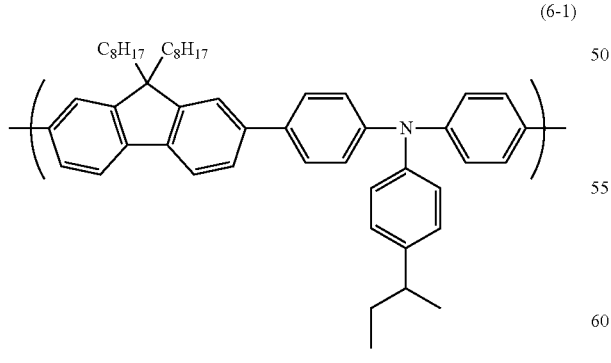

(6-1)

TFB

Low Molecular Compound

Low molecular compounds A-1 to A-4 expressed by Chemical Formulae are prepared.

Low molecular compounds A-1
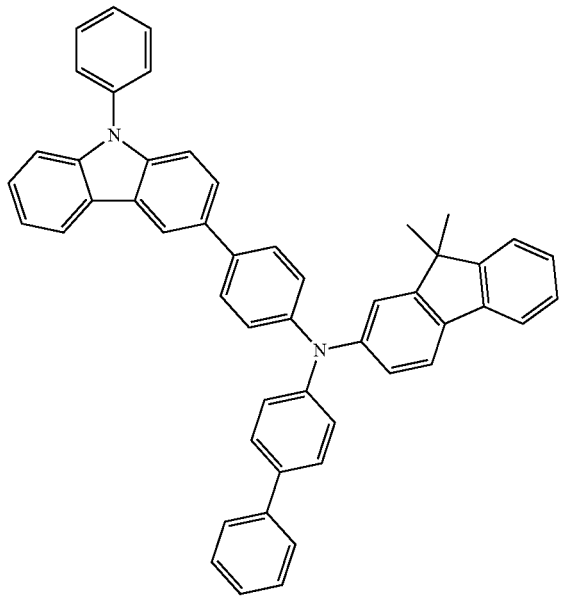
(Molecular weight: 679)
Low molecular compounds A-2
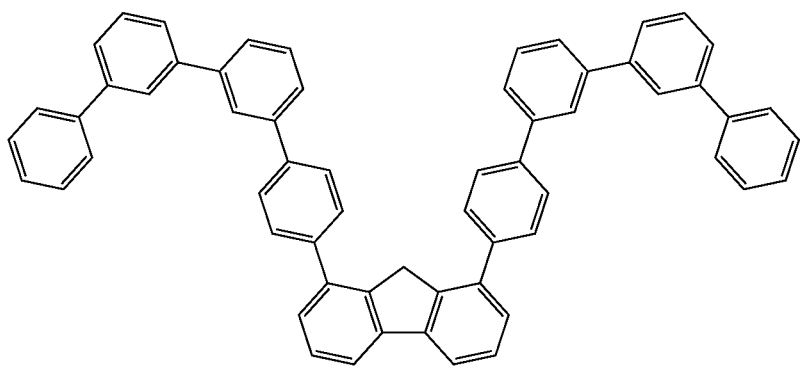
(Molecular weight: 793)
Low molecular compounds A-3
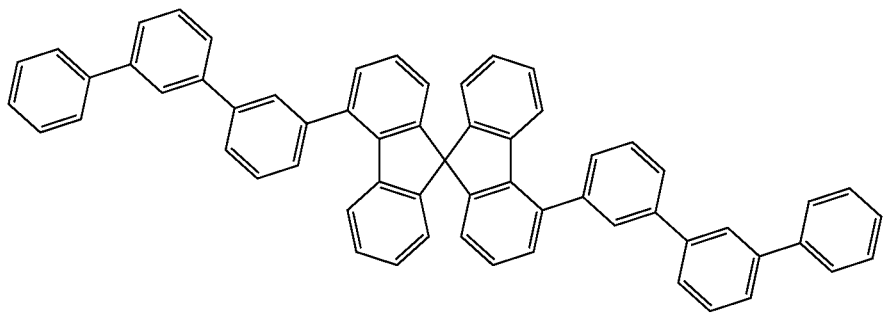
(Molecular weight: 773)

Low molecular compounds A-4

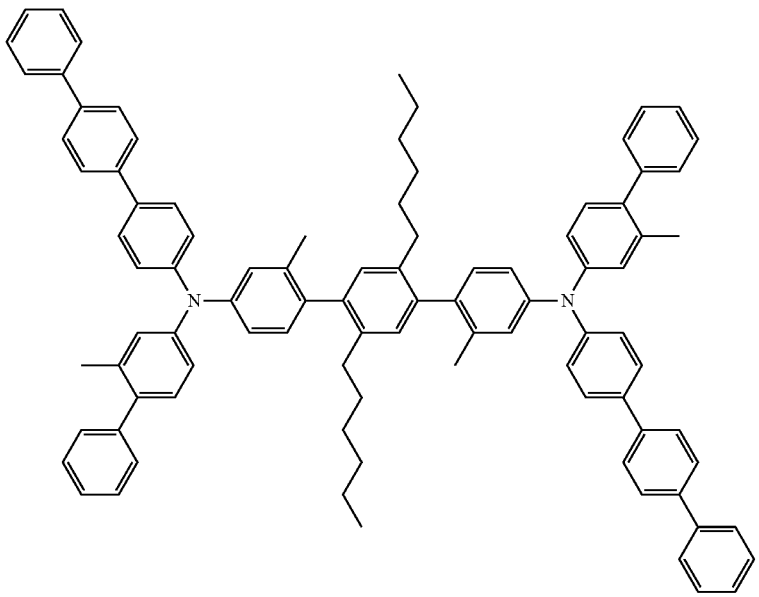

(Molecular weight: 1246)

Residual film ratio Evaluation of Hole Transport Layer

Reference Example 1

Residual film ratios of the hole transport layers are measured by the following method. In other words, the polymer compound P-1 is dissolved in xylene at a concentration of 1 weight percent to prepare a polymer coating liquid (P-1). In addition, the low molecular compound A-1 is dissolved in xylene at a concentration of 1 weight percent to prepare a low molecular coating liquid (A-1). The polymer coating liquid (P-1) and the low molecular coating liquid (A-1) are mixed in a weight ratio of 80:20 to prepare a coating liquid for a hole transport layer PA-1. The low molecular coating liquid (A-1) is spin-coated on a quartz substrate and dried at 150° C. for 30 minutes to form a film. Herein, an absorption spectrum of the film is measured by using a UV-Vis spectrophotometer (UV-1800, Shimadzu Corp.). A peak wavelength at the longest wavelength of the absorption spectrum is measured and used as a reference wavelength. Subsequently, the coating liquid for a hole transport layer PA-1 is spin-coated on the quartz substrate. Then, the coated coating liquid is dried at 150° C. for 30 minutes to form a 40 nm-thick film, and an absorption spectrum thereof after the drying is measured by equally using the UV-Vis spectrophotometer.

Subsequently, n-octane (a solvent of a light emitting layer) is coated with a spin coater (at 2000 rpm) on the same film and dried at 150° C. for 30 minutes. After the drying, an absorption spectrum thereof is measured by using the UV-Vis spectrophotometer. A strength ratio at the reference wavelength of the absorption spectrum before and after coating the n-octane is calculated by using this absorption spectrum to obtain a residual film ratio of the hole transport layer. When the residual film ratio is greater than or equal to 95%, even though the light emitting layer is formed on the hole transport layer, the hole transport layer and the light emitting layer are not mingled but stacked.

In addition, when the 5% dissolved components are all low molecular materials, the components are diffused in a solution of the light emitting layer, a content of the low molecular materials in the light emitting layer is less than or equal to 0.1 weight percent, and the low molecular materials may not work efficiently in the light emitting layer. Accordingly, when the residual film ratio is greater than or equal to 95%, the low molecular materials may be judged to be not mingled into the light emitting layer.

Reference Example 2

A residual film ratio is evaluated according to the same method as Reference Example 1 except that the mixing ratio of the polymer coating liquid (P-1) and the low molecular coating liquid (A-1) is changed into 70:30 (a weight ratio).

Comparative Reference Example 1

A residual film ratio is evaluated according to the same method as Reference Example 1 except that the mixing ratio of the polymer coating liquid (P-1) and the low molecular coating liquid (A-1) is changed into 60:40 (a weight ratio).

Comparative Reference Example 2

A residual film ratio is evaluated according to the same method as Reference Example 1 except that the mixing ratio of the polymer coating liquid (P-1) and the low molecular coating liquid (A-1) is changed into 50:50 (a weight ratio).

Comparative Reference Example 3

A residual film ratio is evaluated according to the same method as Reference Example 1 except that the polymer coating liquid (P-1) is not used.

The residual film ratio evaluation results are shown in Table 1.

TABLE 1

| | Polymer compound | | Low molecular compound | | Polymer:low molecular compound (weight ratio) | Residual film ratio (%) |
|---|---|---|---|---|---|---|
| | name | HOMO (eV) | name | HOMO (eV) | | |
| Reference Example 1 | P-1 | 5.60 | A-1 | 5.57 | 80:20 | 99 |
| Reference Example 2 | P-1 | 5.60 | A-1 | 5.57 | 70:30 | 98 |
| Comparative Reference Example 1 | P-1 | 5.60 | A-1 | 5.57 | 60:40 | 85 |
| Comparative Reference Example 2 | P-1 | 5.60 | A-1 | 5.57 | 50:50 | 57 |
| Comparative Reference Example 3 | — | — | A-1 | 5.57 | 0:100 | 0 |

As shown in Table 1, when the ratio of the polymer compound exceeds 60% by weight, it is suggested that lamination may be ensured and a stable device may be produced.

Manufacture of Quantum Dot Electroluminescence Device

Example 1

A first electrode (a positive electrode) is prepared by coating a glass substrate with a stripe-shaped indium tin oxide (ITO) to form a 150 nm-thick film thereon. On the glass substrate, PEDOT-PSS (Sigma-Aldrich Co., Ltd.) is spin-coated to have a dry film thickness of 30 nm and then, dried to form a 30 nm-thick hole injection layer.

Subsequently, the synthesized polymer compound P-1 is dissolved in xylene at a concentration of 1 weight percent to prepare a polymer coating liquid (P-1). In addition, the low molecular compound A-1 is dissolved in xylene as a solvent at a concentration of 1 weight percent to prepare a low molecular coating liquid (A-1). The polymer coating liquid (P-1) and the low molecular coating liquid (A-1) are mixed in a mass ratio of 80:20 to prepare a coating liquid for a hole transport layer PA-1. On the hole injection layer, the coating liquid for a hole transport layer PA-1 is spin-coated to have a dry film thickness of 30 nm and then, heated and dried at 150° C. for 30 minutes. Thereby, a 30 nm-thick hole transport layer is formed.

CdSe/ZnS quantum dots (a core: CdSe, a shell: ZnS) are dispersed to be 1 weight percent in n-octane to prepare quantum dot dispersion. The hole transport layer is not dissolved in n-octane. This quantum dot dispersion is spin-coated and dried to have a dry film thickness of 25 nm on the hole transport layer. As a result, a 25 nm-thick quantum dot light emitting layer is formed on the hole transport layer.

In ethanol, ZnMgO is dispersed to be 1.5 weight percent to prepare dispersion for an electron transport layer. This dispersion is spin-coated to have a dry film thickness of 60 nm on the quantum dot light emitting layer and then, dried. As a result, a 60 nm-thick electron transport layer is formed on the quantum dot light emitting layer.

On the electron transport layer, aluminum (Al) is vacuum-deposited to form a second electrode (a cathode) having a thickness of 100 nm. In this way, a quantum dot EL device (Device-1) is manufactured.

Example 2

A quantum dot EL device (Device-2) is manufactured according to the same method as Example 1 except that the low molecular compound A-2 is used instead of the low molecular compound A-1.

Example 3

A quantum dot EL device (Device-3) is manufactured according to the same method as Example 1 except that the low molecular compound A-3 is used instead of the low molecular compound A-1.

Comparative Example 1

A quantum dot EL device (Device-4) is manufactured according to the same method as Example 1 except that the low molecular compound A-1 is not used.

Evaluation of Quantum Dot EL Device

The quantum dot EL devices (Devices-1 to 4) according to Examples 1 to 3 and Comparative Example 1 are evaluated with respect to a light emitting life-span.

When a voltage is applied to each quantum dot EL device by using a DC constant voltage power source (a source meter, Keyence Corp.), a current starts to flow at a constant voltage, and the quantum dot EL devices emit light. The current is slowly increased, while luminance of each device is measured by using a luminance-measuring device (SR-3, Topcom), until the luminance becomes 100 nits (candela per square meter (cd/m$^2$)) and then the current is kept constant at this state. The luminance measured by the luminance-measuring device is then slowly decreases, and time when the luminance becomes 50% of the initial luminance is regarded as "LT50 life-span (hours)". And, the luminance life-span of Table 1 is obtained as a relative value based on 1.00 of a measurement value of Comparative Example 1.

HOMO energy levels of the polymer material and the low molecular material included in each device are obtained as ionization potentials measured by using a photoelectron spectrometer AC-3 (Hitachi Technologies Co., Ltd.) in the air.

A residual film ratio of the hole transport layer is measured in the following method. In other words, the low molecular coating liquid used in each device is spin-coated on the quartz substrate and then, dried at 150° C. for 30 minutes to form a film. Herein, an absorption spectrum of the film is measured by using a UV-Vis spectrophotometer (UV-1800, Shimadzu Corp.). A peak wavelength at the longest wavelength of the absorption spectrum is measured and regarded as a reference wavelength. Next, the polymer coating liquid and the low molecular coating liquid used in each device are prepared in the same ratio as the hole transport layer formed in each device and then is applied on the quartz substrate in a spin coating method. Subsequently, the coated liquid is dried at 150° C. for 30 minutes to form a 40 nm-thick film. After the drying, an absorption spectrum thereof is measured by using the UV-Vis spectrophotometer.

Then, n-octane (a solvent of a light emitting layer) is spin-coated (at 2000 rpm) on the same film and dried at 150° C. for 30 minutes. After the drying, an absorption spectrum thereof is measured by using the UV-Vis spectrophotometer. With respect to this absorption spectrum, a strength ratio at the reference wavelength of the absorption spectrum before and after coating the n-octane is regarded as a residual film ratio of the hole transport layer. When the residual film ratio is greater than or equal to 95%, even though the light emitting layer is formed on the hole transport layer, the hole transport layer is not mingled but stacked with the light emitting layer.

In addition, when the 5% dissolved components are all low molecular materials, the low molecular materials are diffused in a solution of the light emitting layer, and accordingly, a content of the low molecular materials in the light emitting layer becomes less than or equal to 0.1 weight percent, and the low molecular materials may not work efficiently in the light emitting layer. Accordingly, when the residual film ratio is greater than or equal to 95%, the low molecular materials may be judged to be not mingled in the light emitting layer.

The results are shown in Table 2.

TABLE 2

|  | Polymer compound | | Low molecular compound | | Polymer:low molecular compound (weight ratio) | Quantum dot | Residual film ratio (%) | LT50 life-span |
| --- | --- | --- | --- | --- | --- | --- | --- | --- |
|  | name | HOMO (eV) | name | HOMO (eV) |  |  |  |  |
| Example 1 | P-1 | 5.60 | A-1 | 5.57 | 80:20 | CdSe/ZnS | 99 | 2.74 |
| Example 2 | P-1 | 5.60 | A-2 | 6.22 | 80:20 | CdSe/ZnS | 100 | 1.63 |
| Example 3 | P-1 | 5.60 | A-3 | 6.54 | 80:20 | CdSe/ZnS | 99 | 2.02 |
| Comparative Example 1 | P-1 | 5.60 | — | — | 100:0 | CdSe/ZnS | 100 | 1.00 |

As shown in Table 2, the quantum dot EL device of Example 1-3 exhibits an improved LT50 life-span compared with that of Comparative Example 1. Referring to this result, the quantum dot EL device of Example 1-3 exhibits satisfactory luminous efficiency and light emitting life-span.

Example 4

A quantum dot EL device (Device-5) is manufactured according to the method as Example 1 except that InP/ZnSe/ZnS quantum dots (a core: InP, a shell: ZnSe/ZnS) are used instead of the CdSe/ZnS quantum dots.

Example 5

A quantum dot EL device (Device-6) is manufactured according to the method as Example 1 except that the low molecular compound A-4 is used instead of the low molecular compound A-1.

Example 6

A quantum dot EL device (Device-7) is manufactured according to the method as Example 4 except that the low molecular compound A-2 is used instead of the low molecular compound A-1.

Example 7

A quantum dot EL device (Device-8) is manufactured according to the same method as Example 4 except that the polymer coating liquid (P-1) and the low molecular coating liquid (A-1) are mixed in a mass ratio of 70:30.

Comparative Example 2

A quantum dot EL device (Device-9) is manufactured according to the same method as Example 4 except that the low molecular coating liquid (A-1) is not used.

The quantum dot EL devices (Devices-5 to 9) are evaluated in the same method as above. The results are shown in Table 3. And, luminance life-spans of Table 3 are obtained as a relative value based on 1.00 of a measurement value of Comparative Example 2.

TABLE 3

|  | Polymer compound | | Low molecular compound | | Polymer:low molecular compound (weight ratio) | Quantum dot | Residual film ratio (%) | LT50 life-span |
| --- | --- | --- | --- | --- | --- | --- | --- | --- |
|  | name | HOMO (eV) | name | HOMO (eV) |  |  |  |  |
| Example 4 | P-1 | 5.60 | A-1 | 5.57 | 80:20 | InP/ZnSe/ZnS | 99 | 2.15 |
| Example 5 | P-1 | 5.60 | A-4 | 5.70 | 80:20 | InP/ZnSe/ZnS | 98 | 2.00 |
| Example 6 | P-1 | 5.60 | A-2 | 6.22 | 80:20 | InP/ZnSe/ZnS | 100 | 239 |

TABLE 3-continued

| | Polymer compound | | Low molecular compound | | Polymer:low molecular compound | | | |
|---|---|---|---|---|---|---|---|---|
| | name | HOMO (eV) | name | HOMO (eV) | (weight ratio) | Quantum dot | Residual film ratio (%) | LT50 life-span |
| Example 7 | P-1 | 5.60 | A-1 | 5.57 | 70:30 | InP/ZnSe/ZnS | 98 | 3.87 |
| Comparative Example 2 | P-1 | 5.60 | — | — | 100:0 | InP/ZnSe/ZnS | 100 | 1.00 |

As shown in Table 3, the quantum dot EL devices according to Examples 4 to 7 particularly exhibit greatly improved LT50 life-span compared with that of Comparative Example 2. Referring to this result, the quantum dot EL devices according to Examples 4 to 7 exhibit satisfactory luminous efficiency and luminance life-span.

Example 8

A quantum dot EL device (Device-10) is manufactured according to the method as Example 4 except that the polymer compound P-2 is used instead of the Polymer compound P-1.

Example 9

A quantum dot EL device (Device-11) is manufactured according to the method as Example 8 except that the low molecular compound A-2 is used instead of the low molecular compound A-1.

Comparative Example 3

A quantum dot EL device (Device-12) is manufactured according to the method as Example 8 except that the low molecular compound A-1 is not used.

The quantum dot EL device (Device-10 to 12) is evaluated according to the same method as above. The results are shown in Table 4. Luminance life-spans of Table 4 are obtained as a relative value based on 1.00 of a measurement value of Comparative Example 3.

As shown in Table 4, the quantum dot EL devices according to Examples 8 to 9 exhibit a greatly improved LT50 life-span compared with that of Comparative Example 3. Referring to this result, the quantum dot EL devices of Examples 8 to 9 exhibit satisfactory luminous efficiency and luminance life-span.

Example 10

A quantum dot EL device (Device-13) is manufactured according to the method as Example 4 except that the polymer compound P-3 is used instead of the polymer compound P-1.

Example 11

A quantum dot EL device (Device-14) is manufactured according to the method as Example 10 except that the low molecular compound A-2 is used instead of the low molecular compound A-1.

Comparative Example 4

A quantum dot EL device (Device-15) is manufactured according to the same method as Example 10 except that the low molecular compound A-1 is not used.

The quantum dot EL devices (Devices-13 to 15) are evaluated according to the same method as above. The results are shown in Table 5. Luminance life-spans of Table 5 are obtained as a relative value based on 1.00 of a measurement value of Comparative Example 4.

TABLE 4

| | Polymer compound | | Low molecular compound | | Polymer:low molecular compound | | | |
|---|---|---|---|---|---|---|---|---|
| | name | HOMO (eV) | name | HOMO (eV) | (weight ratio) | Quantum dot | Residual film ratio (%) | LT50 life-span |
| Example 8 | P-2 | 5.40 | A-1 | 5.57 | 80:20 | InP/ZnSe/ZnS | 99 | 2.00 |
| Example 9 | P-2 | 5.40 | A-2 | 6.22 | 80:20 | InP/ZnSe/ZnS | 99 | 1.56 |
| Comparative Example 3 | P-2 | 5.40 | — | — | 100:0 | InP/ZnSe/ZnS | 100 | 1.00 |

TABLE 5

| | Polymer compound | | Low molecular compound | | Polymer:Low molecular (mass ratio) | Quantum dot | Residual film ratio (%) | LT50 life-span |
|---|---|---|---|---|---|---|---|---|
| | name | HOMO (eV) | name | HOMO (eV) | | | | |
| Example 10 | P-3 | 5.70 | A-1 | 5.57 | 80:20 | InP/ZnSe/ZnS | 100 | 1.33 |
| Example 11 | P-3 | 5.70 | A-2 | 6.22 | 80:20 | InP/ZnSe/ZnS | 100 | 1.17 |
| Comparative Example 4 | P-3 | 5.70 | — | — | 100:0 | InP/ZnSe/ZnS | 100 | 1.00 |

As shown in Table 5, the quantum dot EL devices according to Examples 10 to 11 exhibit a greatly improved LT50 life-span compared with that of Comparative Example 4.

Referring to this result, the quantum dot EL devices of Examples 10 to 11 exhibit satisfactory luminous efficiency and luminance life-span.

Example 12

A quantum dot EL device (Device-16) is manufactured according to the method as Example 4 except that the TFB is used instead of the polymer compound P-1.

Comparative Example 5

A quantum dot EL device (Device-17) is manufactured according to the method as Example 12 except that a coating solution including TFB is not used.

The quantum dot EL devices (Devices-16 to 17) are evaluated according to the same method as above. The results are shown in Table 6. Luminance life-spans of Table 5 are obtained as a relative value based on 1.00 of a measurement value of Comparative Example 5.

TABLE 6

| | Polymer compound | | Low molecular compound | | Polymer:Low molecular (weight ratio) | Quantum dot | Residual film ratio (%) | LT50 life-span |
|---|---|---|---|---|---|---|---|---|
| | name | HOMO (eV) | name | HOMO (eV) | | | | |
| Example 12 | TFB | 5.54 | A-1 | 5.57 | 80:20 | InP/ZnSe/ZnS | 98 | 1.21 |
| Comparative Example 5 | TFB | 5.54 | — | — | 100:0 | InP/ZnSe/ZnS | 100 | 1.00 |

As shown in Table 6, the quantum dot EL device according to Example 12 exhibits a greatly improved LT50 life-span compared with that of Comparative Example 5. Referring to this result, the quantum dot EL device of Example 12 exhibits satisfactory luminous efficiency and luminance life-span.

Hereinafter, a model device is manufactured, and an experiment is performed to examine a reason of improving characteristics thereof.

Reference Experiment: Characteristic Evaluation of Model Device

Reference Example 3

An electron blocking layer is formed by sequentially vacuum-depositing α-NPD (N,N'-di-1-naphthyl-N,N'-diphenylbenzidine) and HAT-CN (dipyrazino[2,34:2',3'-h]quinoxaline-2,3,6,7,10,11-hexacarbonitrile) to have each thickness of 36 nm and 10 nm instead of the electron transport layer. A hole only device (H-Device-1) is manufactured according to the method as Example 4 except for this.

Reference Example 4

The electron blocking layer is formed by sequentially vacuum depositing a-NPD and HAT-CN to have each thickness of 36 nm and 10 nm instead of the electron transport layer. A hole only device (H-Device-2) is manufactured according to the method as Example 6 except for this.

Comparative Reference Example 4

A hole only device (H-Device-3) is manufactured according to the method as Example 2 except that the electron blocking layer is formed by sequentially vacuum-depositing a-NPD and HAT-CN to have each thickness of 36 nm and 10 nm instead of the electron transport layer.

The quantum dot EL devices (Devices-3 to 5) are evaluated with respect to a residual film ratio according to the same method as above. In addition, a voltage is applied to each H-device by using the same DC constant voltage power source as used above in the evaluation of the quantum dot EL devices, and then, voltage-current characteristics thereof are measured by slowly increasing a current, and a driving voltage at 2 mA/cm$^2$ is calculated.

The results are shown in Table 7. And, driving voltages of Table 7 are obtained as a relative value based on 1.00 of a measurement value of Comparative Example 4.

TABLE 7

| Polymer compound | | Low molecular compound | | Polymer (weight ratio) | Quantum dot | Residual film ratio (%) | LT50 life-span |
|---|---|---|---|---|---|---|---|
| name | HOMO (eV) | name | HOMO (eV) | | | | |
| Reference Example 3 | P-1 | 5.60 | A-1 | 5.57 | 80:20 | InP/ZnSe/ZnS | 99 | 0.79 |
| Reference Example 4 | P-1 | 5.60 | A-2 | 6.22 | 80:20 | InP/ZnSe/ZnS | 99 | 0.93 |
| Comparative Reference Example 4 | P-1 | 5.60 | — | — | 100:0 | InP/ZnSe/ZnS | 100 | 1.00 |

As shown in Table 7, the quantum dot EL devices according to Reference Examples 3 to 4 use a low driving voltage compared with that of Comparative Reference Example 4. Referring to this result, the quantum dot EL devices of Examples 4 and 6 exhibit improved hole injectability and transportation properties and thus a long life-span effect.

Reference Example 5

An electron blocking layer is formed by sequentially vacuum-depositing a-NPD and HAT-CN with a thickness of 36 nm and 10 nm, respectively, instead of the electron transport layer. A hole only device (H-Device-4) is manufactured according to the method as Example 10 except for this.

Reference Example 6

An electron blocking layer is formed by sequentially vacuum-depositing a-NPD and HAT-CN with a thickness of 36 nm and 10 nm, respectively, instead of the electron transport layer. A hole only device (H-Device-5) is manufactured according to the method as Example 11 except for this.

Comparative Reference Example 5

A hole only device (H-Device-6) is manufactured according to the method as Comparative Example 6 except that the electron blocking layer is formed by sequentially vacuum-depositing α-NPD and HAT-CN with a thickness of 36 nm and 10 nm, respectively, instead of the electron transport layer.

The hole only devices (H-Devices-4 to 6) are evaluated with respect to a residual film ratio and a driving voltage according to the same method as above.

The results are shown in Table 8. And, driving voltages of Table 7 are obtained as a relative value based on 1.00 of a measurement value of Comparative Example 5.

TABLE 8

| Polymer compound | | Low molecular compound | | Polymer:Low molecular (weight ratio) | Quantum dot | Residual film ratio (%) | Driving voltage @ 2 mA/cm² |
|---|---|---|---|---|---|---|---|
| name | HOMO (eV) | name | HOMO (eV) | | | | |
| Reference Example 5 | P-3 | 5.70 | A-1 | 5.57 | 80:20 | InP/ZnSe/ZnS | 99 | 0.76 |
| Reference Example 6 | P-3 | 5.70 | A-2 | 6.22 | 80:20 | InP/ZnSe/ZnS | 99 | 0.85 |
| Comparative Reference Example 5 | P-3 | 5.70 | — | — | 100:0 | InP/ZnSe/ZnS | 100 | 1.00 |

As shown in Table 8, the quantum dot EL devices according to Reference Examples 5 to 6 use a low driving voltage compared with that of Comparative Reference Example 5. Referring to this result, the quantum dot EL devices of Examples 10 to 11 exhibit improved hole injectability and transportation properties and thus a long life-span effect.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

| Description of Symbols | | | |
|---|---|---|---|
| 100: | quantum dot electroluminescence device (quantum dot EL device) | | |
| 110: | substrate | 120: | first electrode |
| 130: | hole injection layer | 140: | hole transport layer |
| 150: | light emitting layer | 160: | electron transport layer |
| 170: | electron injection layer | 180: | second electrode |

What is claimed is:

1. A quantum dot electroluminescence device, comprising a hole transport layer, an electron transport layer, and a light emitting layer disposed between the hole transport layer and the electron transport layer,
wherein the hole transport layer comprises a polymer material and a low molecular material,
the light emitting layer comprises a quantum dot having a core-shell structure, and
a content ratio of the polymer material in the hole transport layer is greater than or equal to about 70 weight percent and less than or equal to about 90 weight percent, based on 100 weight percent of the polymer material and the low molecular material, such that a residual film ratio of the hole transport layer is greater than or equal to about 95%.

2. The quantum dot electroluminescence device of claim 1, wherein the polymer material has an amine structure.

3. The quantum dot electroluminescence device of claim 1, wherein the polymer material comprises a segment of an alternate copolymer of a structural unit represented by Chemical Formula 1

Chemical Formula 1

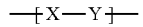
(1)

wherein, in Chemical Formula 1, X is a group represented by Chemical Formula 2, Y is a substituted or unsubstituted C6 to 60 divalent aromatic hydrocarbon group, or a substituted or unsubstituted divalent aromatic heterocyclic group having 3 to 60 ring-forming atoms;

Chemical Formula 2

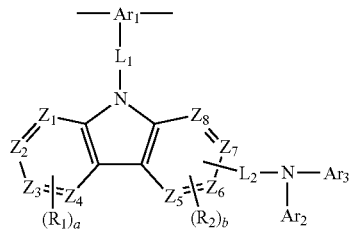
(2)

wherein in Chemical Formula 2, $Ar_1$ is a substituted or unsubstituted C6 to C60 trivalent aromatic hydrocarbon group, or a substituted or unsubstituted trivalent aromatic heterocyclic group having 3 to 60 ring-forming atoms,
$Ar_2$ and $Ar_3$ are independently a substituted or unsubstituted C6 to C60 monovalent aromatic hydrocarbon group, or a substituted or unsubstituted monovalent aromatic heterocyclic group having 3 to 60 ring-forming atoms,
$L_1$ and $L_2$ are independently a single bond, a substituted or unsubstituted C6 to C60 divalent aromatic hydrocarbon group, or a substituted or unsubstituted divalent aromatic heterocyclic group having 3 to 60 ring-forming atoms,
$R_1$ and $R_2$ are independently, a substituted or unsubstituted C1 to C20 alkyl group, a substituted or unsubstituted C1 to C20 alkoxy group, a substituted or unsubstituted C6 to C60 monovalent aromatic hydrocarbon group, or a substituted or unsubstituted monovalent aromatic heterocyclic group having 3 to 60 ring-forming atoms, or
$R_1$ and $R_2$ are optionally linked to each other to form a ring,
a is an integer of 0 to 4,
b is an integer of 0 to 3,
$Z_1$ to $Z_4$ are independently a nitrogen atom, CH or $CR_1$; and
$Z_5$ to $Z_8$ are independently a nitrogen atom, CH, or $CR_2$, and where one of $Z_5$ to $Z_8$ is connected to $L_2$.

4. The quantum dot electroluminescence device of claim 1, wherein
the low molecular material is a hole transporting material or a wide gap material, and
the low molecular material is included among one or more polymer materials.

5. The quantum dot electroluminescence device of claim 4, wherein the hole transporting material is at least one of the low molecular compounds represented by Chemical Formula (L1) to Chemical Formula (L4):

Chemical Formula (L1)

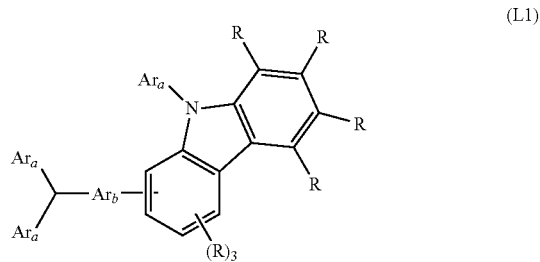
(L1)

wherein, in Chemical Formula (L1),
R is independently a hydrogen atom, a deuterium atom, or a monovalent organic group, or a plurality of R's are linked to each other to form a ring,
$Ar_a$ is a group represented by Chemical Formula (L1-a), a plurality of $Ar_a$'s are the same or different, and optionally a plurality of $Ar_a$'s are linked to each other to form a ring, and
$Ar_b$ is a group represented by Chemical Formula (L1-b);

Chemical Formula (L1-a)

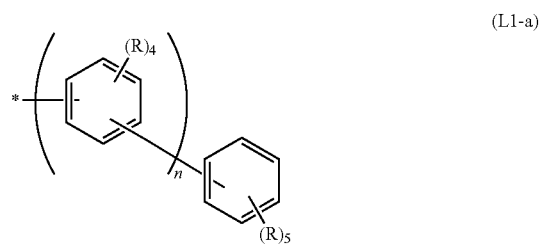
(L1-a)

wherein, in Chemical Formula (L1-a),
R is independently a hydrogen atom, a deuterium atom, or a monovalent organic group, and optionally a plurality of R's are linked to each other to form a ring, n is an integer of 0 to 3, and
* represents a linking portion with an adjacent atom;

Chemical Formula (L1-b)

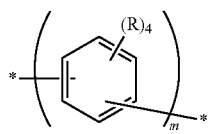

(L1-b)

wherein, in Chemical Formula (L1-b),
R is independently a hydrogen atom, a deuterium atom, or a monovalent organic group, or a plurality of R's are linked to each other to form a ring,
m is an integer of 0 to 2, and
* represents a linking portion with an adjacent atom;

Chemical Formula (L2)

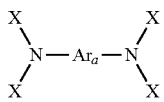

(L2)

wherein, in Chemical Formula (L2),
$Ar_a$ is a group represented by Chemical Formula (L2-a),
X is a group represented by Chemical Formula (L2-b), a plurality of X's are the same or different, and optionally, a plurality of X's are linked to each other to form a ring;

Chemical Formula (L2)-a

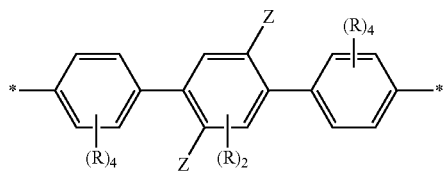

(L2-a)

wherein, in Chemical Formula (L2-a),
R is independently a hydrogen atom, a deuterium atom, or a monovalent organic group, or optionally a plurality of R's are linked to each other to form a ring,
Z is a C1 to C12 linear or branched alkyl group, and
* represents a linking portion with an adjacent atom;

[Chemical Formula (L2)-b]

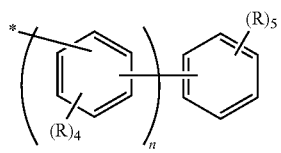

(L2-b)

wherein, in Chemical Formula (L2-b),
R is independently a hydrogen atom, a deuterium atom, or a monovalent organic group, or optionally a plurality of R's are linked to each other to form a ring, n is an integer of 0 to 3, and
* represents a linking portion with an adjacent atom;

Chemical Formula (L3)

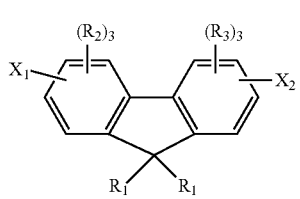

(L3)

wherein, in Chemical Formula (L3),
$R_1$, $R_2$, and $R_3$ are independently a hydrogen atom, a monovalent hydrocarbon group, or a monovalent aromatic hydrocarbon group, or optionally the two $R_1$'s are linked to each other to form a ring,
$X_1$ is a hydrogen atom or a group represented by Chemical Formula (L3-a), and
$X_2$ is a group represented by Chemical Formula (L3-a);

Chemical Formula (L3-a)

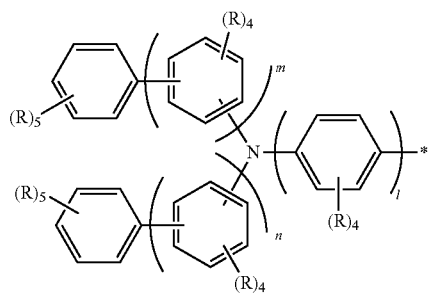

(L3-a)

wherein, in Chemical Formula (L3-a),
$R_4$ and $R_5$ are independently a hydrogen atom or a monovalent hydrocarbon group, and
l, m, and n are independently an integer of 0 to 3;

Chemical Formula (L4)

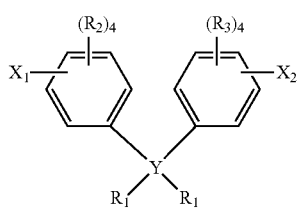

(L4)

wherein, in Chemical Formula (L4),
Y is a carbon atom or a silicon atom,
$R_1$ to $R_3$ are independently a hydrogen atom, a monovalent hydrocarbon group, or a monovalent aromatic hydrocarbon group, or two $R_1$'s are linked to each other to form a ring, $X_1$ is a hydrogen atom or a group represented by Chemical Formula (L4-a), and
$X_2$ is a group represented by Chemical Formula (L4-a);

Chemical Formula (L4)-a

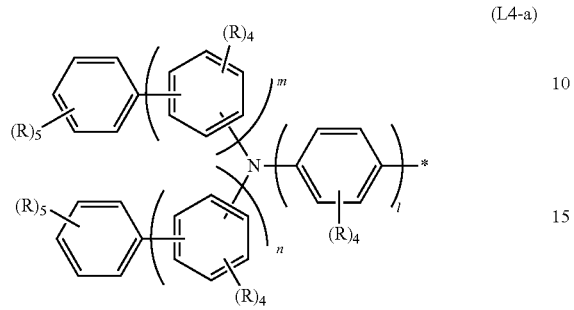

(L4-a)

wherein, in Chemical Formula (L4-a),
$R_4$ and $R_5$ are independently a hydrogen atom or a monovalent hydrocarbon group, and
l, m, and n are independently an integer of 0 to 3.

6. The quantum dot electroluminescence device of claim 3, wherein the device exhibits an relative LT50 lifespan value that is in a range of 1.63 times to 3.87 times that of a similar quantum dot device in the absence of the low molecular weight material.

* * * * *